United States Patent [19]
Ko

[11] Patent Number: 5,852,370
[45] Date of Patent: Dec. 22, 1998

[54] INTEGRATED CIRCUITS FOR LOW POWER DISSIPATION IN SIGNALING BETWEEN DIFFERENT-VOLTAGE ON CHIP REGIONS

[75] Inventor: Uming Ko, Plano, Tex.

[73] Assignee: Texas Instruments Incorporated, Dallas, Tex.

[21] Appl. No.: 728,404

[22] Filed: Oct. 9, 1996

Related U.S. Application Data

[63] Continuation of Ser. No. 547,966, Oct. 25, 1995, abandoned, which is a continuation of Ser. No. 363,450, Dec. 22, 1994, abandoned.

[51] Int. Cl.$^6$ .................. H03K 19/0175; H03K 19/094
[52] U.S. Cl. ............................................... 326/81; 326/68
[58] Field of Search ................................. 326/68, 58, 80, 326/81

[56] References Cited

U.S. PATENT DOCUMENTS

| | | | |
|---|---|---|---|
| 4,080,539 | 3/1978 | Stewart | 326/81 |
| 4,675,544 | 6/1987 | Schrenk | 326/81 |
| 5,341,045 | 8/1994 | Almulla | 326/81 |
| 5,422,523 | 6/1995 | Roberts et al. | 326/68 |
| 5,432,467 | 7/1995 | Reddy | 326/81 |

OTHER PUBLICATIONS

Linley Gwennap, *Microprocessor Report*, "TI Shows Integrated X86 CPU for Notebooks", vol. 8, No.2. Feb. 14, 1994, pp.5–7.

Intel486 SL Microprocessor SuperSet System Design Guide, System and Power Management, Chapter 12, 1992, pp. 12–1–12–38.

PicoPower Technology Inc., The PicoPower "Evergreen HV" PT86C268, Version 1.0.2, Mar. 9, 1993, pp. i–iii, 34–36.

PicoPower Technology, Inc., The PicoPower "Evergreen" 486/386DX Portable Computer Core Chip, Version 1.3.1, Sep. 16, 1992 pp. i–iv, 31.

*Primary Examiner*—Edward P. Westin
*Assistant Examiner*—Richard Roseen
*Attorney, Agent, or Firm*—Dana L. Burton; James C. Kesterson; Richard L. Donaldson

[57] ABSTRACT

An integrated circuit (110) includes, on a single chip, distinct supply voltage terminals and internal on-chip supply conductors connected respectively thereto, including a ground terminal (GND) and terminals for first and second supply voltages (VCC3, VCC5). A first inverter (5526) is connected between first supply voltage (3.3v) and ground and has a first inverter input (IN) and a first inverter output. A second inverter (5518) is connected between second supply voltage (5v) and ground and has a second inverter input (INT) and a second inverter output (OUT). A first feedback transistor (5520) has connections to the second supply voltage (5v), and to the second inverter input (INT) and the second inverter output (OUT). A second feedback transistor (5524) has connections to ground, and to the second inverter input (INT) and the second inverter output (OUT). First and second open-type inverters (5522, 5528) are connected to ground and each of the open-type inverters has an input and output. The input of the first open-type inverter (5522) is connected to the first inverter (5526) input (IN), and the output of the first open-type inverter (5522) is connected to the second inverter input (INT). The input of the second open-type inverter (5528) is connected to the first inverter (5526) output, and the output of the second open-type inverter (5528) is connected to the second inverter (5518) output (OUT). Other devices, systems and methods are also disclosed.

44 Claims, 52 Drawing Sheets

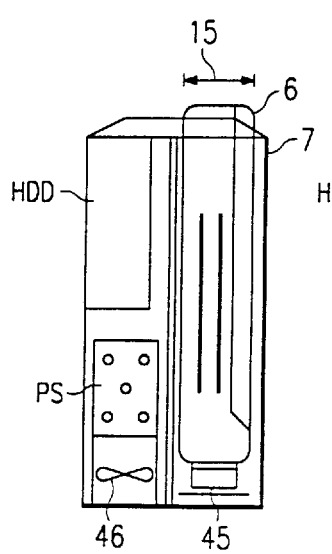
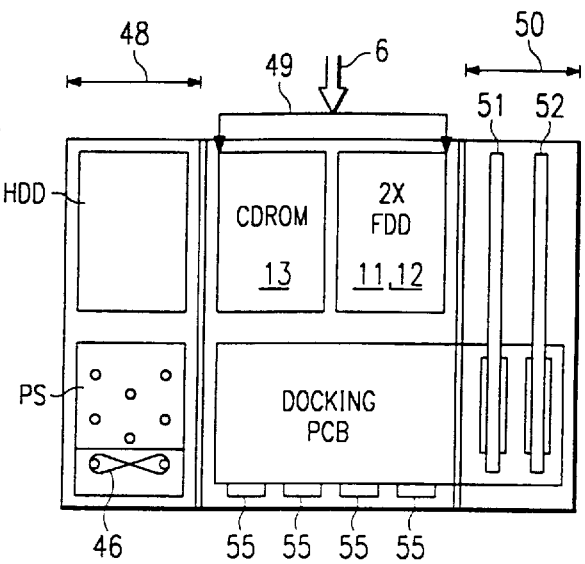
FIG. 2A     FIG. 2B
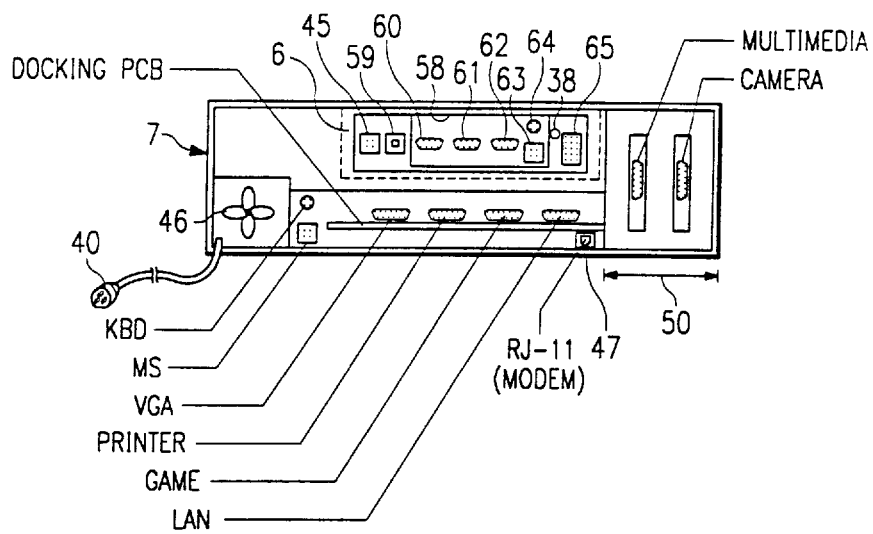
FIG. 2C

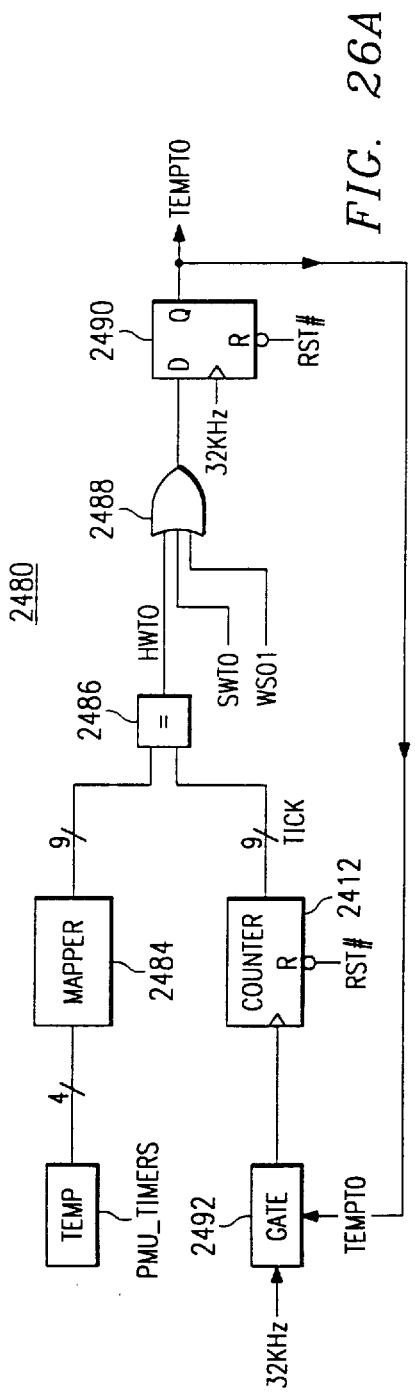
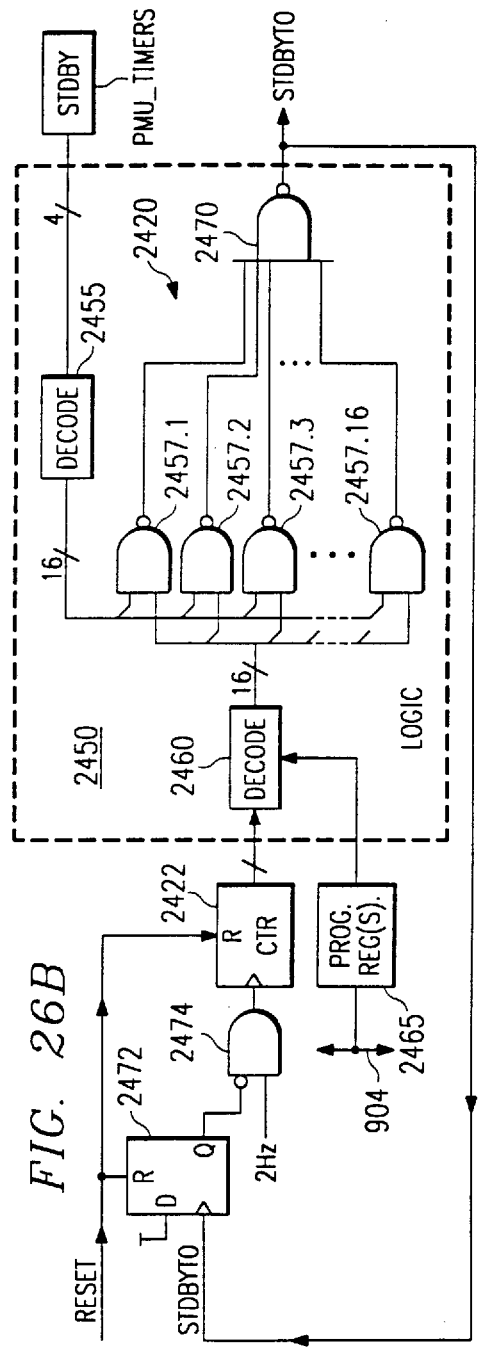
FIG. 26A
FIG. 26B

COST FUNCTION

ZONE OF MINIMUM CONSTRAINED COST

MERIT FUNCTION: COST $(N_1, N_2, N_3)$

CONSTRAINT: $F(N_1, N_2, N_3) = 0$ ($N_1 + N_2 + N_3 \equiv CONST$)

5,852,370

INTEGRATED CIRCUITS FOR LOW POWER DISSIPATION IN SIGNALING BETWEEN DIFFERENT-VOLTAGE ON CHIP REGIONS

CROSS-REFERENCE TO RELATED APPLICATIONS

This application is a continuation, of application Ser. No. 08/547,966, filed on Oct. 25, 1995 now abandoned, which is a continuation of Ser. No. 08/363,450 filed on Dec. 22, 1994 now abandoned.

NOTICE (C) Copyright, *M* Texas Instruments Incorporated 1994. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

Patent applications and patents are incorporated herein by reference by specific statements to that effect elsewhere in this application.

FIELD OF THE INVENTION

This invention generally relates to electronic circuits, computer systems and methods of operating them.

BACKGROUND OF THE INVENTION

Without limiting the scope of the invention, its background is described in connection with computer systems, as an example.

Early computers required large amounts of space, occupying whole rooms. Since then minicomputers and desktop computers entered the marketplace.

Popular desktop computers have included the "Apple" (Motorola 680x0 microprocessor-based) and "IBM-compatible" (Intel or other x86 microprocessor-based) varieties, also known as personal computers (PCs) which have become very popular for office and home use. Also, high-end desk top computers called workstations based on a number of superscalar and other very-high-performance microprocessors such as the SuperSPARC microprocessor have been introduced.

In a further development, a notebook-size or palm-top computer is optionally battery powered for portable user applications. Such notebook and smaller computers challenge the art in demands for conflicting goals of miniaturization, ever higher speed, performance and flexibility, and long life between battery recharges. Also, a desktop enclosure called a docking station has the portable computer fit into the docking station, and improvements in such portable-computer/docking-station systems are desirable. Improvements in circuits, integrated circuit devices, computer systems of all types, and methods to address all the just-mentioned challenges, among others, are desirable, as described herein.

SUMMARY OF THE INVENTION

Generally, and in one form of the present invention, an integrated circuit includes, on a single chip, distinct supply voltage terminals and internal on-chip supply conductors connected respectively thereto, including a ground terminal and terminals for first and second supply voltages. A first inverter is connected between first supply voltage and ground and has a first inverter input and a first inverter output. A second inverter is connected between second supply voltage and ground and has a second inverter input and a second inverter output. A first feedback transistor has connections to the second supply voltage, and to the second inverter input and the second inverter output. A second feedback transistor has connections to ground, and to the second inverter input and the second inverter output. First and second open-type inverters are connected to ground and each of the open-type inverters has an input and output. The input of the first open-type inverter is connected to the first inverter input, and the output of the first open-type inverter is connected to the second inverter input. The input of the second open-type inverter is connected to the first inverter output, and the output of the second open-type inverter is connected to the second inverter output.

Other devices, systems and methods are also claimed.

BRIEF DESCRIPTION OF THE DRAWINGS

In the drawings:

FIGS. 2A, 2B and 2C are a right-side profile view, plan view, and rear elevation respectively of the combined system of notebook and docking station of FIG. 1;

FIGS. 5, 6 and 7 are three parts of a more detailed electrical diagram (partially schematic, partially block) of a preferred embodiment electronic computer system for use in embodiments including those of FIGS. 3 and 4, wherein FIG. 5 shows MPU and PCU, FIG. 6 shows PPU and peripherals, and FIG. 7 shows display controller and other elements;

FIGS. 26A–B are a partially schematic and partially block diagrams of non-linear timer embodiments for use in some of the timers of FIG. 25;

Corresponding numerals and symbols in the different figures refer to corresponding parts unless otherwise indicated.

DETAILED DESCRIPTION OF PREFERRED EMBODIMENTS

Figure 1:
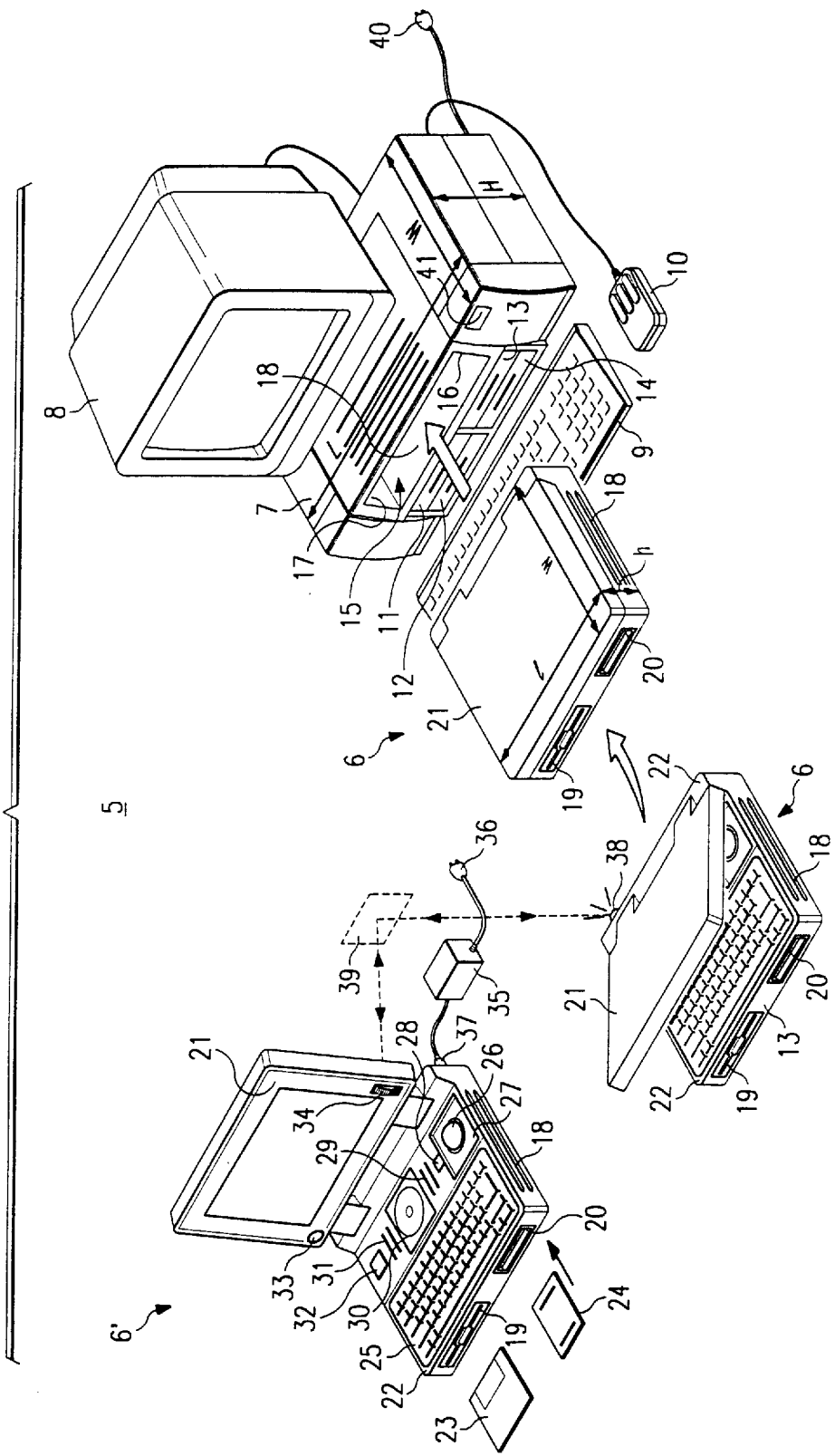
FIG. 1 is a pictorial diagram of two notebook computer embodiments, one of them being inserted into a docking station embodiment to provide a combined system embodiment.

In FIG. 1 a notebook-computer-and-docking-station system 5 has an insertable or dockable notebook computer 6 shown being inserted along a path of bold arrows into a docking station 7. A CRT (cathode ray tube) display 8, a keyboard 9 and a mouse 10 are respectively connected to mating connectors on a rear panel of docking station 7. Docking station 7 has illustratively four storage access drives, for example: 5.25 inch floppy disk drive 11, 3.5 inch floppy disk drive 12, a CD (compact disk) drive 13 and an additional floppy or CD drive 14.

Docking station 7 has a docking compartment 15 into which notebook computer 6 inserts securely against internal rear electrical connectors. Docking compartment 15 in this embodiment accepts manual insertion of notebook computer 6 along lateral guideways 16 and 17 using a minimum of mechanical elements to achieve advantageous economy in cost of the physical docking. A horizontal surface of guideway brackets or a horizontal panel as shown provide physical support for notebook computer 6. In an alternative embodiment, a motorized insertion mechanism associated with docking compartment 15 holds, rearwardly moves and seats notebook computer 6 against either rear electrical connectors, lateral connectors or both.

Docking station 7 in this embodiment occupies a volume V=LWH equal to the product of the length L, width W and height H of the form of a rectangular solid. Notebook computer 6 also has a form of a rectangular solid with volume v=lwh equal to the product of its own lenght l, width w, and height h. The docking station 7 in this embodiment advantageously is proportioned so that the width w of the notebook 6 exceeds at least 75% and preferably 85% of the width W of the docking station. In this way, the room left for keyboard 9 and user work space to the front of keyboard 9 is advantageously sufficient to make docking station 7 as convenient to locate as many conventional desktop computers. Drives are stacked in pairs 11, 12 and 13,14 providing extra ergonomically desirable height (user head position level, low glare) for supporting display 8, reduced length L, and efficient use of volume V. The weight distribution of the docking station 7 suits it for location on a desktop as shown, or for tower positioning with docking station 7 resting on its right side-panel. In either position, the drives 11,12 and 13,14 are suitable as shown, or alternatively are mounted with the docking compartment 15 located centrally between drives 11 and 13 on top, and drives 12 and 14 on the bottom.

Notebook computer 6 has slits 18 for advantageous lateral ventilation both in open air, and in a forced air ventilation environment of docking station 7. Notebook computer 6 features front-facing slots of a 3.5 inch floppy disk drive 19 and a card connector 20 (e.g. for flash memory, modem or other insertable cards). These slots are accessible even when the notebook computer 6 is docked.

A display panel 21 combined with a high-impact back panel is hingeably mounted rearward on a high-impact mounting base 22 Looking to the left in FIG. 1 is an identical but distinct notebook computer unit 6'. (For economy of notation, additional numerals on notebook unit 6' are not primed.)

Notebook unit 6' has display panel 21 raised to operating position relative to base 22 in the portable environment. A 3.5 inch floppy diskette 23 and a flash memory card 24 are shown near their respective insertion slits 19 and 20. A keyboard 25 mounts forwardly on base 22. To the rear of keyboard 25, and between keyboard 25 and display panel 21, lie (in order from right to left) a recessed trackball 26 in a recess 27, an ON/OFF switch 28, ventilation slits 29, a a loudspeaker 30 beneath a protective grille, further ventilation slits 31, and a SUSPEND/RESUME switch 32.

A physical protuberance or stud 33 is molded integral with display panel 21 or affixed thereon, near a hinge so that when the display panel 21 is closed against base 22, the stud 33 impinges against SUSPEND/RESUME switch 32 thereby putting the computer 6' in a Suspend mode whereby very little power is consumed. Then when the panel 21 is reopened, the computer resumes almost immediately with the current application program without rebooting. ON/OFF switch 28 has no stud associated with it, so that the user has the manual option to turn the notebook computer on or off and to reboot when desired.

In still further features, notebook computers 6 and 6' have a display brightness (e.g. backlighting) adjustment control 34 mounted low on the right side of panel 21. An optional power supply 35 is powered from a commercial power source to which an AC plug 36 connects. Power supply 35 in turn supplies battery recharge and supply voltages via a rear power connector 37 to notebook computer 6'.

An infrared (IR) emitter/detector assembly 38 on notebook computer 6 provides two-way communication with a corresponding infrared emitter/detector assembly on the back of notebook computer 6'. The two computers 6 and 6' suitably communicate directly to one another when two users are positioned opposite one another or otherwise such that the computers 6 and 6' have the IR assemblies in line-of-sight. When the two computers 6 and 6' are side-by-side, they still advantageously communicate by reflection from an IR-reflective surface 39, such as the wall of a conference room or side-panel of an overhead projector unit.

Docking station 7 has an AC power plug 40 connected to energize the docking station circuitry as well as that of notebook computer 6 when the latter is inserted into docking compartment 15. An AC Power On/Off switch 41 is manually actuated by the user on the upper right front panel of docking station 7 in FIG. 1.

Turning now to FIG. 2A, notebook computer 6 is shown inserted against a power connector 45 of docking station 7 in a right profile view of the assembly. A hard disk drive HDD and a power supply P.S. are visible in the right profile view and in the plan view of FIGS. 2A and 2B. A ventilation fan 46 efficiently, quietly and with low electromagnetic interference, draws a lateral air flow across a Docking PCB (Printed Circuit Board) of the docking station, as well as through the notebook computer 6 having its own printed circuit board. The ventilation flow continues through the ventilation holes of power supply P.S. whereupon heated air is exhausted by fan 46 broadside and outward from the rear panel of docking station 7, as shown in the rear elevation detail of FIG. 2C.

The Docking PCB is supported low to the bottom panel 47 of an enclosure or cabinet of the docking station 7.

As seen from the rear in FIG. 2B, the enclosure has a left bay 48 for hard disk drive HDD and power supply P.S., a wider middle bay 49 having mass storage drives 11, 12, 13 and 14, and the docking PCB beneath the docking compartment 15, and then a right bay 50 into which a multimedia board 51, a video teleconferencing board 52, and other boards of substantial size readily fit from top to bottom of the enclosure.

For convenience and economy, several connectors 55 are physically mounted and electrically connected to Docking PCB and are physically accessible through a wide aperture in the rear of the enclosure. As shown in rear elevation in FIG. 2C, connectors 55 include a keyboard connector KBD, a mouse connector MS, a display connector VGA, a PRINTER port, a GAME port, a local area network LAN connector, and an RJ-11 telephone jack or modem port. A Multimedia connector and a teleconferencing Camera connector are accessible at the rear of the right bay 50.

Emphasizing now the connector arrangement of the notebook computer 6 in rear elevation, a series of these connectors are physically mounted and electrically connected to an internal printed circuit board of notebook computer 6. These connectors are utilized in two docking station and system embodiments. In a first embodiment, shown in FIG. 2C, an aperture-defining rectangular edge 58 provides physical access to several of the connectors of notebook computer 6, thereby increasing the connectivity of the combined system 6,7 to peripheral units as discussed in connection with FIG. 3. In a second embodiment, the edge 58 is absent, and rear connectors of the docking station 7 mate to these several connectors of notebook computer 6 as discussed in connection with FIG. 4.

Looking from left to right in rear elevation of FIG. 2C, a power and telephone connector 45 securely mounted to docking station 7 mates to notebook computer 6. A telephone connector 59 of notebook 6 is suitably obscured in the docking compartment 15, but available for use when the notebook is used in the portable environment. Next a display connector 60, a printer parallel port connector 61, and a disk drive connector 62 are provided at the back of notebook 6. An optional mouse connector 63 and keyboard connector 64 are provided next to IR emitter/detector 38.

At far right rear on notebook 6, a high-speed bus connector 65 mates securely to a corresponding connector of docking station 7 so that wide-bandwidth communication, such as by a PCI (Peripheral Component Interconnect) type of bus is established between notebook 6 and docking station 7. In this way, the notebook 6 contributes importantly to the computing power of the combined system 5 comprised of notebook 6 and docking station 7.

The physical presence of connector 45 on the left rear and connector 65 on the right rear also contribute to the security of alignment and seating of the notebook 6 in the docking compartment 15. Wide snap-springs of docking compartment 15 click into shallow mating recesses of notebook 6, completing the physical security of alignment and seating of notebook 6 in docking compartment 15.

Figure 3:
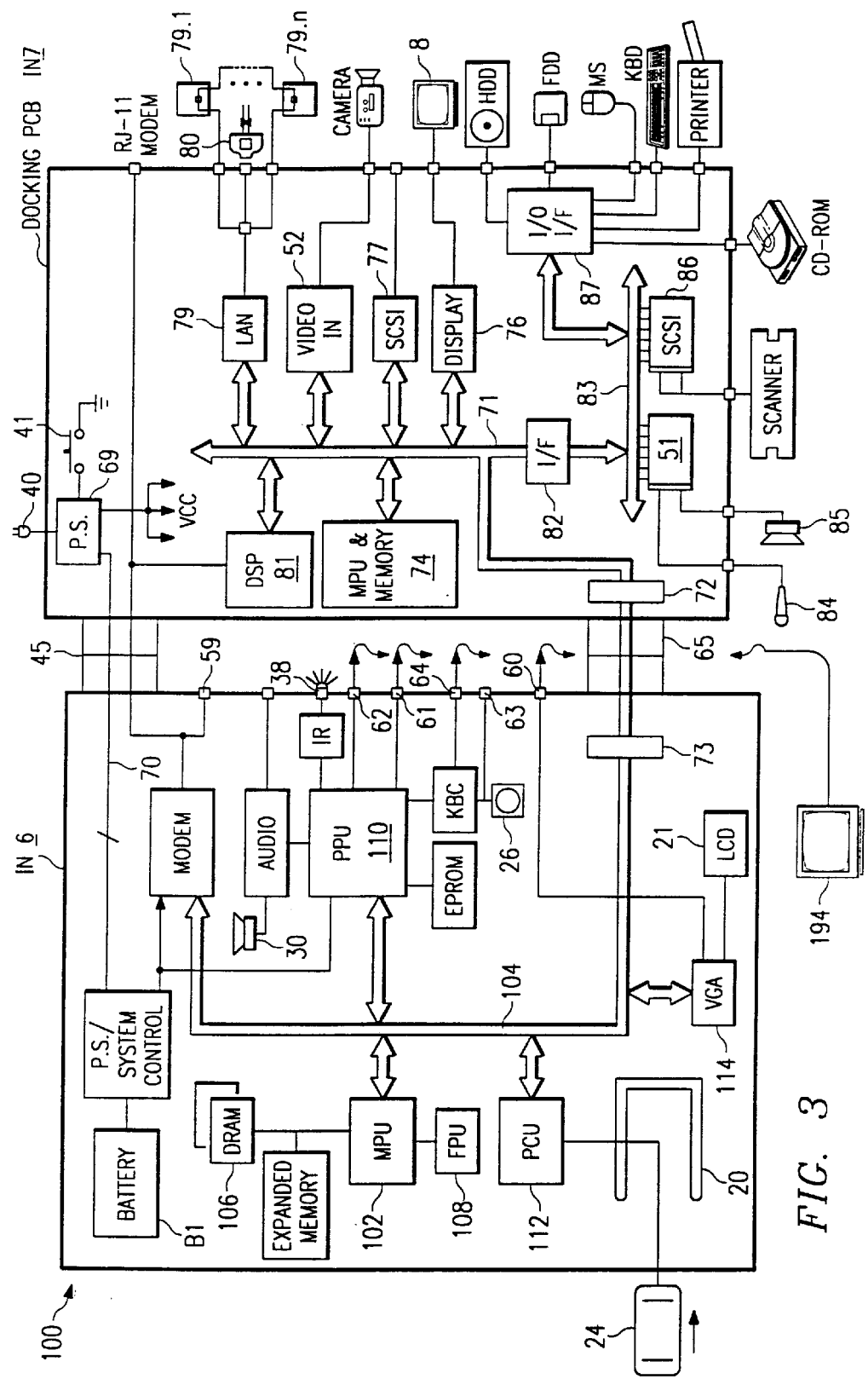
FIG. 3 is an electrical block diagram of the FIG. 1 combined embodiment system of improved notebook computer and docking station system to which the notebook computer system connects.

In FIG. 3, the docking station PCB has a docking station power supply 69 supplying supply voltage VCC to the components of the docking station. Power supply 69 has Power On/Off switch 41, power plug 40, and supplies operating and battery recharging power along power lines 70 through connector 45 to notebook computer 6 which has a printed circuit board and system 100 of interconnected integrated circuits therein as described more fully in connection with FIGS. 5–7 and the later Figures of drawing.

In the docking station PCB, a main bus 71, such as a high bandwidth PCI bus, interconnects via buffers 72, connector 65 and buffers 73 with a high bandwidth bus 104 in system 100 of notebook 6. A docking station microprocessor unit MPU and memory circuitry 74 preferably provides advanced superscalar computing power connected to bus 71. A display interface 76 receives display data and commands from bus 71 and supplies video data out to CRT display monitor 8. A SCSI interface 77 communicates with bus 71 and can receive and send data for any suitable SCSI peripheral. Video input circuit 52 receives video data from a video camera, video recorder, or camera-recorder (CAMERA) and supplies this data to bus 71 for processing. A LAN (Local Area Network) circuit 79 provides two-way communication between the docking station 7 and to n other computers having LAN circuits 79.1, . . . 79.n. Token ring, Ethernet, and other advanced LANs are accommodated. An adapter 80 having an interface chip therein provides communication with any LAN system and plugs into a single same socket regardless of the LAN protocol. Such LAN circuitry is described in coassigned U.S. Pat. No. 5,299,193 "Signal Interface for Coupling a Network Front End Circuit to a Network Adapter Circuit" issued Mar. 29, 1994 (TI-15009), which is hereby incorporated herein by reference.

A digital signal processor circuit 81 is connected to bus 71, and is adapted for voice recognition, voice synthesis, image processing, image recognition, and telephone communications for teleconferencing and videoteleconferencing. This circuit 81 suitably uses the Texas Instruments TMS320C25, TMS320C5x, TMS320C3x and TMS320C4x, and/or TMS320C80 (MVP), DSP chips, as described in coassigned U.S. Pat. Nos. 5,072,418, and 5,099,417, and as to the MVP: coassigned U.S. Pat. No. 5,212,777 "SIMD/ MIMD Reconfigurable Multi-Processor and Method of Operation" and coassigned U.S. Pat. No. 5,420,809, Ser. No. 08/160,116 filed Nov. 30, 1993 Method of Operating a Data Processing Apparatus to Compute Correlation all of which patents and application are hereby incorporated herein by reference.

An interface chip 82, such as a PCI to ISA or EISA interface, connects bus 71 with a different bus 83 to which a multimedia (MIDI) card 51 is connected. Card 51 has an input for at least one microphone, musical instrument or other sound source 84. Card 51 has an output accommodating monaural, stereo, or other sound transducers 85. A SCSI card 86 interfaces a document scanner to bus 83.

Still further peripherals compatible with the speed selected for bus 83 are connected thereto via an I/O interface 87 which communicates with connectors for the hard disk drive HDD, the floppy disk drive FDD 11 and 12, mouse MS 10, keyboard KBD 9, the CD-ROM drive 13 and a printer such as a laser printer.

A cursory view of the notebook 6 in FIG. 3 shows that various rear connectors 60–64 are physically accessible through aperture 58 of FIG. 2C allowing still additional peripherals to be optionally connected. For example, the display connector 60 is connected to a second monitor 194 so that multiple screen viewing is available to the docking station user. Connector 59 of notebook 6 is connected through connector 45 to the RJ-11 telephone connector on the back of docking station 7 so that the user does not need to do any more than insert notebook 6 into docking station 7 (without connecting to the rear of notebook 6) to immediately obtain functionality from the circuits of notebook 6.

Figure 4:
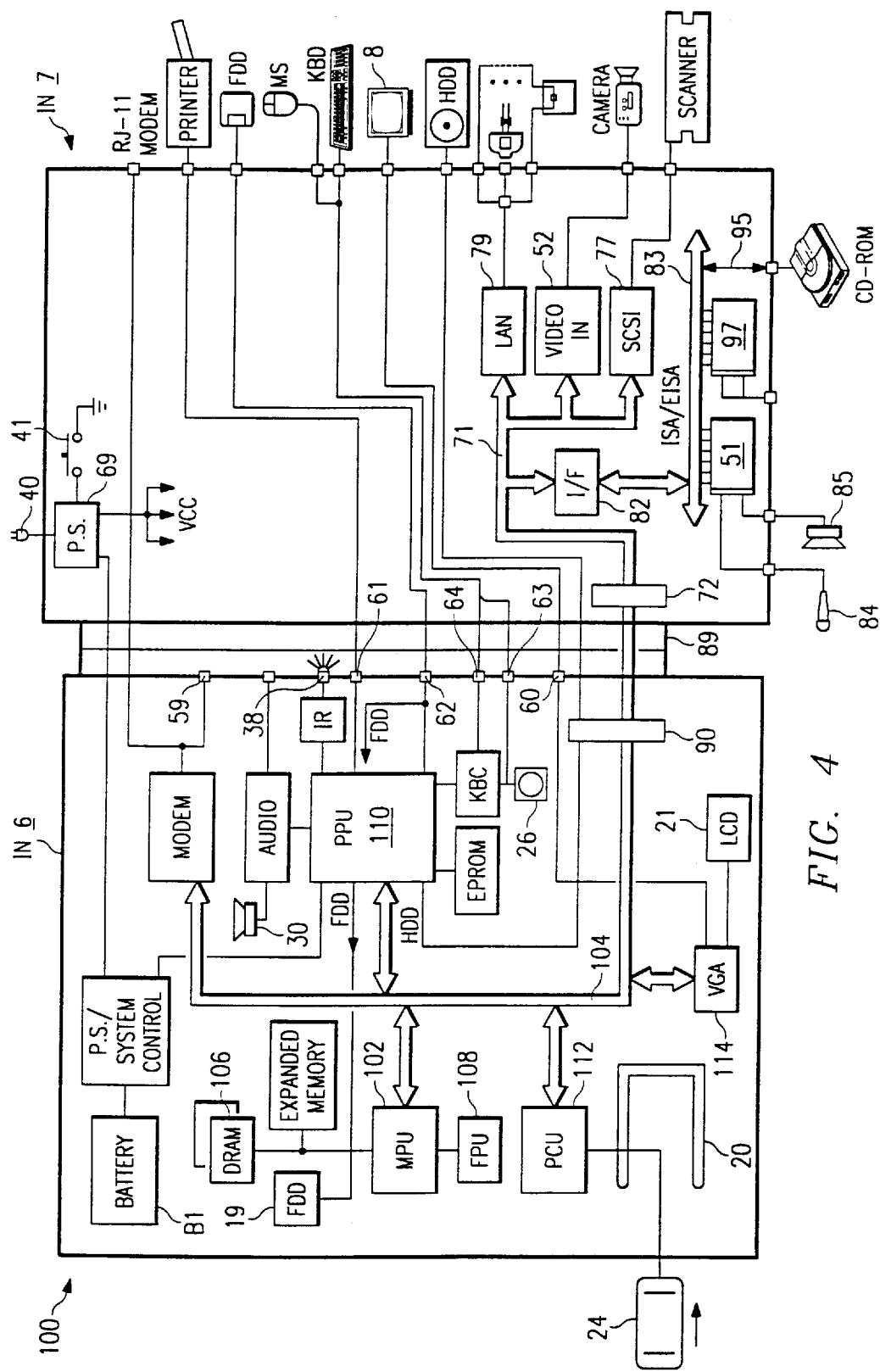
FIG. 4 is an electrical block diagram of another embodiment of an improved computer system for desktop, notebook computer and docking station applications.

In FIG. 4, an alternative embodiment of docking station PCB has a comprehensive connector 89 to which the connectors 60–64 of notebook 6 connect. The connectors 60–64 are not independently accessible physically through any aperture 58 of FIG. 2C, by contrast with the system of FIG. 3. In this way, when notebook 6 is inserted into docking compartment 15, straight-through lines from connectors 60–64 through connector 89 pass respectively to display 8, to a PRINTER peripheral, to floppy disk drive FDD, to mouse MS, and to keyboard KBD. Comprehensive connector 89 not only accommodates lines from a bus to bus interface 90 to bus buffers 72, cascaded between buses 104 and 71, but also has an HDD path from notebook 6 to the internal hard disk drive HDD of docking station 7.

The docking station of FIG. 4 has the printer, FDD, MS, KBD and HDD disconnected when the notebook 6 is removed, by contrast with the docking station and notebook system of FIG. 3. However, the docking station of FIG. 4 confers a substantial economic cost advantage, especially in situations where the user does not need to use these peripherals when the notebook 6 is removed. The docking station of FIG. 3 confers substantial flexibility and functionality advantages, especially in situations in which the docking station continues to be used by a second user when the notebook user has taken the notebook elsewhere. Docking station 7 is augmented by the data and processing power available from notebook 6, when the notebook is reinserted into docking station.

Similar circuit arrangements are marked with corresponding numerals in FIGS. 3 and 4, as to docking station power supply 69, Power On/Off switch 41, power plug 40, notebook system 100, main bus 71, SCSI interface 77, video input circuit 52, LAN circuit 79, interface chip 82, multimedia card 51 and SCSI card 86.

Note in FIG. 4 that the SCSI card 77 is connected to the document SCANNER peripheral, providing advantageously high bandwidth input from the scanner to the hard disk drive HDD, floppy disk drive FDD, and microprocessor unit MPU 102. CD-ROM is connected by path 95 in FIG. 4 to the ISA or EISA bus 83 in FIG. 4. Card 97 connected to bus 83 can accommodate further peripherals or, indeed, a microprocessor board so that the docking station of FIG. 4 is independently usable by second user with the notebook 6 removed.

In either FIG. 3 or 4, the docking station provides A) advantageous system expandability through i) ISA/EISA slots, ii) additional HDD space, CDROM, multimedia with monaural, stereo, quadraphonic and other sound systems, and iii) wide bandwidth PCI bus 71 local bus slots. A further area of advantage B) is quick, easy connections to desired non-portable equipment through i)easier to use, bigger keyboard, ii) bigger, higher quality, CRT display iii) better mouse, printer, and so on. For example, the user merely pushes the notebook 6 into the docking station 7 quickly and easily, and all peripherals are then hooked up, without any further user hookup activity. Another area of advantage C) the docking station 7 provides a platform by which users can retrofit ISA or EISA add-in cards from a previous installation and obtain their use with the notebook 6.

Figure 5:
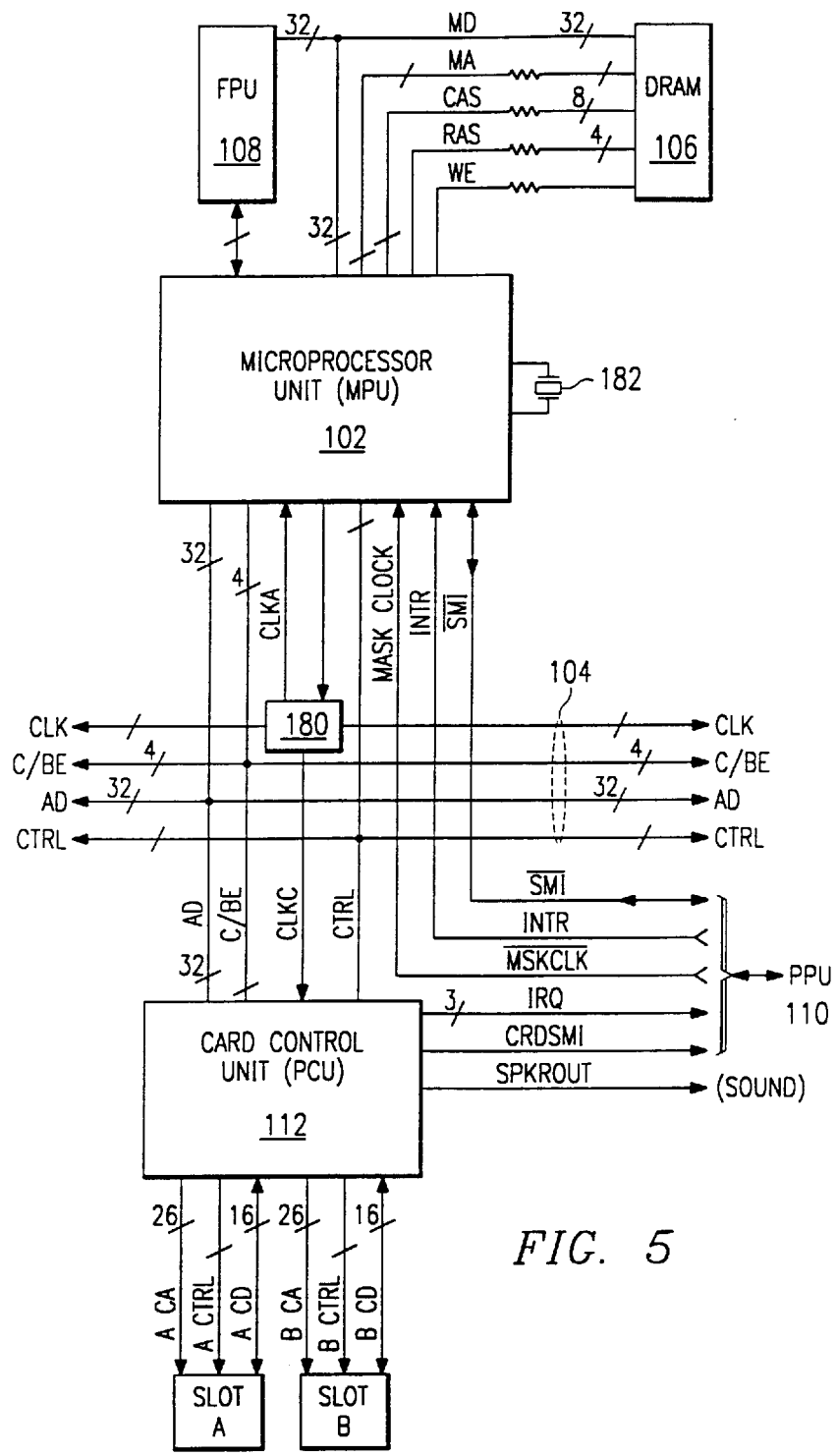
Figure 6:
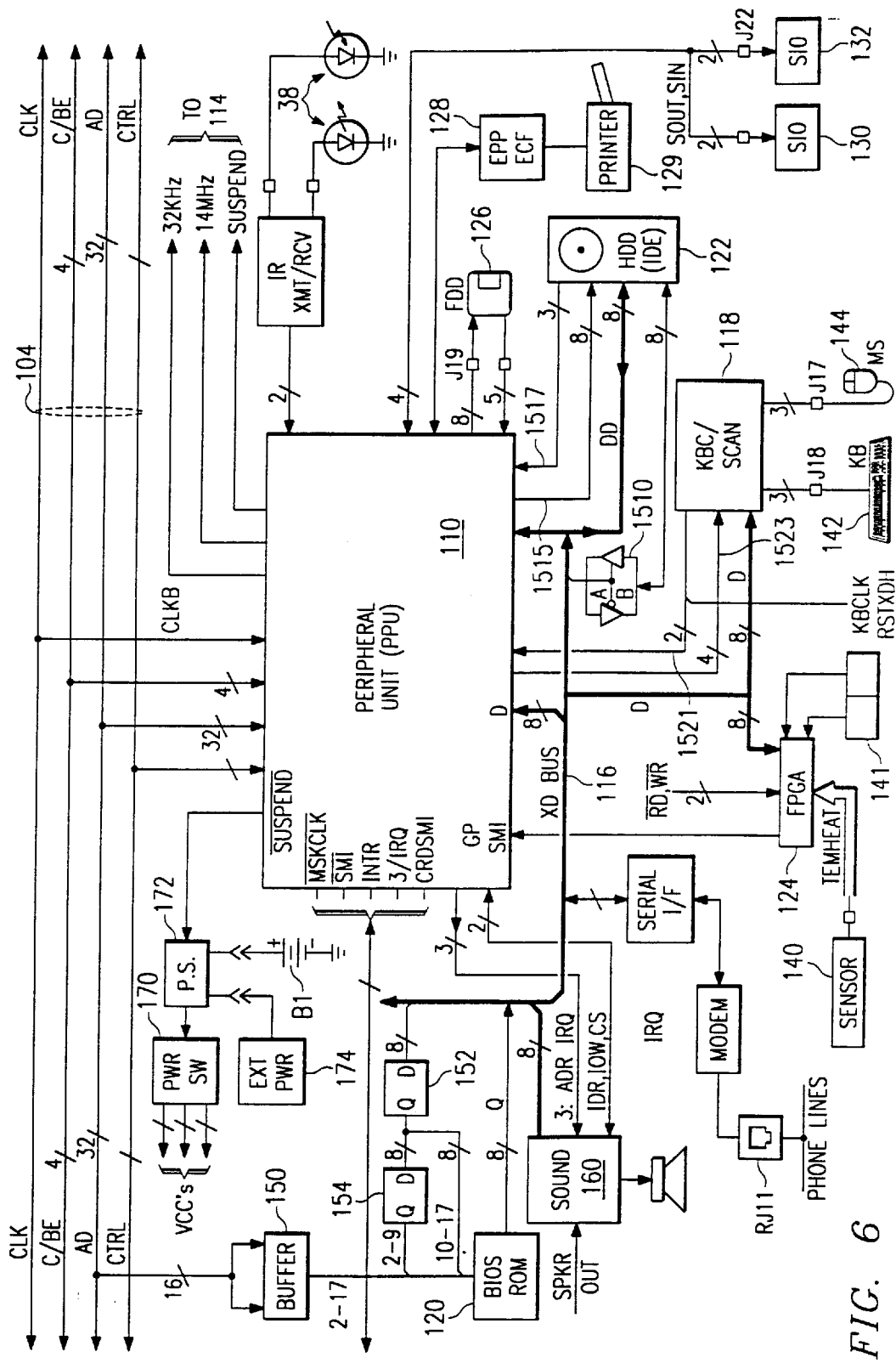
Figure 7:
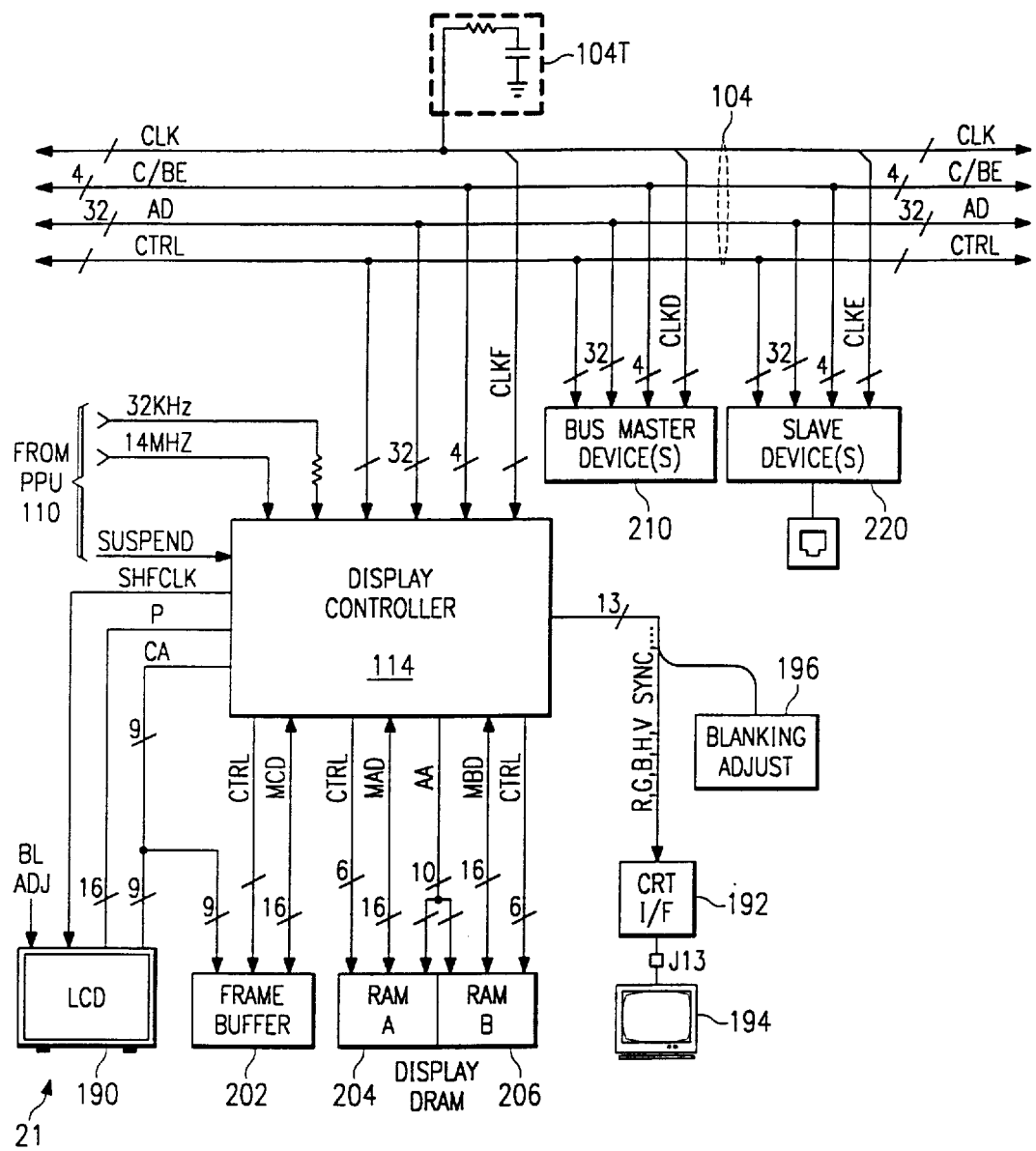

In FIGS. 5, 6, and 7 (which detail the system 100 in FIGS. 3 and 4) a block diagram of a first part of a preferred embodiment computer system 100 shows in FIG. 5 a single-chip microprocessor unit MPU 102 connected to a 32-bit bus 104, DRAM (dynamic random access memory) 106, FPU (floating point unit) 108, single-chip peripheral control unit PCU 112, single-chip peripheral processor unit PPU 110 (in FIG. 6) and a display controller 114 (in FIG. 7). The FPU 108 of FIG. 5 is suitably either implemented on a separate chip as shown, or integrated onto the same chip as MPU 102 in, for example, a 486DX chip, a 586-level microprocessor, or a superscalar or multi-processor of any type.

In FIG. 6, PPU 110 has terminals connected via an 8-bit bus 116 to a keyboard controller and scan chip KBC/SCAN 118, BIOS (basic input/output system) ROM (read only memory) 120, HDD (hard disk drive) unit 122, and logic chip 124. PPU 110 has further terminals connected to a floppy disk drive (FDD) 126, a printer port EPP/ECF 128 to a printer 129, and two serial input/output ports SIO 130 and 132.

A temperature sensor 140, or heating sensor, is connected via logic 124 to the rest of the system to signal temperature levels and cooperate in the power management of the system.

KBC/SCAN 118 is connected to a computer keyboard 142 and computer mouse input device 144.

BIOS ROM 120 is addressed by 18-bit addresses by signals from MSB (most significant bits) or LSB (least significant bits) 16-bit halves of bus 104 via a multiplexer (MUX) 150. Also BIOS ROM is addressed via 16 bit addresses built up by successive 8-bit entries from bus 116 in two cascaded 8-bit registers 152 and 154. In this way, separate PPU 110 pins for BIOS ROM addresses are advantageously rendered unnecessary.

An audio sound system 160 is connected to PPU 110, thereby providing sound resources for the system 100.

A power switch circuit 170 responsive to a SUSPEND# line from PPU 110 controls the supply of power from a power supply 172 to system 100 via three pairs of lines A, B, C from power switch 170 to supply voltages VPP and VCC to system 100. Power supply 172 is energized by an electrical battery B1 and/or an external power source 174.

A clock switch control circuit 180 (FIG. 5) supplies clock signals for system 100 via a line CLK of bus 104.

Returning to FIG. 5, 4 banks of DRAM 106 are resistively connected to MPU 102 via 13 memory address MA lines, 8 CAS (column address strobe) lines, four RAS (row address strobe) lines, and a WE (write enable) line. 32 memory data MD lines provide a path for data to and from DRAM 106 between MPU 102 and DRAM 106.

A frequency-determining quartz crystal 182 of illustratively 50 MHz (MegaHertz) is connected to MPU 102. A 32 KHz (kilohertz) output terminal from PPU 110 is connected resistively to display controller 114.

In FIG. 7, display controller 114 is connected directly to an LCD (liquid crystal display) or active matrix display of monochrome or full color construction. Display controller 114 is connected via a CRT (cathode ray tube) interface (I/F) 192 to a CRT computer monitor 194. A blanking adjustment control 196 is connected to display controller 114. A frame buffer 202 is connected to display controller 114 via address, data and control lines. Two sections A and B of display DRAM 204 and 206 are also connected to display controller 114 via their own address, data and control lines.

Additional bus master devices 210, such as LAN (local area network) and SCSI (Small Computer System Interface) are connected to bus 104 in system 100. Also, slave devices 220 connect to bus 104.

Figure 8:
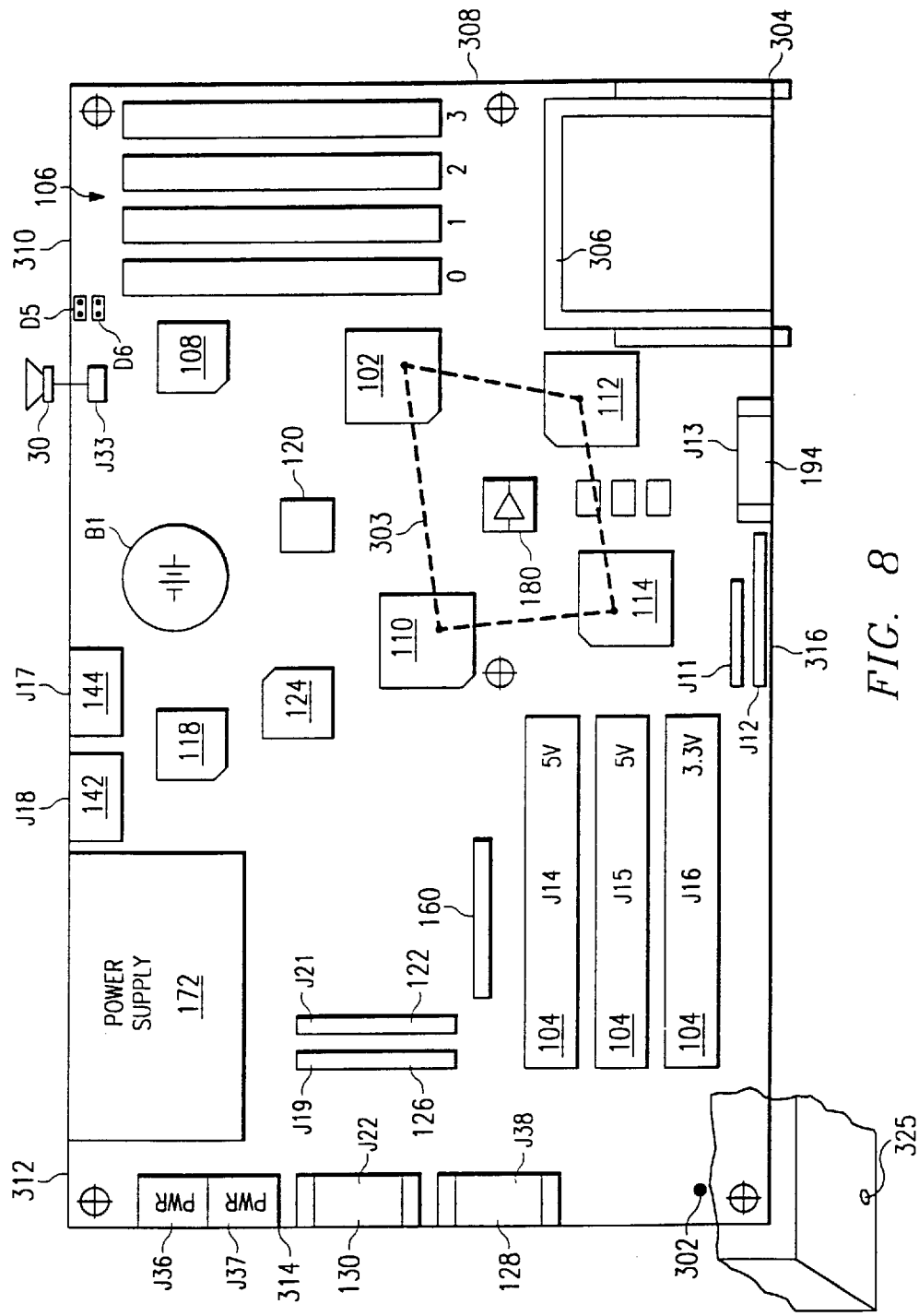
FIG. 8 is a plan view of a preferred embodiment apparatus having a printed wiring board and electronic components of the computer system of FIGS. 5–7.

FIG. 8 is a plan view of a preferred embodiment apparatus having a multiple layer (e.g. 10-layer) printed wiring board 302 and electronic components of the computer system 100 of FIGS. 5–7. FIG. 8 shows a component side of printed wiring board 302, while a solder side of board 302 lies opposite (not shown) from the component side. Arranged at vertices of a centrally located quadrilateral 303, and interiorly disposed on the component side of board 302, are the MPU 102, PPU 110, PCU 112 and video, or display, controller 114. All these component devices 102, 110, 112 and 114 are on a high speed bus 104, and because the quadrilateral affords an arrangement whereby these devices are located very close to each other, the high speed bus 104 is advantageously made physically small and compact both for small physical size and low electromagnetic interference due to small electrical size. Near the PCU 112 and near a corner 304 of board 302 lies a PCMCIA card, such as flash memory card, connector 306.

At the system level, system 100 as implemented in the embodiment of FIG. 8 has a main microprocessor integrated circuit 102, a card interface integrated circuit 112, a peripheral processor integrated circuit 110, a display controller integrated circuit 114, and a bus 104 on the printed wiring board interconnecting each of the integrated circuits 102, 112, 110, and 114. The integrated circuits 102, 112, 110 and 114 establish corners of a quadrilateral 303 bounding the bus 104. Further provided are a plurality of external bus connectors disposed in parallel outside quadrilateral 303 and connected to bus 104. A clock chip AC244 (180) is approximately centrally located inside quadrilateral 303 and connected via approximately equal-length lines to each of the integrated circuits 102, 112, 110 and 114 thereby minimizing clock skew.

Four long DRAM 106 SIMM (single inline memory module) socket connectors for banks 0–3 lie parallel to each other, parallel to a short side 308 of board 302, and perpendicular to the connector 306. FPU 108 is located adjacent to one of the DRAM connectors near the MPU 102. SIMM sockets for the DRAMs provide a direct path for the wiring traces on the printed wiring board 302.

Along a longer side 310 of board 302 lie LED connectors D5 and D6 and a loudspeaker connector J33. Next to the holder for battery B1 are connectors J17 for mouse 144 and J18 for keyboard 142. A power supply unit 172 located on the edge of side 310 lies near a corner 312 diagonally opposite corner 304.

A second short side 314 lies opposite side 308 of board 302. At the edge of side 314 are located two power connectors J36 and J37, a serial connector J22 and a parallel port connector J38 designated "Zippy." Looking interiorly, between side 314 and PPU 110 and parallel to short side 314 are a floppy disk drive connector J19 located closely parallel to a hard disk drive connector J21.

A second long side 316 lies opposite side 310 of board 302. At the edge of side 316 and centrally located are a 15 pin connector J11 parallel to a 20×2 pin header J12. A video connector J13 lies next to J12 below quadrilateral 303.

Between video controller 114 and PCU 112 lie three TMS45160 chips disposed parallel to each other and to side 316 and substantially parallel to the side of quadrilateral 303 defined by vertices 114 and 112. Next to video controller 114 outside quadrilateral 303 lie three bus 104 connectors J14, J15, J16 parallel to each other and to long side 316.

FPGA 124 is located above PPU 110 between PPU 110 and side 310 near power supply 172.

A DOS-compatible static 486 core in MPU 102 allows on-the-fly clock-scale and clock-stop operation to conserve battery power. The special clocking scheme allows optional clock stopping between keystrokes. Low voltage operation such as 3.3 volts or less, coupled with power management, provides the capability to achieve low system battery power consumption. Bus 104 is a high speed high bandwidth bus to improve data transfers of bandwidth-intensive I/O devices such as video. Electrical noise is minimized by this embodiment which has short conductor trace lengths and direct point-to-point clock traces. Each clock trace has a series or parallel termination to prevent undesirable reflections. An economical 74LS244 clock driver 180 is provided in the interior of quadrilateral 303. Placement of that clock driver 180 is such that the length of the clock traces therefrom to each chip 110, 102, 114 and 112 are approximately equal, advantageously minimizing clock skew.

Integrated card controller PCU 112 can be configured to support a portable peripheral bus such as PCMCIA (Personal Computer Memory Card International Association), for example. The connector 306 near corner 304 has one card insertion level in a plane on the top side of board 302 and a second card insertion level in a plane on the underside of board 302.

Single 8-bit ROM 120 support allows for integration of the system BIOS and video BIOS into the same device to reduce motherboard real estate and reduce cost. MPU 102, PPU 110 and PCU 112 are highly integrated into three 208 pin PQFP devices (see FIG. 58 later hereinbelow) which reduces board space and reduces active battery power consumption by integrating all CPU and system logic.

In other embodiments, the PPU 110 and PCU 112 are integrated together into one device. In still other embodiments the MPU 102, PPU 110 and PCU 112 are integrated into only one single-chip device. However, the three chip embodiment shown, with its substantially equal pin numbers, provides remarkable economy and board layout convenience.

In the three-chip embodiment illustrated in FIGS. 5–7, the chips are manufactured using submicron process technology to illustratively provide operation up to 66 MHz and higher at 3.3 volts while keeping power consumption and heat dissipation remarkably low.

Returning to FIG. 8, physical strength and reasonable rigidity without fragility are provided by the relaively small size of board 302. Additional mounting holes near connectors for bus 104 are provided. Board 302 is firmly mounted with screws, bolts, rivets or other mounting elements in an enclosure 325 associated with or comprised by base 22 of FIG. 1. When an external connection to bus 104 is made, such as in a docking station or other environment, the mounting elements in the additional mounting holes advantageously provide substantial load-bearing support strength for improved reliability.

Figure 9:
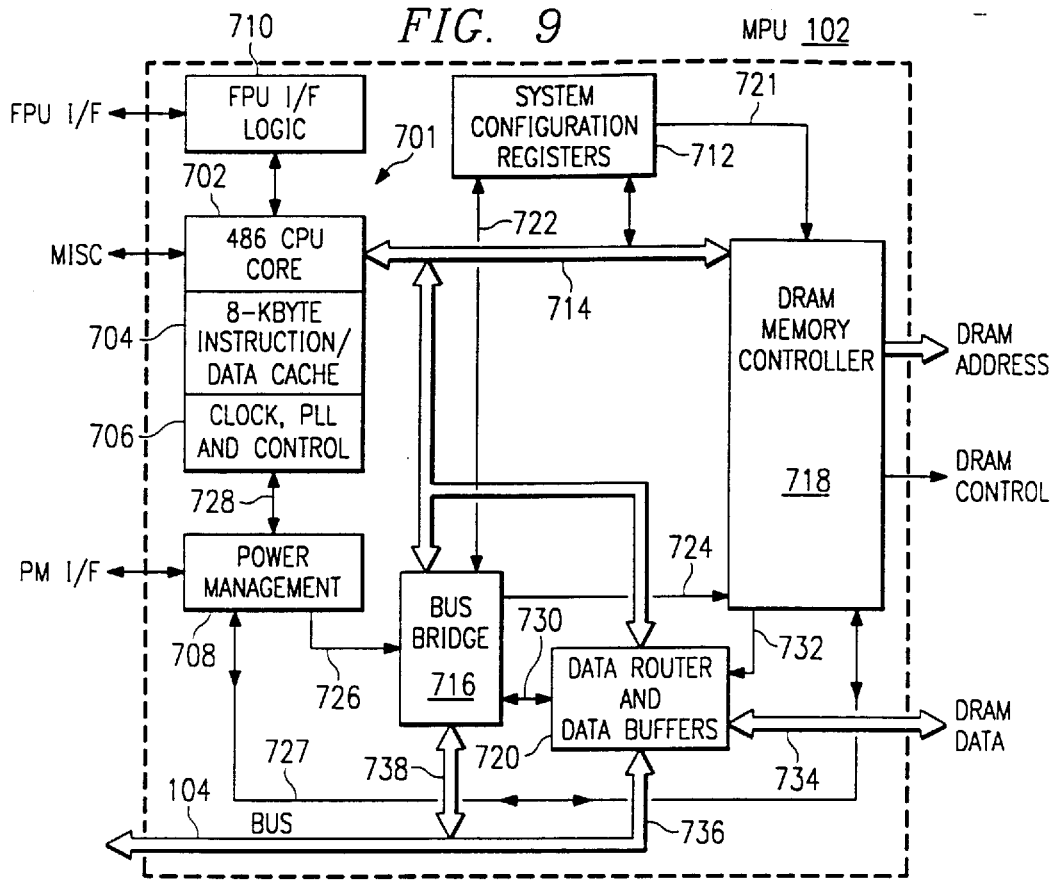
FIG. 9 is a block diagram of a microprocessor unit (MPU) device embodiment for the system of FIGS. 5–7.

In FIG. 9 microprocessor unit (MPU) 102 comprises a preferred embodiment device illustrated in block diagram form. MPU 102 integrates a 486-class CPU (central processing unit) 701 which has a CPU core 702, an 8K-byte write-through 32-bit instruction/data cache 704, and a clock, PLL (phase-lock loop), and control circuit 706. CPU core 702 is described in the *TI 486 Microprocessor: Reference Guide*, 1993, which is hereby incorporated herein by reference. Cache 704 is two-way set associative and is organized as 1024 sets each containing 2 lines of 4 bytes each. The cache contributes to the overall performance by quickly supplying instructions and data to an internal execution pipeline.

A power management block 708 provides a dramatic reduction in current consumption when the microprocessor MPU 102 is in standby mode. Standby mode is entered either by a hardware action in unit 920 of PPU 110 or by a software initiated action. Standby mode allows for CPU clock modulation, thus reducing power consumption. MPU power consumption can be further reduced by generating suspend mode and stopping the external clock input. The MPU 102 is suitably a static device wherein no internal data is lost when the clock input is stopped or clock-modulated by turning the clock off and on repeatedly. In one preferred embodiment, without suggesting any limitation in the broad range of embodiments, the core is a three volt, 0.8 micron integrated circuit having clock operation at 50 or 66 MHz., with clock doubling.

Core 702 has a system-management mode with an additional interrupt and a separate address space that is suitably used for system power management or software transparent emulation of I/O (input/output) peripherals. This separate address space is also accessible by the operating system or applications. The system management mode is entered using a system management interrupt which has a higher priority than any other interrupt and is maskable. While running in the separate address space, the system management interrupt routine advantageously executes without interfering with the operating system or application programs. After reception of the system management interrupt, portions of the CPU are automatically saved, system management mode is entered and program execution begins in the separate address space. System management mode memory mapping into main DRAM memory is supported.

The MPU 102 has interface logic 710 which communicates via external FPU/IF terminals to FPU 108 when the latter is present.

System configuration registers 712 are accessible via a CPU local bus 714. Bus 714 is connected to CPU 701, to a bus bridge circuit 716, and to a DRAM memory controller (MCU) 718. Registers 712 also are bidirectionally connected to the bus bridge circuit 716 via line 722.

DRAM memory controller 718 is connected to system configuration registers 712 via line 721 and receives signals via a line 724 from bus bridge 716. DRAM memory controller 718 supplies DRAM addresses and DRAM control signals to external terminals of single-chip MPU 102. DRAM memory controller 718 is connected by handshake line 727 to power management circuit 708, which circuit 708 is also connected by line 726 to bus bridge 716 and by line 728 to clock, phase lock loop and control circuit 706.

A data circuit 720 provides a data router and data buffers. DRAM memory controller 718 supplies signals to circuit 720 via line 732. Data circuit 720 also bidirectionally communicates with bus bridge 716 via line 730. Data circuit 720 reads and writes DRAM data to external terminals on data bus 734. Main bus 104 connects via terminals to MPU 102 and connects via paths 736 and 738 to data circuit 720 and bus bridge 716 respectively. Data circuit 720 includes two-level posted DRAM write buffers, an integrated four-level DRAM refresh queue, and provides for three programmable write-protection regions.

DRAM memory controller 718 supports up to 256 megabytes or more of DRAM memory with up to four or more 32-bit banks without external buffering. For example, DRAMS of 256K, 512K, 1M, 2M, 4M, 8M, and 16M asymmetric and symmetric DRAMS and up to 64M and higher DRAMS are readily supported. Shadowed RAM is supported. Additionally, the memory interface buffers can be programmed to operate at different operating voltages such as 3.3 or 5.0 volts for different types of DRAMS. The DRAM memory controller 718 is programmable to support different access times such 60 or 80 nanoseconds (ns). For example, 60 ns. is quite advantageous at 50 and 66 MHz. clock speeds at 3.3 v. Varous refresh modes are programmably supported, such as slow, self, suspend, and CAS-before-RAS refresh. Maximum memory throughput occurs because DRAM parameters are driven off the internal high-speed 50/66 MHz. CPU clock to improve resolution, thus taking full advantage of the integration of the DRAM controller.

The bus bridge 716 acts as an integrated interface which is made compliant with whatever suitable specification is desired of bus 104. Bus bridge 716 advantageously acts, for example, as a bus master when there is a MPU 102 initiated transfer between the CPU and bus 104, and as a target for transfers initiated from bus 104.

A bus-quiet mode advantageously supports power management. The bus-quiet mode is used to inhibit cycles on bus 104 when the CPU is accessing the DRAM 106 or internal cache 704. Put another way, bus quieting reduces system power consumption by toggling the data/address bus 104 only on bus transfers. Bus quieting is not only implemented on MCU 718 but also PPU 110 bus bridge 902 and XD/IDE block 934. All signals, buses and pins are made to change state only when they need to. For example, each data bus flip-flop holds its state until the next change of state.

As thus described, MPU 102 integrates in a single chip a 486-class CPU, a DRAM controller, and a bus interface in any suitable integrated circuit package, of which one example is 208 pin PQFP (plastic quad flat pack). PPU 110 and PCU 112 also partition system functionality into respective single-chip solutions which can have the same type of package as the MPU 102, such as a plastic package. These latter two chips can even be pinned out in a preferred embodiment from the same 208 pin PQFP package type.

Figure 10:
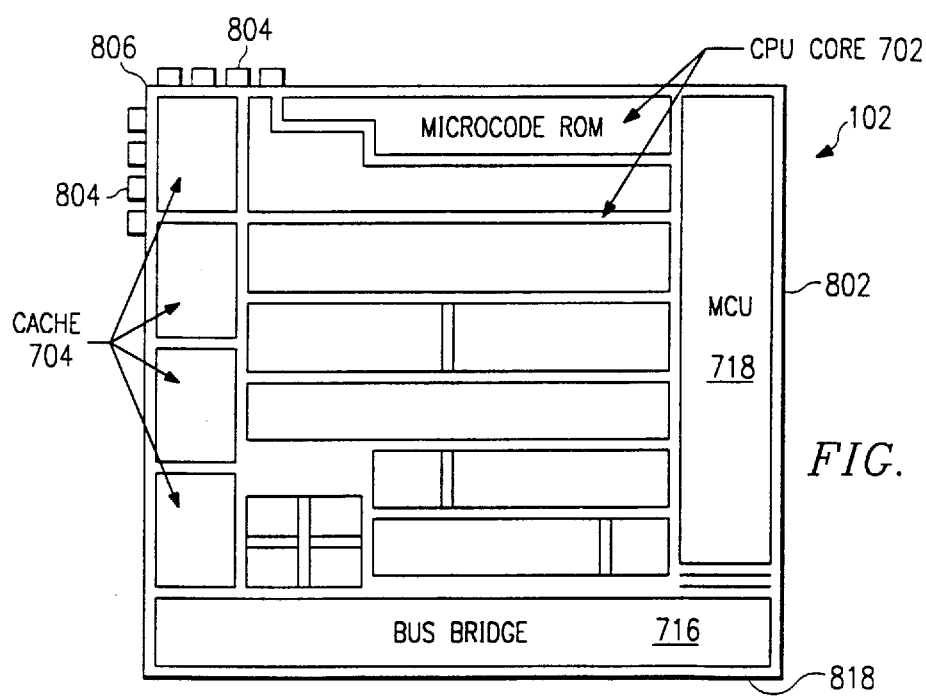
FIG. 10 is a plan view of an integrated circuit with improved topography for implementing the microprocessor unit of FIG. 9.

In FIG. 10 a preferred embodiment layout for MPU 102 has an improved topography wherein MPU 102 is realized as an integrated circuit die with a single substrate 802 with approximately 1:1 ratio of side lengths. Various circuit regions or blocks are fabricated on substrate 802 by a CMOS (complementary metal oxide semiconductor) process. Other processes such as BiCMOS (bipolar CMOS) can also be used.

The 486 CPU core 702 is located in one corner of the die to provide maximum accessibility pin-out with short conductor length to bond pads 804 on the nearby margins forming a right angle at the corner 806 of the substrate 802. Cache 704 lies closely adjacent to CPU core 702 for high speed CPU access to the cache. The memory controller 718 MCU is laid out together in an approximately rectangular block of circuitry lying along a strip parallel to cache 704, and perpendicular to microcode ROM and core 702 along substantially most of an edge of the chip 802 opposite to an edge occupied by cache 704. In this way cache 704 and MCU 718 bracket core 702.

On a side 818 opposite microcode ROM of core 702 lies bus bridge 716 laid out in a long strip parallel and stretching most of the length of side 818. Advantageously, the long length of this bus interface 820 provides physical width accessibility to the numerous terminals for connection to the wide bus 104 of system 100 of FIGS. 3–7.

Figure 11:
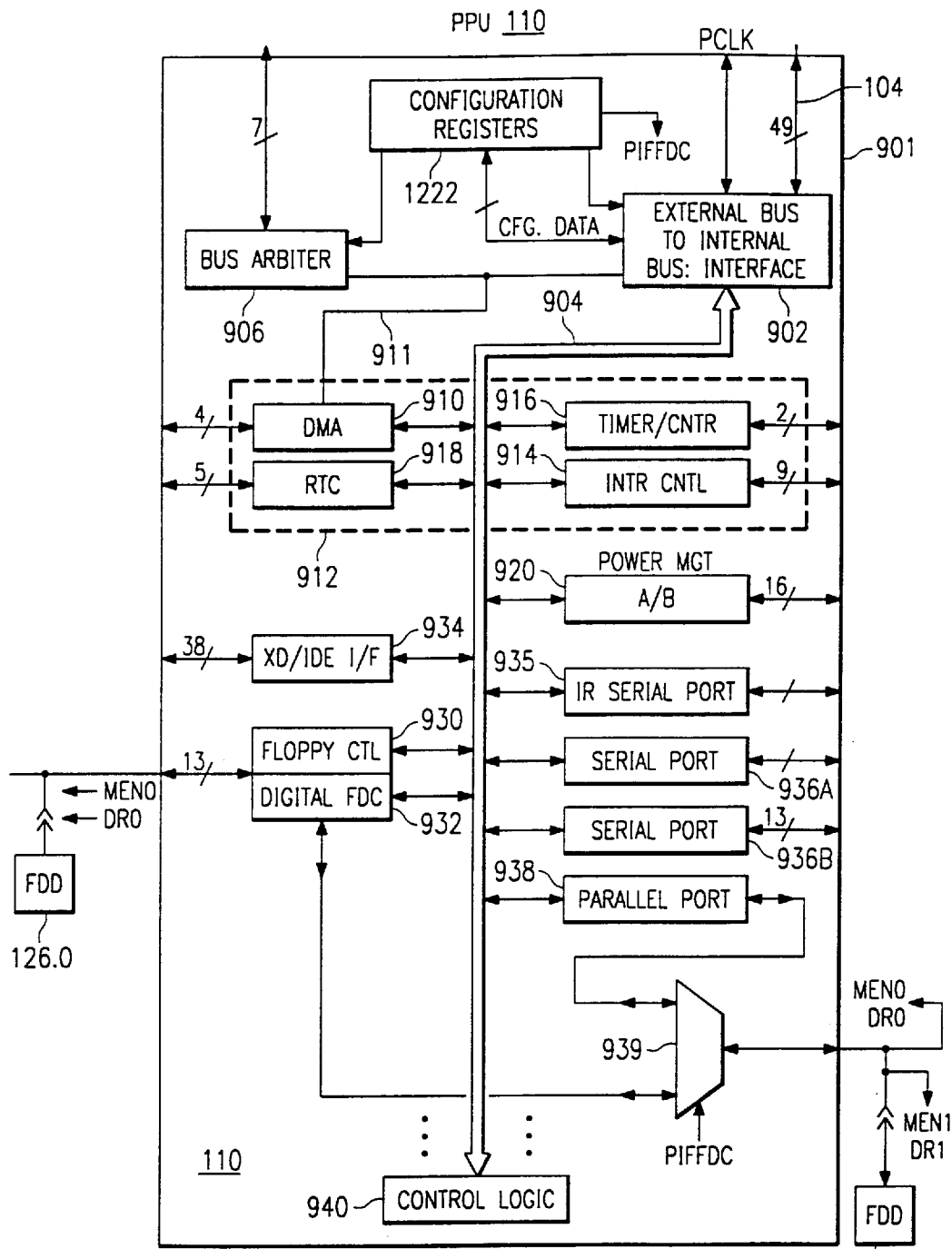
FIG. 11 is a block diagram of a peripheral processing unit (PPU) device embodiment for implementing the PPU in the system of FIGS. 5–7.

In FIG. 11 PPU 110 provides a single-chip solution that has numerous on-chip blocks on chip 901.

First is a bus interface 902 to interface from external bus 104 to an on-chip bus 904. Bus interface 902 is compatible with bus 104 externally, and is at the same time also compatible with bus 904 as a fast internal bus for integration of several peripherals described hereinbelow. For example, the peripherals in various embodiments suitably provide peripheral functions compatible with the IBM-compatible "AT" computers, or compatible with Apple "Macintosh" computers or peripherals having any desired functionality and operational definition as the skilled worker establishes. Bus interface 902 has advantageously short bus 104 ownership when mastering to minimize overall system 100 latency. Bus interface 902 provides fast DMA (direct memory access) transfers from internal I/O devices to agents (circuits) on bus 104.

Bus interface 902 performs a disconnection with retry operation for slow internal accesses to reduce the latency still futher. Illustrative bus 104 frequency is 33 MHz. at either 5 volts or 3.3 volts, although other lower or higher frequencies and voltages are also suitably established in other embodiments. In the embodiment of FIG. 11 the internal bus 904 is suitably clocked at half or a quarter of the bus 104 frequency, and higher or lower frequency relationships are also contemplated.

A bus arbiter 906 on-chip provides arbitration of bus 104 for the MPU 102 of FIG. 5, PPU 110 of FIG. 6, and two external bus masters 210 of FIG. 7. PPU 110 acts as a bus 104 bus master during DMA cycles for transfers between bus 104 and a DMA peripheral 910.

One preferred embodiment provides more peripherals that are compatible with the "PC-AT" architecture. Since the bus 904 provides an on-chip common connection to all of these on-chip peripherals, their speed and other electrical performance are enhanced. For example, two DMA controllers 910 control the DMA transfers through bus interface 902. In PPU 110 DMA controllers 910 are connected to bus 904 and separately also to both bus arbiter 906 and bus interface 902 via path 911. DMA controllers 910 also pin out externally to four pins from bond pads 912 on chip 901. Two interrupt controllers 914 provide channels individually programmable to level-triggered or edge-triggered mode. Also in interrupt controllers 914 is an interrupt router that routes an external interrupt from bus 104 or an interrupt from PCU 112 to a software-selectable interrupt channel. In PPU 110 interrupt controllers 914 and a timer/counter 916 connect to bus 104 and also pin out externally to 9 pins and 2 pins respectively. An RTC (real time clock) circuit block 918 has an integrated low-power 32 kHz. oscillator and a 128 byte CMOS SRAM (static RAM). Examples of some features and circuitry which are useful in DMA controllers 910, interrupt controllers 914, timer-counter 916 and RTC circuit 918 are found, respectively, in a commercially available 8237, 8259, 8254 and MC146818 device together with improvements as described herein. It is also contemplated that still other peripherals be provided on-chip for system purposes as desired.

A power management block 920 has a battery powered first section 920A for operation whenever the system 100 is energized, and a section 920B which is battery powered at all times. Power management block 920 provides clock control for CPU 702 even without a system management interrupt. Mixed voltage (e.g., 3.3v/5v) support is provided as a power management function.

Power management block 920 includes system activity timers named the STANDBY timer and the SUSPEND timer which monitor bus 104 activity via DEVSEL# signal, display frame buffer (e.g., VGA) activity (see controller 114 and frame buffer 202), DMA requests, serial port 130 interrupts and chip selects via a COM1 signal, parallel-port 128 interrupts and chip select via a LPT1 signal, hard disk controller 122 interrupts and chip select, floppy disk controller 126 interrupts and chip select, programmable chip select signals PCS0190 and PCS1#, and other interrupts IRQ9,IRQ10,IRQ11 and IRQ15.Power management block 920 further provides for short term CPU clock speedup timer monitoring of keyboard 142 and mouse 144 interrupt requests from KBC/SCAN chip 118, as well as bus 104 bus master cycle requests, and masked system activity timer output.

CPU clock masking, or clock-modulation, is provided by power management block 920 hardware that includes a programmable register for adjusting the gate-on-to-gate-off ratio, i.e., a ratio of clock time on to clock time off.

A bidirectional system management interrupt handshaking protocol is supported by power management block 920. Also, six power management traps are provided for IDE block 122, FDD 126, serial port 130 COM1, parallel port 128 LPT1, and the programmable chip selects PCS0190 and PCS1#.

Four-bit (16 level) backlight intensity adjustment pulse-width modulation (PWM) advantageously results from the operations of power management block 920 in response to intensity control 34 of FIG. 1.

When power management block 920 has caused substantial sections of PPU110 and the rest of system 102 to be deactivated, reactivation can be initiated by circuitry in block 920 responsive to an RTC alarm, a modem ring, a suspend/resume button, keyboard IRQ (interrupt request), mouse IRQ, ON/OFF button, a card system management interrupt CRDSMI from PCU 112, or a low-to-high transition on a battery input BATLOW.

Shadow registers in power management block 920 support saving the full system state to disk.

Bus quieting and I/O leakage current control circuitry are also included in power management block 920.

Advanced Power Management support is also provided by power management block 920.

Further in FIG. 11, a floppy disk controller block 930, digital disk controller (932), hard disk interface XD/IDE 934, serial interface block SIU 936, and a parallel port interface 938 are all coupled to internal bus 904 and to pins externally.

The floppy disk controller block 930 is integrated on-chip in PPU 110 to support 3.5 inch drives (720 kB (kilobyte), 1.44 MB (megabyte), and 2.88 MB) as well as 5.25 inch drives (360 kB and 1.2 MB). All buffers are integrated. Floppy disk controller block 930 has circuitry to accommodate data in several track formats: IBM System 34 format, perpendicular 500 kb/s (kilobits per second) format, and perpendicular 1-Mb/s (one megabit per second) format. A data FIFO (first-in-first-out) buffer operates during the execution phase of a read or write command in block 930. Block 930 also has a 255-step (16 bit) recalibrate command and function. This floppy disk controller block 930 can be reset by software. It has an integrated floppy data separator with no external components in this embodiment. Drive interface signals can be multiplexed to parallel port 938 pins for use with an external drive.

The interface 934 provides a complete IDE hard disk interface logic with high speed access. The IDE hard disk is isolated and can be powered off independently. Also included in interface 934 is a bus interface for XD bus 116 of FIG. 6, which supports BIOS ROM (which can be flash EEPROM electrically erasable programmable read only memory), provides keyboard controller KBC/SCAN connections, has two user-programmable chip selects, and can connect to audio CODEC (coder-decoder).

Further in FIG. 11 a block for miscellaneous control functions is provided as block 940.

Serial interfaces 936A and 936B each have a 16-byte FIFO for queuing and buffering the serial data to be transmitted and received, and has a selectable timing reference clock of 1.8461 MHz. or 8 MHz.

Parallel interface 938 has a 16-byte datapath FIFO buffer and provides DMA transfer. Support for fast parallel protocols such as ECP and EPP is suitably provided. More than one floppy disk drive FDD 126.0 and 126.1 are suitably accommodated by provision of a multiplexer 939 to mux the output of digital floppy disk controller 932 with parallel port 938. When a control signal PIFFDC from configuration registers 1222 of PPU 110 causes mux 939 to select floppy disk, then external pins otherwise utilized by parallel port 938 are suitably used instead for a FDD 126.1.

Figure 12:
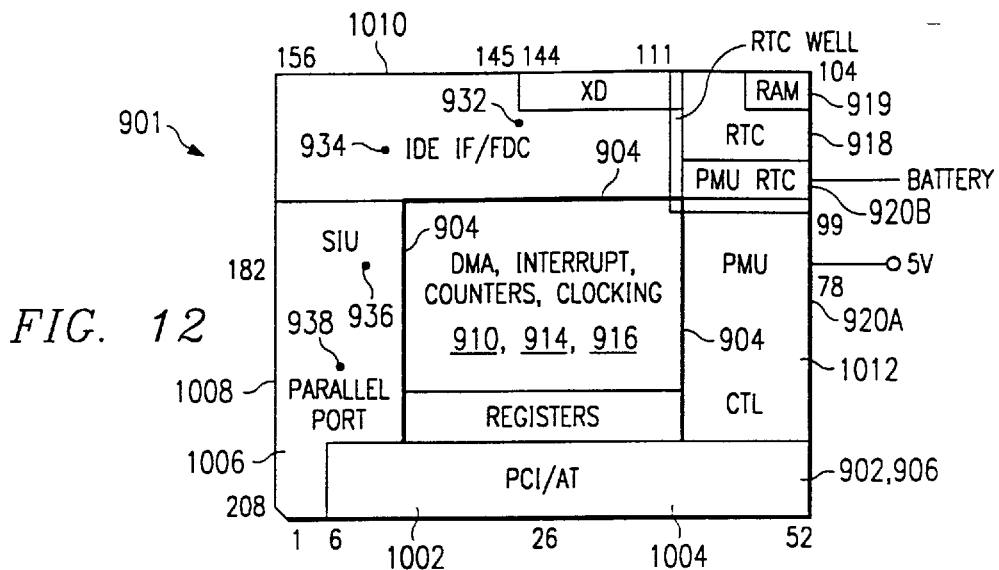
FIG. 12 is a plan view of an integrated circuit with improved topography for implementing the peripheral processng unit of FIG. 11.

In FIG. 12 a preferred embodiment layout for PPU 110 has an improved topography wherein PPU 110 is realized as an integrated circuit die 901 with a single substrate having approximately 1:1 ratio of side lengths. Various circuit regions or blocks are fabricated on die 901 by a CMOS (complementary metal oxide semiconductor) process. Other processes such as BICMOS (bipolar CMOS) can also be used.

On a side 1002 lies bus arbiter 906 and bus interface 902 all laid out in a long strip 1004 parallel and stretching most of the length of side 1002. Advantageously, the long length of this circuitry strip 1004 provides physical width accessibility to numerous terminals for connection to the wide bus 104 of system 100 of FIGS. 5–7.

Adjacent and perpendicular to circuitry strip 1004, blocks 936, 938 form a column 1006 which occupies more than half of the length of a side 1008.

Perpendicular to column 1006 lies a wide strip for floppy disk controller 932 and hard disk interface 934 laid out parallel to and on the opposite side 1010 from side 1002 PCI/AT bus interface strip 1004. The XD bus interface portion of circuit 934 also lies on side 1010.

RTC 918 with its RAM 919 lies at a corner of the die on side 1010 atop a column 1012 of PMU 920 circuitry occupying a strip perpendicular to both the edge 1010 with FDC/IDE I/F and to edge 1002 with bus bridge 1004. Battery powered PMU RTC 920B lies adjacent to RTC 918 in said corner in a 3.3 volt well, or region, distinct from all the rest of chip 901 which is powered at a different power supply voltage VCC such as 5 volts.

A large, substantially rectangular or square central region of die 901 is occupied by the DMA 910, interrupt circuitry 914, timer/counters 916, and dynamic clocking circuitry described elsewhere. The central location of these circuits minimizes clock skew, and promotes efficient layout of fast-AT internal bus 904 around this central region. Not only configuration registers 1222 but also local block registers are efficiently grouped together in a central block named Registers in FIG. 12 between the central block 910, 914, 916 and the strip 1004. Also, bus 904 is internally adjacent to and within the surrounding strips 1004, 1006, 934, 932, and 1012. The latter strips are advantageously located next to the external pins they heavily employ.

Figure 13:
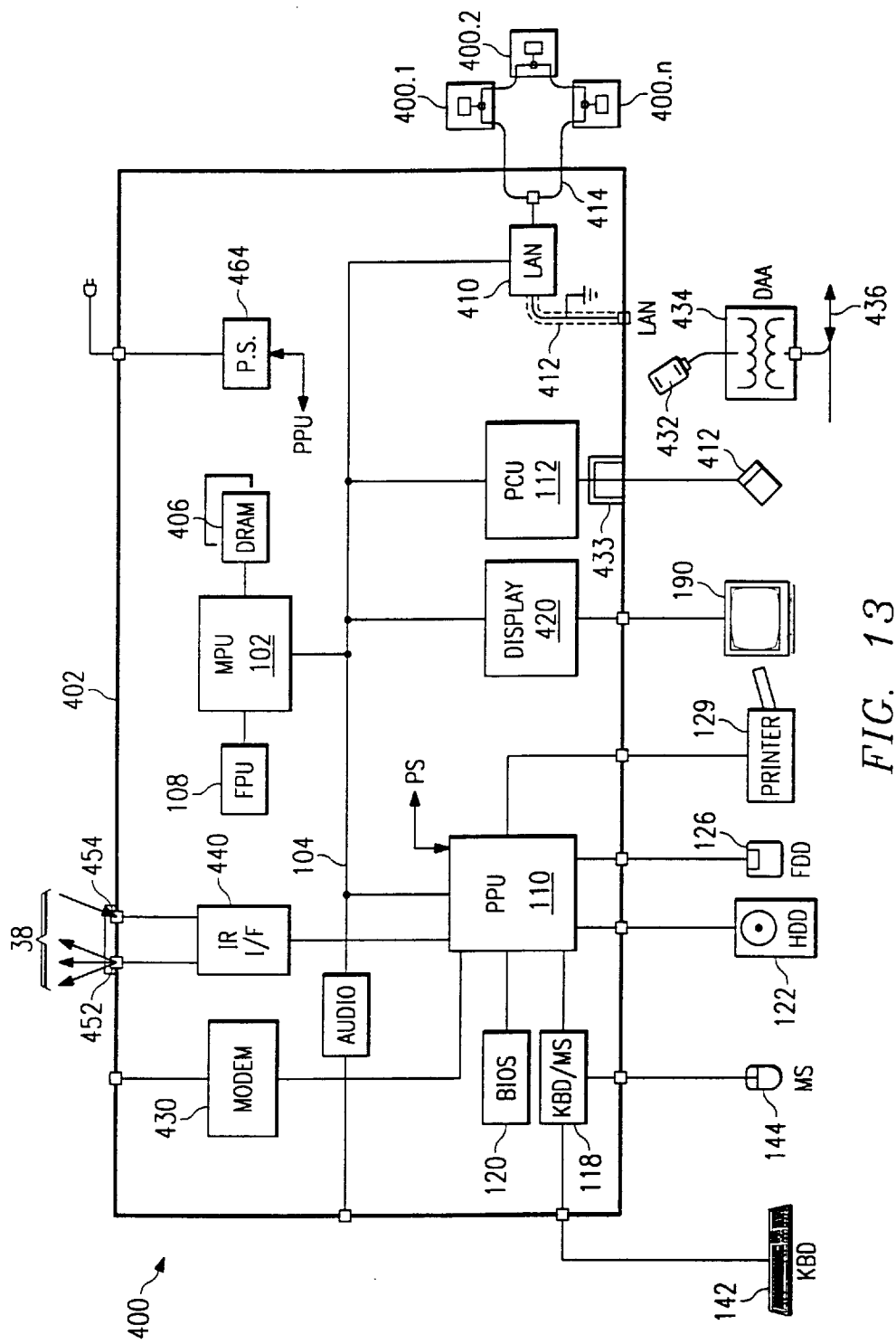
FIG. 13 is an electrical block diagram of another embodiment of an improved computer system for desktop and other applications.

In FIG. 13, returning to system level to consider a further important system embodiment utilizing the special chips therein, a computer system 400 of a preferred embodiment has an enclosure 402 with a printed wiring board holding components chosen, configured and combined for advantageous desk top computer or portable (e.g. notebook) application. MPU 102 is coupled to FPU 108 and additionally coupled to a DRAM memory 406. A main bus 104 interconnects MPU 102, PPU 110, VGA/LCD display controller chip 114, PCU 112 and a LAN (local area network) controller 410. LAN controller 410 suitably supports either Ethernet protocol via coax path 412, or token ring protocol via path 414 to stations 400.1, 400.2, . . . 400.n, or both protocols, using TMS380 LAN technology from Texas Instruments Inc.

PPU 110 has flash ROM 120 connected to some terminals thereof. This optional flash BIOS allows user upgradeable BIOS support. At other terminals is connected a keyboard controller 118 which in turn is connected to both a keyboard 142 and a mouse 144. PPU 110 is further connected to a hard disk drive 122 and a floppy disk drive 126 with insertable magnetic floppy disks. PPU 110 further interfaces to a printer 129.

Display controller chip 420 is externally connected to a CRT 190 or alternatively to a display panel such as one using digital micromirror devices or field emission device flat panel technology from Texas Instruments Incorporated. PCU 112 is externally connected to flash memory cards 412. These cards in one embodiment are 3 or 5 volt PCMCIA cards.

A modem 430 is connected to a serial port of the PPU 110 in system 400. Modem 430 connects to the telephone network either by direct connection by a rear jack on enclosure 402, or by a wireless interface incorporated in the system. Modem 430 can also be implemented by using a PCMCIA modem card 432 insertable into card socket 433 for PCU 112. Modem card 432 connects to a DAA interface 434 to telephone line 436.

An infrared interface 440 connects to another serial port of the PPU 110 and connects to an emitter/detector assembly 38 having emitter LED 452 and photodetector diode 454.

Bus 104 in one embodiment can be a PCI (Peripheral Component Interconnect) bus which is described in a published PCI Specification 2.0 from PCISIG (PCI Special Interest Group).

A power supply 464 for connection to AC power with or without battery backup provides supply voltage to energize the PPU 110 and the other circuits in system 400.

Figure 14:
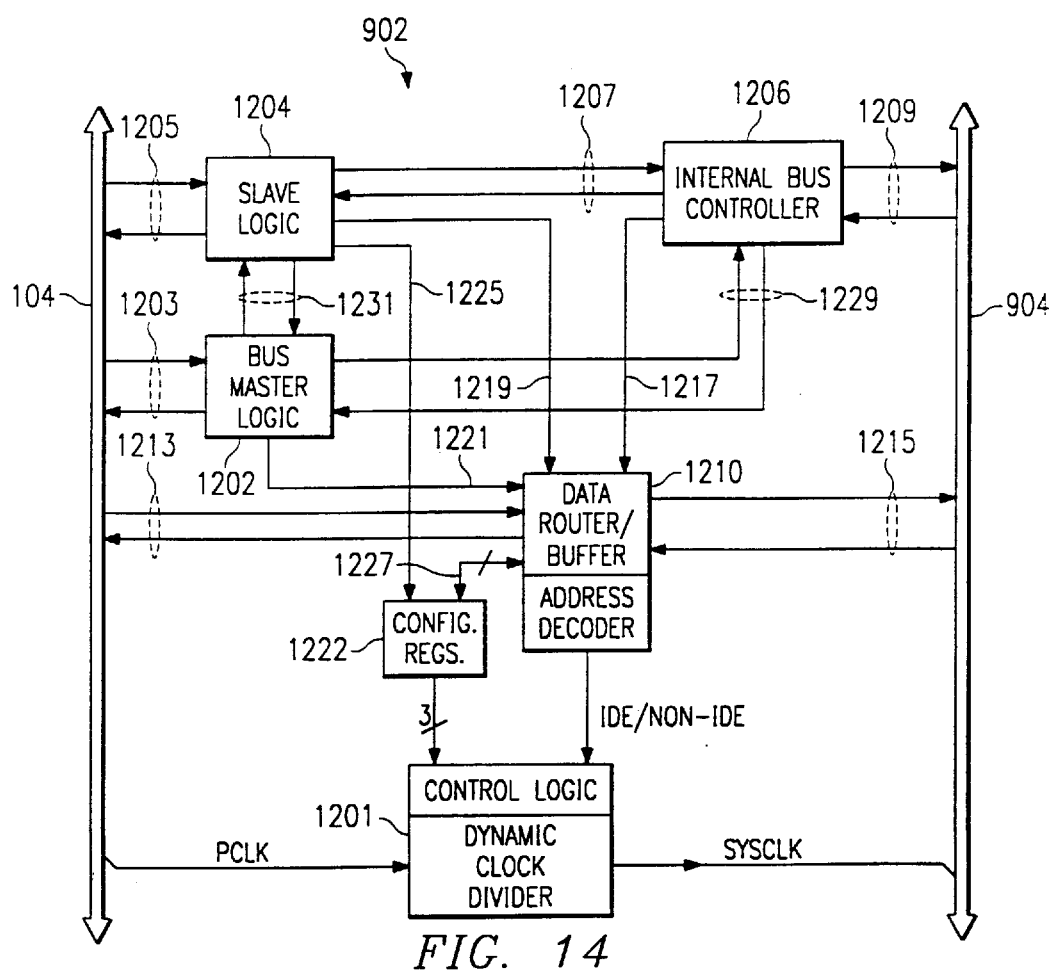
FIG. 14 is a more detailed block diagram of a bus interface block for the embodiment of FIG. 11.
Figure 15:
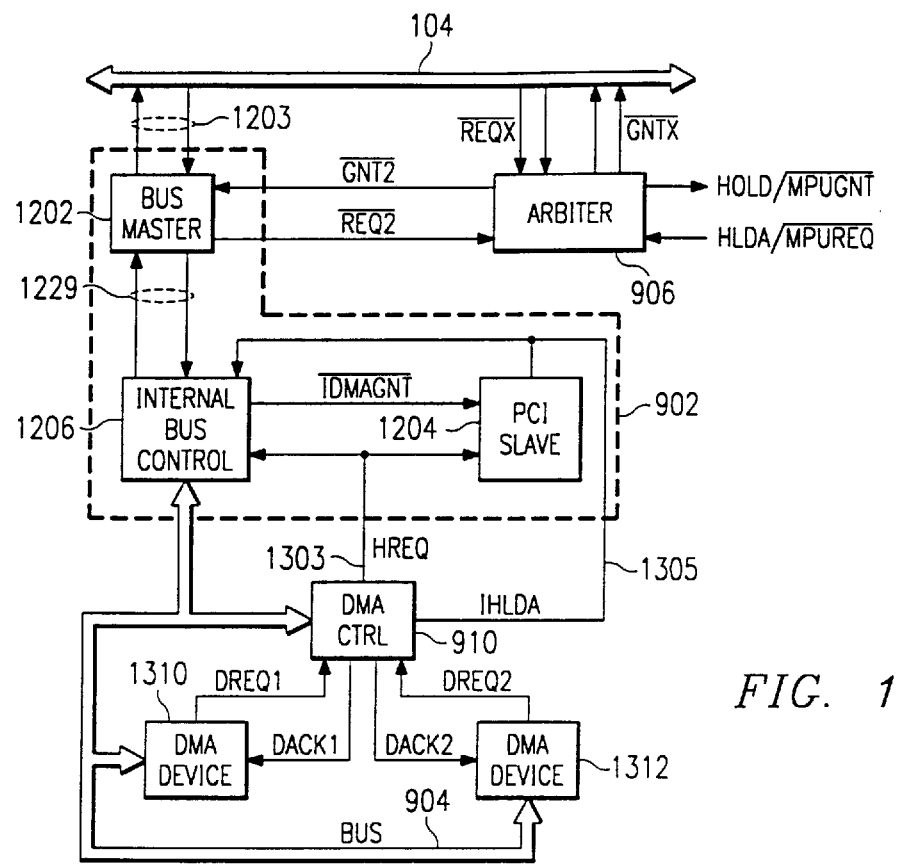
FIG. 15 is a more detailed block diagram of DMA (Direct Memory Access) circuity relating to the circuitry embodiments of FIGS. 11 and 14.

In FIGS. 14 and 15 the description turns to further specifics of circuits in the PPU 110 embodiment. Bus interface 902 of FIGS. 11 and 14 is connected between bus 104 and internal bus 904 of PPU 110. A bus master 1202 bidirectionally connected via lines 1203 to bus 104 has state machines and interface logic used when the arbiter 906 of FIGS. 11 and 15 grants control of bus 104. A slave block 1204a bidirectionally connected via lines 1205 to bus 104a translates bus cycles externally initiated on bus 104. The slave block 1204 translates these bus cycles to an internal bus controller block 1206 to which slave block 1204 is bidirectionally connected via lines 1207. Slave block 1204 does non-posted writes and wait-stated reads. Internal bus controller 1206 generates the signals for communication on the internal bus 904 via bidirectional lines 1209.

A data router/buffer 1210 has latches for data latching between bus 104 and internal bus 904 via bidirectional lines 1213 to bus 104 and bidirectional lines 1215 to internal bus 904. Respective controls from internal bus controller 1206, slave 1204 and bus master 1202 pass via respective lines 1217, 1219 and 1221 to data router/buffer 1210. Internal bus controller 1206 controls assembly and disassembly of data between the internal bus 904 and the data router/buffer 1210. Registers CFG 1222 specify the configuration of interface 902, and receive information from slave 1204 via a line 1225 and are bidirectionally connected via lines 1227 to data router/buffer 1210. Bus master 1202 is bidirectionally connected to internal bus controller 1206 via lines 1229. Bus master 1202 is bidirectionally connected to slave 1204 via lines 1231. Internal bus controller 1206 provides subtractive decode DEVSEL# assertion. Address decoding for slave devices connected to the internal bus 904 is performed by those devices.

In FIG. 15 DMA circuitry in PPU 110 is shown in more detail. Bus arbiter 906 receives bus request signals from bus 104 via two pins REQ0190 and REQ1#, and supplies bus grant signals to bus 104 via two pins GNT0190 and GNT1#. Since bus master 1202 in bus interface 902 is on-chip in the PPU 110, the arbiter 906 has two more lines REQ2# and GNT2# internally connecting to bus master 1202. Arbiter 906 also has an input line HLDA/MPUREQ# (Hold Acknowledge high, MPU 102 Request low, CPU acknowledges it has gotten off bus 104) and an output line HOLD/MPUGNT# (Hold high/MPU 102 Grant low, arbiter 906 request to CPU that CPU get off bus 104). HLDA is a grant of both bus 904 and bus 104 for DMA operation by DMA controller 910. Internal bus control 1206 supplies a bus idle signal IDMAGNT# (internal bus DMA grant, active low) to slave block 1204. DMA controller 910 supplies a DMA controller request HREQ to both the internal bus control 1206 and the slave block 1204 via a line 1303. Slave block 1202 acknowledges with signal IHLDA to both DMA controller 910 and internal bus control 1206 on a line 1305. Internal bus 904 interconnects internal bus control 1206, DMA controller 910 and first and second DMA devices 1310 and 1312. Respective signals and lines are provided for DMA devices 1310, 1312 requests DREQ1, DREQ2 to DMA controller 910, and DMA device grants DACK1, DACK2 from DMA controller 910 back to DMA devices 1310, 1312. Note that FIGS. 14 and 15 should be read together for both the data and control paths.

Figure 16:
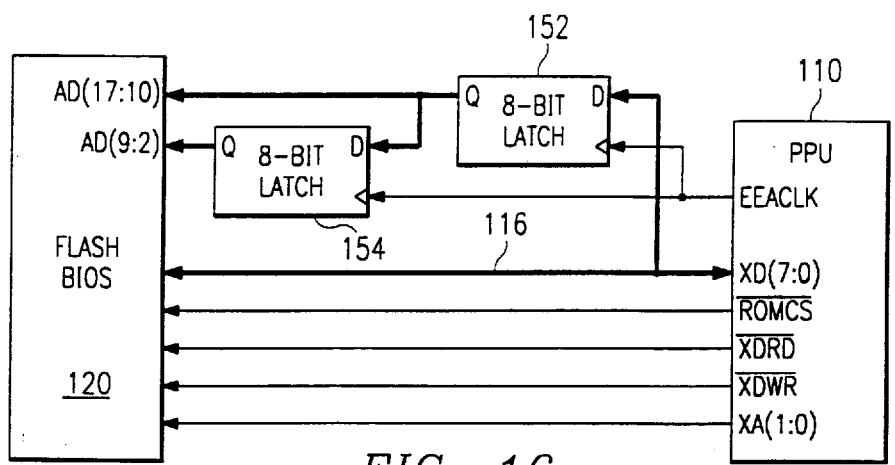
FIG. 16 is a block diagram of an improved BIOS addressing circuit interconnecting the PPU of FIG. 11 with a BIOS flash memory.

In FIG. 16 a BIOS addressing circuit interconnects the PPU 110 of FIG. 6 with BIOS flash EEPROM 120 when flash is used. The XD bus interface in PPU 110 is suitably connected to the BIOS ROM 120, keyboard controller KBC/SCAN 118, and additional devices such as audio codec chip 160.

BIOS flash memory 120 is connected to PPU 120 is thus supplied with address bits XA(1:0), a chip select ROMCS#, a read strobe XDRD# and a write strobe XDWR#. An upper set of 15 address lines are driven onto the bus 104 by PPU 110 while PPU 110 is waiting for data to be returned from the BIOS memory 120 with the resulting advantage that no external address latches are required. When BIOS memory 120 is flash, two 8-bit latches 152 and 154 are used to latch the BIOS address, and a latch enable signal EEACLK is provided from a pin of PPU 110 to clock inputs of both of the latches 152, 154 to clock the latches.

As shown in FIG. 16, the 8-bit XD bus is connected directly to data terminals of BIOS memory 120 and of data D inputs of 8-bit latch 152. Latch 152 has its Q output lines connected to 8 MSB bits AD(17:10) of BIOS memory 120, and latch 152 has the same Q output lines also connected to the data D inputs of 8-bit latch 154. Latch 154 has its Q output lines connected to 8 LSB bits AD(9:2) of BIOS memory 120. Thus, these latches have an advantageously bus-wide serial structure in the addressing of BIOS 120.

Figure 17:
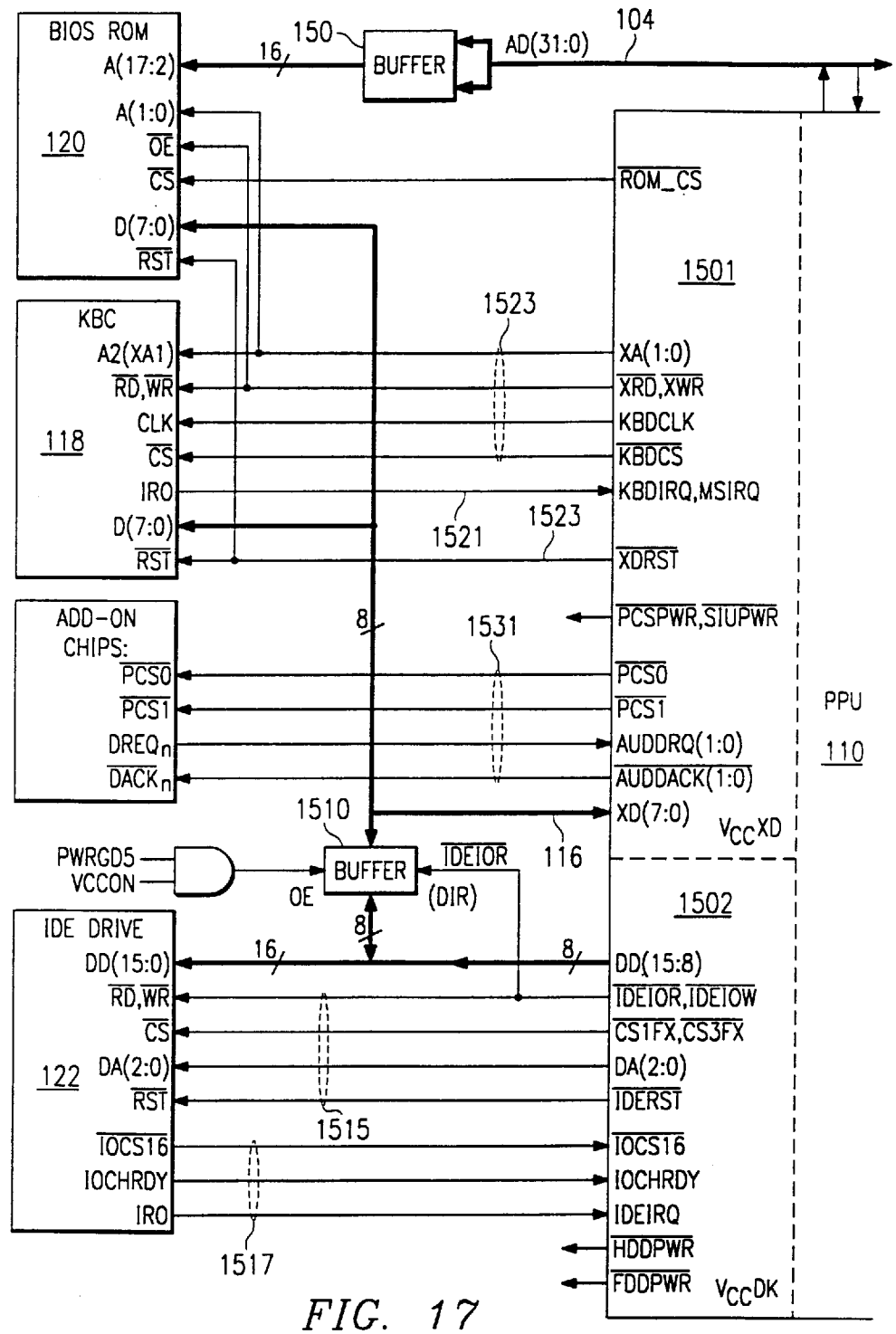
FIG. 17 is a block diagram of interconnection of the PPU of FIG. 11 with BIOS ROM, KBC (Keyboard Controller), add-on chips and IDE hard disk drive in the system embodiment of FIGS. 5–7.

In FIG. 17 the PPU 110 of FIGS. 6 and 11 is connected with BIOS ROM 120, KBC (Keyboard Controller) 118, and IDE Drive 122. Control and data connections and signals provide in FIG. 17 further detail to FIG. 6.

The XD bus 116 of FIGS. 6 and 17 has associated control signals which are split into respective sections 1501 and 1502 for XD and IDE interface signals. These sections 1501 and 1502 have separate voltage rails in PPU 110 connected to power supply lines at pins VCC_XD and VCC_DK of PPU 110. The structural feature and method of separate voltage rails in a preferred embodiment provides advantageous flexibility in system configuration. For example, a keyboard controller KBC/SCAN 118 and BIOS ROM 120, both of 3.3 volt type selected for low power consumption, are suitably combined in system 102 with an IDE disk drive 122 selected to be of 5 volt type for low cost.

Eight outgoing control signal lines 1515 and three incoming control signal lines 1517 in FIG. 17 show the PPU 110 pin connections to IDE Drive 122 as further detail to FIG. 6. An eight-bit buffer 1510 (such as a '245 chip) responsive to PPU 110 control line IDEIOR# (and powered from supply voltage VCC) couples the XD bus 116 to the lower eight lines DD(7:0) of IDE drive 122, while the upper 8 lines DD(15:8) are fed directly from the DD pins of PPU 110.

Six outgoing control signal lines 1523 and two incoming signal lines 1521 in FIG. 17 show the PPU 110 pin connections to KBC 118 as further detail to FIG. 6. Chip select and selectable clock signals are provided for KBC 118, and read/write strobes and 8-bit data signals are analogous to the signals for other XD-bus peripherals of FIG. 17. Address line XA1 functions as and connects to input A2 of KBC 118. The XRD# and XWR# signals serve as read and write strobes for both memory and I/O cycles. When ROM chip select ROMCS# is active, XRD# and XWR# are equivalent to the internal memory read MEMR# and memory write MEMW# signals; for all other accesses, XRD# and XWR# are equivalent to the internal I/O read IOR# and I/O write IOW# signals.

Referring to lines 1531 of FIG. 17, two DMA channels and a programmable chip select PCS0190 are available to support a business audio chip such as the AD1848 commercially available from Analog Devices Inc. A second programmable chip select PCS1# is also available.

When a ROM (and not flash memory) is used to realize BIOS ROM 120, connections are made from PPU 110 as shown in FIG. 17 to the control pins of ROM 120. A buffer 150 couples 16 lines such as AD(17:2) from bus 104 to address inputs A(17:2) of ROM 120. The other AD lines are used to create a separate address space for an additional ROM or ROMs in an alternative embodiment.

Figure 18:
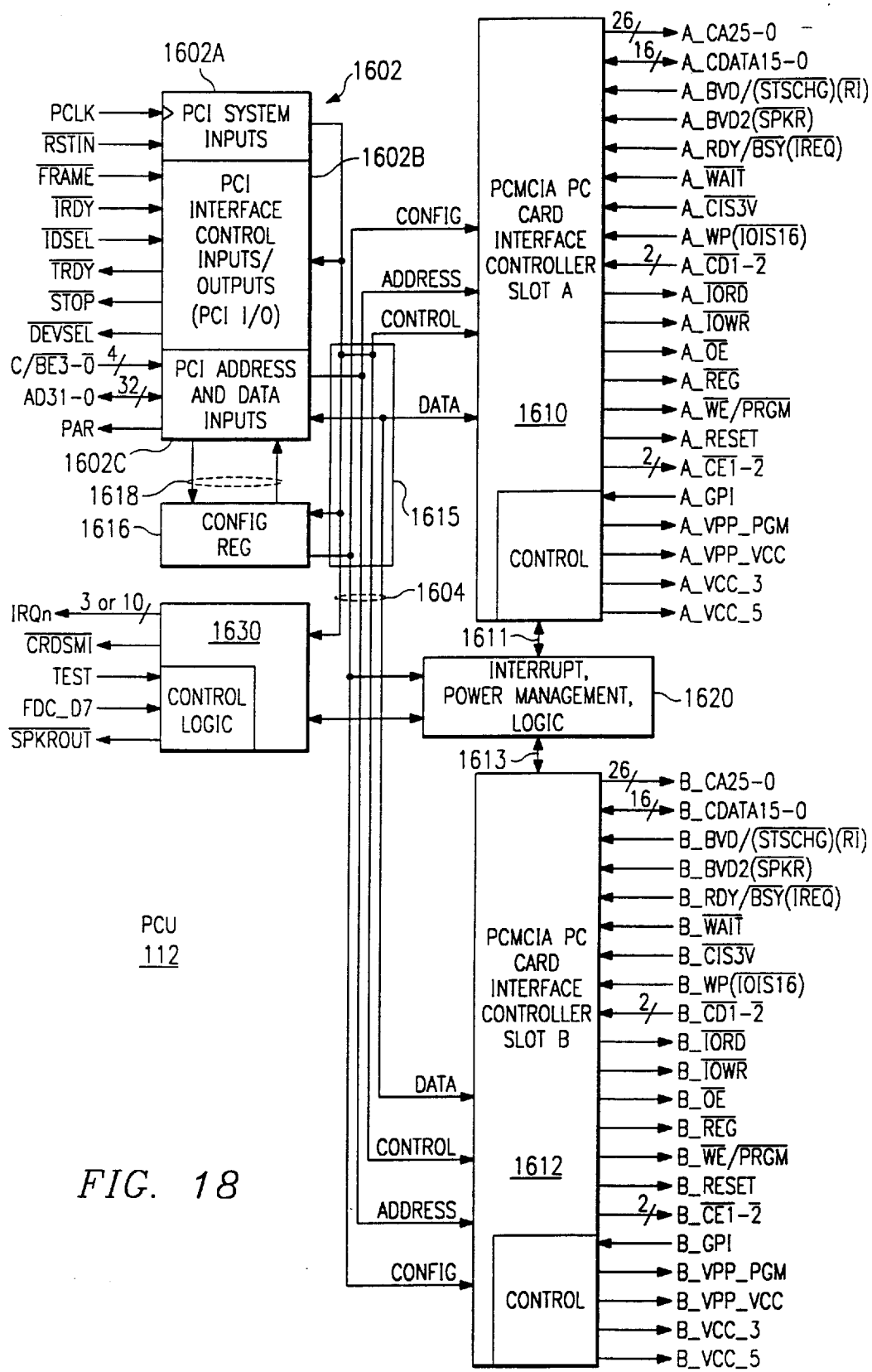
FIG. 18 is a block diagram of a peripheral control unit (PCU) device embodiment to accept insertable cards for the system of FIGS. 5–7.

In FIG. 18 the description to turns to the card interface chip PCU 112 of FIG. 5. PCU 112 has bus interface 1602 connected to bus 104. Bus interface 1602 is further connected to two illustratively identical card interface circuits 1610 and 1612 for card slots A and B. Configuration registers 1616 bidirectionally communicate with bus interface 1602 by lines and supply configuration information CFG to circuits 1610 and 1612 and well as to blocks 1620 and 1630 for Interrupt, power management circuitry and other logic. Cards are advantageously insertable and removable while power to PCU 112 is on due to integrated hot insertion and removal buffers in circuits 1610 and 1612. Plural selectable supply voltages (e.g., 3.3v and 5 v) are supported. The card controller generates control signals for individual slot power control to connect the selected supply voltage to each card under software control. In one embodiment the card controller is made register compatible with a controller 82365SL DF exchangeable card architecture commercially available from Intel Corporation. PCU 112 can be replicated on bus 104 thereby providing numerous card slots as desired for a particular application system.

The pinout of PCU 112 is described in detail elsewhere herein. In brief, the card data path CDATA (A or B) is 16 bits wide. Each circuit 1610 or 1612 respectively assembles or concatenates 8-bit or 16-bit card accesses from its CDATA lines into 32-bit words onto bus 104 lines AD(31:0) via the bus interface 1602.

Circuit 1620 bidirectionally communicates with circuits 1610 and 1612 via lines 1611 and 1613 respectively. Bus interface 1602 has bus 104 connections to lines AD(31:0), input controls CTRLIN and output controls CTRLOUT. Each of circuits 1610 and 1612 has respectively A- and B-designated 26 CADR address lines, 16 bidirectional data lines CDATA and 20 control lines. Bus interface 1602 via a data router circuit 1615 connects in parallel to both circuits 1610 and 1612 via 26 ADR address lines, 32 DATA lines (data is in assembled form) and by lines marked control.

Pins IRQn differ in number n with the particular embodiment of PCU 112. For example, in systems having an externally accessible ISA bus, 10 pins IRQn are provided in a first embodiment with interrupts routed to the appropriate IRQn line depending on the card function. In systems having an ISA bus internal to PPU 110 only, only three pins IRQ named CRDAIORQ, CRDBIORQ, CRDSRVRQ are provided in a second embodiment with interrupts routed by special shadowing in PPU 110 to the appropriate IRQ line among typically 10 ISA interrupt lines, depending on the card function. The second embodiment has economic and speed advantages. In a third embodiment of PCU 112, ten pins IRQn for routed interrupts muxed with CRDAIORQ, CRDBIORQ, CRDSRVRQ are provided, so that the chip may be used in either an externally accessible ISA bus environment, or the PPU 110 internal bus environment depending on the system manufacturer choices incorporating the PCU 112. The description of FIGS. 38 and 43 herein provides further description of the shadowing circuitry, systems and methods of this third embodiment.

Figure 19:
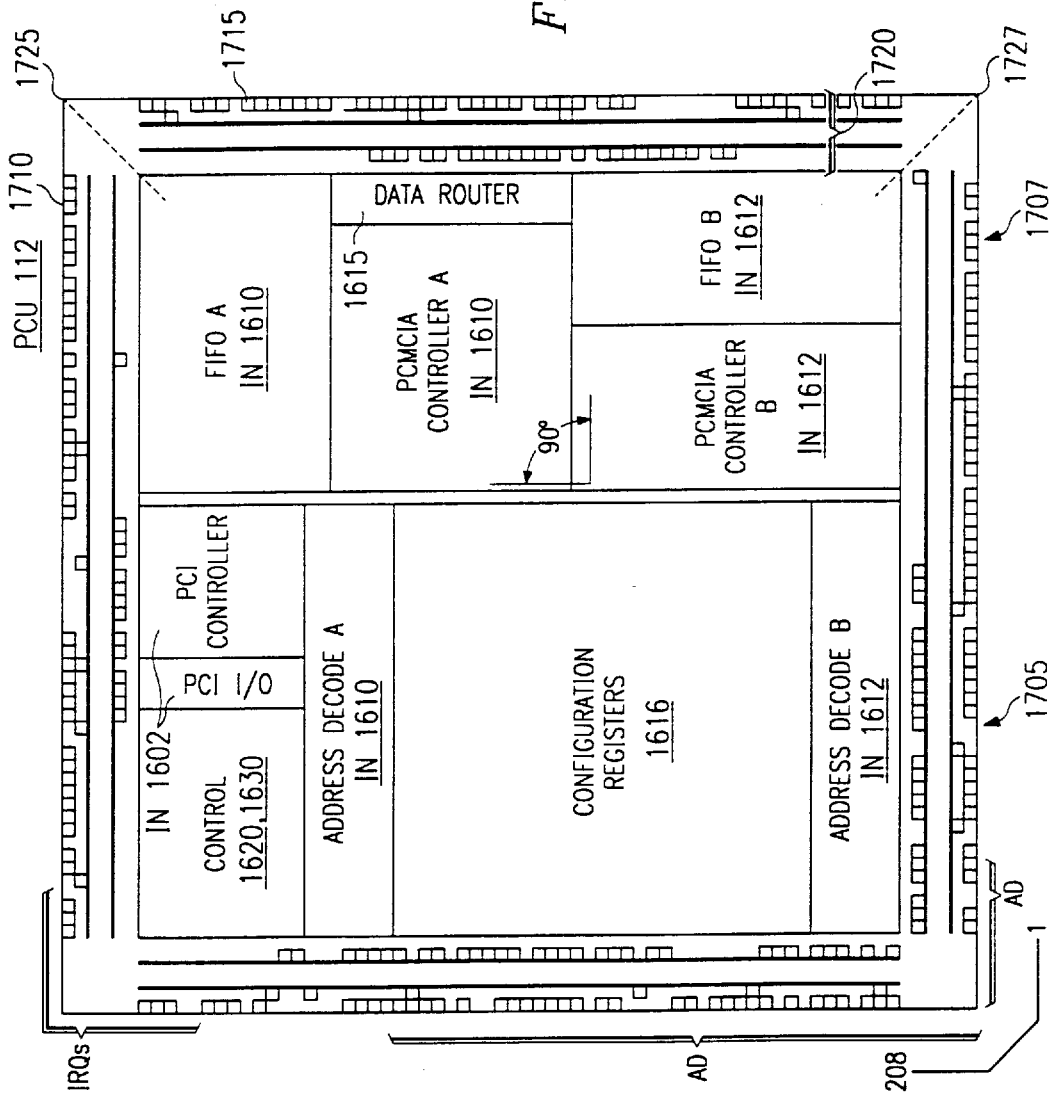
FIG. 19 is a plan view of an integrated circuit with improved topography for implementing the peripheral control unit of FIG. 18.

In FIG. 19 PCU 112 in a preferred embodiment has genarally rectangular integrated circuit blocks fitted together in a layout comprising two columnar halves 1705 and 1707 on an approximately 1:1 square die 1710 having I/O buffers and small rectangular bond pads 1715 located on a narrow peripheral strip 1720 around the perimeter of the die 1710. Pin references 208, 1 are provided in the lower left corner of FIG. 19.

In FIG. 19, bus interface 1602 has PCI I/O and PCI Controller blocks oriented at upper center in the layout. In the upper left corner lies the Control circuitry 1620, 1630 with access to the IRQ pins and SMI pin nearby. Configuration Registers 1616 occupy about half the area of column 1705 and are flanked by Address Decode A and Address Decode B circuitry for controllers 1610 and 1612 respectively.

Column 1707 controller 1610 blocks for FIFO A and PCMCIA controller A occupy the upper half of column 1707, and controller 1612 blocks for FIFO B and PCMCIA controller B occupy the lower half. The A circuitry in the upper half is advantageously rotated in orientation by an angle of 90 degrees relative to the B circuitry in the lower half to form two quadrants of circuitry with high bond pad accessibility.

Figure 57:
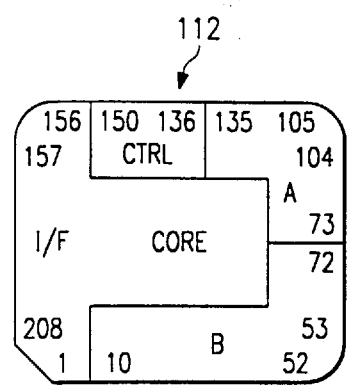
FIG. 57 is a pin diagram for a 208 pin PQFP package used for the card interface MCU and related to operational regions of the MCU, the pin assignments being tabulated for it in the Detailed Description.

The FIFO A (first-in-first-out buffer) in circuit 1610 of FIG. 19 occupies a rectangular region spanning the top of column 1707, and FIFO B lies in the lower right next to the corner at the bottom of column 1707. PCMCIA controller block A in controller 1610 lies adjacent to FIFO A. PCMCIA controller block B in controller 1612 lies adjacent to FIFO B and perpendicular in aspect to PCMCIA controller A. In this way, circuits which have many external inputs and outputs like FIG. 18 circuits 1602C (AD pins), 1610 (A\_CA and A\_CDATA pins) and 1612 (B\_CA and B\_CDATA pins) also have substantial bond pad physical accessibility, as shown in FIGS. 19 and 57.

Data router 1615 lies in a narrow peripheral strip adjacent to PCMCIA controller A and between FIFOs A and B. Comparing FIGS. 18 and 19, data router 1615 advantageously supplies and routes the Controller A and B Configuration, Address, Control and Data information from block 1602 as intended by the information in Configuration Registers 1616. In FIG. 18 block 1615, the interior joinings of A and B lines are representative of muxes or other selector and routing logic to complete the information paths.

Figure 20:
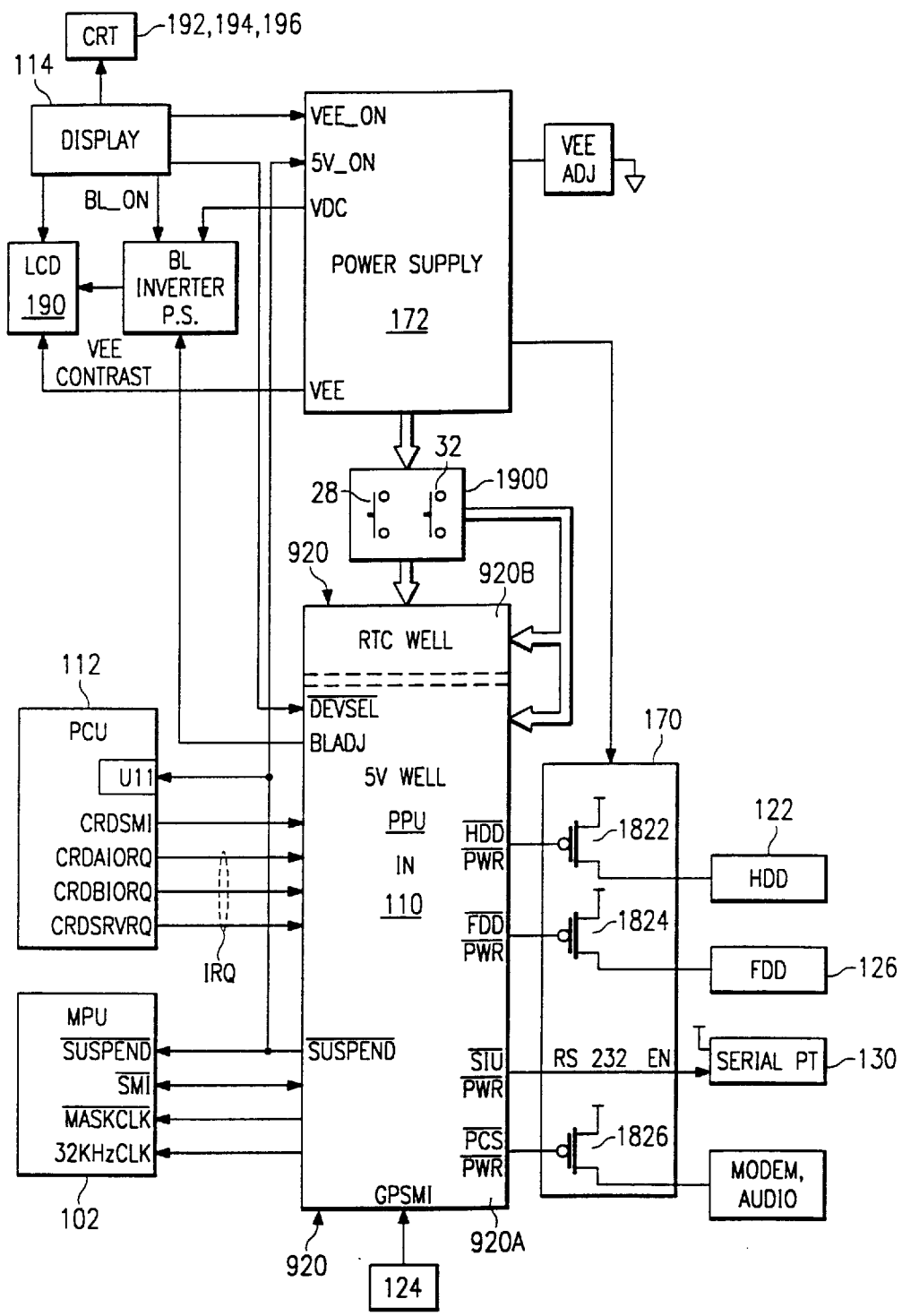
FIG. 20 is a block diagram of selected power and control interconnections between the MPU, PCU, PPU, power supply, display circuitry and peripherals in the system embodiment of FIGS. 5–7.

In FIG. 20, PPU 110 power control output pins for hard disk HDDPWR#, floppy disk FDDPWR# and programmable chip select PCSPWR# are connected to respective MOSFETs (metal oxide semiconductor field effect transistors) 1822, 1824 and 1826, or any other suitable power control elements) so that a selected supply voltage such as 3 volts or 5 volts is controllably applied to or disconnected from the corresponding peripheral HDD 122, FDD 126 and PCS chip such as modem and audio, for advantageous system power management. In other words, each peripheral has its own individual supply voltage wherein one peripheral can run on a switchable 5 volts for low cost, and another peripheral can run on a switchable 3 volts for low power. Another power control output pin SIUPWR# is connected to an RS232EN# control input of a serial port for power management of the serial port. PPU 110 thus provides important advantages of single-chip control of multiple power voltages and further combined with a suspend function.

Display chip 114 is suitably a C&T 65530 or Cirrus Logic GD6545 among commercially available examples. Display chip 114 when activated, sends a control voltage VEE\_ON to power supply 172 to cause the supply to provide contrast voltage VEE to LCD 190. The level of VEE is controlled by VEE ADJ block in response to knob 34 of FIG. 1. Display chip 114 is suitably configured as a PCI-compliant chip with internal PCI interface circuitry and configuration registers so that it returns a device select signal DEVSEL# to PPU 110 when active. Display chip 114 is connected to directly send video information to the LCD 190, as well as to send a BL-ON control signal to activate a Back Light Inverter P.S. power supply to invert a low voltage VDC from supply 172 to hundreds of volts or otherwise as suitable for a fluorescent back light in LCD 190 and supply the result to LCD 190 responsive to back light adjust BLADJ PWM signal from PPU 110.

Graphics and text outputs are also provided by display chip 114 in video form to display circuitry 192, 194 and 196 of FIG. 7.

MPU 102 is connected to power management circuit section 920A at pins SMI#, MASKCLK#, 32 KHZCLK and SUSPEND#. The latter SUSPEND# line not only connects to MPU 102 and PPU 110 but also connects to and controls a SUSPEND# pin of a power control chip U11 (see FIG. 52 detail) associated with PCU 112 and a 5V_ON pin (also called low-active shutdown SHDN# in FIG. 52) of power supply 172. PCU 112 supplies card system management interrupt CRDSMI, as well as three routable interrupt request lines for card A and card B (CRDAIORQ, CRDBIORQ) and card service request CRDSRVRQ. Circuitry 124 provides general purpose SMI to the GPSMI pin of PPU 110.

From a system partitioning point of view, the power management logic has circuit 920 in PPU 110 as a first integrated circuit on a first chip. MPU 102 has a second power management integrated circuit having the control input SUSPEND# and this second power management integrated circuit is thus provided on MPU 102 as another chip coupled to the first integrated circuit PPU 110. Indeed, The power management circuitry is distributed not only in PPU 110 as the main center for this function, but also PCU 112 and display controller 114 as well as MPU 102. This embodiment thus provides power management improvements locally in each chip and also globally in the system into which the chips are interconnected. High speed circuits for clock control (see e.g. FIG. 36) are concentrated in MPU 102 and advantageously partitioned from the lower speed circuits for clock control of PPU 110 (see e.g. MASKCLK and 32 KHz. of FIG. 24), thereby also minimizing radio frequency interference (RFI) and timing problems.

This embodiment illustrates an example of an improved system arrangement that has a microcomputer integrated circuit (e.g., 102) having a first power management circuit, an interface integrated circuit (e.g. 112) adapted for coupling a memory card to said microcomputer integrated circuit (102) and having a second power management circuit, a peripheral processor integrated circuit (e.g. 110) having a third power management circuit coupled to each of the first power management circuitry of said microcomputer integrated circuit and the second power management circuit of the interface integrated circuit, the third power management circuit controlling the first and second power management circuits via control lines coupled to each of the first power management circuitry of said microcomputer integrated circuit and the second power management circuit of the display controller integrated circuit. Each of the first, second and third power management circuits comprises transistors and said third power management circuit has at least four times as many transistors as each of the first and second power management circuits. Also provided is a display controller integrated circuit having a fourth power management circuit coupled to the third power management circuit in the peripheral processor integrated circuit.

A card system management interrupt CRDSMI output from PCU 112 is connected to a corresponding CRDSMI input of PPU 110. PCU 112 I/O request outputs for Card A (CRDAIORQ), Card B (CRDBIORQ), and CRDSRVRQ are also connected to corresponding inputs of PPU 110.

A general purpose system management line GPSMI is provided between GPSMI pins of FPGA 124 and PPU 110 for FPGA signaling to the PPU.

Display controller chip VGA 114 is enabled by a VEE_ON control signal from power supply 172. A further control signal Back Light On BL-ON# is low-active and controls the on/off state of the back light of LCD 190 (Liquid Crystal Display). Backlight systems for a monochrome type of LCD display can contribute 2–3 watts to system 100 power consumption without power management. Thus display power management is important.

When user I/O interfaces such as keyboard, mouse and display are idle, as determined by activity timers, the display can be dimmed or shut off. The keystroke that causes power management mode exit (to bring the display back on or full on) is suitably ignored for user convenience. VGA LCD controllers have an ouput signal VEE enable used to enable or disable LCD VEE power and used to generate contrast.

A first method of providing this convenience, for example, comprises a first step of routing a screen blank status signal (e.g. a VEE enable signal) to the keyboard controller/scanner KBC 118. Then in a second step the KBC BIOS is programmed to ignore or prevent system response to any keystrokes when VEE enable is inactive.

A second alternative method of providing this convenience comprises a first step of routing the screen blank status signal (e.g. a VEE enable signal) to a system management interrupt (SMI) input such as GPSMI on PPU 110. A second step generates the SMI when the display is disabled. In a third step, system management software responds to the SMI and sends a command to the KBC 118 to ignore the next keystroke, with the system free of any independent data path for VEE enable to KBC 118, and compatible with use of KBC 118 for additional power management functions. The SMI is further advantageously used by power management BIOS in determining system activity.

Figure 21:
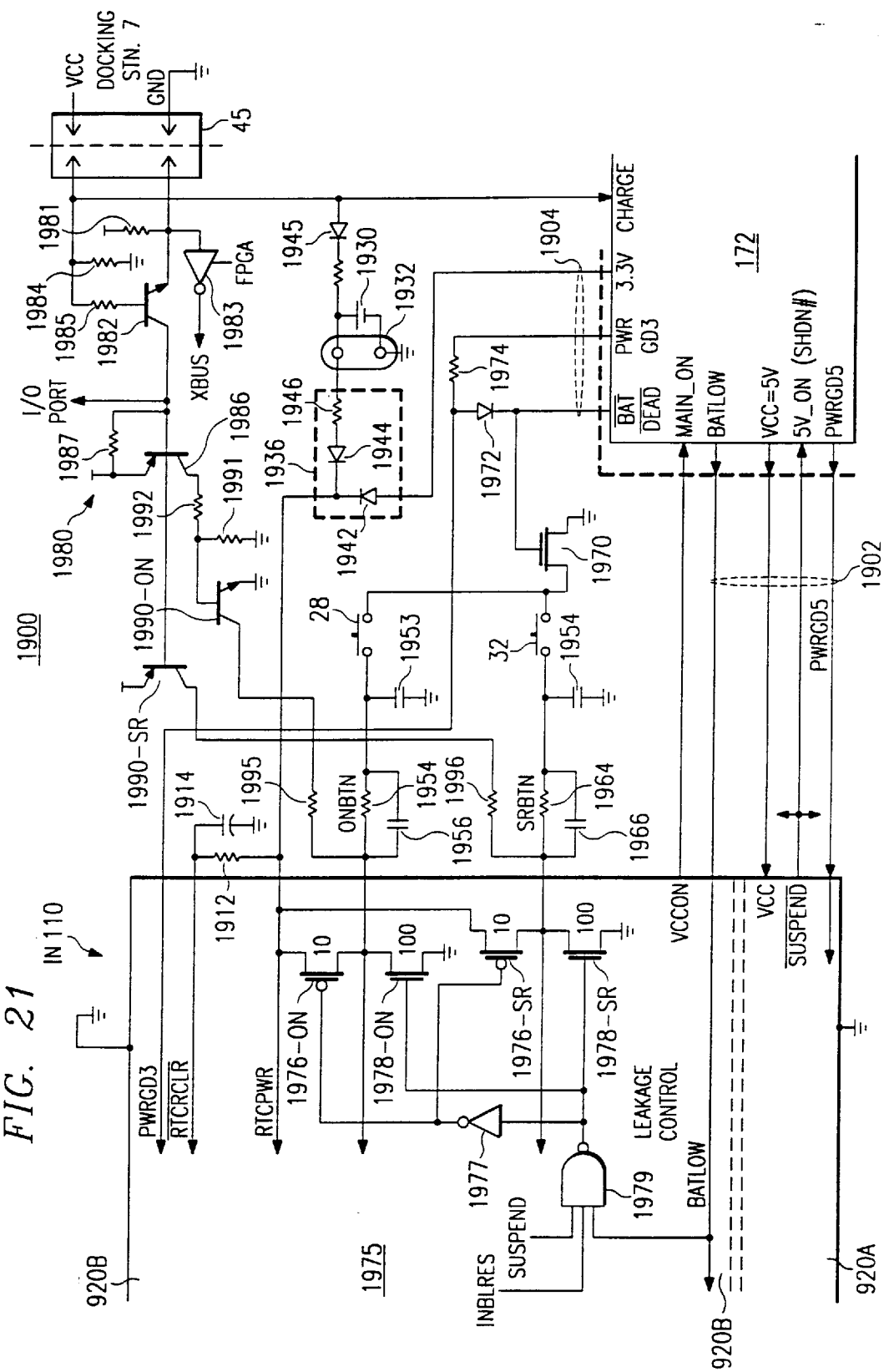
FIG. 21 is a partially block, partially schematic diagram of a PPU circuit embodiment connecting to ON/OFF and SUSPEND/RESUME button circuitry, docking station connector circuitry and a power supply in various circuit embodiments.

Circuitry 1900 is shown as a block in FIG. 20 and detailed in FIG. 21 for control buttons 28 and 32 of FIG. 1 as well as interconnections between the power supply 172 and PPU 110.

In FIG. 21 power supply 172 is coupled to the PMU 920 of PPU 110 in part of electronic system 100 of FIGS. 5–7. First and second power supply connectors or sections 1902 and 1904 are electrically coupled to power management logic circuit 920 to respectively energize first logic section 920A connected to said first power supply connector 1902 and second logic section 920B connected to second power supply connector 1904. In this way, PMU second logic section 920B operation is independent of the first PMU logic section 920A such as when power is available at said second power supply connector 1904 and unavailable at said first power supply connector 1902. This condition happens when control signal VCCON is cleared by section 920B, and VCCON causes power supply 172 to turn power voltage VCC on or off. Power management logic circuit 920 has a power input VCC for section 920A and another power input RTCPWR for section 920B. A common supply rail is provided for ground connection.

PPU 110 has control inputs PWRGD5 (to section 920A) and PWRGD3 (to section 920B) respectively connected to power supply 172. Active PWRGD5 and PWRGD3 indicate available 5 volt and 3 volt power respectively from the supply 172.

Further PPU 110 pins for RTC section 920B provide a battery low warning input BATLOW from any appropriate battery sensor, an ON Button 28 input ONBTN, and a Suspend/Resume button 32 input SRBTN.

Figure 22:
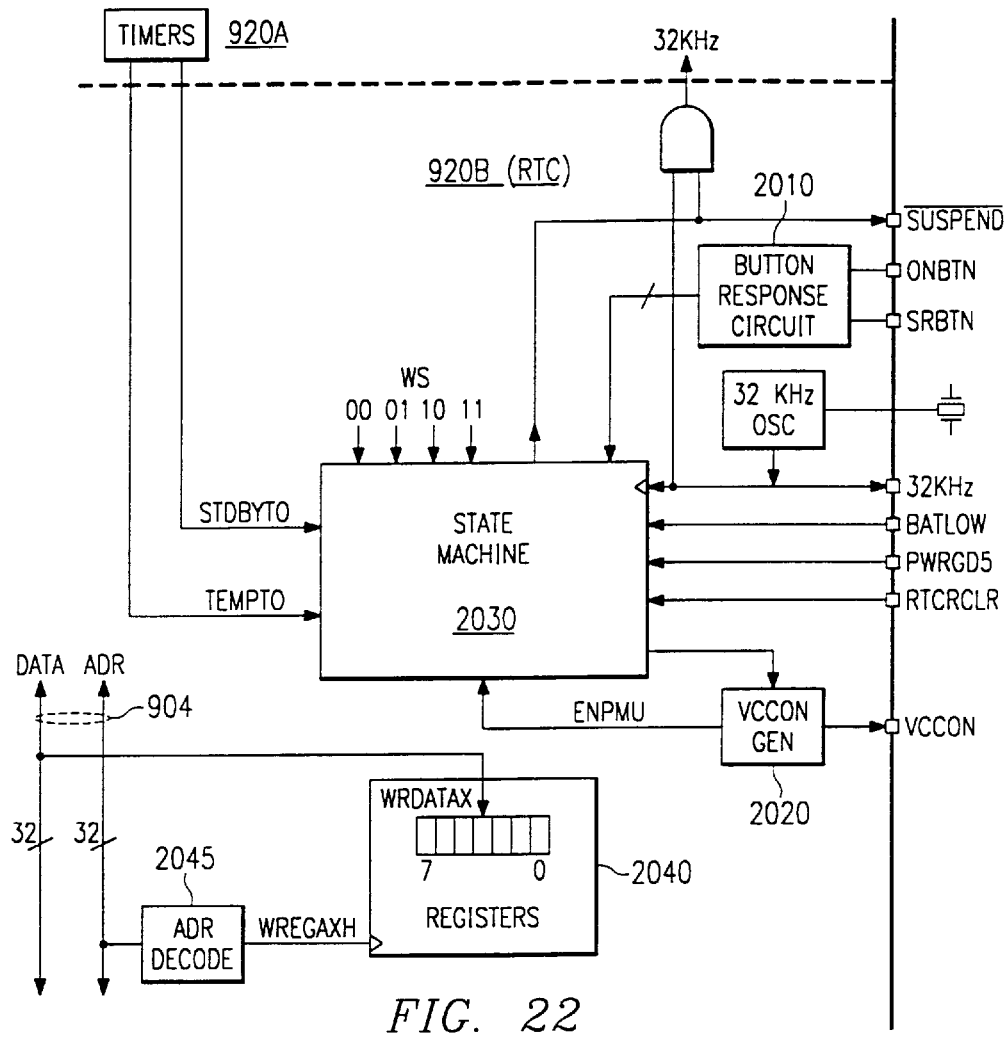
FIG. 22 is a block diagram of a part 920B of a power management circuit embodiment for use in a PPU of FIG. 11.

In FIG. 21 a resistor 1912 is connected between power input RTCPWR and control input RTCRCLR, and a capacitor 1914 is connected between control input RTCRCLR and ground GND, thus providing a power-on reset function for RTC section 920B which has a state machine 2030 of FIG. 22 operative as an internal logic circuit adapted to go to a particular state in response to a voltage on the RTCRCLR control input indicative of a lack or failure of power.

The FIG. 21 power supply 172 which has a 3 volt battery and a 5 volt supply circuit also operable from residential or office wall socket, is connected to first power supply connector 1902. Power supply 172 provides respective system-wide reset signals designated PWRGD3 and PWRGD5 for all devices as may be desired to utilize such reset signals on the 3.3 volt and 5 volt power planes of FIG. 62 circuit board 302 respectively.

A second power supply such as a temporary power cell (e.g., coin cell) 1930 is connected to a further power supply connector 1932. A power-channeling circuit 1936 is connected to both supply connectors 1904 and 1932 and to power input RTCPWR of PPU 110. Power-channeling circuit 1936 has a pair of diodes 1942 and 1944 connected together at their cathodes and therefrom to power input RTCPWR. Diodes 1942 and 1944 also have their anodes connected separately to connector 1904 for supply 172 and to connector 1932 via a drain-limiting resistor 1946 for coin cell 1930.

Power management logic circuit section 920B has logic (in circuitry 2010 of FIG. 22 for system on/off responsive to a first control input ONBTN, and ON/OFF switch 28 of FIG. 21 coupled to input ONBTN via a contact bounce suppressor having a parallel combination of a resistor 1954 and capacitor 1956. Further logic in circuitry 2010 of FIG. 22 provides for suspension and resumption of operation responsive to a control input SRBTN, and SUSPEND/RESUME switch 32 of FIG. 21 is coupled to input SRBTN via its own contact bounce suppressor having a parallel combination of a resistor 1964 and capacitor 1966. The outputs of Button Response circuit 2010 are ON Button Trigger pulse OBTNTGR and Suspend/Resume Button Trigger pulse SRBTNTGR.

A MOSFET transistor 1970 is connected between both switches 28 and 32 and the ground supply rail. The transistor 1970 is controlled by a voltage at a battery-dead terminal BATDEAD# (see connector 1904) to disconnect both switches 28 and 32 from the ground supply rail when the voltage at the battery-dead terminal is indicative of a battery-dead condition.

Further in connection with BATDEAD# is a diode 1972 connected between BATDEAD# terminal of supply 172 and pin PWRGD3 of PMU 920, to inactivate PWRGD3 at PMU 920 when the battery is dead (BATDEAD# low). A resistor 1974 is provided between the PWRGD3 terminal of PMU 920 and PWRGD3 terminal of supply 172, advantageously limiting current from PWRGD3 of supply 172 in case it is high when BATDEAD# is low and overriding the PWRGD3 supply 172 signal.

A leakage control circuit 1975 is implemented on-chip in PMU 920, to eliminate a leakage current which flows through the ONBTN AND SRBTN button inputs of the chip 110. Nominally ten microampere (10 uA) pull-up p-channel FET transistors 1976-ON and 1976-SR are respectively connected between power conductor RTCPWR (also called VCC_RTC) and the on button input pin ONBTN or the SR button input pin SRBTN. Nominally one hundred microampere (100 uA) pull-down n-channel FET transistors 1978-ON and 1978-SR are respectively connected between the ground or common power conductor and the on button input pin ONBTN or the SR button input pin SRBTN.

A NAND gate 1979 has its output connected connected to the gates of both transistors 1978-ON and 1978-SR. NAND gate 1979 further has its output connected to the input of an inverter 1977. The output of inverter 1977 is connected to the gates of both pull-up transistors 1976-ON and 1976-SR.

NAND gate 1979 is fed by a programmable input bit INBLRES and qualified by inputs for signal SUSPEND and low battery BATLOW. NAND GATE 1979 determines whether the pull-ups 1986-ON and 1986-SR should be disabled through inverter 1977 connected between the output of NAND gate 1979 and the gates of those pull-ups. If the INBLRES bit is reset to zero (0), the pull-ups are enabled; if it is set to one (1), then the pull-ups are disabled when the system is in either the 5V SUSPEND or 0V-SUSPEND states of below-described state machine 2030, provided the BATLOW input is active. The output of NAND gate 1979 is also connected to the gates of both of the pull-downs 1978-ON and 1978-SR. In this way the inputs ONBTN and SRBTN to a Button Response Circuit 2010 of FIG. 22 are free of leakage, thereby increasing battery life of system 100.

Circuitry 1980 of FIG. 21 advantageously recognizes that even when the lid of notebook 6 of FIG. 1 is down, thus pressing suspend button 32, the notebook 6 should be on and/or resumed if it is inserted into docking station 7 and docking station power is on.

In FIG. 21, notebook 6 upon insertion makes connection via connector 45 of FIG. 3 or connector 89 of FIG. 4, as the case may be. A grounded pin GND of this connector 45 mates to a notebook pin that is otherwise pulled up by a resistor 1981 connected to notebook VCC (indicated as a top-hat on the resistor 1981). Insertion causes pin GND to pull down the notebook pin and thus the emitter of an NPN bipolar transistor 1982, as well as an input of an inverter 1982 described later hereinbelow.

Also upon insertion, a VCC pin of connector 45 of docking station 7 places voltage across a pull-down resistor 1984 in notebook 6. This voltage causes current flow through a resistor 1985 to the base of transistor 1982, turning transistor 1982 on, and forcing the bases of a pair of PNP bipolar transistors 1986 and 1990-SR and their base pullup resistor 1987 low via the collector of transistor 1982. The collector of transistor 1982 is suitably made available for sensing at an I/O port of the system. The emitters of transistors 1986 and 1990-SR are connected high in notebook 6, and with bases low, transistors 1986 and 1990-SR turn on, and their collectors go high. An NPN transistor 1990-ON has its emitter grounded and its base commonly connected to and ordinarily pulled down by a resistor 1991. When transistor 1986 collector goes high, however, current flows therefrom to the base of transistor 1990-ON via a resistor 1992, turning on transistor 1990-ON whereupon its collector goes low. A pair of resistors 1995 and 1996 connect the collectors of transistor 1990-ON and 1990-SR to the respective ONBTN and SRBTN inputs of PMU 920B. With transistor 1990-SR conductive, the SRBTN input is forced high regardless of the state of switch 32, resuming the notebook 6. In case the notebook 6 had button 28 turned OFF (switch open), the conductive transistor 1990-ON pulls PMU input ONBTN low and turns on the notebook 6. Advantageously, when the notebook 6 is away from docking station 7, transistors 1990-ON and 1990-SR are non-conductive, and their independent connections to inputs ONBTN and SRBTN prevent any cross-coupling or unintended operation at either of these inputs.

Circuitry 1980 is also suitably implemented in CMOS transistors and located on-chip in PMU section 920B of PPU 110. Circuitry 1980 is made responsive in such embodiment to an input pin DOCK connecting to VCC of docking station 7 upon insertion of notebook 6.

Upon power-up in notebook 6 caused as described above by insertion into docking station 7, inverter 1983 is enabled by a voltage from FPGA chip 124 (FIG. 6) detecting a polling request signal from software. Inverter 1983 output goes high on XBUS XD due to its input low. The output high is polled by the software so that system 100 detects valid insertion of notebook 6 into docking station 7 whereupon software releases the inverter 1983 enable.

In FIG. 22 power management section 920B in PPU 110 has a button response circuit 2010, a VCCON generator 2020, a state machine 2030 and register block 2040. The button response circuit debounces the button inputs ONBTN and SRBTN producing respective active-high, predetermined duration, button trigger pulses OBTNTGR and SRBTNTGR in response to the first low-going transition for the respective button input and ignoring any other input activity for that button for a predetermined duration which is longer than the trigger pulse.

Figure 23:
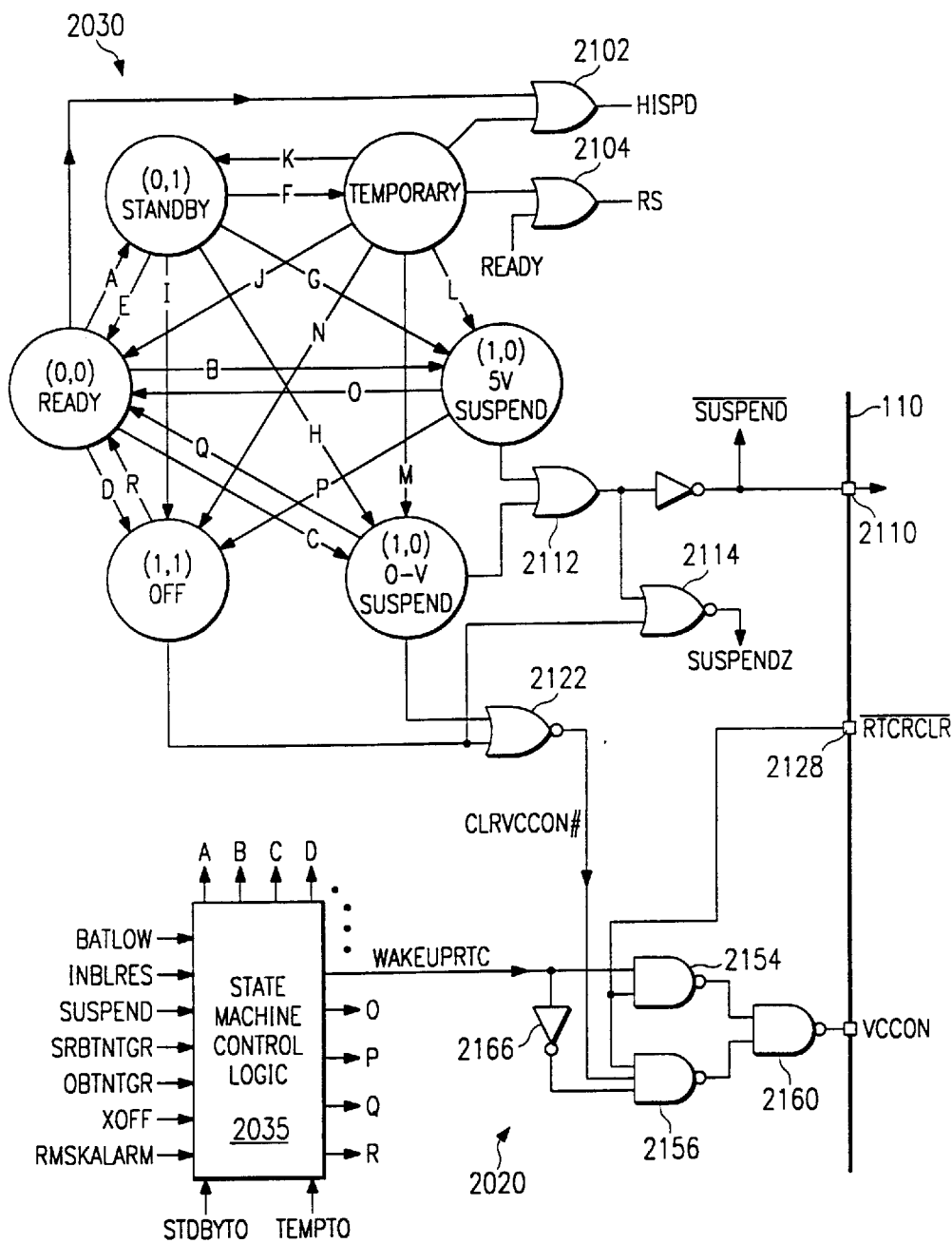
FIG. 23 is a state transition diagram of power management states in a preferred embodiment of the power management system of FIG. 22, as well as circuitry for same and method of operation.

VCCON generator 2020 and state machine 2030 are described in FIG. 23.

Further in FIG. 22, register block 2040 includes five register bytes at locations 0A0h–0A4h which retain important data for the power management unit 920. These registers are described in a tabulation of PMU registers elsewhere herein, and include 3 bytes at 0A0–0A2h for 24-bit register PMU-Control, an open byte at 0A3h for register expansion, as well as a byte at 0A4h for 8-bit register Mask-Resume. Data is read or written to/from bus 904 on lines WRDATAX (x=register identifying number 0–4) to the register x. A register address decode block 2045 decodes addresses on an address portion ADR of bus 904, and when an address 0A0–4 of a register x in block 2040 is detected, a Write-Register clock input WREGAxh is activated for the appropriate register byte indicated generally by spaces 7-0 in block 2040 of FIG. 22.

In FIG. 23 a state transition diagram of state machine 2030 has six states READY (0,0) state 0, STANDBY (0,1) state 1, TEMPORARY state 2, 3V SUSPEND (1,0) state 3, 0-V SUSPEND (1,0) state 4, and OFF (1,1) state 5. The circuitry of state machine 2030 is sequential logic established in random logic, or in a PLA (programmable logic array), in a control ROM or any other form suitable for the application at hand. The state machine 2030 remains in any one current state reached by it until a transition signal initiates a transition from the current state to another state predetermined by the identity of the alphabetically letter designated transition signal as defined in the Transition State Table herein. Transitions occur from any one of the six states to another of them in response to transition signals associated with the illustrated transition arrows A, B, C, D, E, F, G, H, I, J, K, L, M, N, 0, P, Q, R. Also, the state transition diagram represents steps in a preferred method of operation in system 100, PPU 110, PMU 920 and RTC 920B.

Figure 27:
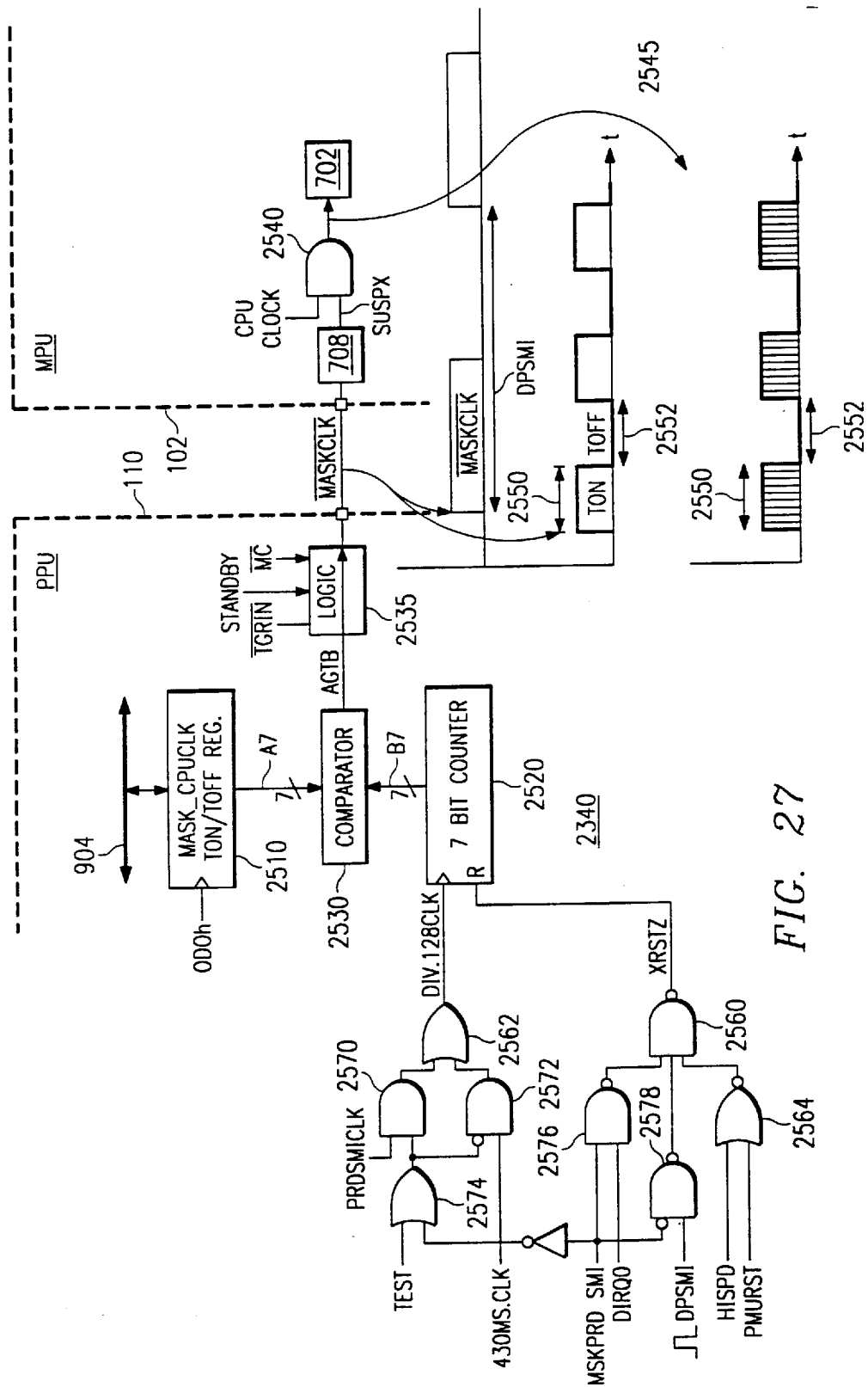
FIG. 27 is a partially schematic and partially block diagram of a mask clock generator 2340 embodiment in FIG. 23 connected to clock circuitry in the MPU of FIGS. 5, 9, 33 and 36, together with waveform diagrams.

STANDBY mode activates pulse width modulation of the MPU 102 clock as in FIG. 27. Transitions into and out of STANDBY state or mode involve clock control considerations due to a phase lock loop PLL internal to MPU 102 as described in connection with FIGS. 33, 34 and 36. If the CPU clock is fully stopped, the DOS timer tick (IRQ0 of FIG. 43) is not executed, so the DOS clock is updated based on the battery powered RTC 918 of PPU 110, when the Standby mode is exited.

3V SUSPEND Mode keeps most motherboard 302 (FIG. 8) logic powered but in a static low power state, and transition out of this mode quickly resumes the user application that was executing beforehand. This mode is preferable to the OFF state except when the battery pack simply goes dead or is removed. System power consumption in the milliwatt range or less can be achieved in 5V Suspend mode, and this consumption is comparable to the power loss associated with the self discharge current in NiCad and NiH cells.

Clock control for 3V Suspend turns oscillators and PLL off, as contrasted with Standby Mode which keeps them going and gates clocks out. In the preferred embodiment, the PCI and CPU clocks make the clock transitions off and back on in a glitch free manner with minimum pulse widths maintained. Clocks to devices that are reset when Resuming need not be restarted cleanly.

Power supply surge currents during 3V Suspend/Resume transitions are reduced or eliminated by keeping signals driven to VCC rails during these transitions. Also, the power supply 172 is suitably designed to accommodate surges with control circuitry that operates in a constant frequency, pulse width modulated (pwm) mode for larger output currents, and operate in a hysteretic control mode for lower output currents.

Zero volt suspend (0V SUSPEND) stores the state of the computer to disk before powering the system off. In this way, the state of the computer can be restored as in 5V Suspend mode, with the main difference being a longer amount of time to resume from 0V Suspend due to HDD spin up time and saving the state of trackball/mouse 144.

A first method of trackball/mouse state save comprises the step of adding a custom command to the trackball scanner 118, then executing the command to read the state of the trackball/mouse, and saving the state of the trackball/mouse thus read.

A second different method of trackball/mouse state save comprises the step of adding custom code to a keyboard controller to store host CPU commands related to the trackball state as these commands are sent to the trackball. Upon entry of the 0V Suspend state, a next step executes these commands read the state of the trackball/mouse, and an additional step saves the state of the trackball/mouse thus read.

Swapping battery packs without losing 5V Suspend power is successfully accomplished by an on-board-302 VCR capacitor and/or rechargeable lithium cell. A one-farad VCR capacitor can provide 5V Suspend power for about half a minute. Rechargeable lithium coin cells such as coin cell 1930 of FIG. 21, can provide one or more hours of 5V Suspend power. Additional circuitry is suitably provided to charge the coin cell in FIG. 21. An optional diode 1945 or a FET transistor circuit similarly connected in place of diode 1945 in FIG. 21 advantageously charges the coin cell 1930 when it is low on charge. Docking station VCC is supplied to a CHARGE input of power supply 172 for battery charging when the notebook 6 is inserted.

In FIG. 23, some output signals from the state machine 2030 are developed by combinational logic using the states (assumed high active for illustration) as inputs. For example, a signal HISPD indicative of high speed operation is active at the output of an OR-gate 2102 when state machine 2030 is in either READY or TEMPORARY state. Another signal RS is active at the output of an OR-gate 2104 when state machine 2030 is in either the STANDBY or the TEMPORARY state. A SUSPEND signal output pin 2110 from PPU 110 becomes active at the output of inverter fed by an OR-gate 2112 when state machine 2030 is in either the 3-V SUSPEND or the 0-V SUSPEND state. A NOR gate 2114 provides a complementary signal SUSPENDZ in response to SUSPEND as one input and the OFF signal as another input.

A low-active control signal CLRVCCON# (Clear VCC ON) is supplied by a NOR-gate 2122 from inputs 0-V SUSPEND or OFF.

Among its other advantageous features, power management logic 920 thus has a state machine circuit 2030 having a plurality of states (FIG. 23) in addition to an OFF state (OFF representing that the system is to be turned off). The state machine circuit 2030 is adapted to respond to presence of power from power supply connector or section 1904 (FIG. 21) when power is absent from a first power supply connector 1902, to transition from at least one of the plurality of states in FIG. 23 to the OFF state.

STANDBY Mode involves slowing, masking or stopping the CPU clock, and other clocks are suitably controlled as well. The MPU 102 may be the second largest power consumer in a backlit portable PC system 100 and thus is a target for power management.

In FIG. 23 the VCCON generator 2022 of FIG. 20 is detailed further, showing the development of the signal at output pin VCCON of PPU 110. Transition logic 2035 is combinational logic that develops the clock signals A–R for latches that define the six states of state machine 2030 according to the Transition States Table. Also, part of this logic 2035 develops a signal WAKEUPRTC (same as causes transition R of the Table) for VCCON generator 2020. A MASK_RESUME register tabulated elsewhere herein allows selected event-sources such as ON-button, S/R button, modem ring, alarm, etc., to be masked or selected to resume the system in Transition "0" from 3V-SUSPEND to READY as tabulated.

In the VCCON generator 2020, the control pin 2128 input RTCRCLR# is fed to a NAND gate 2154 as well as a NAND gate 2156. The output of gates 2154 and 2156 are connected to respective inputs of a NAND gate 2160 which drives the VCCON output pin. Control signal WAKEUPRTC is fed to another input of NAND gate 2154 and is inverted by an inverter 2166 which feeds another input of NAND gate 2156. Signal CLRVCCON# is connected from the output of NOR gate 2122 to a third input of NAND gate 2156.

In this way, when RTCRCLR# is low, it forces the outputs of both NAND gates 2154 and 2156 high, forcing the VCCON output of NAND gate 2160 low, clearing VCCON. If RTCRCLR# is high, however, it qualifies both NAND gates 2154 and 2156. If WAKEUPRTC is high, then NAND gate 2154 output goes low, forcing the VCCON output of NAND gate 2160 high, thereby turning on VCCON as part of a wake-up function. If RTCRLCR# is high, and WAKEUPRTC is low, then both NAND gates 2154 and 2156 are qualified as before, but the low WAKEUPRTC forces the output of NAND gate 2154 high, qualifying NAND gate 2160, and inverter 2166 feeds a high qualifying input to NAND gate 2156. Then CLRVCCON# (active low) controls output VCCON (because both NAND gate 2156 and NAND gate 2160 are otherwise qualified), and, for example, a low or high signal CLRVCCON# forces output VCCON low or high respectively.

Figure 24:
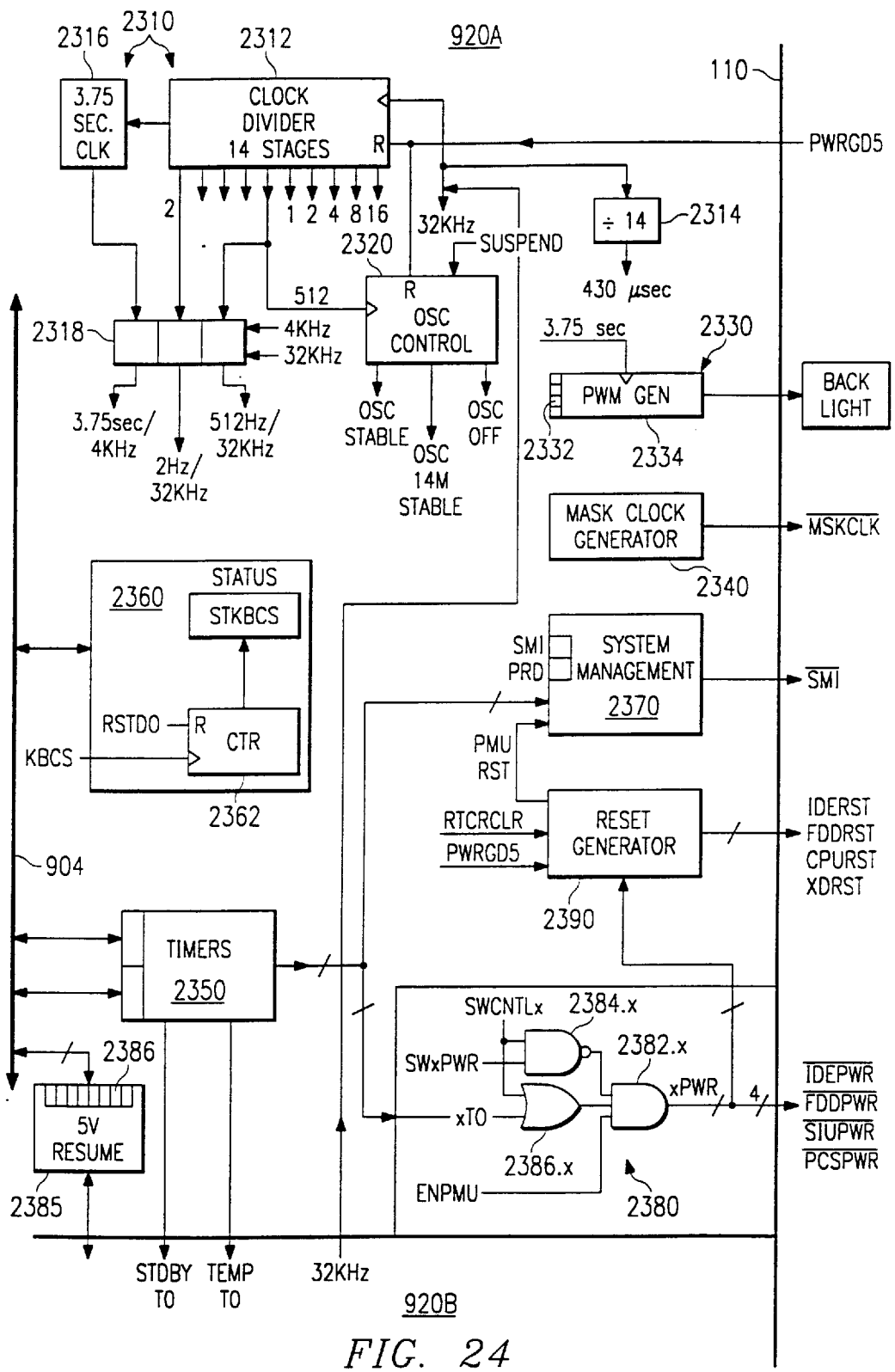
FIG. 24 is a block diagram of another part 920A of the power management circuit embodiment in the PPU of FIG. 11.

In FIG. 24 PMU portion 920A has a clock divider circuit 2310, an oscillator control circuit 2320, a backlight PWM generator 2330, a mask clock generator 2340, a timer circuit 2350, status counters circuit 2360, system management interrupt circuit 2370, a peripheral power control circuit 2380, a Resume 5V circuit 2385, and a Reset generator 2390. All the circuits in this PMU portion run under power from the power supply in this embodiment, and not from a battery like RTC 920B, so that RTC 920B can disable all these circuits in section 920A.

Clock divider circuit 2310 in PPU 110 is realized by a multi-stage counter 2312 that has a 32 KHZ. clock input from MPU 102 of FIG. 5. Counter 2312 is resettable when power is uncertain, by an externally supplied control signal PWRGD5 to turn the system off upon the completion of at least one clock cycle of the clock circuit.

The counter 2312 has 14 stages and provides successive divide-by-two clocks at 16, 8, 4, 2, and 1 KHz, and 512, 256, 128, 64, 32, 16, 8, 4, and 2 Hertz. Clock divider circuit 2310 further has a divide-by-14 circuit 2314 clocked by 32 KHz. input to produce an output clock with a period of 430 microseconds (a little faster than 2 KHz.). Still another circuit 2316 divides the counter 2312 four (4) Hertz output by fifteen (15) to produce a clock with a period of 3.75 seconds. A clock substitution circuit 2318 substitutes 32 KHz. for each of the 512 Hz. and 2 Hertz outputs, and 4 KHz. for the 3.75 sec. clock output, in response to the PWRGD5 signal and a test input.

Oscillator control circuit 2320 is responsive to the 512 Hertz clock, PWRGD5 and SUSPENDZ signals to sense the clock oscillator state as OSCILLATOR STABLE, OSCILLATOR OFF, AND OSC14M STABLE. Circuit 2320 senses a number of successive cycles to determine stability.

PWM generator 2330 has a 4-bit or other multibit software programmable control register 2332 to produce a backlight adjust control signal at a BLADJ output pin of PPU 110. Register 2332 variously qualifies clocked-AND-gates and clocked OR-gates in a logic circuit 2334 and thereby controls a combination of clock pulses from 1 KHz., and 512, 256 and 128 Hertz clock outputs of clock divider circuit 2310 to establish the duty cycle of the BLADJ signal in correspondence to the binary value represented by the bits in register 2332. For example, each clock has a 50% duty cycle. ANDing two of them together reduces the duty cycle to 25%. ORing two of them increases the duty cycle to 75%. The results of the AND and OR can be still further logically combined with other AND and OR operations with the other clocks to produce a continuous range of duty cycles. If all the bits are ones, then BLADJ has 100% duty cycle for full-on back lighting of system 100 by the BACK LIGHT of FIG. 2.

Mask Clock generator 2340 in PPU 110 advantageously provides a pin output MSKCLK# variable duty cycle low frequency control signal to periodically turn on and off the high speed clock in MPU 102, as described in more detail by reference to FIG. 27.

Figure 28:
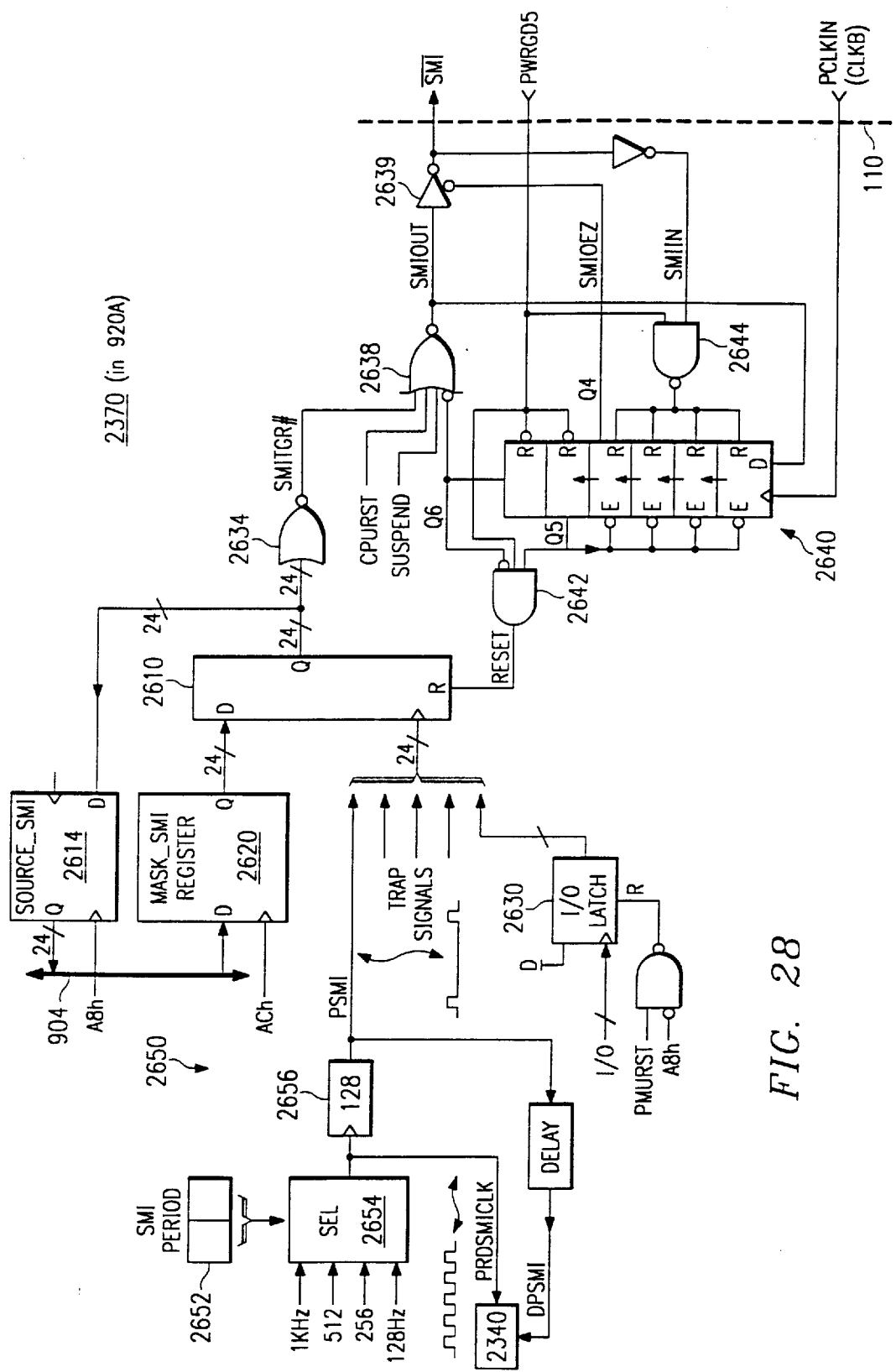
FIG. 28 is a partially schematic and partially block diagram of a system management interrupt circuitry 2370 embodiment in FIG. 24.

Timers block 2350 produces timer outputs for system management interrupt block 2370 of FIGS. 24 and 28 and for peripheral power circuit 2380. Timers block 2350 is described in more detail in connection with FIG. 25.

Figure 45:
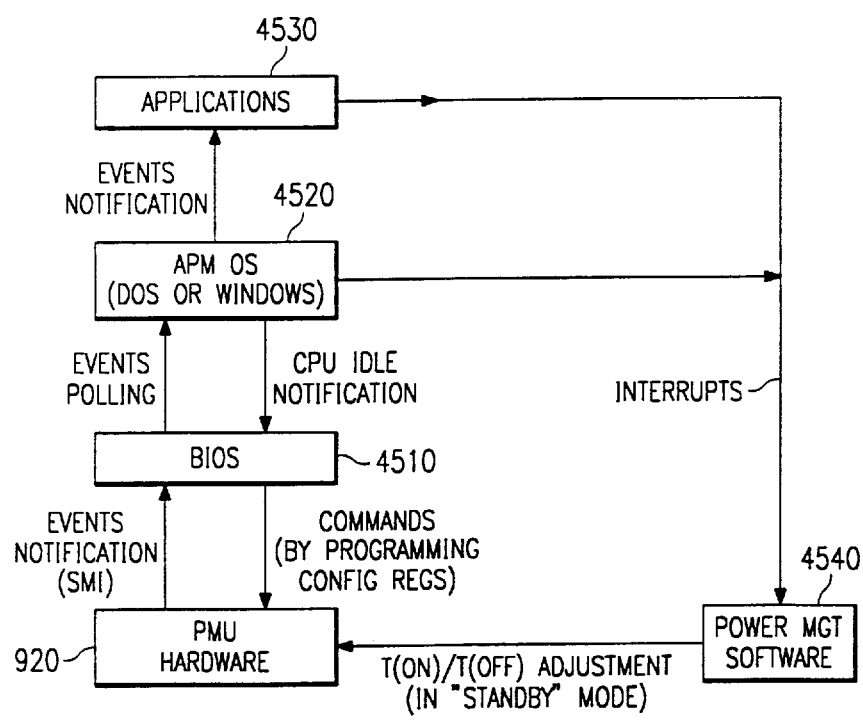
FIG. 45 is a flow diagram of a process or method of operation of the preferred embodiment system of FIGS. 5–7.

Status counters block 2360 provide software readable event history statistical information accessible from bus 904 and useful in active power management software such as in FIG. 45. Status counters block 2360 includes status information for I/O such as serial port COM1, parallel port LPT1, mouse MSINT, keyboard KBINT, bus 104 interrupt (e.g. PCI-INTA), drive trigger signal DRVTGR, X-drive signal XDRV, and display (e.g. VGA). For example, a 4-bit KBCS counter 2362 (or a counter of any of the above-listed event signals) counts KBCS event pulses and produces an output status register value STKBCS (which counts the number of events of that type since the last poll by software) which is software accessible (such as by active power management software or by BIOS) to facilitate program monitoring and control of the system based on the counter information developed in and concatenated from the status counters block 2360. These counters saturate and do not roll over and instead are reset when desired. A LAN event counter is weighted differently from a HDD event count by active power management software, for example.

System Management block 2370 is described in more detail in connection with FIG. 28. It has SMI period register control bits SMIPRD, and timer inputs from timers block 2350. Also, another SMI input receives a power management unit reset PMURST signal that also resets some PMU 920 circuitry on return from 5V SUSPEND.

Peripheral power block 2380 produces PPU 110 output signals for 1) hard disk power IDEPWR, 2) floppy disk power FDDPWR, 3) serial interface unit power SIUPWR and 4) programmable chip select power PCSPWR. The foregoing numbers 1–4 representative of IDE, FDD, SIU and PCS are indicated by "x" in the following description. Peripheral power block 2380 has four AND gates 2382.x producing outputs xPWR to output pins. All four of AND gates 2382.x are qualified at a first input by the enable power management unit ENPMU signal. Each AND gate 2382.x has a second input connected to an output of a corresponding NAND gate 2384.x, and a third input connected an output of a corresponding OR-gate 2386.x. Each NAND gate 2384.x has a first input connected to a respective enable control signal SWCNTLx corresponding to bits 7, 5, 3 and 1 of the SW_PWR_CNTL register and a second input connected to a respective high active power signal SWXPWR corresponding to bits 6,4,2 and 0 of the SW_PWR_CNTL register tabulated elsewhere herein. NAND 2384.x inverts SWXPWR to produce low-active output for FIG. 20 power on in block 170, in advantageous software-controlled power management.

Each OR-gate 2386.x has a first input connected to the respective software control signal SWCNTLx as above and a second input connected to a respective timer time-out hardware control signal xTO, in advantageous hardware-type passive power management. When software control enable SWCNTLx is low (software control disabled, hardware control enabled), and xTO goes high on hardware timer timeout for that peripheral x, then power is cut off to the timed out peripheral x via AND gate 2382.x suppling inactive-high to a line for that peripheral in block 170 of FIG. 20.

Resume 5V circuit 2385 provides a wakeup from 5V-SUSPEND state 3 of the state machine 2030 of FIG. 23. A register 2386 has the software-readable eight top 16–23 bits of the PMU_CNTRL register as described in the table for that register. Notice that the function of the Resume 5V circuit 2385 is closely associated with the state machine 2030 in the 3 volt well 920B but the location of the Resume 5V circuit 2385 is in the 5 volt well in circuit 920A. This physical layout embodiment keeps gate count low in the 3 volt well 920B and keeps power consumption low when only the 3 volt well 920B is powered.

Reset Generator 2390 supplies outputs to PPU 110 pins IDERST for hard disk reset, FDDRST floppy disk reset, and XDRST for peripherals on the XD bus. Internal resets PMURST for the power management circuitry 920 and a bus 104 reset BUSRSTOUT (e.g. BUS=PCI) are also provided.

Figure 25:
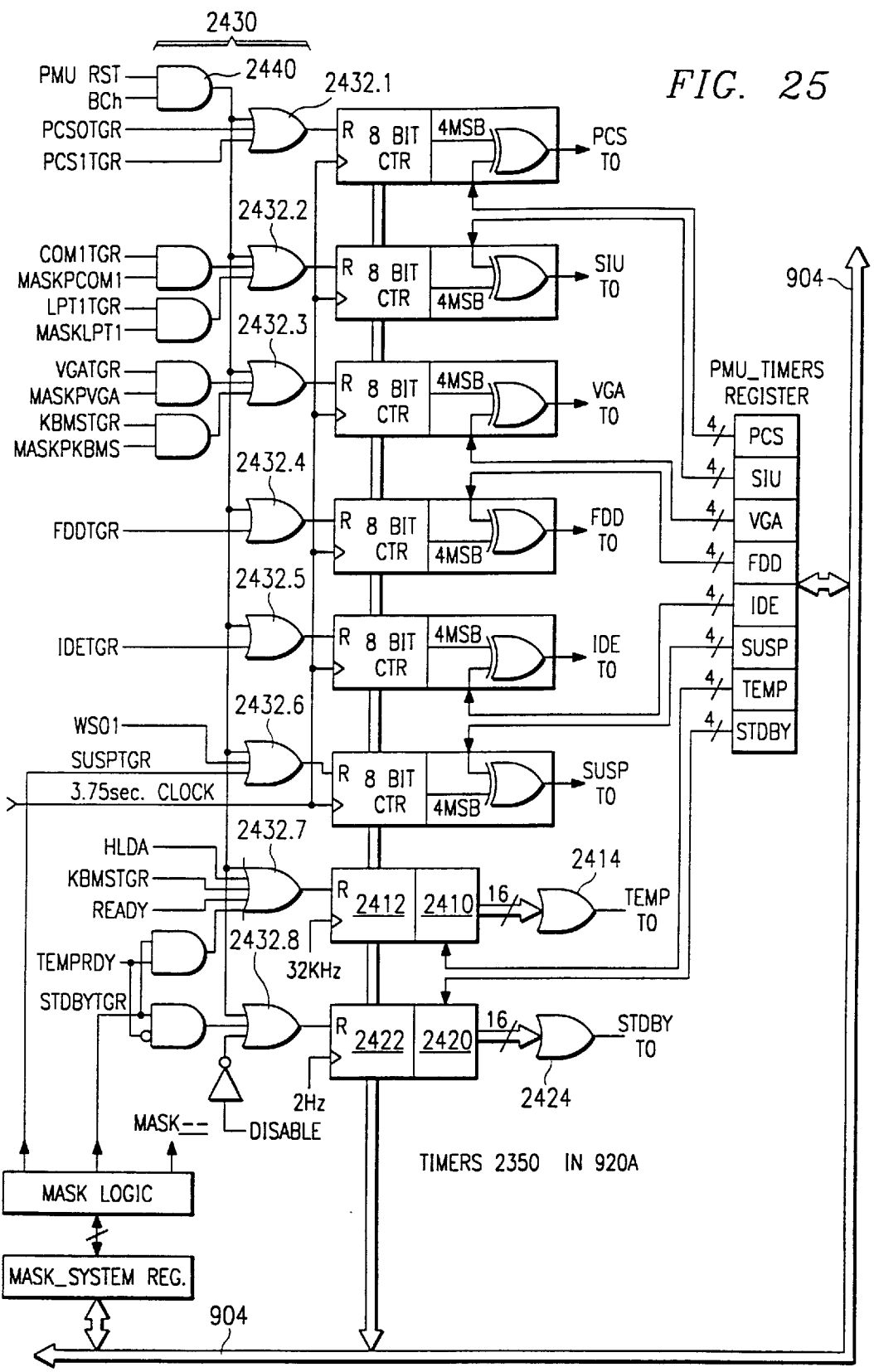
FIG. 25 is a partially schematic and partially block diagram of a timers block 2350 in FIG. 24.

In FIG. 25 Timers block 2350 in PMU section 920A of FIG. 24 has eight timer counters, each fed four-bit codes from eight (8) corresponding four-bit sections of a software-accessible 32 bit register PMU_TIMERS connected to bus 904. The sections and corresponding timers for this register PMU_TIMERS are tabulated under its name elsewhere in. Also tabulated are a translation of the four-bit codes into time-out values. A 0000 code disables each timer. The timer timeout values are 0–15 minutes with minutes coded to binary, except that the Standby Timer STDBY is nonlinearly coded up to 15 minutes as shown for bits 31–28, and that the Temporary Timer TEMP is nonlinearly coded in tens of microseconds and then in milliseconds up to 15.36 milliseconds. The VGA timer is linearly coded up to 14 minutes and then "1111", equals 8 seconds.

Further in FIG. 25, timers PCS, SIU, VGA, FDD, IDE, and SUSP are all eight-bit binary counters, each with one time-out digital output lines fed by a 4-bit comparator (indicated by XOR exclusive OR symbol) that compares the four MSBs (most significant bits) of each counter with the 4-bit code supplied from register PMU_TIMERS. Each of these six just-mentioned counters have a clock input connected to the 3.75 second period clock from block 2316 of FIG. 24. The timer STDBY has its clock input connected to the 2 Hertz output from block 2312 of FIG. 24. The short-time timer TEMP is clocked directly by 32 KHz. clock. Timers TEMP and STDBY have timer decode circuitry 2410 and 2420 respectively connected to the counters 2412 and 2422 in each timer. The timer decode circuitry 2410 and 2420 each provide 16 output lines to OR-gates 2414 and 2424. Only one of the 16 output lines from each timer TEMP and STDBY is high at any time, depending on the results of the decode.

The eight timer counters each have a reset input which is responsive to a respective block of combinational logic 2430 having an OR gate 2432.1–.8. A first input of each OR gate 2432.1–.8 is connected to the output of a common AND gate 2440. The latter gate 2440 provides an active output when PMU reset signal PMURST is active and a register write signal WREGBCH is active. (BC hex is an address.)

A MASK_SIU_VGA register is tabulated with the rest of the timer registers, and provides signals (designated with the prefix MASK ahead of event names COM1, LPT1, KBMS, VGA) which mask system events when they are not intended to be monitored by the timer SIU or VGA associated with the combinational logic 2430 fed by a signal line for that event. The reset logic for the timers is illustrated in FIG. 25.

This reset logic confers advantages including important system flexibility and power management configuration. For instance, keyboard activity via KBMSTGR can be used or not (depending on mask bit MASKPKBMS), for resetting the VGA display timer in FIG. 25. Analogous statements are evident for each of the various triggers_TGR and masks in the context of the circuits to the timers of FIG. 25.

In FIG. 25, the reset logic of the SUSP, TEMP and STDBY timers is described further. A suspend reset event SUSPTGR is implemented in combinational logic MASK LOGIC by OR-ing the outputs of fifteen AND gates. The fifteen AND gates respectively AND together each of 15 system event signals with its corresponding mask bit in the set of mask bits 0–14 (event prefixed by SUSP for mask) in register MASK_SYSTEM as described in its tabulation.

A standby reset event STDBYTGR is implemented in combinational logic by OR-ing the outputs of another fourteen AND gates in MASK LOGIC. The fourteen AND gates respectively AND together each of 14 system event signals with its corresponding mask bit in the set of mask bits 16–29 (event prefixed by STDBY for mask) in register MASK_SYSTEM as described in the tabulation for that register. Refer to FIG. 15 for HLDA and FIG. 23 for state or mode signals to timers of FIG. 25.

In FIG. 26, a description of the STDBY nonlinear timer is given in detail. The description of the TEMP nonlinear timer in one embodiment is the same, and therefore omitted, except that the input clock is as shown in FIG. 25, and the connection to PMU_TIMERS register is analogous. In another embodiment the TEMP timer is different as is shown in the upper part of FIG. 26 and described.

In FIG. 26B, STDBY timer has a counter 2422 clocked by 2 Hz. clock and reset by logic of FIG. 25. The 4 bit nibble STDBY in register PMU_TIMERS is fed to the 4-bit input of a 4-to-16 binary decoder 2455. Sixteen lines from the 16-bit output of decoder 2455 connect to 16 first inputs of 16 NAND gates 2457.1, 2457.2, . . . 2457.16 respectively. Counter 2422 produces a multi-bit value which is fed to a decode circuit 2460 which has as many outputs (e.g. 16) as there are NAND gates 2457.n. The decode 2460 has combinational logic which is arranged to produce an output high on only one of the sixteen lines at a time, wherein each line connects to one of 16 respective second inputs of NAND gates 2457.n, and corresponds to a table row in the tabulation for bits 31–28 (STDBYTMR3-0) in the tabulation for the PMU_TIMERS register elsewhere herein. A high on such line corresponds to the occurrence of a counter 2422 value representing the amount of time tabulated in one of the 16 table rows. These times are nonlinear as a function of table row number, in general, and the circuitry of FIG. 26 efficiently performs a nonlinear timer function (with linear as a special case). This nonlinear function can be hardwired into the decoder 2460. Also, an optional programming register 2465 accessible from bus 904 is in a second embodiment provided to drive decoder 2460 in programmable form to implement any tabulation desired. Sixteen outputs of the NAND gates 2457.n are supplied to 16 inputs of a single NAND gate 2470 (analogous to OR-gate 2424) to provide the STDBYTO output. When STDBYTO goes active it clocks a latch 2472 which disables an AND-gate 2474 from passing clock to counter 2422, thereby freezing the counter 2422 value. The counter 2422 can be restarted by a RESET signal on a line connected to the reset inputs of Latch 2472 and counter 2422.

In FIG. 26A, TEMP timer has a nine-bit counter 2412 clocked by 32 KHz. clock and reset by its own logic of FIG. 25. The 4 bit nibble TEMP in register PMU_TIMERS is fed to the 4-bit input of a 4-to-9 mapper circuit 2484 such as a ROM, PAL or combinational logic. The nine bit outputs of counter 2412 and mapper 2484 connect to first and second 9-bit inputs of a comparator 2486 to produce an output HWTO indicative of equality or not. Note that TEMP points to a table row in the tabulation for bits 23–20 (TEMPTMR3-0) in the tabulation for the PMU_TIMERS register elsewhere herein, and the 9-bit mapper 2484 output corresponds to the amount of time tabulated in one of the 16 table rows. These times are nonlinear as a function of table row number, in general, and the circuitry of FIG. 26A efficiently performs a nonlinear timer function (with linear as a special case). This nonlinear function can be hardwired into the mapper 2484. Comparator 2486 detects or responds to an occurrence of a counter 2412 value representing the mapper value to which the TEMP input thereto points. When any one of hardware timeout HWTO, or a software time out line SWTO or a WSO1 control line go active at the inputs of an OR-gate 2488, the output of OR-gate 2488 supplies a high to the D input of a latch 2490 clocked at 32 KHz, thereby providing a Q output TEMPTO for the timer block 2480. When TEMPTO goes active it feeds back to a gate 2492, which prevents 32 KHz clock from reaching counter 2412, thereby freezing the counter 2412 value. The counter 2412 can be restarted by a reset signal on a line RST# connected to the low-active reset R inputs of Latch 2490 and counter 2412. In this way a variety of nonlinear timer embodiments provide speed, programmability, and die area advantages for power management units, timers and integrated circuits generally.

In FIG. 27, the Mask Clock generator 2340 in PMU section 920A of PPU 110 has a software programmable register MASK_CPUCLK (also called TONTOFF) 2510 programmable from internal bus 904 when clocked by signal RREGD0H (decode of D0 hexadecimal register address). A clock signal (e.g.,2 KHz or the 430 microsecond clock) from clock divider 2310 is fed to a 7 bit counter 2520 which counts clock cycles from 0 to 127 and repeats continually. A system reset resets this counter 2520. A comparator 2530 outputs a logic one or zero signal AGTB depending on whether the count in counter 2520 is greater or less than the count in register 2510. Signal AGTB is connected to gating logic 2535. When logic 2535 is qualified by presence of the STANDBY mode, and logic signals trigger input TGRIN#, and mask clock enable MC#, then AGTB passes to an output pin MSKCLK# of PPU 110.

As shown in the waveform diagram in FIG. 27, MSKCLK# has a repetition rate of about 18 Hertz, with a period of 55 milliseconds, when the 430 microsecond clock is counted. 7 bit counter 2520 divides rate by 128, so 430 microsecond period is multiplied by 128 to yield about 55 milliseconds. This low frequency signal is coupled from PPU 110 to MPU 102 as shown in FIGS. 5, 6, and 27. In MPU 102, an AND circuit 2540 gates the nominal 50 MHz. MPU 102 clock to the operative parts of MPU 102 in response to the advantageously variable duty cycle MSKCLK# control signal. Inside MPU 102 the waveform 2545 of the gated clock has a first interval 2550 of high speed pulses followed by another interval 2552 of no high speed clock pulses. The time intervals 2550 and 2552 are the same in both MSKCLK control signal and the gated clock waveform 2545. The frequency of MSKCLK is advantageously low since it is coupled between chips 102 and 110 on printed wiring board 302 of FIG. 8. The gated clock circuitry advantageously occupies only a small area inside MPU 102. The low frequency of MSKCLK# modulating the very high frequency of the CPU clock does not produce significant harmonics, and advantageously avoids radio frequency interference (RFI) or other electromagnetic interference (EMI) at the system or device levels.

The circuitry embodiment as described provides an illustration of an electronic device that has a register for duty cycle data (e.g. TONTOFF) and a clock circuit coupled to the register and control circuitry responsive thereto configured to repeatedly generate an output having a duty cycle responsive to the data and then a plurality of series of clock pulses, the series interspersed or followed with intervals free of, or lacking, clock pulses. Each series has a number of clock pulses and that number is responsive to the data in the register. The register and clock circuit are integrated onto one integrated circuit chip. A microprocessor (e.g. MPU 102) is connected to receive the duty cycle variable output as a modulating signal to produce the series of clock pulses to clock the microprocessor, whereby a resulting modulated clock is has a duty cycle established by the data in the register. The interval free of clock pulses also has a complementary length responsive to the data in the register. The clock circuit has a clock rate, and the series of clock pulses has the same clock rate. The microprocessor device is fabricated on a first integrated circuit, and the clock circuit and register are fabricated on a second integrated circuit chip coupled to said first integrated circuit chip.

Also represented by FIG. 27 is a method of operating a computer system having a microprocessor device and a clock circuit, with a first step of storing data in a register, secondly controlling the clock circuit with the data, and thirdly thereby supplying to the microprocessor device a modulating or masking signal output having a duty cycle responsive to the data, and fourthly, modulating a higher frequency clock signal in the microprocessor device with the modulating or masking signal by interspersing a plurality of series of clock pulses with intervals lacking clock pulses.

The control logic for the reset R input of the 7-bit counter 2520 in FIG. 27 provides important system control and flexibility advantages. For example, a signal shutting off LCD 190 as an SMI depends on the SMI masking in FIG. 28 and can be used to slow down the CPU clock.

A three-input NAND gate 2560 feeds the reset input R of counter 2520, and a two-input OR-gate 2562 feeds the clock input of that counter 2520. A first input of NAND gate 2560 is fed by a NOR-gate 2564. NOR-gate 2564 has two inputs respectively connected to high active signals high-speed control HISPD and power management unit reset PMURST. If either of these latter signals are high, counter 2520 is reset and MASKCLK# is forced inactive high so that the CPU clock runs continually at high speed. These results are exactly what is desired if the state machine 2030 of FIG. 23 is in either the Temporary or the Ready state or if the power management function is reset.

The rest of the control gates at left in FIG. 27 cooperate to provide a clock switch or choice circuit between 430 microsecond clock or a selectable periodic SMI (system management interrupt) clock rate from FIG. 28 (1 KHz, 516, 256, or 128 Hz.). This periodic SMI clock PRDSMICLK is fed to a first input of an AND gate 2570, and the 430 MS.CLK signal fed to a first input of another AND gate 2572. Only one of the AND gates 2572 is qualified depending on the clock selection represented by the output of an OR-gate 2574. A first input to OR-gate 2574 comes from bit 10 of the MASK_SMI Register tabulated elsewhere herein. This bit 10 is called mask periodic SMI or MSKPRDSMI and is fed to a first input of an AND gate 2576 and fed inverted to the first input of OR-gate 2574 and to a low active input of an AND gate 2578.

When MSKPRDSMI is high, the 430 microsecond clock is selected, because OR-gate 2574 output is low and qualifies AND gate 2572. A TEST input to OR-gate 2574 can also be used to select either clock at will, when MSKPRDSMI is high. When MSKPRDSMI is low, OR-gate 2574 output goes high and passes PRDSMICLK through AND gate 2570 and OR-gate 2562 to clock counter 2520.

NAND gates 2576 and 2578 perform a supporting and analogous function for counter 2520 reset. An RTC 918 (FIG. 11) timer tick IRQ0 occurs every 55 microseconds, and is fed delayed by 400 nanoseconds as a signal Delayed IRQ0 (DIRQ0)to a second input of NAND gate 2576. A periodic SMI (PSMI) signal of FIG. 28 can wake up the system 100 every ⅛ second, ¼ second, ½ second or every one (1) second depending on whether the selected SMI clock PRDSMICLK is 1 KHz, 512, 256 or 128 Hz. respectively. A delayed periodic SMI signal DPSMI is fed delayed by 400 nanoseconds to a second input of a NAND gate 2578 in FIG. 27.

The control signal MSKPRDSMI supplied to NAND-gate 2576 and low-active input to NAND 2578 performs the selection between the DIRQ0 and DPSMI reset signal candidates. If MSKPRDSMI is high DIRQ0 is gated through NAND gates 2576 and 2560 to supply a reset every 55 milliseconds. If MSKPRDSMI is low, DPSMI is gated through NAND gates 2578 and 2560 to supply a reset every DPSMI period of ⅛ second, ¼ second, ½ second or every one (1) second depending on the selection in FIG. 28.

As described above, the MASKCLK# circuit 2340 advantageously provides mask clock to support Standby mode at either timer tick rate or in coordination with System Management Interrupt rate.

In FIG. 28 system management interrupt circuit 2370 in section 920A of PPU 110 has 24 data bit latches 2610 which respectively have 24 data inputs from a 24-bit mask register MASK_SMI 2620 which is software programmable bytewise at three byte addresses 0AC–0AE hex from internal bus 904, all as tabulated bitwise elsewhere herein. Data latches 2610 have their 24 Q outputs respectively connected to the 24 D inputs of a register 2614 called SOURCE_SMI. The 24 Q outputs of register 2614 are readable on internal bus 904 bytewise at three byte addresses 0A8–0AA hex also as tabulated bitwise elsewhere herein. This register 2614 is resettable by software when the information about which event triggered a system management interrupt is no longer needed.

The mask register 2620 bits are set to one or zero depending on whether the circuit 2370 is to be responsive or not to a possible SOURCE_SMI tabulated source of SMI interrupt. The 24 data latches 2610 respectively have 24 clock inputs which are separately fed with 24 different trap signals from different interrupt sources. Among the possible interrupt sources are six I/O sources as tabulated for bits 21–16 in register SOURCE_SMI which supply latches 2630 and which have their outputs connected to bit latches 21–16 of the respective clock inputs of data latches 2610.

A Periodic SMI circuit 2650 supplies a clock input of one of the latches 2610. Circuit 2650 has a 2 bit programmable SMI Period register 2652 which controls a clock selector 2654. Clock selector 2654 selects one of four clock signals (e.g., 1 KHz., 512, 256, 128 Hertz) depending on the two bits in register 2652 and passes the clock signal on to a clock input of a counter 2656 that supplies every 128th clock pulse. The output of counter 2656 is connected to a clock input of the latch for bit 10 in latches 2610.

A NOR-gate 2634 has 24 inputs from the 24 Q outputs of data latches 2610. Thus a high from any unmasked interrupt source clocked into register 2610 can force the NOR-gate 2634 output SMITGR# low.

Another NOR-gate 2638 produces low-active SMI output on the SMI# pin of the PPU 110 for MPU 102. MPU 102 acknowledges on the same SMI# line and executes a SMI routine in software according to a process which in a process step that suitably reads SOURCE_SMI register 2614 and in other process steps executes system management operations dependent on the source of the SMI which is flagged in register 2614.

Figure 29:
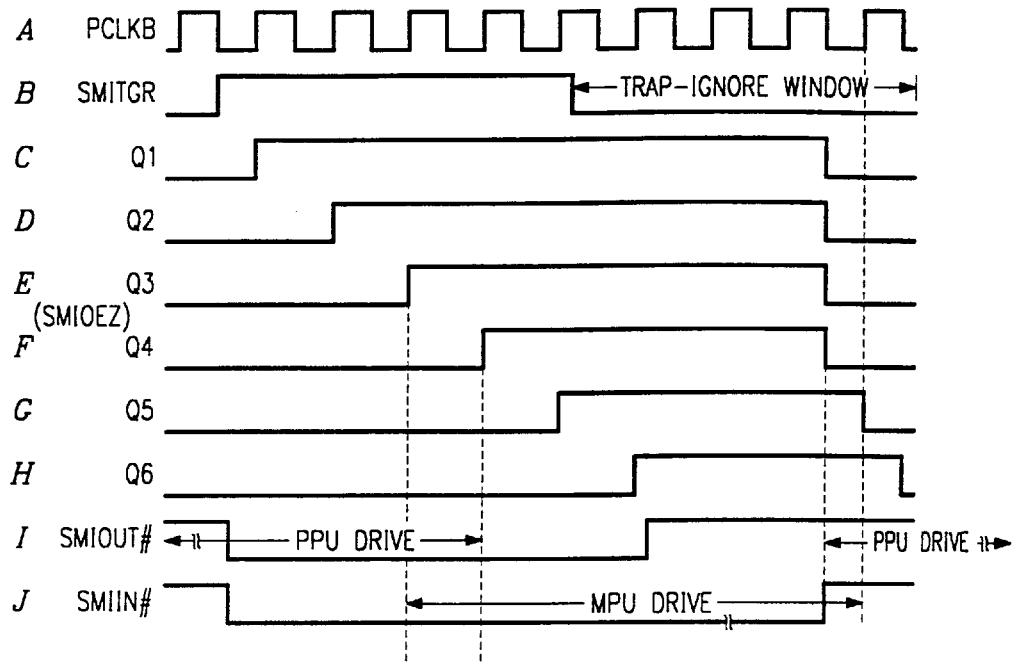
FIGS. 29A–J are a waveform diagrams of clock signals and control signals showing an improved method of operation and further describing the operation of the SMI circuitry of FIG. 28.
Figure 30:
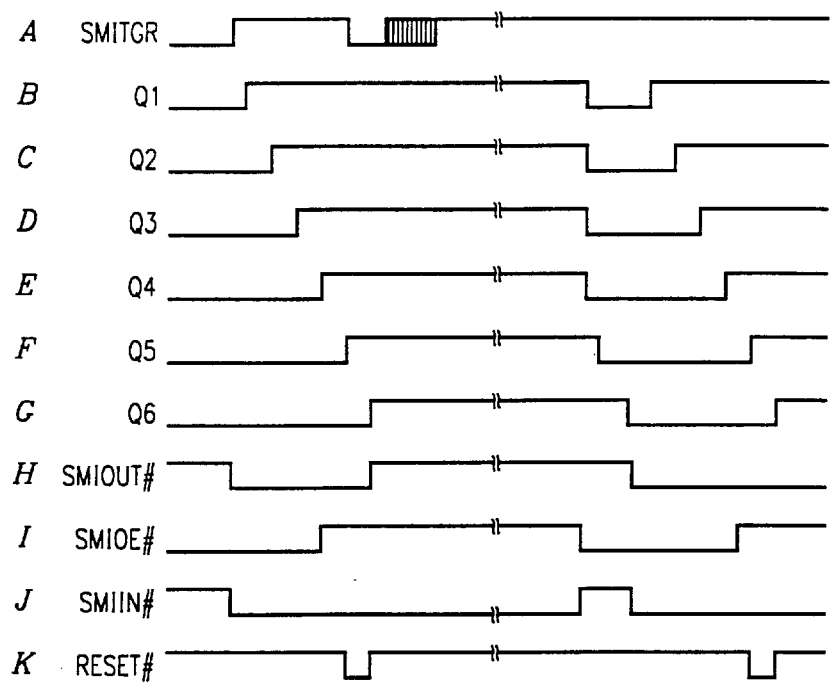
FIGS. 30A–K are a further waveform diagrams of clock signals and control signals showing an improved method of operation and further describing the operation of the SMI circuitry of FIG. 28.

With reference to FIGS. 28, 29 and 30, the operations of SMI circuit 2370 are next described in further detail. According to conventional notation, any one of an over-bar, z suffix, or pound-sign (#) suffix usually indicate a low-active signal unless context clearly indicates otherwise.

NOR-gate 2638 has four inputs including SMI trigger SMITGR# from NOR-gate 2634, CPU Reset signal CPURST, the SUSPEND signal, and a SMI generator control signal Q6. In this embodiment, a system management interrupt SMIOUT# high is generated when a SMITGR# low event is present, and the CPU is not reset, and there is no SUSPEND condition, and control signal Q6 is high. The output of NOR-gate 2638 is fed to the SMI# pin of PPU 110 when inverter 2639 is enabled by low-active SMI output enable signal SMIOEZ due to Q4 low from a multibit shift register 2640.

Control signal Q6 is generated in the operations of a multibit shift register 2640, here six bits long, having shift register sections 2640.1, .2, . . . , .N where N=6 in this embodiment. All of the shift register sections are clocked by the same bus 104 clock signal PCLKIN (PCLKB of FIG. 6) to PPU 110.

Shift register 2640 is connected in the top two bits (e.g. Q5 and Q6) to a respective pair of inputs of an AND-gate 2642. A third input of gate 2642 is qualified by the external power good signal PWRGD5. The output of AND-gate 2642 is connected to a reset input of each of the 24 data latches 2610. Recordkeeping register SOURCE_SMI 2614, by contrast, is reset by software independently of data latches 2610.

When a particular two-bit code (e.g. Q5=1, Q6=0) appears at the top of shift register 2640, qualified AND-gate 2642 supplies an active high reset signal to all of the 24 latches 2610. In this way, the latches 2610 can advantageously sample the 24 interrupt sources repeatedly. Put another way, the shift register 2640 and latches 2610 advantageously cooperate to terminate SMIOUT and a system management interrupt SMI# within a period of time after an interrupt source has ceased requesting or I/O trap signalling for the interrupt, unless the request reoccurs.

Focusing even more specifically on shift register 2640, it is noted that the SMIOUT output of NOR-gate 2638 is fed back to the data input of the first section of shift register 2640, while the output of the top, or last, section Q6 of shift register 2640 is connected to one of the inputs of the NOR-gate 2638. Further, the output state of the next-to-last bit or section (Q5) of shift register 2640 is connected to low-active enable E inputs of Q1–Q4 shift register sections and used to freeze or enable transfers (shifts) from all of the lower sections to their respective next higher section, including to Q5 itself.

A NAND-gate 2644 provides a reset signal to reset inputs R of register 2640 sections Q1–4, namely all but the top sections of shift register 2640, that is, all sections which are not decoded by reset gate 2642. The latter two sections are reset when signal PWRGD5 goes low. NAND-gate 2644 resets shift register 2640 sections Q1–4 when either PWRGD5 goes low or there is no SMI# active low at the SMI# pin of PPU 110.

Let operations in circuit 2370, with reference to FIGS. 28–30 for purposes of description, begin with shift register 2640 reset with Q1–Q6 all low. SMI# is high and inactive until some event signal clocks a latch in latches 2610 that is not masked by register 2620, whereupon NOR-gate 2634 output SMITGR# goes low, and NOR-gate 2638 being otherwise qualified by lows, takes SMIOUT high, forcing SMI# low by PPU circuit 2370 drive. The SMIOUT high is fed to bit Q1 of shift register 2640, and successive bus 104 clock cycles shift the high bit Q1 through stages Q2, Q3, and Q4, into stage Q5. When Q4 goes high, SMIOEZ, which is the same as Q4, disables (three-states) inverter 2639, whereupon MPU 102 continues just-begun SMI-responsive low-drive single-line acknowledge on SMI# as shown by SMIIN# of FIG. 29. Now Q5 is high and Q6 is low, causing NAND gate 2642 to reset all of the latches 2610, and initiate a Trap Ignore Window of FIG. 29, whereupon with gate delays in gates 2634 and 2638, SMIOUT goes back low. Shift register 2640 Q1 goes low, but Q1–Q4 shifting is frozen because Q5 is high. The Q5 high is shifted into Q6, forcing SMIOUT low, but releasing the reset from AND-gate 2642 and latches 2610. When MPU 102 drive goes back high in FIG. 29, SMIIN goes low and resets shift register 2640 bits Q1–Q4 via NAND gate 2644. Q5 and Q6 go back low, completing the SMI cycle and terminating the Trap Ignore Window. In this way, a die-area-efficient circuitry cooperates with MPU 102 to supply SMI interrupt signaling from maskable sources for SMI wake-ups and other system purposes.

Figure 31:
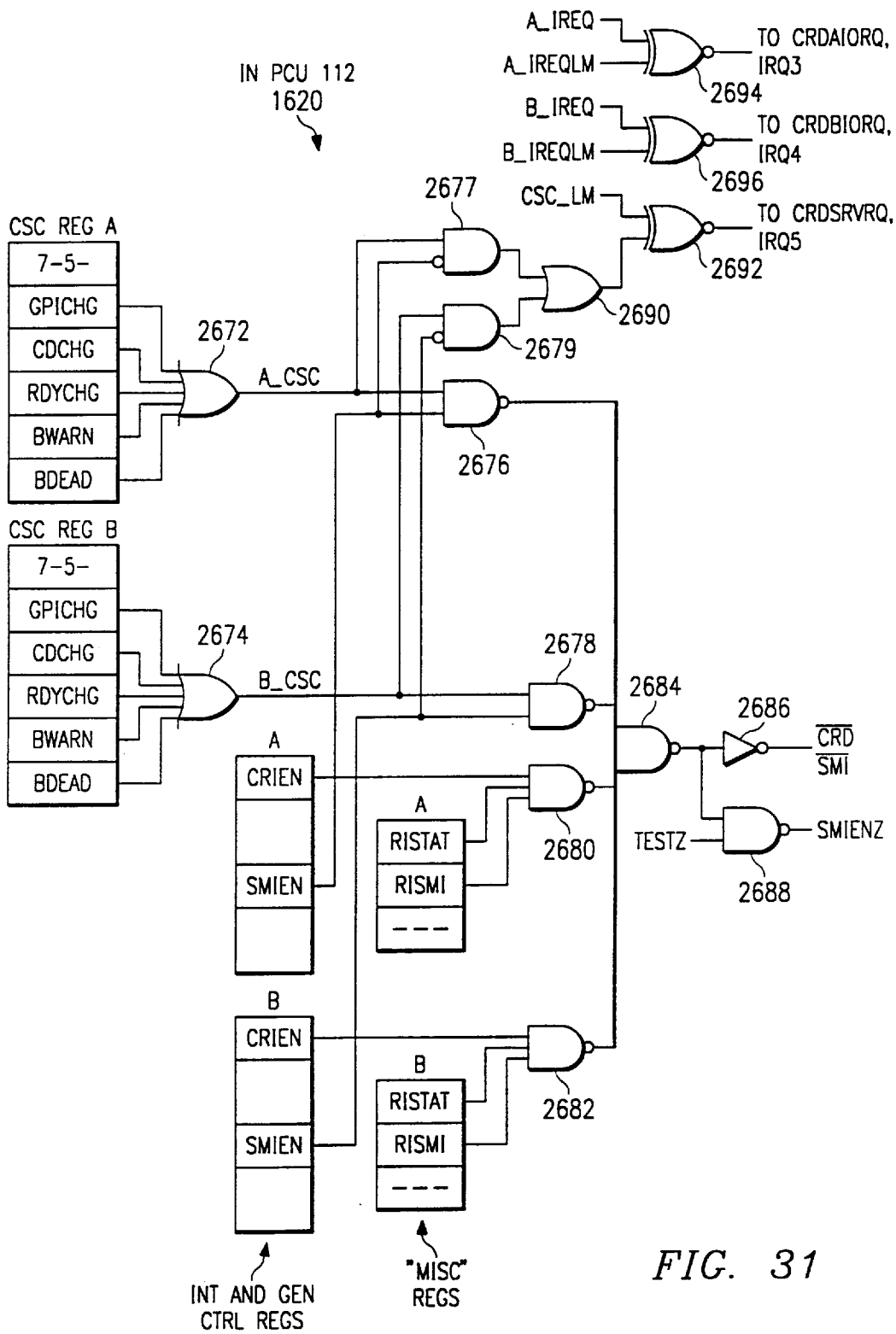
FIG. 31 is a partially schematic and partially block diagram of a system management interrupt circuitry 1620 embodiment in the PCU of FIG. 18 which is interconnected with the PPU of FIG. 11 and MPU of FIG. 9 to form a distributed power management system embodiment of FIGS. 31, 28, 33 and 34 interrelated with the computer system embodiment of FIGS. 5–7.

FIG. 31 is a partially schematic and partially block diagram of a system management interrupt circuitry 1620 embodiment in the PCU of FIG. 18 which is interconnected with the PPU of FIG. 11 and MPU of FIG. 9 to form a distributed power management system embodiment of FIGS. 31, 28, 33 and 34 interrelated with the computer system embodiment of FIGS. 5–7.

In FIG. 31 the Card Status Change Register for socket A (CSC REG A) and the Card Status Change Register for socket B (CSC REG B), tabulated elsewhere herein, respectively have their bits 4,3,2,1,0 OR-ed by OR-gate 2672 and 2674 to produce respective signals A_CSC and B_CSC indicative of a change in card status change if any of five conditions GPICHG, CDCHG, RDYCHG, BWARN or BDEAD occur.

For card SMI purposes, signal A_CSC and B_CSC are fed to respective first inputs of SMI NAND gates 2676 and 2678, and further respectively fed to first inputs of card service interrupt NAND gates 2677 and 2679. NAND gates 2676 and 2678 are respectively qualified by SMI enable bits SMIEN high in the Interrupt and General Control Register for Socket A and the same for socket B. If a SMIEN signal is high for a respective socket, a SMI is enabled for that socket. However, a SMIEN is low for socket A or B, enables the respective NAND gate 2677 or 2679 and gates the corresponding A_CSC or B_CSC signal to act as a card service interrupt.

In the SMI circuitry of FIG. 31, two further NAND gates 2680 and 2682 provide card A or card B specific outputs for SMI purposes provided that 1) card ring indicate enable CRIEN is high for that card in Interrupt and General Control Register, 2) Ring Indicate to SMI enable is high for that card in the "Miscellaneous" Register for that card, and 3) ring indicate change RISTAT is high for that card in the "Miscellaneous" Register for that card.

NAND gates 2676, 2678, 2680, and 2682 have their outputs respectively connected to four inputs of a NAND gate 2684. If any output goes low from NAND gate 2676, 2678, 2680, or 2682, then the output of NAND gate 2684 goes high whereupon succeeding inverter 2686 takes PCU 112 card SMI output pin CRDSMI# low. In this way, substantial circuitry and event data for SMI purposes are concentrated in the PCU 112 to economically supply just one pin output to PPU 110. For test purposes a NAND gate 2688 is also provided with inputs connected to NAND 2684 output and signal TESTZ to supply a signal SMIENZ.

In the interrupt circuitry of PCU 112, an OR-gate 2690 is responsive to either the output from NAND gate 2677 or 2679 to supply an input to an exclusive-NOR (XNOR) gate 2692. A second input of XNOR gate 2692 is fed by a level mode/pulse mode control signal CSC_LM bit 1 as tabulated elsewhere herein for the Global Control Register. The CSC_LM bit causes the XNOR-gate 2692 to programmably inverts or not invert the output of OR-gate 2690 for advantageous level mode or pulse mode output selection. Similarly Global Control Register bit 3 card A interrupt request level mode AIREQLM and bit 4 card B interrupt request level mode BIREQLM program the operation of respective XNOR gates 2694 and 2696 fed with interrupt request lines from card A (A_IREQ) and card B (B_IREQ). The outputs of XNOR gates 2692, 2694, and 2696 are respectively coupled to output pins IRQ5, IRQ3 and IRQ4 which compactly send card service, and card A and B interrupt signals to PPU 110 as CRDSRVRQ, CRDAI0RQ, and CRDBI0RQ.

Figure 32:
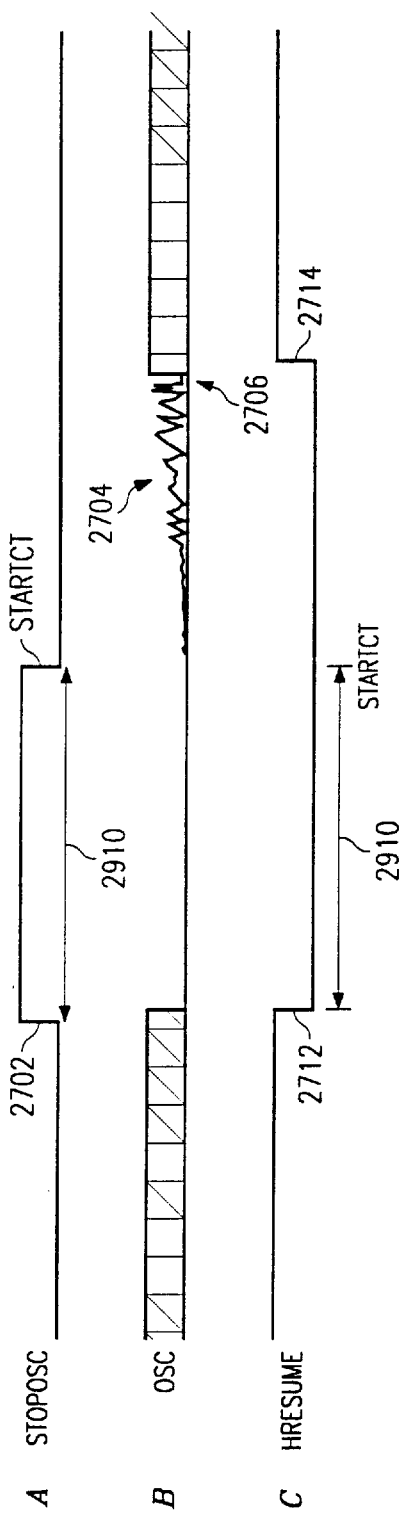
FIGS. 32A–L are a waveform and process of operation diagrams of clock signals and control signals in circuitry of FIG. 34 in the MPU of FIG. 5.

In FIG. 32 a waveform diagram for MPU 102 shows a clock oscillator signal OSC (e.g., 50 MHZ) continuing until it is terminated by a STOPOSC control signal going from low to high at a transition 2702. Subsequently, an opposite transition startct occurs in the STOPOSC control signal, whereupon the 50 MHz. oscillator in MPU 102 is enabled and begins a number of startup cycles 2704 which are to be prevented from clocking the CPU 702. Finally, reliable clock cycles 2706 are available. A signal hresume is taken low at transition 2712 coincident with STOPOSC going high at 2702. However, signal hresume is made to go high at transition 2714 only when clock cycles 2706 have become available.

Figure 33:
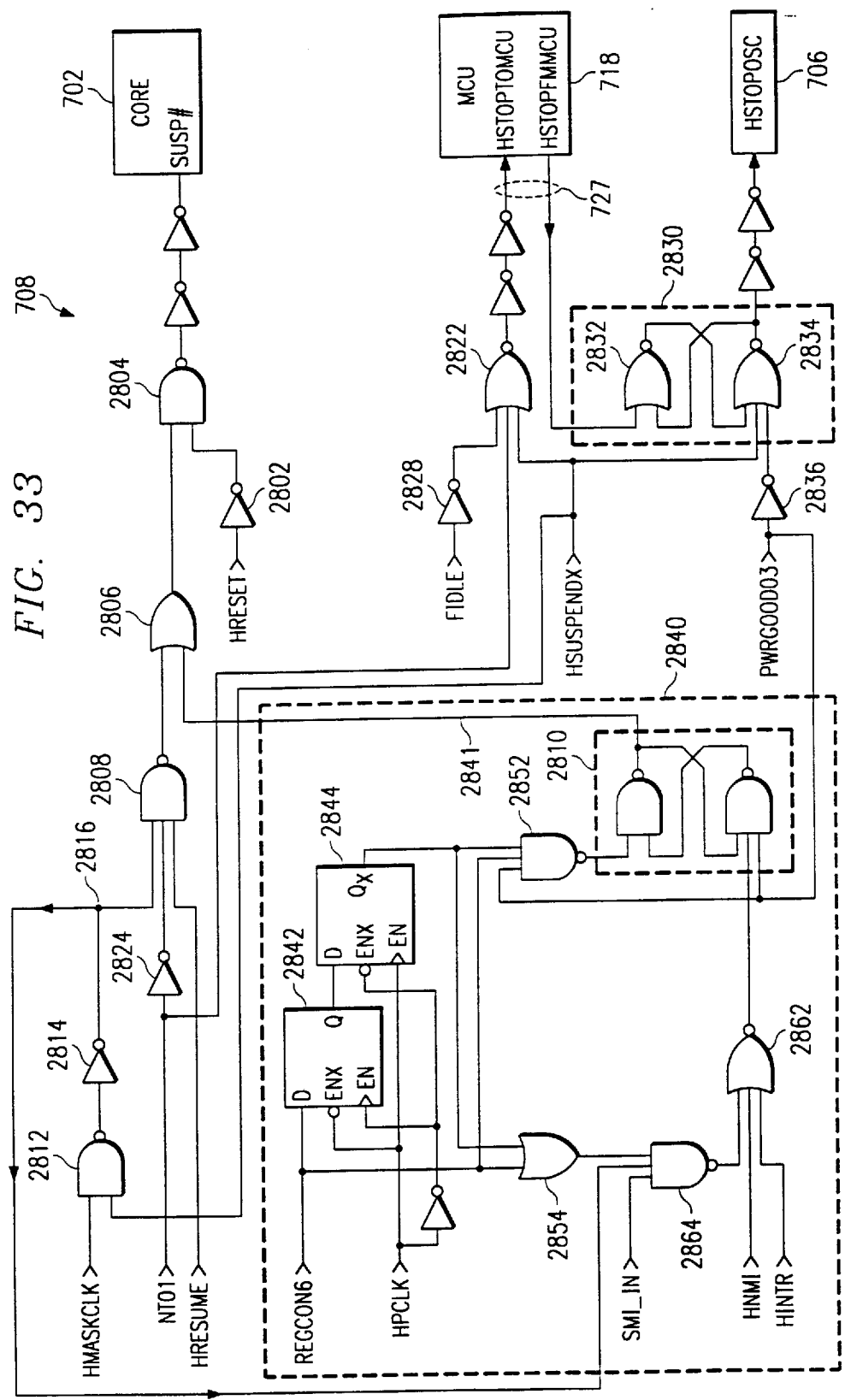
FIG. 33 is a schematic diagram of a power management circuitry embodiment in the MPU supplied with the signals of FIGS. 32 and 34.

In FIG. 33 power management circuitry 708, in the MPU 102 of FIG. 9, has an output suspx control signal connected to the SUSP# input core circuit 702 of FIG. 9 to suspend operations therein when suspx is low.

A high active Reset signal hreset from an input pin RSTCPU of MPU 102 is inverted low by an inverter 2802 which is connected to a first input of a NAND gate 2804 and thereupon forces the NAND gate 2804 to output a high which (buffered) is suspx high, preventing the MPU core clock from being stopped, and thus causing latches in the circuitry 701 to be clocked and thereby reset.

The NAND gate 2804 provides a low suspx output to suspend the core clock when both the Reset signal is low and the output of an OR gate 2806 is high.

A second input of NAND gate 2804 is fed by the output of the OR-gate 2806. OR-gate 2806 has a first input fed by the output of a NAND gate 2808 and a second input fed by the output of a dual-NAND flip-flop 2810. NAND gate 2808 acts as an OR for low-active inputs. Notice that either of the inputs of OR-gate 2806 when high, and any of the inputs of NAND gate 2808 when low, can force suspx low to stop the core clock unless the RSTCPU pin signal hreset is active.

A MASKCLK# low-active clock control signal from PPU 110 mask clock generator 2340 of FIG. 27 is fed to a corresponding input of MPU 102 and inverted to supply signal hmaskclk in FIG. 33 to a first input of a NAND gate 2812. When hmaskclk is low (in the part of its cycle that is to turn off the core clock), the output of NAND gate 2812 is forced high, whereupon it is inverted by an inverter 2814, the output 2816 of which goes to a first input of the NAND gate 2808 forcing the output of NAND gate 2808 high at OR-gate 2806 and ultimately producing a suspx signal low so that the core clock is indeed suspended.

NAND gate 2812 has a second input fed by low-active control signal hsuspendx corresponding to the SUSPEND# input pin of MPU 102 fed by the SUSPEND# output of PPU 110. Thus, when hsuspendx is low, the core clock is suspended by suspx low unless reset is active.

A test mode input nt01 is low in normal operation and qualifies a NOR gate 2822. The test mode input nt01 is high only in the test mode, but when this mode occurs, input nt01 via an inverter 2824 supplies a suspending low to a second input of NAND-gate 2808. Put another way, in test mode this input nt01 is high, stopping the internal CPU 701 core clock by driving suspx low.

Figure 34:
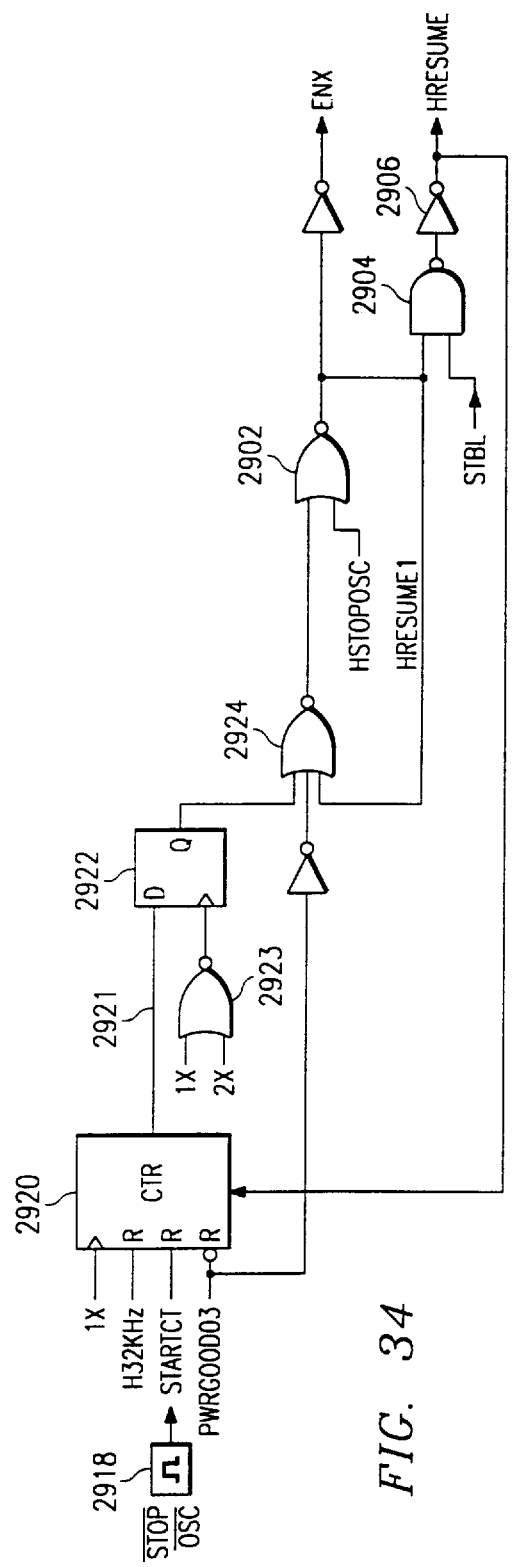
FIG. 34 is a further schematic diagram of a power management circuitry embodiment in the MPU for supplying a Resume signal to the circuitry of FIG. 33.

A third input of NAND gate 2808 is fed by the hresume signal of FIGS. 32 and 34. When this resume signal is low, indicating that the oscillator is not ready for normal use by the CPU, the suspx signal goes low unless reset is active.

Before describing the circuitry associated with flip-flop 2810, a description is provided for the FIG. 33 suspend-control of the memory controller 718 of FIG. 9 via line 727 from power management circuit 708.

The output (buffered) of NOR-gate 2822 supplies a signal hstoptomcu which when high disables or stops the memory controller 718. NOR-gate 2822 provides an ANDing of its low-active inputs hsuspendx, test mode nt01, and a control signal f_idle (inverted). The control signal f_idle (inverted) is an internal CPU 702 signal to which the CPU 702 suspend acknowledge signal SUSPA# is logically related (see hereinabove-cited TI486 Microprocessor: Reference Guide p. 1–9).

Advantageously, this part of the embodiment arranges for suspend signal hsuspendx to sequentially 1) initiate suspension of the CPU 702 via logic 2804–2816; and then 2) subsequently suspend the operation of the memory controller MCU 718 via logic 2822–2828; and 3) finally generate signal hstoposc to stop the oscillator via further logic 2834.

When f_idle goes high, with suspendx and nt01 low, the output of inverter 2828 goes low, indicating CPU suspend acknowledge, at an input of NOR-gate 2822. NOR-gate 2822 output hstoptomcu goes high to disable the memory control circuitry 718 of FIG. 9.

The memory control circuitry 718 acknowledges by supplying a high signal hstopfmmcu (stop from mcu). A dual-NOR flip-flop 2830 has first and second NOR-gates 2832 and 2834 with the output of each NOR coupled to a first input of the other NOR. The output of NOR-gate 2834 is buffered to supply a signal hstopoc (same as stop oscillator signal STOPOSC of FIG. 32) to the circuitry of FIG. 34 and the oscillator 706. Since this signal stops the oscillator itself as well as gating it, restart will take many cycles, and the oscillator will not be reliably available again until an active hresume signal (FIGS. 32, 33, 34) is received from the circuit of FIG. 34 for NAND gate 2808 of FIG. 33.

As described, signal hstopfmmcu is connected as a set signal to a second input of first NOR-gate 2832, so that flip-flop 2830 captures a pulse of hstopfmmcu when such occurs. Signal hsuspendx SUSPEND# from PPU 110 is connected as a reset signal to a second input of second NOR-gate 2834 so that when a suspend is lifted by hsuspendx going high, the output of NOR-gate 2834 is forced low immediately and removes the oscillator stop.

A power up reset signal pwrgood03 (see PWRGD3 in FIG. 21) is fed as an alternative reset signal via inverter 2836 to a third input of NOR-gate 2834, so that when power is coming on and lacks "good" status (pwrgood03 low), the inverter 2836 output goes high, forcing the output of NOR-gate 2834 low, and preventing the oscillator 706 from being stopped (or kept from starting) on power up.

Refer now to a circuit section 2840 which provides an output on line 2841 to NAND-gate 2808. The input signals of circuit section 2840 are as follows:

regeon6: a configuration register bit 6 establishes a clock mask via software entry in bit 6
hpclk: a high speed clock at half of crystal frequency (25 MHz with nominal 50 MHz. crystal)
smi_in: a system management interrupt interlock
hnmi: presence of a nonmaskable interrupt
hintr: presence of any ordinary interrupt.

The configuration bit six when high is turned into a low-active set pulse for flip-flop 2810 by being clocked by clock hpclk through two cascaded latches 2842 and 2844 to produce an inverted Qx output which is fed to respective first inputs of a NAND gate 2852. Configuration bit six itself is fed directly to a second input of the NAND gate 2852. The output of NAND gate 2852 is fed to a low-active set input of flip-flop 2810.

The configuration bit six when low is converted into a low active reset pulse for flip-flop 2810 because the Qx output of the cascaded latches also goes to a first input of an OR gate 2854, and bit six goes directly to the other input of the OR gate 2854. This OR gate 2854 has its output low when both its inputs are low, thus providing a reset low to flip-flop 2810 via intervening gates 2864 and 2862.

Power up reset signal pwrgoodO3 is fed to a low-active reset input of flip-flop 2810 and to a third input of NAND-gate 2852. In this way, when power is coming on but is not yet at "good" status, pwrgood03 is low and lifts any set input to flip-flop 2810 via AND-gate 2852 while resetting flip-flop 2810 at a reset input of the lower NAND gate thereof.

An alternative source of low-active reset to flip-flop 2810 is provided by a NOR-gate 2862 which has three high active inputs responsive to interrupt hintr, nonmaskable interrupt hnmi, and the output of NAND gate 2864. For this purpose, NAND-gate 2864 acts as an or-function for three low active inputs: 1) smi_in, 2) hmaskclk (anded by NAND 2812 with suspendx), and 3) the output of OR-gate 2854 (configuration bit 6 low-active pulse when bit 6 goes low).

The circuitry 2840 provides functions that confer system advantages.

Among these advantages are, first, that setting configuration bit 6 high causes the CPU clock to be suspended via signal suspx except when an interrupt occurs, whereupon the interrupt is serviced by CPU activity with suspx lifted.

Second, setting configuration bit 6 low lifts the suspension of core clock for activity in addition to interrupt service.

Third, when PPU 110 introduces mask clock pulses (hmaskclk), the circuitry remarkably overrides a high configuration 6 without requiring a time-consuming software step of updating that register bit. This latter advantage is introduced by coupling the gates 2812 and 2814 for mask clock from PPU 110 back into the logic 2840 at gate 2864 to reset the flip-flop 2810 and lift the suspension imposed outside of interrupts.

Figure 35:
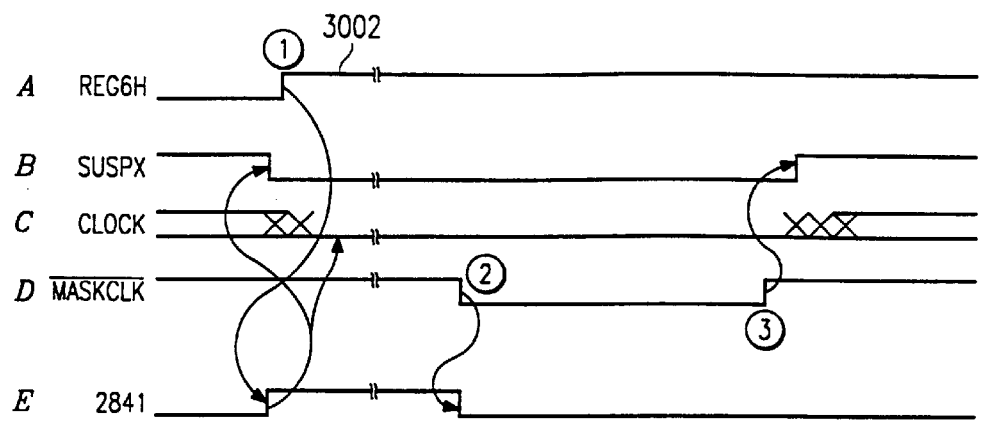
FIGS. 35A–E are a waveform and process of operation diagrams for selected signals in the circuitry of FIG. 33.

In FIG. 35, the process of operation introducing the mask pulses into circuit 2840 of FIG. 33 is shown step-by-step in waveform diagram form. In a first step "1" the register bit 6 is set high by software, causing a set pulse to flip-flop 2810 that takes line 2841 high and suspx low to mask the core clock. After an indefinite intervening time 3002, it is desired that PPU 110 start cycling the mask clock pulses instead of leaving the mask clock signal high. In a second step "2" the maskclk signal goes low, taking flip-flop line 2841 low via logic 2812, 2814, 2864, 2862 and 2810. Since mask clock low keeps the CPU core suspended via logic 2806–2816, this logic responds in third step "3" to confirmation of mask clock activity wherein mask clock goes back high, whereupon core suspend signal suspx goes high, lifting the suspend directly by mask clock activity and without any software intervention.

FIG. 34 is a further schematic diagram of power management circuitry in the MPU for supplying a Resume signal hresume to the circuitry of FIG. 33. First notice that stop oscillator signal hstoposc (see also FIG. 33) when high during a time interval 2910 of FIG. 32 will force a NOR-gate 2902 output ENX low, which in turn forces resume signal hresume low via a NAND gate 2904 and succeeding inverter 2906.

Resume signal hresume is variably delayed from the end of interval 2910 of FIG. 32 to its eventual return to high at transition 2714 by counter logic 2920 feeding a latch 2922 feeding a first input of a NOR-gate 2924 feeding a second input of the NOR-gate 2902. Power on reset signal pwrgood03 when high qualifies counter logic 2920 and further via an inverter 2926 qualifies NOR-gate 2924. Latch 2922 is clocked by a NOR gate 2923 which supplies a high transition to the clock input of the NOR gate 2923 when both 1x and 2x clocks become low.

NOR-gates 2924 and 2902 also act together as a set-reset flip-flop with high-active output hresume1, wherein hstoposc is a high-active reset signal, and the output of latch 2922 is a high-active set signal. Note that hstoposc is the same as STOPOSC and HSTOPOSC of FIGS. 32 and 33.

Start Count signal STARTCT is generated by a pulse former 2918 transitorily supplying a reset input to counter 2920 of FIG. 34 in response to a low-to-high transition of STOPOSC# (STOPOSC inverted) as indicated by the STARTCT label in FIG. 32. Release of SUSPEND condition (HUSPENDX low) in FIG. 33 can cause this STARTCT response, for example.

In counter logic 2920, pwrgood03 and hresume low jointly act as an enabling signal, whereupon when the STARTCT transition in STOPOSC of FIG. 32 occurs, the counter 2920 (clocked by 1x pulses at nominally 25 MHz. from 50 MHz. crystal pulses divided by 2) starts to count up (or down) from zero or any suitable predetermined multi-bit value. During the count, the output 2921 of counter 2920 is low. This low is clocked through latch 2922, and NOR-gate 2924 output is high. At this time NOR gate 2902 output is forced low, inactivating the enable ENX (via an inverter) and holding the hresume signal low.

In this embodiment, the circuitry of FIG. 34 is looking for a predetermined number of clock pulses 1x from the crystal oscillator before the oscillator is regarded as having successfully started whereupon hresume can go high. Notice that the pulses may be irregular in spacing at first, and the circuit simply counts the pulses that do occur. If the counter has not found the predetermined number within the about –30 microsecond period of the 32 KHz. clock, then that h32 KHz. input resets the count.

When the count in counter 2920 reaches at least a predetermined threshold value (e.g., 152) representing production of that many clock pulses by the 1x oscillator, its output 2921 goes high, latch 2922 output goes high, flip-flop 2924 output goes low whereupon NOR-gate 2902 output hresume1 goes high (unless hstoposc goes active high to stop the oscillator). Note that the counter is suitably alternatively configured to count down to zero from a preset value. Attainment of the counting event causes enable signal ENX to go active (low) and enable block 3620 of FIG. 36 to output clock from MPU 102. Also, NAND gate 2904 becomes qualified by signal hresume1, and the output hresume goes high as soon as a stability signal stbl input to AND-gate 2904 goes high from a clock-doubling phase-lock loop (PLL) indicating the PLL has stabilized and is producing clock doubled clock pulses closely controlled in duty cycle value (e.g. 50%).

Figure 36:
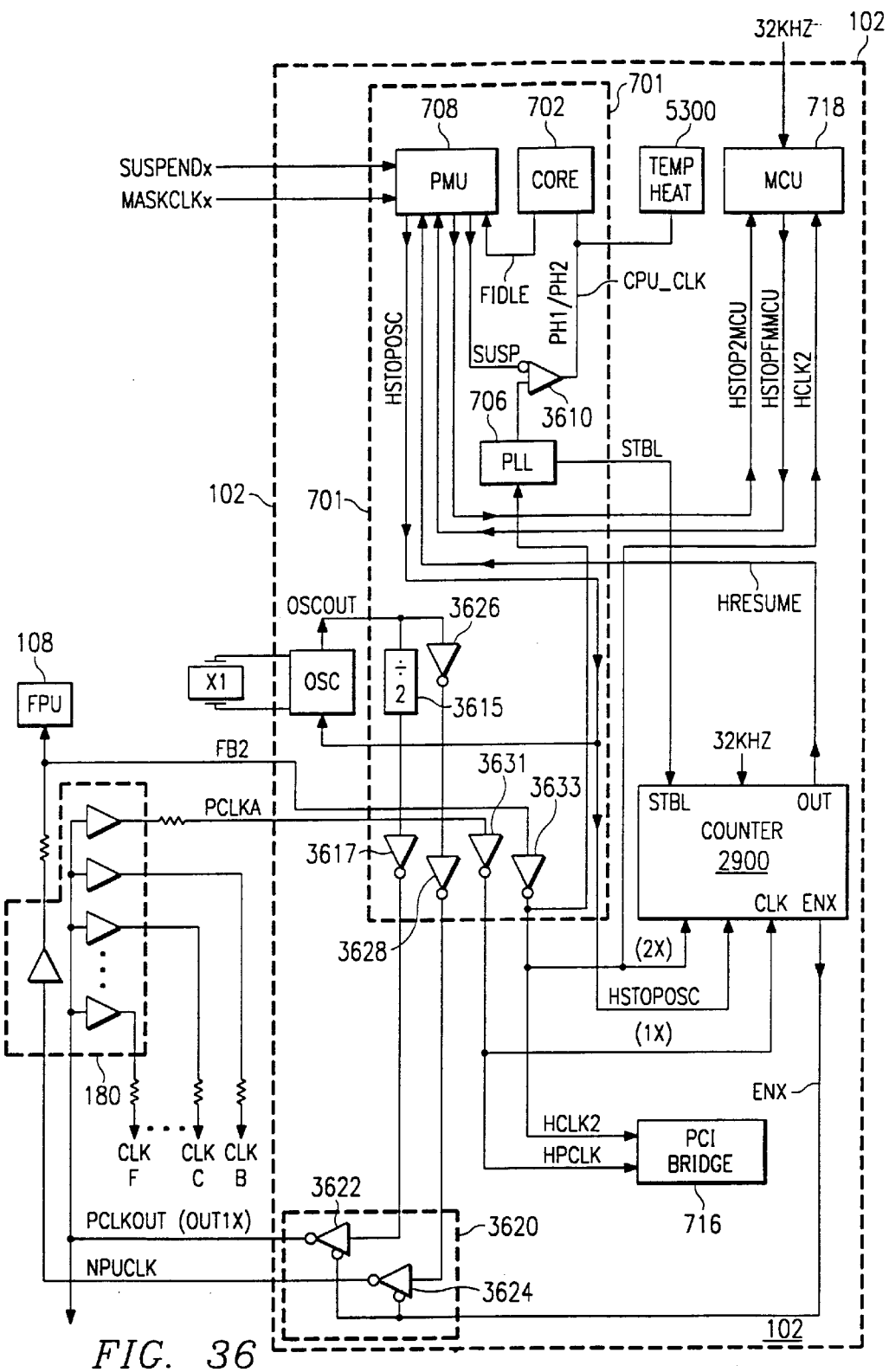
FIG. 36 is a partially block, partially schematic diagram of a clocking and control circuitry embodiment of the MPU of FIG. 5.

FIG. 36 is a partially block, partially schematic diagram of a clocking and control circuitry embodiment of the MPU of FIG. 5, and should be read in conjunction with MPU FIGS. 9, 33 and 34. In FIG. 36, MPU 102 has block 701 including a 486 CPU core 702, a PLL 706, and the PMU 708 of FIG. 33. Outside block 701 and in MPU 102 is also memory control unit MCU 718, PCI bus bridge 716 and counter circuit 2900 of FIG. 34. PMU 708 has external terminal pin inputs for SUSPENDx and MASKCLKx, internal inputs FIDLE from CPU core 702, HSTOPFMMCU from MCU 718 and HRESUME from block 2900, and internal outputs HSTOP2MCU to MCU 718, suspend SUSP, and HSTOPOSC to oscillator OSC and counter block 2900.

In an important improvement, clock buffer 3610 is interposed between PLL 706 output and the phase1/phase2 clock input of the CPU core 702. Output suspend SUSP from PMU 708 is fed to an enable input of the clock buffer 3610. This improvement confers advantages of suspending core 702 in one clock cycle, and subsequently resuming core 702 in one clock cycle. Resuming, which is a process step of returning to high speed clock operation after a suspend, advantageously can occur without a core reset and free of core register restore operations, since the core 702 has static circuits that retain their data even when the clock is suspended by PMU 708 and buffer 3610. The availability of this suspend mode saves power in coordination with the power management process and power management control circuitry 920 of PPU 110 responsive to the process and control circuitry 1620 in PCU 112.

In MPU 102 a clock crystal X1 cut for 50 or 66 MHz for example, is connected via two pins to an on-chip oscillator circuit OSC which in turns provides an output OSCOUT to a divide-by-two clock divider 3615 which feeds a buffer 3617 that in turn connects to an input of an inverting clock buffer 3622 in a buffer block 3620. A second inverting clock buffer 3624 in said block 3620 is fed by a pair of cascaded inverters 3626 and 3628 supplied by undivided OSCOUT.

Buffer 3622 has an output connected to a terminal pin of MPU 102 designated PCLKOUT (or OUT1X) which supplies the external clock buffer circuit 180 of FIG. 5. The circuit 180 shown in more detail in FIG. 36 has respective clock buffers which resistively drive the bus clock inputs PCLKA (pin PCLK) for MPU 102, PCLKB for PPU 110, PCLKC for PCU 110, PCLKD and PCLKE for devices 210 and 220 of FIG. 5 and PCLKF for display chip 114.

Input PCLKA returns the MPU divided-by-two bus clock from buffer 3622 back into MPU 102 with timing essentially the same as for all the other chip clocks PCLKB-F, and clock skew in the system 100 is advantageously minimized. An internal inverting clock buffer 3631 fed by PCLKA supplies a clock HPCLK (host clock) to both the 1X CLK input of block 2900 and the HPCLK input of PCI bus bridge 716.

Buffer 3624 supplies undivided clock to an output terminal pin for numerical processor unit clock NPUCLK of MPU 102 which is connected on printed circuit board 302 via a buffer in block 180 and resistance to FPU 108. This clock thus buffered is also returned via the resistance back to a terminal pin FB2 of MPU 102 and connected to the input of an inverting clock buffer 3633. The output HCLK2 of buffer 3633 is supplied to clock-multiplying PLL 706, MCU 718, PCI bus bridge 716 in MPU 102, and to the 2X clock input of counter block 2900.

Counter block 2900 has input STBL connected to an output from PLL 706 indicating that the PLL has stabilized. The clock input CLK of block 2900 in FIG. 36 is marked CLK, is fed by inverter 3631, and is called "1X" in FIG. 34. Counter block 2900 is reset at input RST of FIG. 36 by 32 KHz. clock and as described in connection with FIG. 34.

FIGS. 34 and 36 counter block 2900 output ENX is connected to both of two low-active enable inputs of inverting clock buffers 3622 and 3624 of buffer block 3620. Advantageously, the clock control provided by block 2900 ENX and buffers 3620 is responsive to the PCLKA input delayed by the external board 302 environment to stop and/or resume both the PCLKOUT and NPUCLK outputs generated internally in the MPU 102. In this way, timing is maintained and skew is minimized, while realizing single cycle stops and resumes for the whole chipset and system 100.

Figure 37:
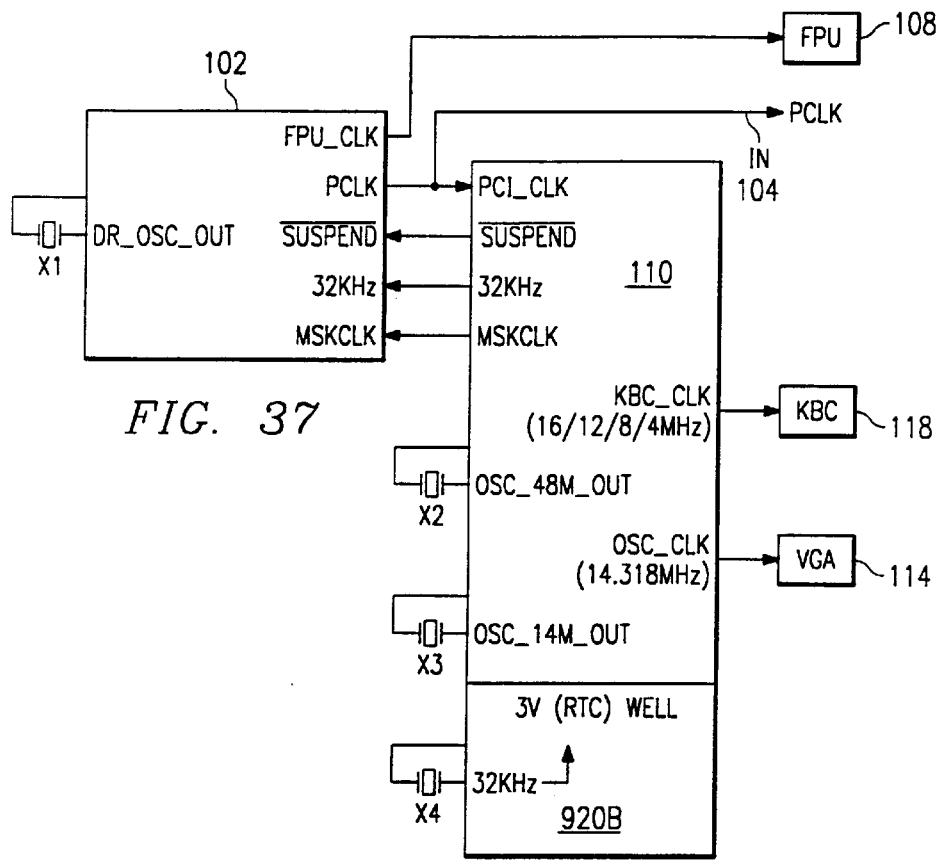
FIG. 37 is a block diagram of frequency-determining crystal connections and clock lines in the system embodiment of FIG. 5–7.

FIG. 37 is a block diagram of frequency-determining crystal connections and clock lines in the system embodiment of FIG. 5–7. In FIG. 37 the clocking scheme includes four frequency-determining quartz crystals X1–X4. Crystal X1. is the nominally 50 or 66 MHz. crystal (much higher or lower frequencies also suitably used) connected to MPU 102. The PPU 110 has three crystals X2 at nominally 48 MHz, X3 at nominally 14.318 MHz. and X4 at nominally 32.768 MHz. All frequencies may be higher or lower for achieving the design purposes of the skilled worker in preparing various embodiments.

When the system is in 5V SUSPEND, most of the subsystem clocks inside PPU 110 are disabled.

The SUSPEND# input is used to generate a signal STABLEOSC which goes low immediately when SUSPEND# input is asserted, and goes high 58.6 milliseconds after the SUSPEND# input is deasserted. This signal is used to stop clocks to most of the subsystems of PPU 110. The delay of 58.6 milliseconds advantageously ensures that the oscillator output has been stabilized before the clock to different sub-blocks is strted. The disabling and enabling of the clocks is done in such a way that no glitches are produced, i.e. that a minimum pulse width of clock pulses is maintained. Further, any clock generated by PPU 110 that goes off chip has a signal that when stopped has a low logic level.

Referring now to both the oscillator-related diagrams of FIGS. 37 and 24 (regarding circuits 920A, 920B), an OSCOFF signal is connected to a PWRDN pin of the 48 MHz. and 14.31818 MHz. oscillators. A STABLE14 MHZ signal, indicating that the 14 MHz. clock has become stable, is generated to gate out the 14.31818 MHz. clock to an OSCOUT (also called OSC_CLK) pin. When the STABLE14 MHZ signal is low, the OSCOUT pin is held low, and when STABLE14 MHZ signal goes back high, the OSCOUT pin starts generating 14.31818 MHz. clock again, without glitches. The STABLE14 MHZ signal is deasserted low before OSCOFF signal is deasserted, and is asserted high after a STABLEOSC (OSC STABLE in FIG. 24) signal has been asserted. The 14.31818 MHz. OSCOUT clock is driven for about one hundred (100) milliseconds (msec) after the SUSPEND# signal is asserted to allow the VGA display subsystem to go through a power down sequence.

Most peripheral subsystems do not require explicit clock control. Clock control, however, is described here for the floppy disk subsystem FDC/FDS. The clock to FDC/FDS subsystem is controlled by an FDCIDLE output of an FDC block. When the FDCIDLE signal is asserted, the clock to the FDC/FDS module is stopped. Clock is not stopped to the ECP parallel port or the serial port modules.

The 32.768 KHz. clock runs continuously throughout the suspend/resume sequence and RESET stays inactive throughout. The external clocks PCICLK, KBRDCLK, 14.3

MHz clock transition from full speed to zero or vice-versa. SUSPEND# is used to shut off all oscillators in the system except 32 KHz. A clock signal SUS_32 KHZ is a 32 KHz clock signal supplied by PPU 110 to MPU 102 and used primarily for suspend mode DRAM 106 refresh timing. When SUSPEND# is lifted by a rising edge thereof, a circuit is enabled and produces a OSC 14 MHZ STABLE signal after a predetermined number of 32 KHz clock cycles that insures that the 14 MHz. oscillator has stabilized. PWRGD3 inactive immediately enables all stable clock outputs.

The KBC_CLK output from PPU 110 is supplied to the keyboard controller and scanner. This clock is derived from appropriate frequency division from the 48 MHz. crystal to produce any selected one of sixteen, twelve, eight, or four (16/12/8/4) MHz. clock rates, and its duty cycle is preferably kept near 50% (such as between 40% and 60%).

Figure 38:
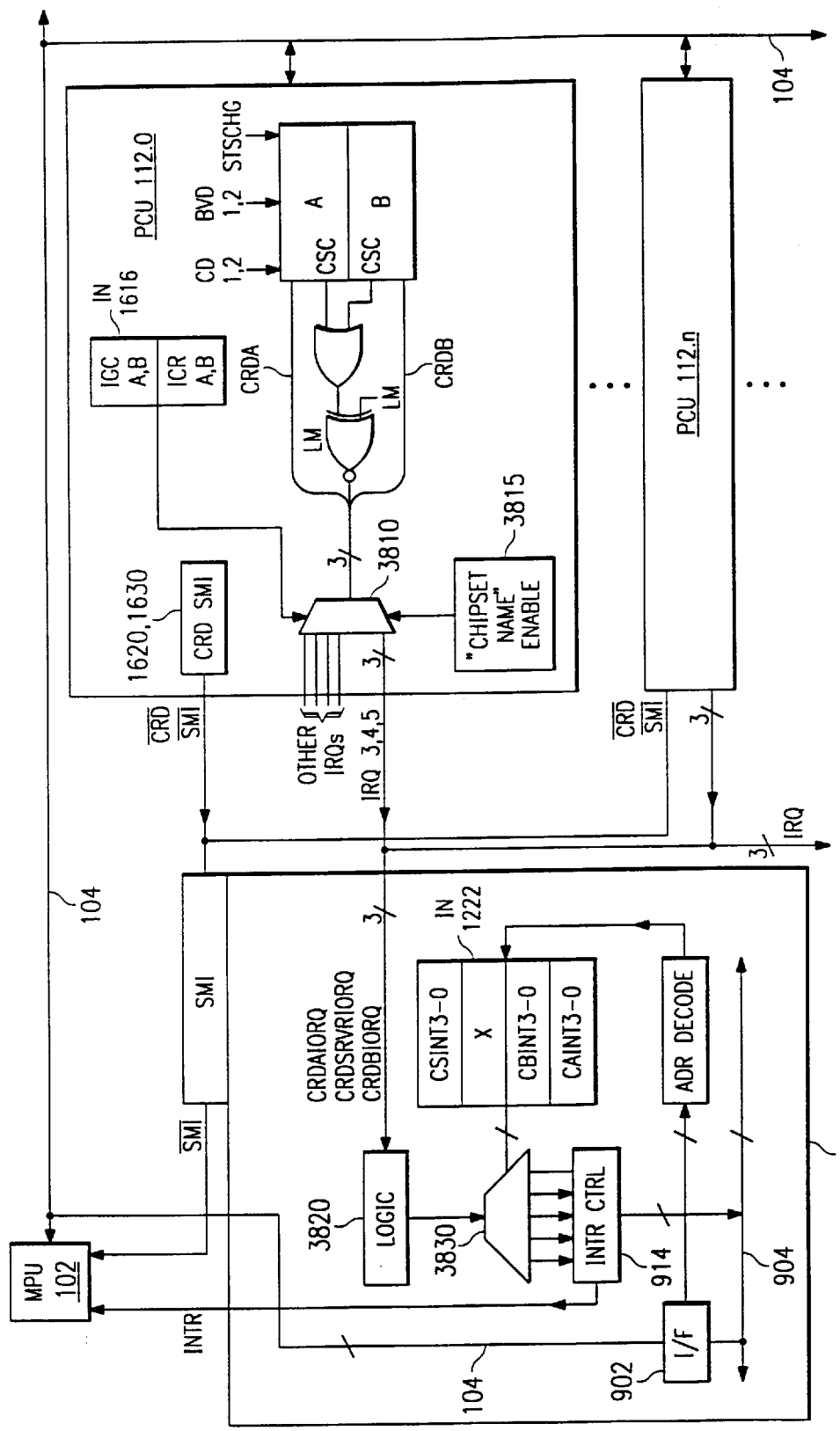
FIG. 38 is a block diagram showing an interrupt routing system using one or more PCUs connected to an interrupt routing circuitry embodiment in the PPU, with outputs for connection to the MPU, detailing the system embodiment of FIGS. 5–7.

FIG. 38 is a block diagram showing an interrupt routing system using one or more PCUs 112 connected to an interrupt routing circuitry embodiment in the PPU 110, with outputs for connection to the MPU, detailing the system embodiment of FIGS. 5–7. In FIG. 38, a system embodiment has a combination of the PPU 110 and one or more PCU blocks designated PCU 112.0, . . . PCU 112.n. The PPU 110 shadows the PCU 112 interrupt routing registers in block 1616.

This circuitry overcomes problems existing heretofore. Software is written to route PCU card interrupts and Card Status Change interrupts to any of ten different standard PC interrupt lines, or channels. These PC interrupts are called IRQ3, IRQ4, IRQ5, IRQ7, IRQ9,IRQ10,IRQ11,IRQ12, IRQ14 and IRQ15. Other chips of this kind require a dedicated pin in the PPU for each such channel. This reduces the number of pins available on the PPU for other functions.

The circuitry shown in FIG. 38 permits the PCU 112.n interrupts to be transmitted to the PPU 110 chip using only three wires. The PPU monitors host processor writes to the PCU's internal registers and uses the information to route the three incoming interrupts to the ten standard PC-AT interrupts listed above. The three interrupt signals output by the PCU 112.n carry card status change interrupts, card A interrupts, and card B interrupts. If the PCU 112.n only supports two peripheral card slots then only two interrupt signals, one for card status change and one for card interrupts, would be needed.

When the host system processor writes to one of the interrupt routing registers inside the PCU 112.n, the data is actually written to the corresponding register in both the PCU 112.n and the PPU110. When the host system processor reads from a routing register address, only the PCU 112.n responds and the PPU 110 remains inactive. In this way the contents of the routing registers in both chips is always the same and can be used by the PPU 110 to route the PCU 112.n interrupts.

PPU 110 shadows some of the PCU 112 I/O registers that define PCMCIA compatible interrupt routing so that PPU 110 can route the interrupts internally to the appropriate interrupt request IRQ lines on behalf of each PCU 112.

Three signals from PCU 112 to PPU 110 carry interrupt signals from PCU 112 card A circuitry, PCU 112 card B circuitry, and status interrupts from both card A circuitry and card B circuitry. Information stored in configuration registers in 1616 IGC and IGR for cards A and B respectively within each PCU 112 define how these interrupts are to be routed to any one of the ten possible IRQ lines of the AT type of IBM-compatible computer.

For example, a modem interrupt request (IRQ) in an AT-system goes to a predefined IRQ line in the system, but another peripheral such as a hard disk drive goes to another predefined IRQ line. Since cards with different functions are or can be plugged at different times into the same PCMCIA card slot, the PCU 112 needs to sort out which IRQ line will carry the IRQ corresponding to the device in the card slot.

PPU 110 also captures this information when it is being supplied along bus 104 to each PCU so that it is shadowed in corresponding registers CSINT3-0, CBINT3-0 and CAINT3-0, in register set 1222 in PPU 110 for each card A and B. These registers in register set 1222 correspond to the registers in register set 1616 as follows. ICR A and ICR B are shadowed in CSINT3-0. IGCA is shadowed in CAINT3-0. IGC B is shadowed in CBINT3-0. These registers in register set 1222 in PPU 110 enable the interrupt routing control circuitry 3820 inside the PPU 110 to route the interrupts to the IRQ lines of PPU 110 in the correct manner of the internally-implemented fast ISA (AT) bus inside the single-chip PPU 110.

By loading in the Interrupt Control block 914 the identifier of the defined IRQ channel, as determined by the information stored in the shadow registers in register set 1222, the Interrupt Control block 914 is able to identify to MPU 102 the defined IRQ channel for the interrupt sent to MPU 102 on line INTR in response to the receipt of an interrupt from PCU 112.n in logic unit 3820, when subsequently interrogated by MPU 102 in accordance with conventional ISA interrupt signaling procedures.

The PPU 110 identifies PCI I/O writes on bus 104 destined for the PCU 112 index and data registers at I/O addresses 3E0h (h=hexadecimal) and 3E1h respectively. If the index written to the I/O location 3E0h matches 03h, 43h, 05h, or 45h, representing the addresses of CAINT3-0 (03h), CBINT3-0 (43h), and CSINT3-0 (05h and 45h), the data written to data register 3E1h is stored internally in the corresponding register in register set 1222 by the PPU 110. This information is used to control the interrupt routing as described below. This information can be read back from PPU 110 at PCI base address 50-51, as described in connection with the PCU Interrupt Shadow Register. Note that the PCU Interrupt Shadow Register in 1222 is updated every time the corresponding PCU 112 registers in 1616 are written, using I/O accesses, without handshaking to the PCI bus as would be the case in a PCI transaction, but the register can also be updated by directly writing to PPU 110 configuration base address 50-51, recognized by I/F block 902. Any previous shadowed information is thereby lost. In this way PCMCIA Card Services and Socket Services software (that may prefer to program PCU registers via PCI configuration cycles) advantageously can write appropriate interrupt routing information to the PPU interrupt routing control register.

Some configurations of the PCU 112 allow it to reset some of its registers and to disable interrupt routing automatically when a card such as card A or B is removed from a socket. Since the PPU 110 cannot determine whether a PCMCIA card has been removed from a PCU socket, it would not disable interrupt routing automatically. The system therefore appropriately generates a Card Service interrupt CRD-SRVRQ when a card is removed, and the interrupt service routine in software suitably is programmed in a process embodiment to include a process step implemented in computer code to disable the interrupt routing inside the PPU 110.

In the tables in this Detailed Description for the PCU 112 registers, the Interrupt and General Control (IGC) Registers are 8 bits each for each card A or B. The LSB four bits CINT3-0 in IGC-A select the routing for PC card I/O interrupts for card A. The LSB four bits CINT3-0 in IGC-B select the routing for PC card I/O interrupts for card B.

Analogously, the Card Status Change CSC Interrupt Configuration Registers ICR are 8 bits each for each card A or B. The LSB four bits SINT3-0 in ICR-A select the routing for CSC interrupts for card A. The LSB four bits SINT3-0 in ICR-B select the routing for CSC interrupts for card B.

Tables for the interrupt routing configured by the codes in each of this four bits CINT3-0 for A and SINT3-0 for A, and likewise for B are shown in tabulations 0000–1111 embedded for those bits in the larger charts elsewhere herein describing the IGC and ICR registers.

When PCU 112 is used as a standalone device in a computer system, it suitably routes status change interrupts from card A and card B onto respective selections through selector mux 3810 to ten interrupt lines and pins shown in FIG. 38 as IRQ 3,4,5 plus seven Other IRQs. However, when the PCU 112 is used in the environment of system 100 as diagramed in FIG. 38 and called a Chipsetname environment (Chipsetname Enable bit=1), the three interrupt outputs from FIG. 31 XNOR gates 2692, 2694, 2696 are advantageously routed directly through selector 3810 to three corresponding predetermined IRQ pins, here IRQ3,4, 5. The Chipsetname Enable bit is bit zero (0) in the Initialization Register tabulated with the Extension Registers for PCU 112 elsewhere herein. When this Chipsetname Enable bit is reset by default or by software to hold a value zero, then the standalone device mode for selector mux 3810 is selected.

The PPU 110 shadows the PCU 112 register locations that define status change interrupt routing for both card A and card B, but internal to the PPU 110, only one shadow register (the PCU Interrupt Shadow register in 1222 of PPU 110) is maintained in the preferred embodiment. As a result, if PCU 112 were set up to route card A and card B status change interrupts to separate IRQ lines, the PPU would only respond to the interrupt routing request that was most-recently programmed. For example, if PCU 112 is programmed to route card A status change interrupts to IRQ4, and later, card B status change interrupts are routed to IRQ7, the PPU 110 routes all the status change interrupts to IRQ7. However, current PCMCIA Card Services and Socket Services software is expected to write the same value to both register ICR A and ICR B. In any event, in this way, the important system information that at least one card has had a status change is efficiently routed to the PPU 110 with only one line for card service interrupt request CRDSRVRIORQ.

The SMIEN bit (Bit 4) of shadowed exchangeable card architecture offset location 03h, 43h determines whether the PCU 112 card status change CSC interrupts are routed to SMI pin of the PCU 112, or to AT-compatible IRQ pins. If AT-compatible IRQ routing is selected, then the SINT3-0 bits (bits 7,6,5,4 (7:4)) of the IGR registers (registers 05 and 45) determine how card status interrupts are to be routed, as shown in the SINT3-0 table for those registers.

Figure 39:
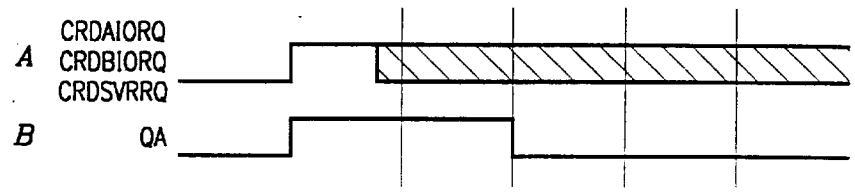
FIGS. 39A–B are a waveform and process of operation diagrams for selected signals in the circuitry of FIG. 38.
Figure 43:
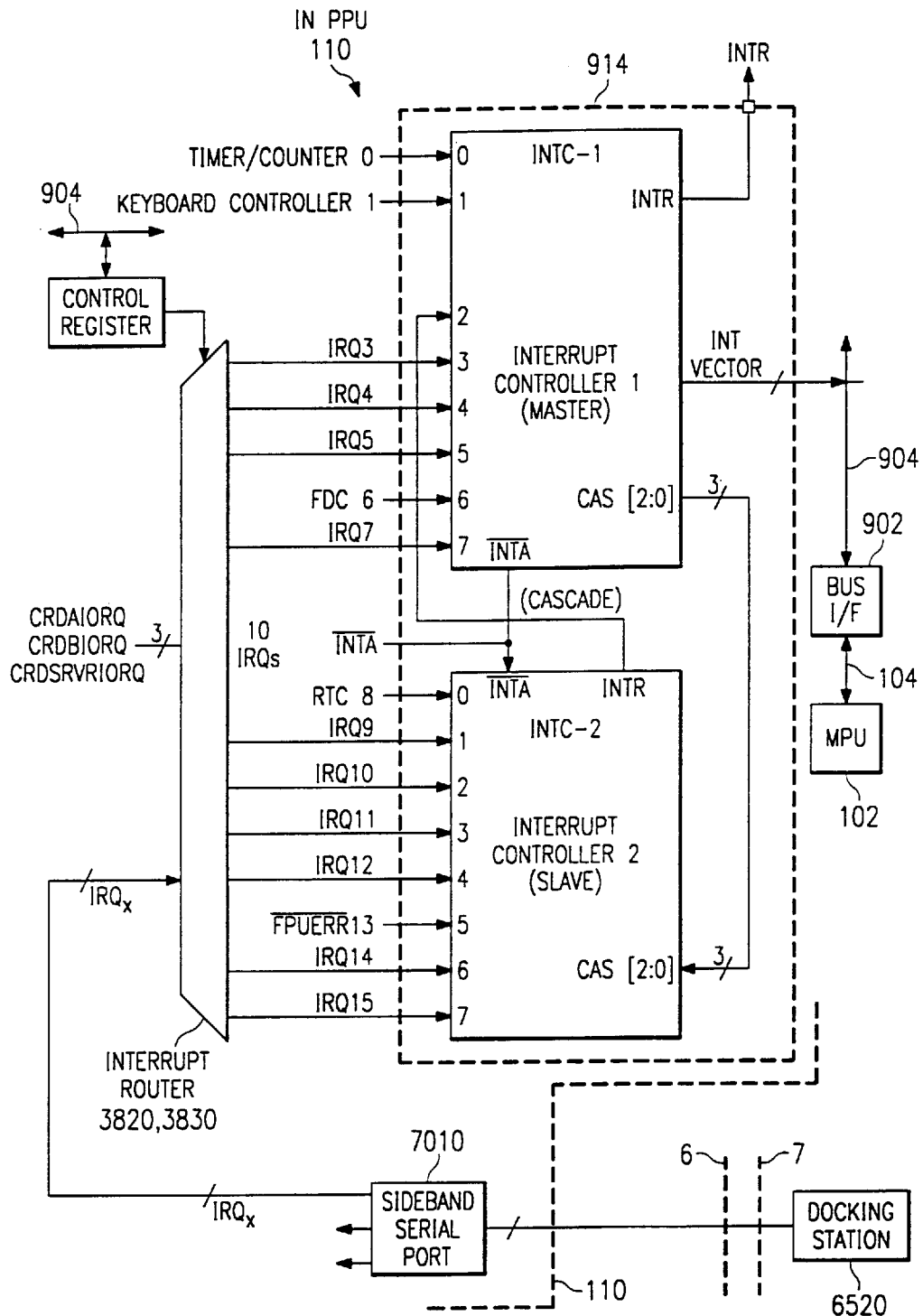
FIG. 43 is a more detailed block diagram of interrupt routing circuitry in the PPU of FIG. 38.

FIG. 39 is a waveform and process of operation diagram for selected signals in logic circuitry 3820 of FIG. 38 responsive to the three interrupt requests for Cards A and B and Card Service. Logic 3820 supplies these signals to a selector mux 3830 which routes the three interrupt according to the shadowing information CSINT3-0, CBINT3-0, CAINT3-0 to interrupt controls as shown in FIG. 43. Since the three interrupt requests may have unpredictable length, and the interrupt circuitry advantageously uses signals of predetermined length, the logic 3820 is responsive to produce a signals, such as signal QA, of predetermined length for card A, and analogous signals QA for the other two interrupt requests CRDBIORQ and CRDSRVRQ.

Figure 40:
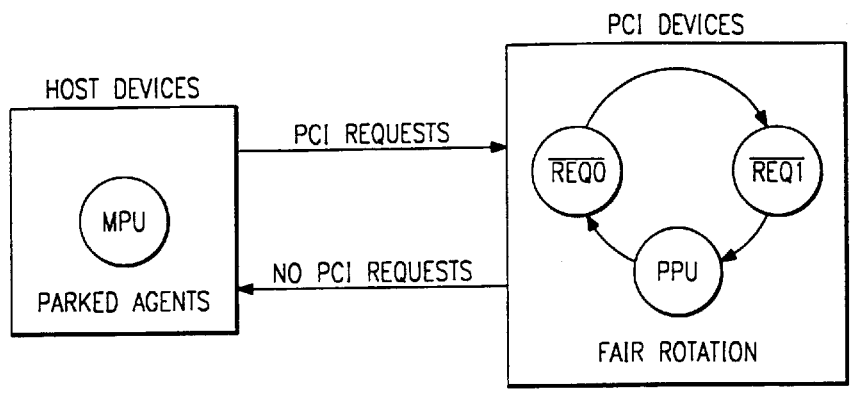
FIG. 40 is a process of operation diagram for fair rotation in arbitration.
Figure 41:
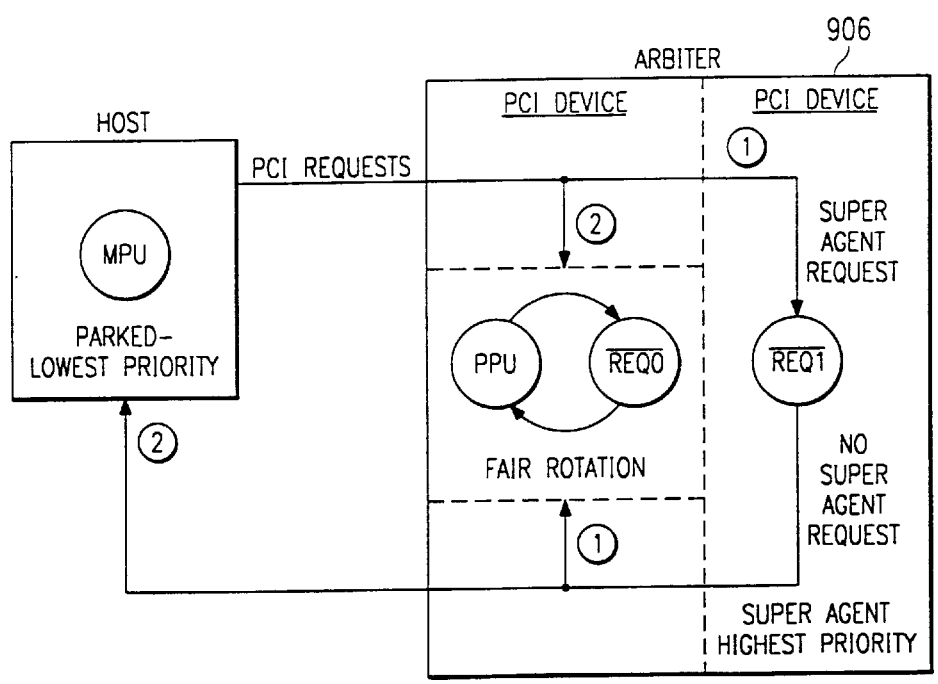
FIG. 41 is a more detailed process of operation diagram for arbitration by the arbiter 906 of the PPU of FIG. 11.

FIGS. 40 and 41 describe processes of operation for fair rotation in arbitration by arbiter 906 described elsewhere herein in connection with PPU 110 of FIG. 11.

Figure 42:
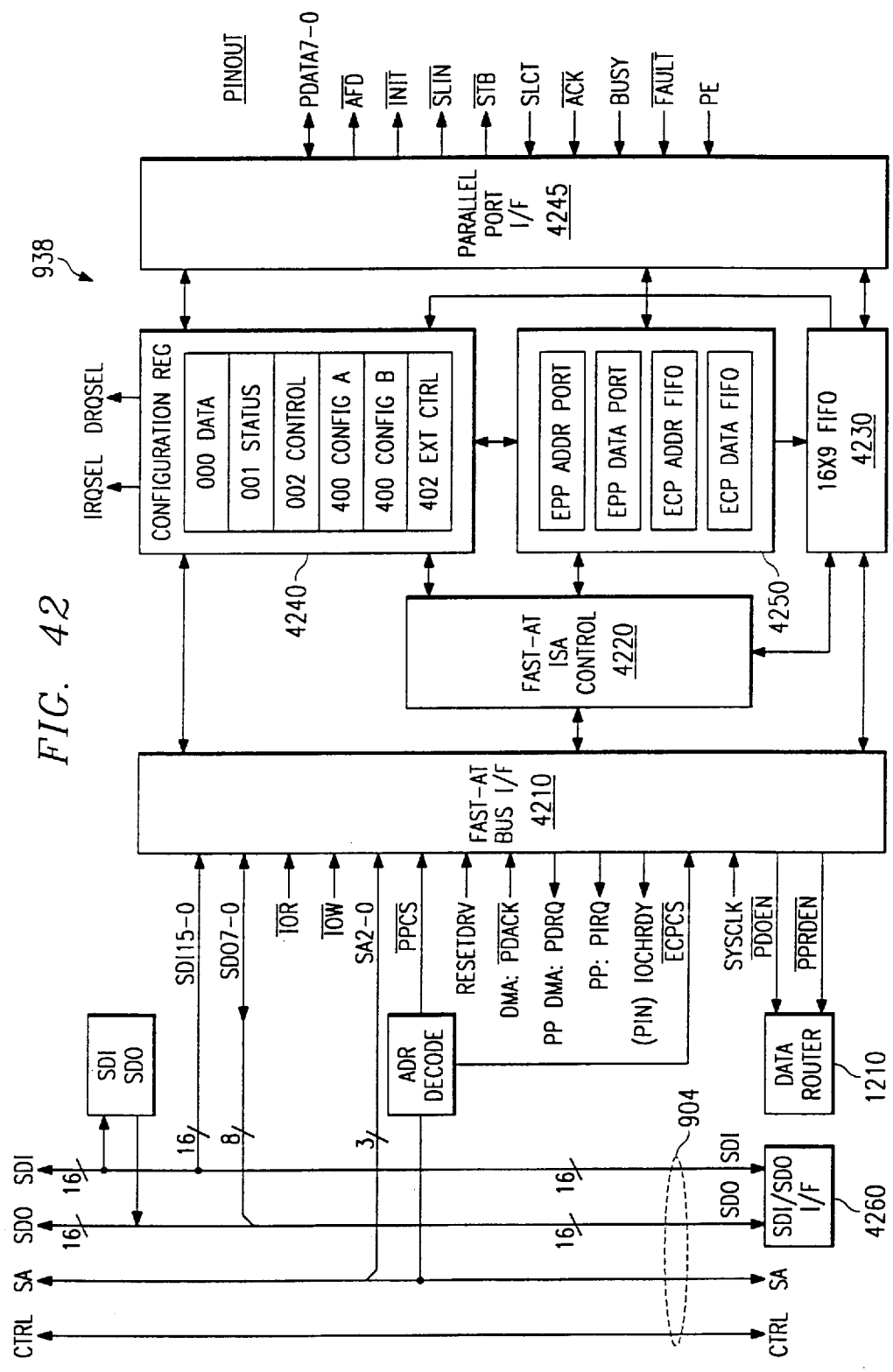
FIG. 42 is a more detailed block diagram of a fast internal PPU bus 904 with parallel port 938 embodiment of the PPU of FIG. 11.

FIG. 42 is a more detailed block diagram of a fast internal PPU bus 904 with parallel port 938 embodiment of the PPU of FIG. 11, as described elsewhere in connection with that parallel port 938. Note that the pinout to external terminals is elsewhere tabulated for the parallel port interface 4245. The description here concentrates now on the connections to the interface 4210 to on-chip improved Fast-AT bus 904. Two sets of 16-bit data sub-buses SDO and SDI are respectively specialized to carry input on bus SDI to inputs SDI15-0 of I/F 4210, and to carry output from I/F 4210 to the lower byte lane SDO7-0 of bus SDO. Data is transferred between SDI and SDO data buses by SDI/SDO interface I/F 4260. The SDI data bus is connected to reflect the state of any external inputs and of any internally-generated SDO bus outputs sent externally. By contrast, when the SDO data bus carries internally generated signals to internal destinations, the SDI and SDO states will differ. This arrangement advantageously eliminates much three-state circuitry in one embodiment. In this way, not only is the clock speed of bus 904 higher than in a corresponding AT-type external board-based bus, but also the width of the data bus is doubled, due to the on-chip implementation of bus 904 and the peripherals connected thereto in FIG. 11 and 42.

Control CTRL lines for I/O read IOR# and I/O write IOW# connect to I/F 4210. Three address lines SA2-0 from the SA address sub-bus of bus 904 are also supplied as address inputs to I/F 4210. Chip select signals for parallel port chip select PPCS# and extended capabilities port ECP chip select ECPCS# are decoded by block ADR DECODE from the full width of SA bus. DMA request PDRQ is connected from I/F 4210 of the parallel port to the DMA block, and the DMA acknowledge line PDACK# returns from DMA to I/F 4210. A parallel port interrupt request line PIRQ also is provided. Clocking by SYSCLOCK is provided. Data router 1210 is fed signals from I/F 4210 for parallel data output enable PDOEN# and parallel port read enable PPRDEN#.

Figure 44:
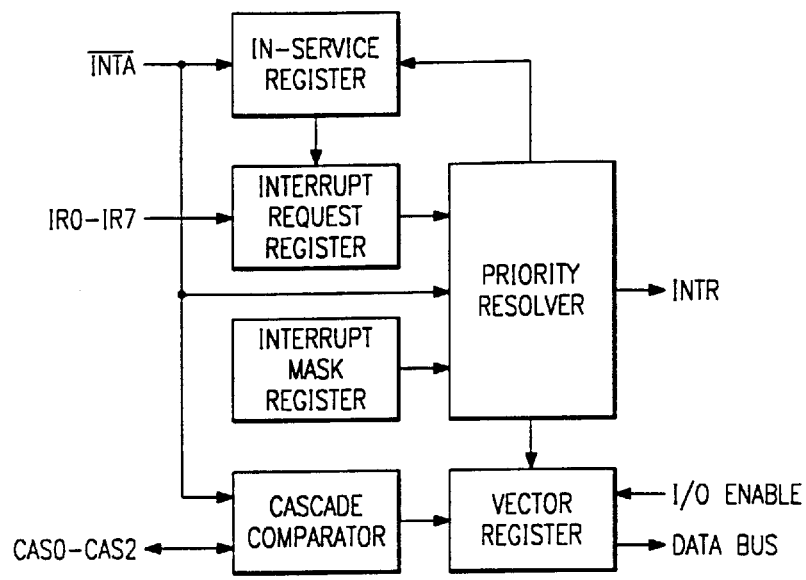
FIG. 44 is a more detailed block diagram each interrupt controller block of FIG. 43.

FIGS. 43 and 44 are more detailed block diagrams of interrupt routing circuitry as described elsewhere in connection with the PPU interrupt block 914 of FIG. 38. Interrupts from ISA cards in a docking station 7 of FIGS. 70 and 65 also are communicated serially to and output from a side-band serial port 7010 in PPU 110. These interrupts IRQx are routed via interrupt router block 3830 to the particular IRQ-numbered interrupt input line (to controller 914) to which the identity of each ISA card corresponds under ISA technique. This routing is established in a first embodiment by simply jumpering the ISA cards in the docking station in a predetermined manner and then OR-ing all IRQx lines in block 3830 to the corresponding IRQ-numbered input line of controller 914, provided the routing of card A, B and Card Service interrupts can be known or characterized beforehand. In a second embodiment, an additional control register set up by BIOS from bus 904 supplies control information for this routing, and routing circuitry 3830 is responsive to the control information to keep any two interrupts from the docking station and the PCU 112 from driving the same IRQ-numbered input to controller 914.

FIG. 45 is a flow diagram of a process or method of operation of the preferred embodiment system of FIGS. 5–7. In FIG. 45, PMU (Power Management Unit) hardware in PPU 110 notifies BIOS software 4510 of system management events by sending SMI interrupts to MPU 102 which executes the BIOS software 4510. BIOS software sends commands by programming the configuration registers 712 of MPU 102, 1222 of PPU 110, 1616 of PCU 112, and configuration registers in each of the other devices connected to bus 104. An operating system (OS) 4520 such as DOS or WINDOWS or any other operating system having a power management feature polls events from information supplied by BIOS 4510, and returns a CPU IDLE notification to the BIOS 4510. The operating system provides notification of system events to Applications software 4530. Either or both of the OS and/or the Applications provide interrupts to power management software 4540. Power management software 4540 provides an output for T(on)/T (off) adjustment of the TONTOFF register in PMU 920 hardware of PPU 110.

Advantageously, the embodiments described herein are compatible with passive and active power management algorithms. Passive power management algorithms reactively adjust the CPU clock based on system activity (inactivity) timers such as those of FIG. 25. Active power management algorithms estimate CPU activity, and can be adaptive in nature.

Figure 46:
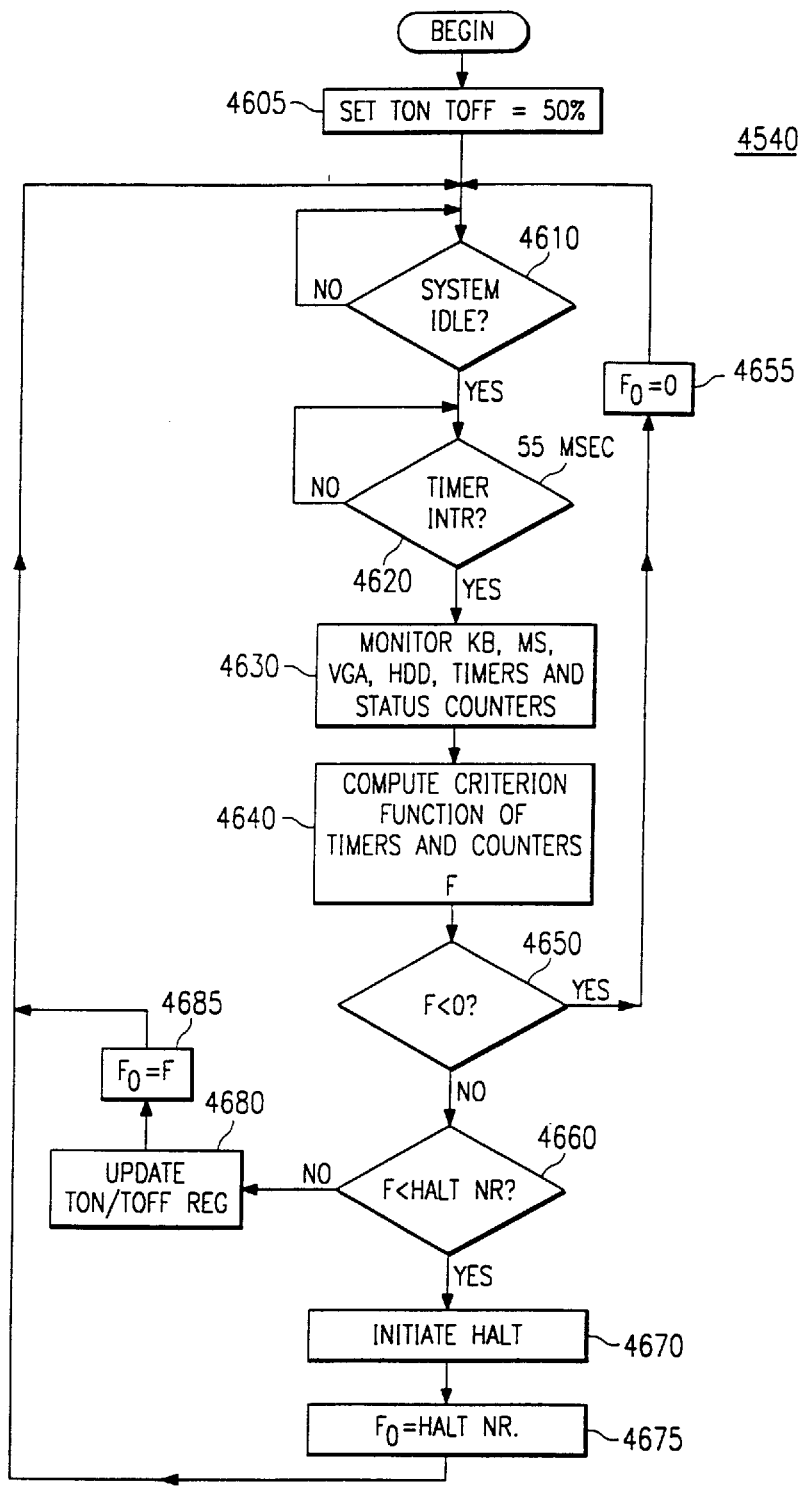
FIG. 46 is a flow diagram of a process or method of operation for power management adjustment of a TONT-OFF register of FIG. 27 in the preferred embodiment system of FIGS. 5–7.

FIG. 46 is a flow diagram of a process or method of operation for power management adjustment of a TONTOFF register of FIG. 27 in the preferred embodiment system of FIGS. 5–7. After BEGIN and an initialization of the TONTOFF to an initialization value such as 50% duty cycle in a step 4605, operations go on with a test step 4610 for system idle status, which is repeated until an idle status is found, whereupon operations proceed to a step 4620 to check for 55 ms. timer tick interrupt IRQ0. When that interrupt is detected, operations go on to a step 4630 to monitor the keyboard, mouse, display VGA, hard disk, timers and status counters of PMU 920 in PPU 110 as well as activity timers in PCU 112. In this approach, the high 4 bits (or all if desired) in each of the eight counters of FIG. 25 are concatenated and read via bus 904 by software according to step 4630 periodically (e.g. on each IRQ0 DOS timer tick).

Figure 47:
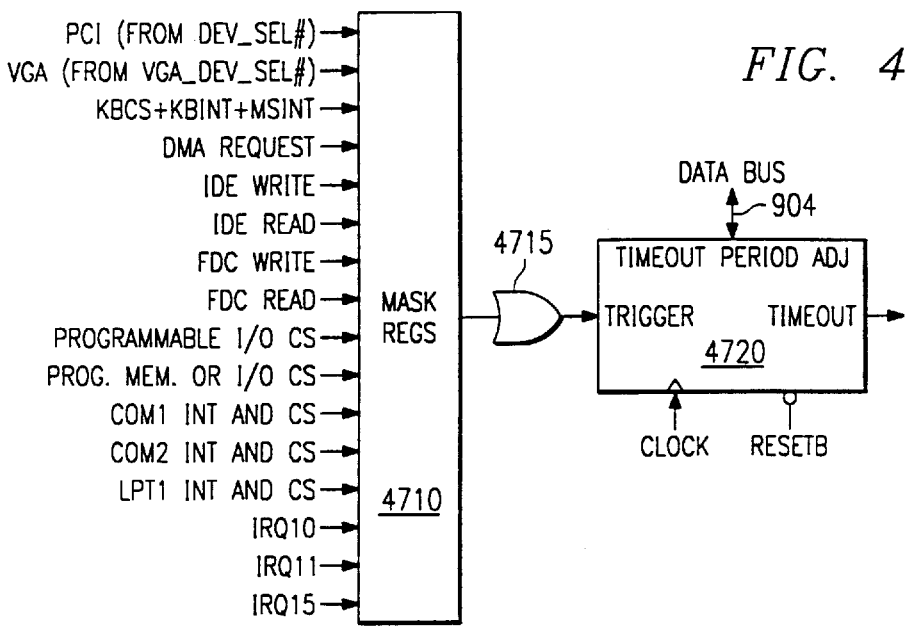
FIG. 47 is a block diagram of a system activity timer embodiment alternative to the embodiment of FIG. 25.

Next in a step 4640, the process computes a criterion function F of the values in the timers and counters. One example of criterion function F is a minimum (min function) of various values in the timers suitably weighted. FIG. 47 shows a structure for supplying data for a version of this approach, wherein the listed system trigger signals of FIG. 47 are suitably selected or masked by software write to mask registers 4710, and then the selected (unmasked) trigger signals are ORed together by an OR-gate 4715 to a common TRIGGER reset input of a counter 4720. Note that any FIG. 47 monitored or unmasked system activity between consecutive keystroke trigger events also produces a trigger of its own to freeze the counter for a read and subsequent reset at input RESETB and restart by gating in the CLOCK. Thus, the counter combines system information for all unmasked system sources to provide a time between any event and the next event which may be of the same type or another type of system event. The value in the counter upon each trigger event is read over data bus 904 by software of step 4630 and translated in step 4640 to provide the function F latest value. Since some scattering or variability of counter data in this approach is to be expected even in a system steady state, some averaging of plural successive counter values is utilized in an example embodiment. Some low predetermined value in counter 4630 is translated to be the function F zero value or low threshold Th0. Some higher predetermined value, or the maximum value that counter 4630 can have, is translated by subtraction and scaling to be a halt threshold or high threshold Th1 (scaled to be unity, for example).

Another example of a criterion function F for step 4640 is a weighted sum of the values in the timers, with the weights determined so that the process operates to minimize power consumption. A special case of the weighted sum concept applies zero weights to (or ignores) some timers. A simple special case simply monitors the VGA timer of FIG. 25 to follow keyboard and mouse activity.

In a succeeding test step 4650, the criterion function F value computed in step 4640 is compared with a predetermined first threshold value such as zero. If the criterion value is less than the first threshold value (YES condition) due to substantial user demand and system activity causing low elapsed times in the timers of FIG. 25 for example, then operations loop from step 4650 back to step 4610 via a recordkeeping step wherein a note is made that the criterion value is deemed to be equal to the first threshold value (e.g. 0). However, if the criterion value F exceeds the threshold value due to low user demand (e.g. no keystrokes and mouse activity) and low system activity, then operations instead proceed from step 4650 to a step 4660.

In step 4660 the criterion function is compared to a second threshold value to determine whether the system should merely be slowed down, or should be halted. If system activity is so low that very long timer values are occurring on all the timers, for example, then operations proceed to a step 4670 to initiate a halt, such as to actively cause entrance to a Suspend state or mode by writing to bit 13 (SUSPBTN) of register SOURCE_SMI to simulate the use of the Suspend Button 32. Then in a step 4675, recordkeeping sets Fo to a deemed value equal to the second threshold, or halt number of step 4660, whence operations loop back to step 4610.

If in step 4660 criterion value F is insufficient to justify halt, operations branch to a step 4680 to update the TONTOFF register 2510 in FIG. 27. The updated value is determined according to a selected computation which provides one or more advantages such as stability of computed result in a system stead-state, freedom from hunting or erratic behavior in the TONTOFF value, relative speed of adaptation to new conditions, reduction in power consumption, user convenience, and at least approximate and preferably very close to optimum power management control.

In a first example, the updated value is computed as $$\text{TONTOFF}=[(Th1-F)/(Th1-Th0)]\times 128, \tag{1}$$

where Th1 is the halt number threshold of step 4660 and Th0 is the criterion first threshold (e.g. 0) of step 4650. So when Th0 is zero, the second example update value is one minus ratio of criterion function F divided by Th1. This first example provides all the above-listed advantages and trades off a little smoothness in change for speed of change because one value of F is used.

In a second example, an averaging filter process is employed wherein the current F value and the recordkeeping value Fo are averaged and used in place of F in the equation (1) of the first example:

$$\text{TONTOFF}=\{[Th1-(F+Fo)/2]/(Th1-Th0)\}\times 128 \tag{2}$$

This second example provides all the above-listed advantages and trades off a little speed of change for more smoothness of change because two values of F are used. More F values windowing n loops of the process 4540 can be used if the greater complexity of computation and reduction in speed of change are acceptable. The process of these examples responds to sensors of system activity to produce one or a plurality of values between first and second threshold values and representative of system activity and then repeatedly generates a control value representative of duty cycle in clock masking, as a function of the one or a plurality of said values, whereupon a clock masking circuit continually responds to the control value to establish and continually modify the clock masking function to power-manage the operation of the system. To achieve adaptive CPU clock control, the thresholds Th0 and Th1 and/or the criterion function F itself are dynamically adjusted based on errors in CPU activity prediction.

Following the TONTOFF update of step 4680, operations pass to a recordkeeping step 4685 where recordkeeping value Fo is given the current value of criterion value F, whereupon operations loop back to step 4610.

In a simple example, let Th1=1, Th0=0 without loss of generality. Let recordkeeping value Fo=0 initially, TONTOFF=50%, and F is first computed as 0.4 perhaps largely determined, for example, by a series of user keystrokes at a slow rate. Using the formula of the second example, TONTOFF={[1−(0.4+0)/2]/(1−0)}×128=102    (decimal)

In a next loop through process 4540, Fo=0.4, recordkeeping on the first value of F. Now suppose the system adjusts and operates and a new value of F comes in at 0.6 indicating the slowdown. Now the second iteration on decrement becomes TONTOFF={[1−(0.4+0.6)/2]/(1−0)}×128=64    (decimal)

Thus, process 4540 implements a servo loop that homes in on an optimum behavior that varies over time for TONTOFF and thus for the power management of the system that satisfies user demands. Different versions of process 4540 that use other servo loop or filtering formulas and steps are contemplated where these provide faster control behavior or otherwise tune the power management system.

Figure 49:
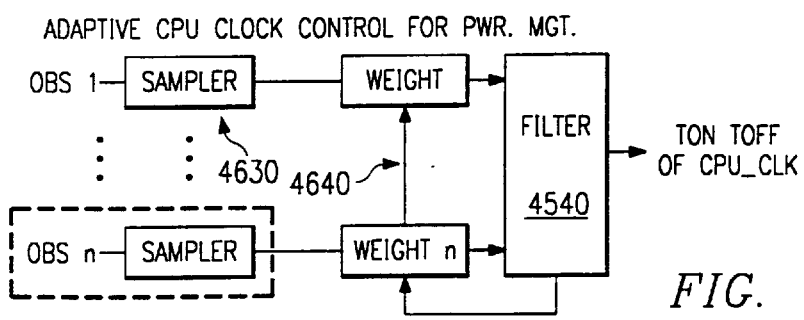
FIG. 49 is a block diagram of an adaptive CPU clock control system and method for power management.

FIG. 49 shows a structural diagram of an adaptive CPU clock control for power management. Various observations such as counter and timer values are obtained by sampling or sensing these values over time. Either hardware or software can provide the functions of observation and sampling in system, device, and process or method embodiments. In the process or method embodiment of FIG. 46, the sampling and observation occur in monitoring step 4630. Next the values or samples thus obtained are weighted in hardware or weighted by computation as described in connection with step 4640 of FIG. 46. Then these values are provided to a filter or servo structure. FIG. 46 implements this operation as the rest of the steps in the process loop 4540.

FIG. 47 is a block diagram of a system activity timer embodiment alternative to the embodiment of FIG. 25 as described above in connection with FIG. 46.

Figure 48:
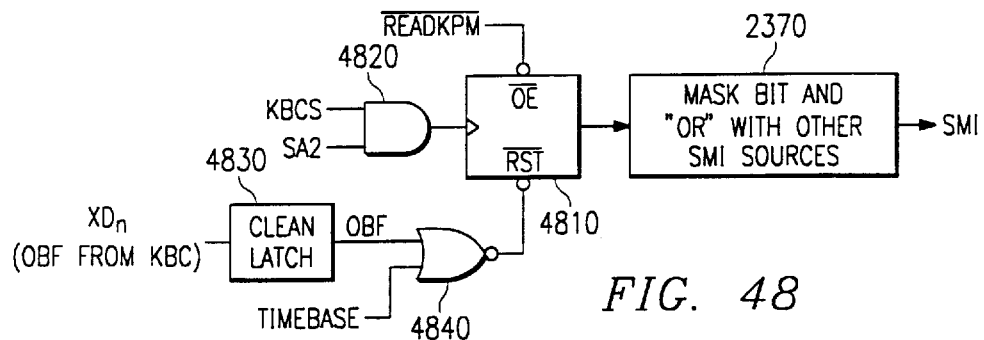
FIG. 48 is a block diagram of a keyboard polling monitor circuit embodiment for use in the SMI circuit embodiment of FIG. 28.

FIG. 48 is a block diagram of a keyboard polling monitor circuit embodiment for use to supply a trap signal to the SMI circuit embodiment 2370 of FIG. 28. In FIG. 48 a counter 4810 is clocked by the output of an AND gate 4820 fed by keyboard chip select signal KBCS and an SA2 address input from bus 904. The counter 4810 counts the transitions at the clock input, and is read for power management purposes on bus 904 upon assertion of a Read Keyboard Polling Monitor READKPM# to an output enable input of counter 4810. Also, for SMI purposes, all but a selected bit of counter 4810 are masked off so that the bit is fed to SMI circuit 2370 so that the bit is advantageously used for SMI purposes as well.

Further in FIG. 48, the count is reset in counter 4810 by an OBF output from keyboard controller 118 fed to a clean-up latch 4830 via XD bus 116 of FIG. 6. The cleaned up OBF output of latch 4830 is supplied to a first input of a NOR gate 4840 the output of which is connected to low-active reset input RST# of counter 4810. The second input of NOR gate 4840 is fed from a clock of suitably long period to act as a default reset source in case OBF does not reset the counter.

FIG. 49 is a block diagram of an adaptive CPU clock control system and method for power management as described above in connection with FIG. 46.

Figure 50:
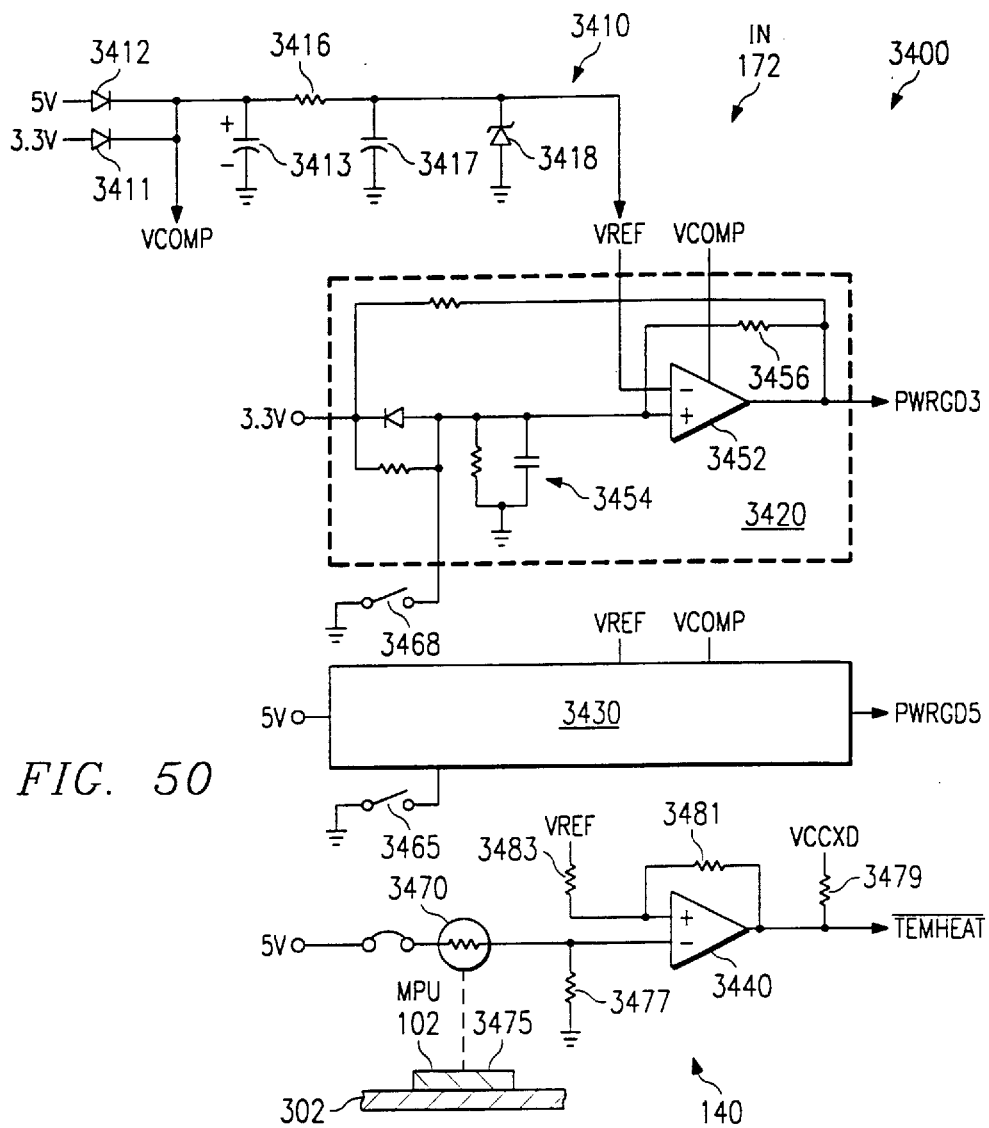
FIG. 50 is a schematic diagram of a system environment sensing circuit.

FIG. 50 is a schematic diagram of a system environment sensing circuit. In FIG. 50 a system environment sensing circuit 3400 has a reference voltage supply 3410, a 3.3 volt power-good sensor 3420 and a 5 volt power-good sensor 3430 (all in supply 172), and an analog comparator 3440 (in temperature sensor 140).

Reference voltage supply 3410 has a pair of diodes 3411 and 3412 with their anodes respectively connected to 5 volt and 3.3 volt sources and with their cathodes connected together and to an electrolytic capacitor 3413 to supply a comparator circuit supply voltage VCOMP. A reference voltage VREF which is less than VCOMP is developed by a dropping resistor 3416 series connected to an avalanche diode 3418 across the electrolytic capacitor 3413. A capacitor 3417 is connected across the avalanche diode 3418. The anode of the diode 3418 is connected to ground, and the cathode thereof is connected to a line to supply reference voltage VREF.

3.3 volt power-good sensor 3420 has a comparator operational amplifier 3452 with its noninverting (+) input connected to a voltage divider 3454 fed from 3.3 volt supply voltage. The inverting (−) input of op amp 3452 is connected to reference voltage VREF. Op amp 3452 has voltage VCOMP as its supply voltage, has its output connected to the PWRGD3 output line, and has a hysteresis resistor 3456 connected between its output and its (+) input. A switch 3460 forces the input to zero volts for disabling or test purposes.

A 5 volt power-good sensor 3430 has the same internal circuit as shown for sensor 3420, so that circuit shown in block for brevity. A switch 3465 independent of switch 3460 forces the input low on the op amp in sensor 3430 generating system wide resets for 3.3 and 5V power planes. The output of sensor 3430 is power-good 5 signal PWRGD5.

In temperature sensor 140 a temperature-responsive element 3470 such as a thermistor is thermally contacted or thermally conductively affixed to the chip package 3475 of MPU 102 that is attached to PCB 302. In another embodiment element 3470 contacts inside the package 3475 itself to the actual substrate of MPU 102 integrated circuit physically located in the package.

A five volt supply voltage is connected by a jumper across a voltage divider comprising thermistor 3470 in series with a resistor 3477. The inverting input of an op-amp 3440 is connected to receive divided voltage from the connection between 3470 and 3477. The noninverting input of op-amp 3440 is resistively connected to reference voltage VREF by a resistor 3483. A hysteresis resistor 3481 links the output of op-amp 3440 with its noninverting input. The output of op-amp 3440 supplies the low active output TEMHEAT# to FPGA 124 of FIG. 6 and is connected to a pullup resistor 3479 to VCCXD supply voltage for the XD bus circuitry. The advantage of hysteresis resistors 3456 and 3481 in FIG. 50 is to create a first threshold before the active signal is given, and then create a second threshold to which the condition must retreat before the active signal is inactivated. This promotes stability in circuit operation and system control.

Figure 51:
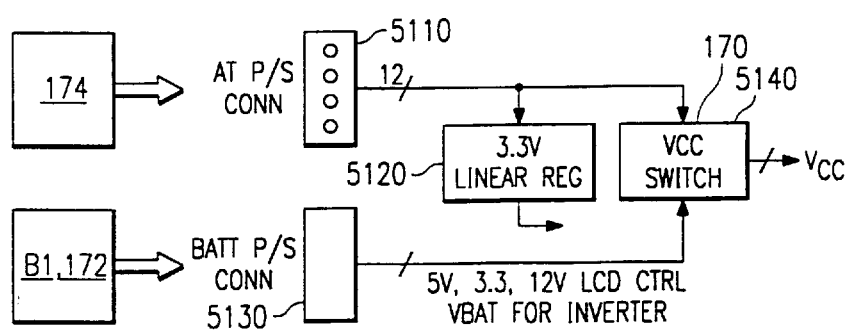
FIG. 51 is a block diagram of power supply connections for a system of FIGS. 5–7.

FIG. 51 is a block diagram of power supply connections for a system of FIGS. 5–7. Note further that PPU 110 has different VCC voltage levels on the same die as described in connection with FIG. 55. A standard AT-computer type power supply connector 5110 supplies voltage lines and supplies a 3.3v. linear regulator 5120 to provide VCC_3. A battery power supply connector 5130 has lines for 5V, 3.3V, and 12V for LCD control, EPROM programming, and voltages for MPU 102, PPU 110, PCU 112, VGA 114 and the other chips in system 100, supplied to a set of jumpers 5140, manual switches, or a software programmable VCC switch so that each voltage source and line intended for the various chip VCC destinations is effectively routed thereto. See the pinout tabulations for MPU, PPU and PCU, and the VCC tabulation in connection with FIG. 55.

Figure 52:
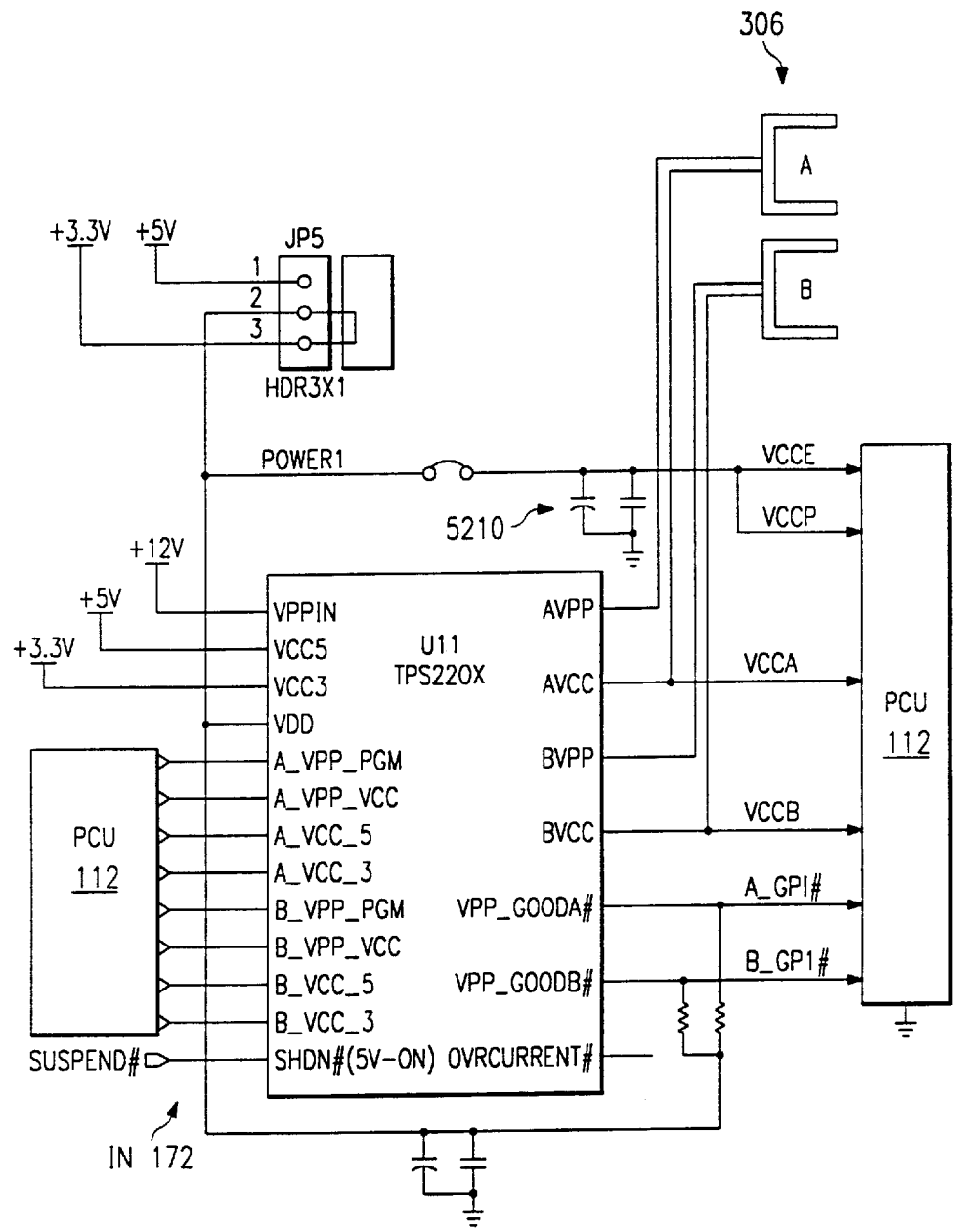
FIG. 52 is a partially block, partially schematic diagram of a power supply circuit in the system of FIGS. 6, 8, 20 and 21.

FIG. 52 is a partially block, partially schematic diagram of a power supply circuit for PCU 112 in the system of FIGS. 6, 8, 20 and 21. In FIG. 52, supply voltages 3.3V, 5V, and 12 V are distributed under the control of PCU 112 using a commercially available TPS220X circuit. A jumper block JP5 (or software programmable power switch) selectively routes 3.3V or 5V to U11, and alos to the VCC pin of PCU 112 along a line POWER1 which is suitably RF-bypassed by capacitors 5210. Voltage programming outputs of PCU 112 for card A or B are the same as the corresponding inputs of U11 marked on FIG. 52, see also pinout tabulation and FIG. 18. Card A and B supply voltages AVCC and BVCC are supplied by circuit U11 both to PCU 112 and to the upper and lower level card connectors A and B of connector 306 of FIG. 8. Card A and B programming voltages AVPP and BVPP are supplied by chip U11 to the upper and lower level card connectors A and B. VPPGOODA# and VPPGOODB# outputs of circuit U11 connect respectively to pin inputs A_GPI and B_GPI of PCU 112 which are described further in connection with PCU 112 elsewhere herein.

The SUSPEND# line of FIG. 20 from PPU 110 is fed to a low-active Shutdown input SHDWN# of circuit U11. Because circuit U11 of FIG. 52 cooperates closely with PCU 112 in this embodiment, they are shown in one block 112, U11 of FIG. 20.

Figure 53:
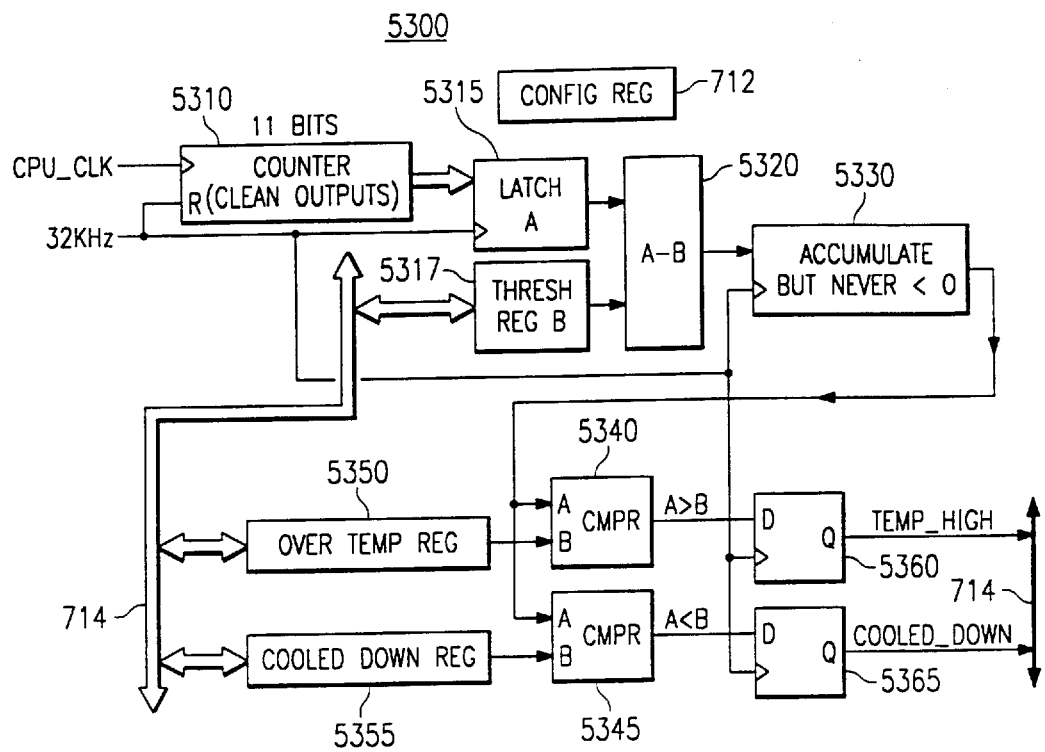
FIG. 53 is a block diagram of a temperature sensing and control circuit embodiment for implementation in FPGA 124 of FIG. 6.

FIG. 53 is a block diagram of a CPU-clock-rate temperature sensing and control circuit embodiment for implementation in MPU 102 or PPU 110 of FIG. 6. The illustration shows MPU 102 as the site, for example.

In FIG. 53, the CPU clock CPU_CLK of FIG. 36 (also designated as PH1/PH2 output of buffer 3610) is fed to a temperature sensing circuit 5300 which advantageously monitors the actual MPU 102 activity. Circuit 5300 has a counter 5310 which is clocked by CPU_CLK and provides clean outputs to a Latch A 5315. Latch 5315 is clocked by 32 KHz. clock, while counter 5310 has its reset input connected to sufficiently delayed 32 KHz. clock to allow Latch A to capture the count before counter 5310 starts over. The number of bits N in the counter 5310 is at least such that 2-to-the-N-power is about the same as or greater than the ratio of the CPU nominal core clock frequency at 100% MASKCLK duty cycle to the frequency of the counter reset clock (here 32 KHz.). For a 66 MHz. CPU clock and 32 KHz. reset clock, the ratio is 2062, close to 2048 or 2-to-11th power. Therefore, counter 5310 is at least 11 bits long in this embodiment. The reset clock is set high enough to conserve counter bits in 5310 and low enough so that a substantial sample of CPU clock pulses is taken.

A Threshold Register B 5317 is loaded from local bus 714 (FIG. 9) with a value indicative of the number in latch A 5315 which would keep the temperature of MPU 102 constant, considering the ambient temperature, thermal resistance and convective cooling level for MPU 102. Next a subtractor unit 5320 outputs the difference A–B of the contents of Latch A and Latch B to an accumulating circuit 5330 which keeps a running total of entries, and which is limited to positive values, and zeroing on negative totals (but not merely negative inputs). The contents of accumulator 5330 model the temperature of MPU 102 rising and falling with activity level.

The output of accumulator 5330 is supplied to each operand A input of a pair of comparators 5340 and 5345. Over/Under temperature limit values supplied by software via bus 714 are loaded into respective registers 5350 and 5355 which in turn respectively feed the B operand inputs of comparators 5340 and 5345. A comparator 5340 A greater-than B logic level output and a comparator 5345 A less-than B logic level output are respectively fed to the D data inputs of a pair of one-bit latches 5360 and 5365. These two bits TEMP_HIGH and COOLED-DOWN respectively are readable on bus 714 by power-management software. Accumulate circuit 5330, and latches 5360 and 5365 are clocked by 32 KHz clock.

If an over temperature condition occurs, as indicated by an active one TEMP_HIGH for example, the power management software or PMU 920 hardware executes a process or method by which it issues a SUSPEND# signal to cool off MPU 102 until the COOLED-DOWN bit goes high and the TEMP_HIGH bit goes low, whereupon the system 100 is resumed. Compared to the TEMHEAT# circuit of FIG. 50, the circuit embodiment of FIG. 53 provides advantages of programmable hysteresis levels in registers 5350 and 5355, as well as direct electronic sensing of the electronic circuit without actual thermal contact. On the other hand the TEMHEAT# circuit of FIG. 50 provides advantages such as direct thermal contact which inherently takes account of ambient temperature, chip activity, thermal resistance and convection level without special modeling circuitry 5310, 5315, 5317, 5320, 5330.

Figure 54:
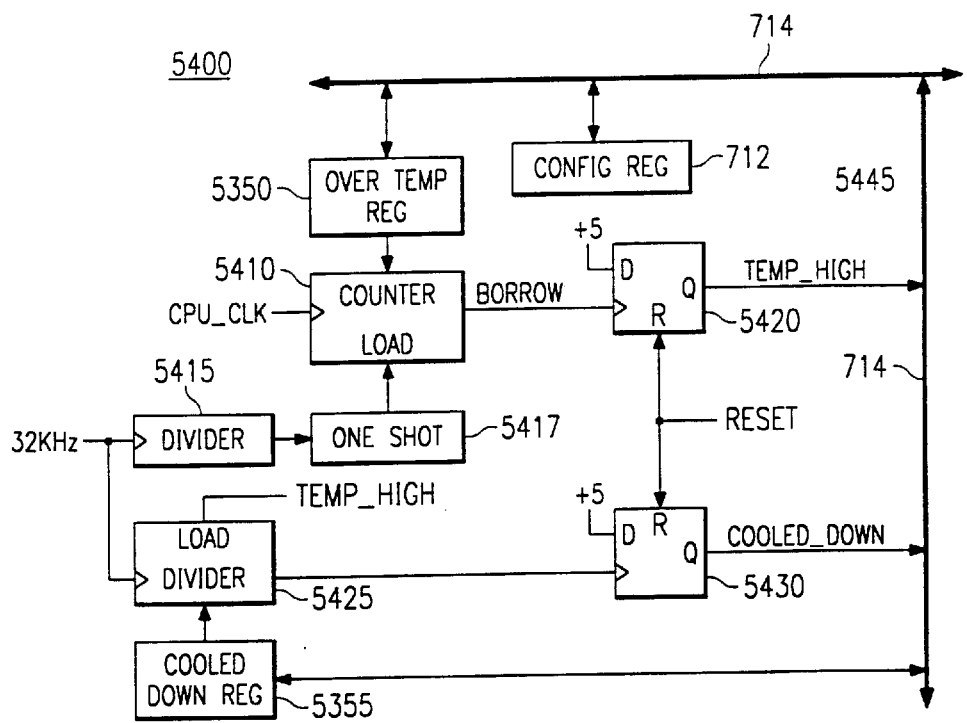
FIG. 54 is a block diagram of another temperature sensing and control circuit embodiment for implementation in FPGA 124 of FIG. 6.

FIG. 54 is a block diagram of another temperature sensing and control circuit embodiment 5400 for implementation in MPU 102 or PPU 110 of FIG. 6 and having fewer blocks. Local bus 714 can write to Over Temp register 5350 and Cooled Down Register 5355, and can read output bits for Temp High and Cooled Down.

In FIG. 54, 32 KHz. clock is divided by a frequency divider 5415 which rolls over and triggers a one-shot pulse generator 5417 to periodically supply a Load signal to a LOAD terminal of a counter 5410 whereupon the over-temp register 5350 value is loaded into counter 5410. The high speed CPU clock CPU_CLK clocks counter 5410 in a down-counter mode. If counter 5410 counts so many clock pulses that it counts down to zero, a BORROW output goes active and clocks a latch 5420. Latch 5420 has its D input tied high, so that after occasional software polling reset R, a BORROW output passes the high D input to the Q output to actively indicate a TEMP_HIGH condition.

A frequency divider 5425 down-count clocked by 32 KHz, a latch 5430 fed by divider 5425 Borrow, and Cooled Down Register 5355 for loading divider 5425, provide a programmable timing circuit which is activated by or when TEMP_HIGH active at latch 5420. In this way, a programmable time elapses upon TEMP_HIGH going active before a COOLED_DOWN output of Latch 5430. Power management software or hardware resets latches 5420 and 5430 in some system, device and method embodiments. Also, the reset is derived from the COOLED-DOWN output in another embodiment.

Figure 55:
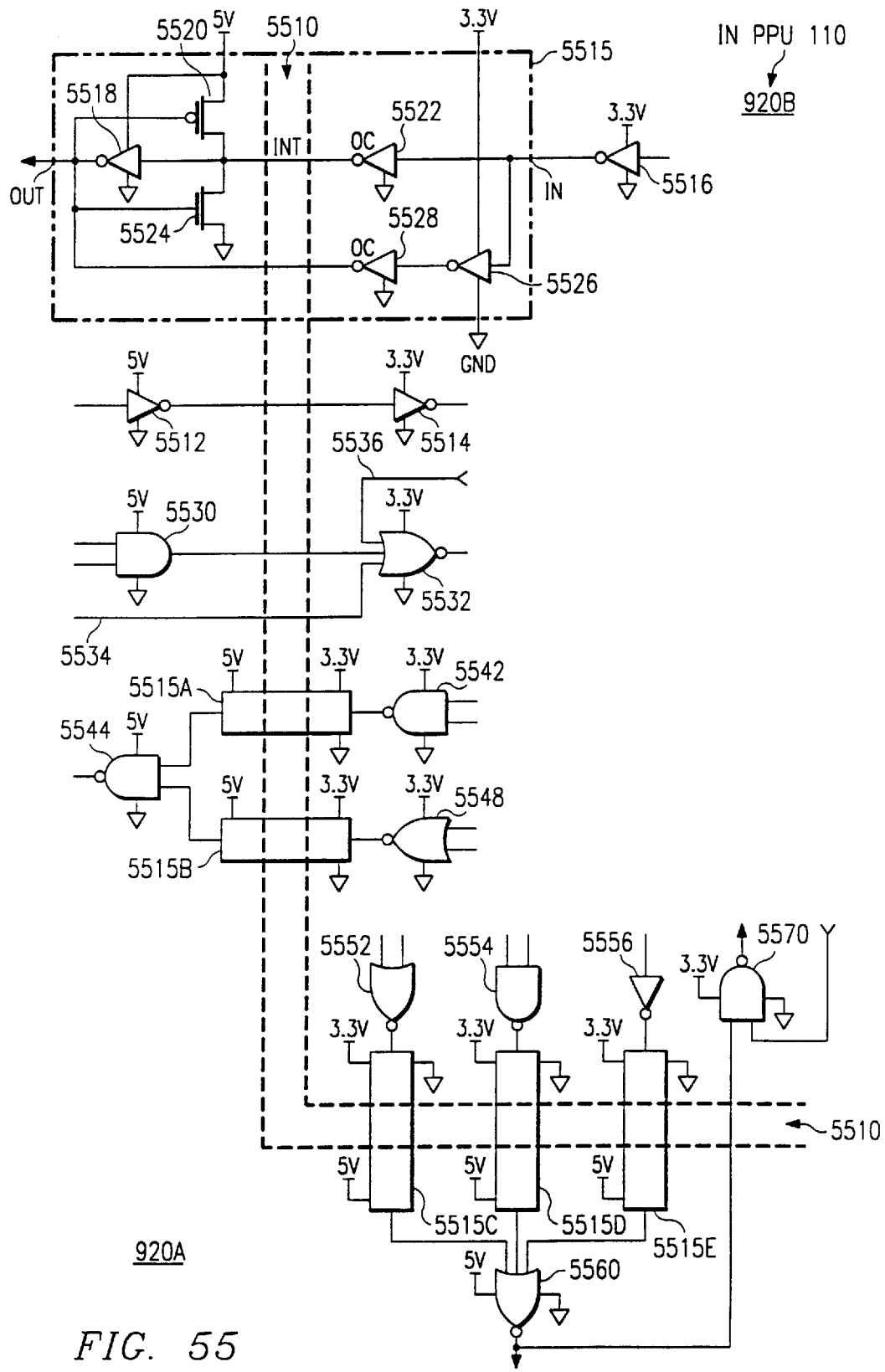
FIG. 55 is a schematic diagram of a circuitry embodiment for reducing power dissipation at a boundary between differing-voltage areas of the PPU also shown in FIGS. 6, 11, 12, and 20–22.

FIG. 55 is a schematic diagram of a circuitry embodiment for reducing power dissipation at a boundary between differing-voltage areas 920A and 920B of the PPU 110 also shown in FIGS. 6, 11, 12, and 20–22. Dual voltage VCCs coexist on the same silicon device (such as PPU 110) to enable low power, multiple supply voltages and regions associated therewith to be integrated on the same device substrate. The die is physically sectioned into different VCC wells or regions, and a special dual voltage interface circuitry 5515 is used at the boundary each of pair of VCC wells 5510.

For a single-VCC device, a ring of VCC and ground GND is provided around the I/O buffer area at the periphery of the die or chip. For multiple VCCs, the VCC ring is segmented into different pieces, and the GND ring remains continuous or unsegmented. In the exemplary embodiment of PPU 110 in FIG. 12 several rings are used:

V_3: 3.3 volt supply for PMU 920A (unless 5v. used), PCI/AT I/F 902, 906, central region for 910,914,916

V_XD: 3.3V/5V selectable voltage for XD port

V_DK: 3.3V/5V selectable voltage for IDE IF/FDC 932, 934

V_5: 5V supply for SIU 936 and PIU 938 and also for PMU 920A if 3.3 volts is not used for PMU 920A

V_bat: 3 V battery supply for PMU 920A, RTC 918 and RAM 919

Pin numbers intermediate on the edges of the PPU 110 die of FIG. 12 indicate specifically where the breaks of the VCC ring occur in terms of I/O site location.

For a single-VCC device a grid of VCC and GND suitably exists in the core of the device and not in the I/O buffer strip area around the edges of the device. For multiple VCCS, the VCC grid is suitably isolated into regions respective to each tabulated "V_" VCC above, advantageously preventing power supply shorts.

In the next description, a boundary between a 5 volt VCC PMU 920A and a 3.3 volt battery powered PMU 920B is used as an example. Another equally applicable area is the boundary between the 3.3 volt central region for 910, 914, 916 and the adjacent 5 volt region for SIU 936, PIU 938 and the adjacent selectable 3V/5V region for FDC 932, IDE I/F 934.

In FIG. 55, an inverter 5512 with 5 volt VCC feeds an inverter 5514 with 3.3 volt VCC in a signal path leading from higher supply voltage VCC section 920A to lower VCC section 920B. In an opposite path, an inverter 5516 with 3.3 volt VCC would, without more, feed an inverter 5518 with 5 volt VCC in an internal signal path INT leading from lower supply voltage VCC section 920B to higher VCC section 920A. Signal swing on the 3.3 volt inverter 5516 would be insufficient to prevent high current events in the 5 volt inverter 5518 wherein an upper p-channel FET therein is partially on, and a lower n-channel FET is also partially on.

The embodiment in FIG. 55 avoids such power-wasting and heat dissipating behavior, first, by providing a positive feedback circuit or element on the device 5518 on the higher VCC side of the boundary 5510. Such circuit is suitably, for example, a p-channel FET transistor 5520 having a gate connected to the output of inverter 5518, and the source and drain terminals thereof connected between the 5 volt VCC and the inverter 5518 input. An additional device 5522, suitably an open-collector (OC) or open-drain inverter, is provided between the output of inverter 5516 and the input of inverter 5518. An n-channel FET 5524 cooperates with OC device 5522 and assists high-to-low transitions at the input of high voc inverter 5518. FET 5524 has its gate connected to the output of inverter 5518 and its source-to-drain path connected between inverter 5518 input and GND.

Inverter 5516 high-to-low transition drives a 3.3 volt inverter 5526 which in turn drives an "open-collector" (single n-channel FET) inverter 5528, which in turn drives the output node of inverter 5518 and the gate of FET 5520 low. In this way, a high-to-low transition at inverter 5516 output pulls down the inverter 5518 output node so that transistor 5520 advantageously pulls the signal INT all the way to 5V.

Conversely, a low-to-high transition by inverter 5516 pulls the input of inverter 5518 low via "open collector" inverter FET 5522, whereupon inverter 5518 output starts to go high, turning on the feedback transistor 5524 and accelerating the low-to-high transition at inverter 5518 output with greatly reduced power dissipation. The OC inverters 5522 and 5528 are sized sufficiently large relative to FETs 5520 and 5524 to drive the operations described herein.

This arrangement provides good performance even if the 5V region 920A has its VCC changed or switched to 3.3V or even a lower voltage.

A NAND gate 5530 feeds a NOR-gate 5532 in a high-to-low VCC path straddling the boundary 5510. No special feedback elements are applied to either of these two gates in this embodiment even when gate 5532 has other inputs such as 5534 from the higher VCC side and 5536 from the lower VCC side. However, low-to-high VCC circuits straddling the boundary have feedback elements applied as with block 5515 and as further described next.

A lower VCC NAND gate 5542 feeds a first input of a higher VCC two-input NAND gate 5544 on the 5 volt side. Accordingly, a power reduction circuit 5515A identical to circuit 5515 is interposed between the output of NAND gate 5542 and the first input of NAND gate 5544. A lower VCC NOR gate 5548 feeds a second input of the higher VCC two-input NAND gate 5544 on the 5 volt side. Accordingly, a second identical power reduction circuit 5515B is applied between the output of NOR gate 5548 and the second input of NAND gate 5544.

Next it is hypothetically intended to drive three inputs of high-VCC NOR-gate 5560 respectively with 1) a low-VCC NOR-gate 5552, 2) a low-VCC NAND gate 5554, and 3) a low-VCC inverter 5556. Higher power dissipation is prevented by interposing circuits 5515C,D,E (identical to 5515) between the lower VCC gates 5552,5554,5556 and the 3 inputs respectively of high-VCC NOR-gate 5560.

The output of NOR-gate 5560 is coupled back across the boundary 5510 to feed an input of a lower-VCC two input NAND gate 5570 without further feedback provision.

Figure 66:
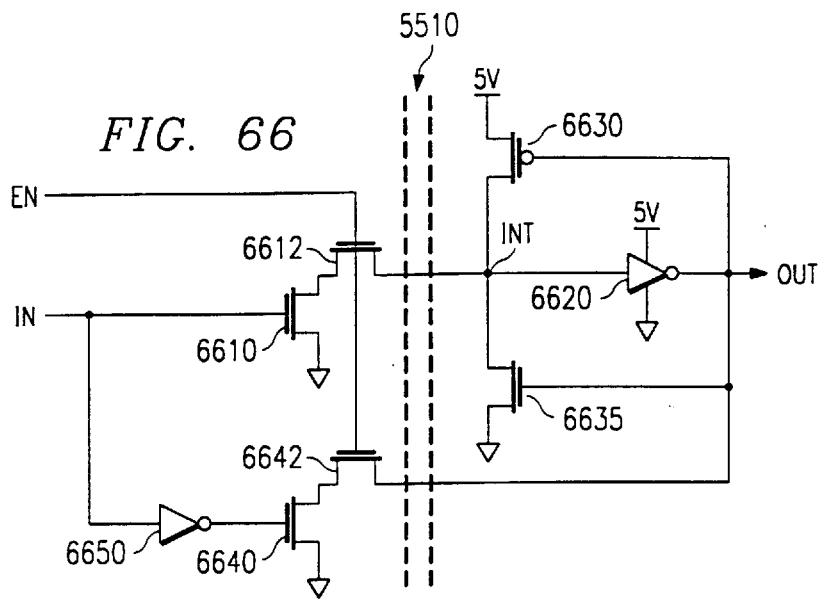
FIG. 66 is a schematic diagram of a further dual VCC power-reducing circuitry embodiment described above with FIG. 55.

In FIG. 66, a lower VCC open collector inverter 6610 has its gate connected to a signal IN. A source-drain path of FET 6610 is connected in series with the source-drain path of another FET 6612 to feed higher VCC inverter 6620 across boundary 5510. Since inverter 6610 is open collector it can pull down the INT signal causing inverter 6620 to make OUT go high. Advantageously, another open collector inverter 6640 and enabling transistor 6642 cooperate in the other direction and pull up the INT node as next described. FETs 6612 and 6642 both have their gates connected to an enabling signal EN which when active renders them conductive.

An inverter comprised of pmos FET 6630 and nmos FET 6635 has both gates connected to OUT and to the output of open collector inverter 6640 via FET 6642. The source and drain of FET 6630 are connected between the INT node and 5V VCC, and the source and drain of FET 6635 are connected between the INT node and GND. Another inverter 6650, having upper and lower FETs therein, has its input connected to the input IN of OC inverter 6610. Inverter 6650 has its output connected to the gate, or input, of OC inverter 6640.

When IN is going from high to low, inverter 6610 is off and the output of inverter 6650 goes high, taking the output of OC inverter 6640 low which forces the output OUT low via transistor 6642 directly. This also causes transistor 6635 to shut off, and transistor 6630 to conduct, therefore pulling the signal INT to the higher VCC 5V supply voltage and causing higher VCC inverter 6620 to output a hard low.

Advantageously, the principles and circuits disclosed in FIGS. 55 and 66 as examples above confer power-reduction improvements to PMU 920 which are applicable to all kinds of gates and circuit variations in dual VCC voltage circuitry for multiple-supply-voltage applications. Also FIG. 66 shows an example circuit useful in providing a three-state (floating) operation, thanks to the enabling/disabling transistors 6612, 6642, as for a data bus connection at OUT on the higher VCC side of the boundary.

Figure 56:
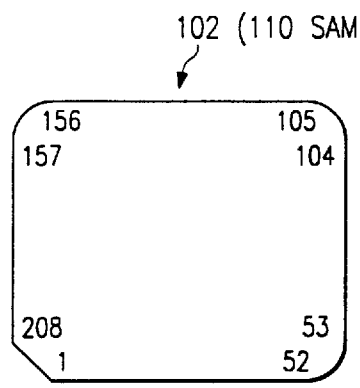
FIG. 56 is a pin diagram for a 208 pin PQFP package used for the MPU and the PPU, the pin assignments tabulated for each chip in the Detailed Description.

FIG. 56 is a pin diagram for a 208 pin PQFP package used for the MPU and the PPU. The pin assignments are tabulated for each chip elsewhere herein.

FIG. 57 is a pin diagram for a 208 pin PQFP package used for the card interface MCU and related to operational regions of the MCU. The pin assignments are tabulated for them elsewhere herein.

Figure 58A:
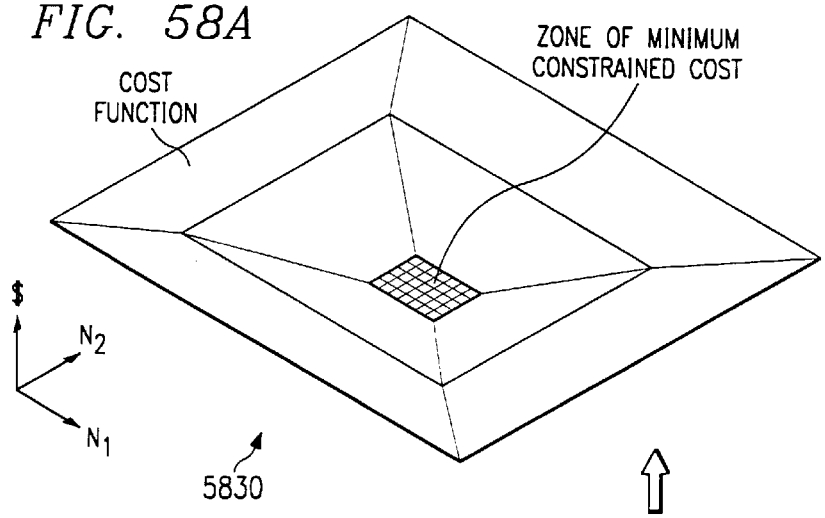
FIGS. 58A–C are a diagrams showing a sequence of cost function graphs in a method of determining a preferred system embodiment for FIGS. 5–7 and FIG. 8.
Figure 58B:
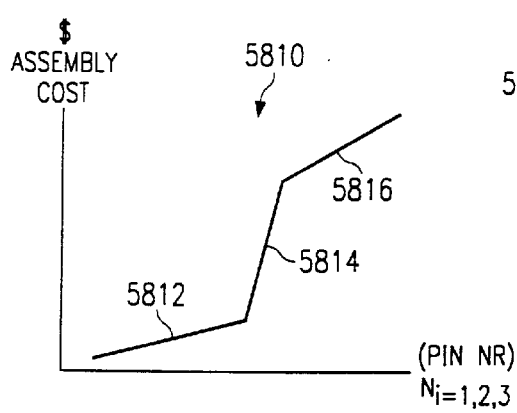
Figure 58C:
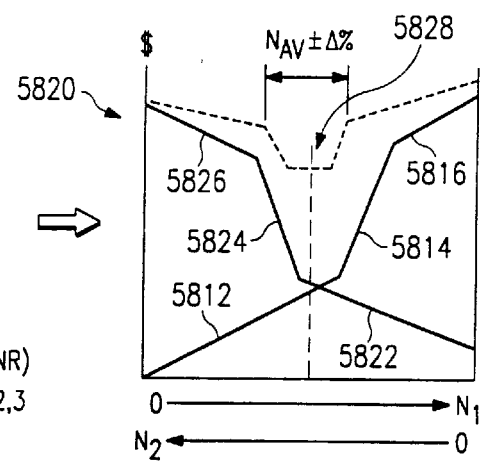

FIG. 58 is a diagram showing a sequence of cost function graphs in a method of determining a preferred system embodiment for FIGS. 5–7 and FIG. 8. A first graph 5810 shows assembly cost of a chip versus pin number qualitatively having a first low-slope rising portion 5812, a high-slope rising portion 5814, and another less-high slope rising portion 5816. A second graph 5820 shows combined cost of two chips which trade off pin numbers against each other. The first chip has portions 5812, 5814, and 5816 as in graph 5810, and the second chip has complementary portions 5822, 5824 and 5826 that are the mirror image of the first portions due to the tradeoff. A sum curve 5828 of the first two curves has a minimum near the average number of pins of the two chips plus/minus a low cost zone of delta of about 10% to 20% either side of the average. The next step in the analysis considers a graph 5830 wherein three chips such as MPU 102, PPU 110 and MCU 112 trade off pin numbers in various partitions all comprising the system functionality of system 100. The merit function is COST as a function of pin number N1, N2, N3 for each of the three chips, where the sum of N1, N2 and N3 is a constant. In general the merit function is constrained by some function F(N1,N2,N3)less than or=0. Analogous to graph 5820, the graph 5830 shows a three-dimensional concave zone of cost that has a minimum cost region cross-hatched in FIG. 58. This region is centered around the average number of pins of the three chips AVGNR=(N1+N2+N3)/3. The region has a size between about plus/minus 10% to 20% of this average. In the system 100 embodiment, the numbers of pins are selected all equal at 208 pins. Advantageously, this pin relationship of near or substantial equality in the context of system 100 provides a low system from both a chip and board cost perspective.

Figure 59:
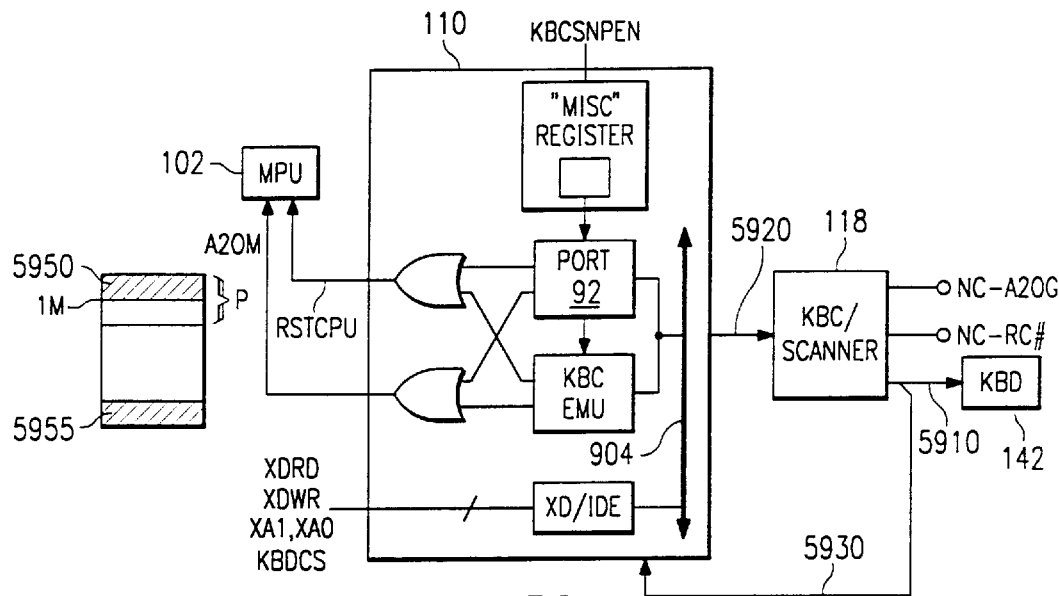
FIG. 59 is a snooping embodiment for an improved system combination of PPU and keyboard controller of FIG. 6.

FIG. 59 is an improved snooping embodiment for an improved system combination of PPU 110 and keyboard controller 118 of FIG. 6. A background is provided by TACT84500 EISA Chip Set, Texas Instruments, 1992, pp. 6–48,49 which is hereby incorporated herein by reference. The keyboard controller KBC 118 works in an 8042 compatible manner, or in an IBM PC AT compatible manner, and is a relatively slow-speed mask-ROM-programmed (or reprogrammable) microcontroller. At times the KBC 118 in a prior art system would switch the prior art 8086 CPU into real mode from protected mode by asserting a Reset signal to the 8086 CPU. Since the early 8086 CPU had an address space ranging only up to 1M (2-to-the-20 power), but later x86 CPUs had an extended address space beyond 1M, there arose a need to provide a mask bit for the address bit A20. For example, when paging is provided, the system can set up a page P from 1M minus 32K to 1M plus 32K. Then merely by using the A20M mask signal, the CPU can access the area 5950 from 1M to 1M plus 32K in protected mode or the area 5955 from zero to 32K (instead of 1M plus 32K) in real mode. Thus, the signals A20M and RSTCPU work together to support this x86 system feature.

Since the KBC 118 is a relatively slow microcontroller, and some operating system functions call for numerous switching operations back and forth between protected mode and real mode, the system performance has heretofore been slowed down because of the latency (delay) in response of KBC 118. In fact, some software has even taken advantage of this latency by first providing for a keyboard controller output that after latency would provide a protected-to-real mode switching operation, and the software continuing to have code executing for a while during a first part of the latency period.

PPU 110 has a configuration bit KBCSNPEN bit 7 in the PCI configuration space for PPU 110 address A8. This KBCSNPEN bit enables or disables circuitry that looks for input commands via bus 904 to PORT 92h to activate the A20M and RSTCPU pins. BIOS software operations determine whether to set this KBCSNPEN bit or not.

The embodiment of system 100 and PPU 110 further includes a keyboard emulator KBC EMU for high-speed emulation of KBC 118 by directly monitoring the fast-AT bus 904 inside PPU 110. This KBC EMU is on the same single chip as the fast-AT bus 904 and the PCI bus interface and PCI configuration registers. For software compatibility purposes, the KBC EMU is suitably provided with a predetermined or a register programmable delay on its A20M and RSTCPU outputs to cover only the interval occupied by the operations of such existent software which in some systems encroaches into part of the KBC 118 latency period. KBC EMU is arranged to have hardware that creates these signals otherwise as fast as possible to improve system operation. If such software is absent from the system, then the interval of KBC EMU is established to be as fast as its hardware allows.

This structure and method is distinguished from yet another type of earlier approach of filtering out a designated sequence of input commands on a line 5920 such as the commands relating to the A20G and CPU-Reset RC# signals to prevent them from reaching keyboard controller 118, nor sending inhibiting signals from PPU 110 to KBC 118 to prevent it from responding with A20G and RC# outputs 5910 of KBC 118 to such commands when sent.

Keyboard controller 118 in one embodiment is suitably a Mitsubishi M38802E2FP chip. The 8 bits wide of data on XD bus 116 are coupled to inputs DQ0-7 on KBC 118. A keyboard clock source line LKBDCLK in lines 5930 is supplied by PPU 110 from the KBDCLK pin of PPU 110 to the XIN input of KBC 118. A second line RSTXD# in lines 5930 output by PPU 110 connects the RESET# input of KBC 118 to the RSTXD# pin of PPU 110.

Lines 5910 between KBC 118 and keyboard KBD or mouse MS are:
KBDIRQ keyboard interrupt request
KCLK keyboard clock
KDATA keyboard data
MSIRQ mouse interrupt request
MSCLK mouse clock
MSDATA mouse data Lines 5920 between PPU 110 and KBC 118 are:
XD0-7 Data
XDWR# XD write to IOW# of KBC
XDRD# XD read to IOR# of KBC
KBDCS# KBC chip select to CS# of KBC
XA1 Address line to SA2 pin of KBC The operative result of the system 100 and PPU 110 is not only swift generation of controls, but also operation of the keyboard controller 118 in the intended manner without filtering, so that any application software that polls the controller 118 finds no departure from intended operation.

Advantageously in system 100 of FIG. 6, no inputs to the keyboard controller 118 are inhibited nor filtered out. Two outputs of the keyboard controller KBC called A20G (gate A20) and RC# (Reset CPU) are simply left disconnected. In this way on-chip PPU 110 routing circuitry for the KBC A20G and RC# signals is rendered unnecessary and in this embodiment the KBC EMU circuit is directly coupled to the output logic with port 92h.

A further bit 1 designated keyboard controller emulator enable KBC_EM_EN is implemented in the "Miscellaneous" register in PCI configuration space in PPU 110. This emulator enable bit 1 when at logic one enables the operation of the hardware emulator KBC EMU of FIG. 59, and when logic zero, disables KBC EMU. In this way, the PPU 110 outputs A20M and RSTCPU are suitably OR-ed with KBC 118 outputs A20G and RC# respectively on the printed circuit board 302 in still another embodiment, while advantageously avoiding the complication of A20G and RC# inputs to PPU 110 and unnecessary pin-expense.

Figure 60:
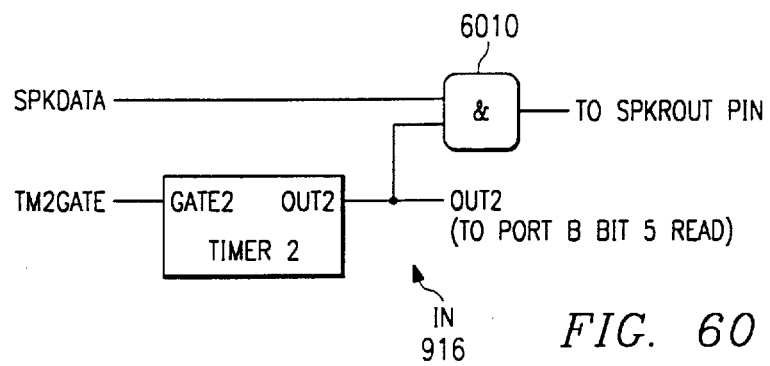
FIG. 60 is an audio circuit embodiment for timer control of audio output in the PPU of FIG. 11.

FIG. 60 is an audio circuit embodiment for timer control of audio output in the PPU of FIG. 11. An AND gate 6010 has two inputs, a first input for speaker audio data in digital form, and an output connected to the SPKROUT pin of PCU 112. A second input of AND gate 6010 is coupled to bit 1 (SPKEN) of the Miscellaneous register in PCU 112 tabulated elsewhere herein. Advantageously, software operates the register bit 1 in PCU 112 to control sound out in FIG. 5 connected to sound circuit 160 of FIG. 6.

Figure 61:
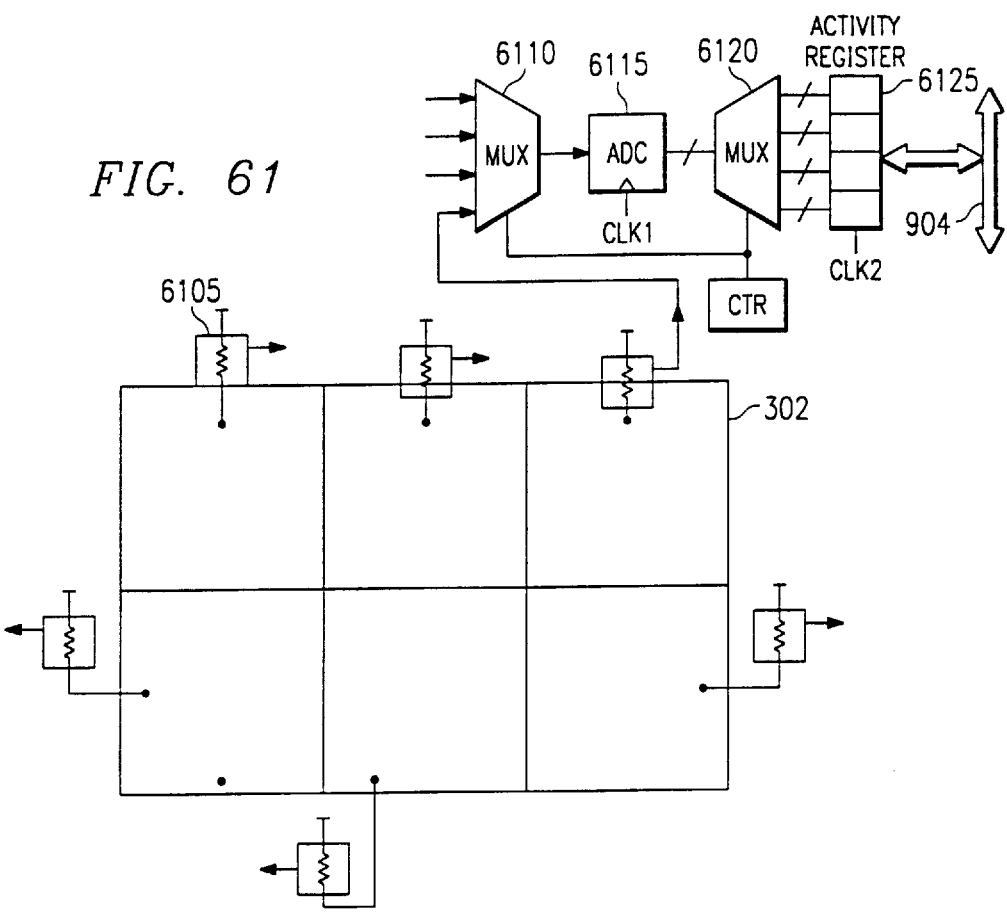
FIG. 61 is an electrical schematic of current sensors connected to the segments in the segmented power conductor plane of FIG. 61 for connection to power management circuitry of the system of FIGS. 5–7.
Figure 62:
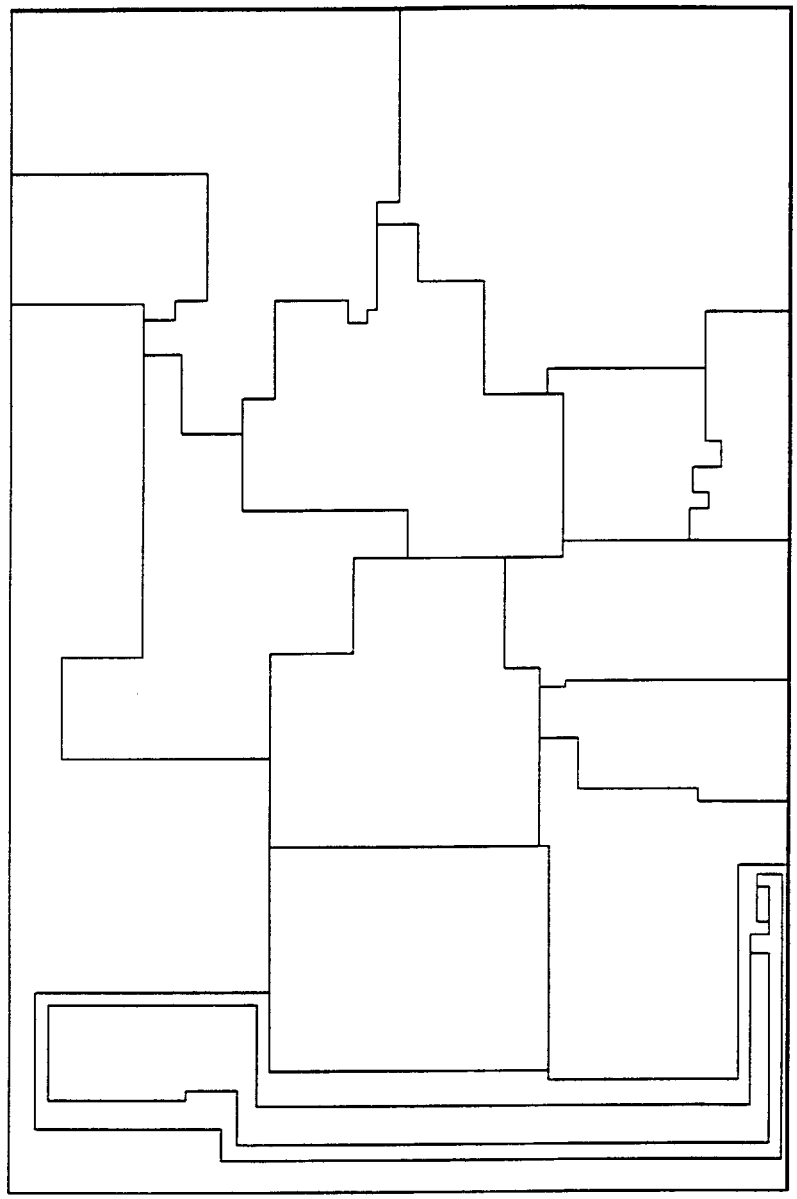
FIG. 62 is a plan view of a segmented power conductor plane in the printed circuit board of FIG. 8 for selectively supplying different supply voltages to different segments of the board.

FIG. 61 is an electrical schematic of current sensors 6105 connected to segments in a segmented power conductor plane of board 302 of FIGS. 8, 61 and 62, for connection to power management circuitry of the system of FIGS. 5–7. The current sensors 6105 are multiplexed by an analog sampling mux 6110 responsive to a sensor selecting counter CTR, and have electric current levels converted by an analog-to-digital converter ADC 6115 into one bit, or 2–3 bits as desired, of digital information representative of current consumption, and therefore power consumption, of the separate segments of board 302. More bits of analog-to-digital conversion can be used, if the extra expense justifies them. Clock signals CLK1 and CLK2 are fed to a counter CTR and to ADC 6115 as needed to step them through their functions. The bits of digital information thus obtained are then demultiplexed by demux 6120 and CTR into sections of an Activity Register 6125 accessible via bus 904, and can be stored in memory 106 and incorporated into the criterion function F of step 4640 of FIG. 46 directly or as time-averages. Since low current suggests low contribution to system activity, the bits from ADC 6115 are suitably complemented by demux 6120 or otherwise used to generate an inverse type of contribution to the criterion function in one process embodiment.

FIG. 62 is a plan view of a segmented power conductor plane in the printed circuit board of FIG. 8 for selectively supplying different supply voltages to different segments of the board. Note the jig-saw interrelationship of the segments or regions of different VCC.

Figure 63:
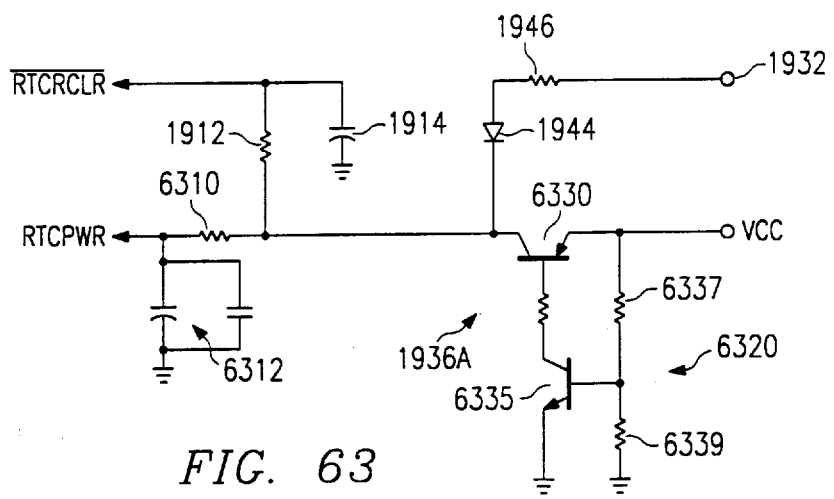
FIG. 63 is another embodiment of power circuitry for use in FIG. 21.

FIG. 63 is another embodiment of power circuitry 1936A for use in FIG. 21 instead of circuitry 1936. Coin cell diode 1944, resistor 1946, and RC network 1912, 1914 to RTCRCLR# correlate to FIG. 21. Input RTCPWR is decoupled from RTCRCLR# by provision of a second RC network wherein a RTCPWR resistor 6310 is connected at supply side to resistor 1912. Bypass capacitors 6312 are connected between pin RTCPWR and common GND.

A transistor network 6320 couples supply VCC to the cathode of coin cell diode 1944 and to the resistors 1912 and 6310. A PNP bipolar supply switching transistor 6330 has its emitter connected to supply 172 VCC, its collector connected to coin cell diode 1944, and its base resistively connected to the collector of a base drive NPN bipolar transistor 6335. The base of transistor 6335 itself is fed by a voltage divider, having resistors 6337 and 6339 in series, connected between supply VCC and ground. In this way, when VCC rises on power-up or falls on power-down, the base current in transistor 6335 rises, turning it on, whereupon base current rises in transistor 6330, turning it on as well and supplying VCC to the RTC circuitry in substitution for the backup power from the coin cell at connector 1932. Advantageously, this arrangement provides a reliable, glitch-free source of supply voltage.

Figure 64:
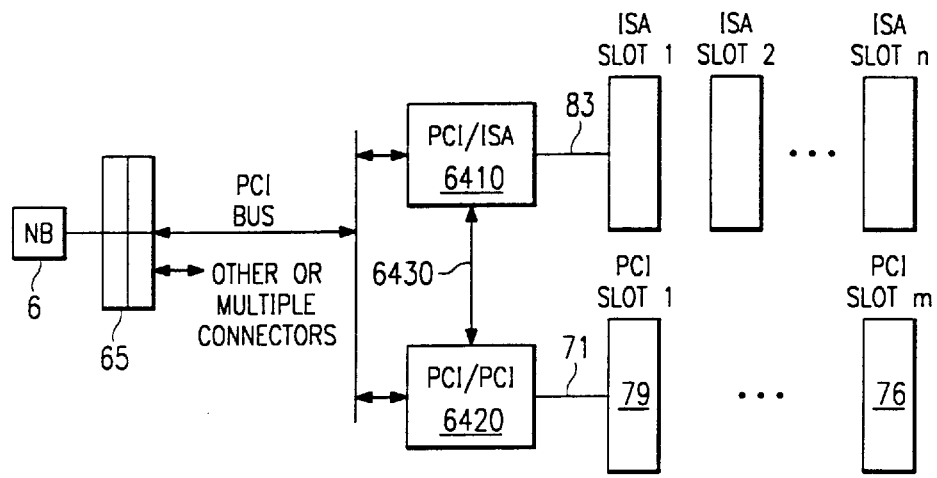
FIG. 64 is a block diagram of a bus interface circuitry embodiment in a docking station embodiment of FIG. 3.

FIG. 64 is a block diagram of a bus interface circuitry embodiment in a docking station embodiment of FIG. 3. Both a PCI/ISA interface 6410 and a PCI/PCI interface 6420 are connected to the same PCI lines to connector 65 and ultimately to notebook 6 at left. Control lines 6430 join interfaces 6410 and 6420.

Figure 65:
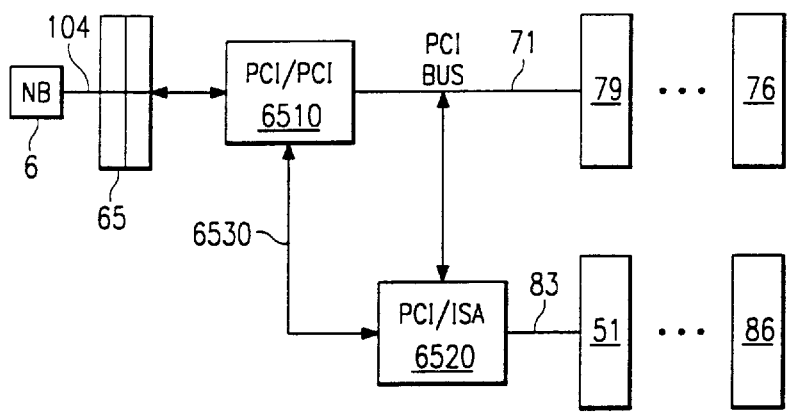
FIG. 65 is a block diagram of an alternative bus interface circuitry embodiment in a docking station embodiment of FIG. 3.

FIG. 65 is a block diagram of an alternative bus interface circuitry embodiment in a docking station embodiment of FIG. 3. Only the PCI/PCI interface 6510 is connected to the lines to connector 65. The docking station PCI bus 71 here is the point of connection to a PCI/ISA interface 6520. Control lines 6530 join interfaces 6510 and 6520. Other numerals correspond to system elements in FIG. 3 for comparison.

FIG. 66 is a schematic diagram of a further dual VCC power-reducing circuitry embodiment described above with FIG. 55.

Figure 67:
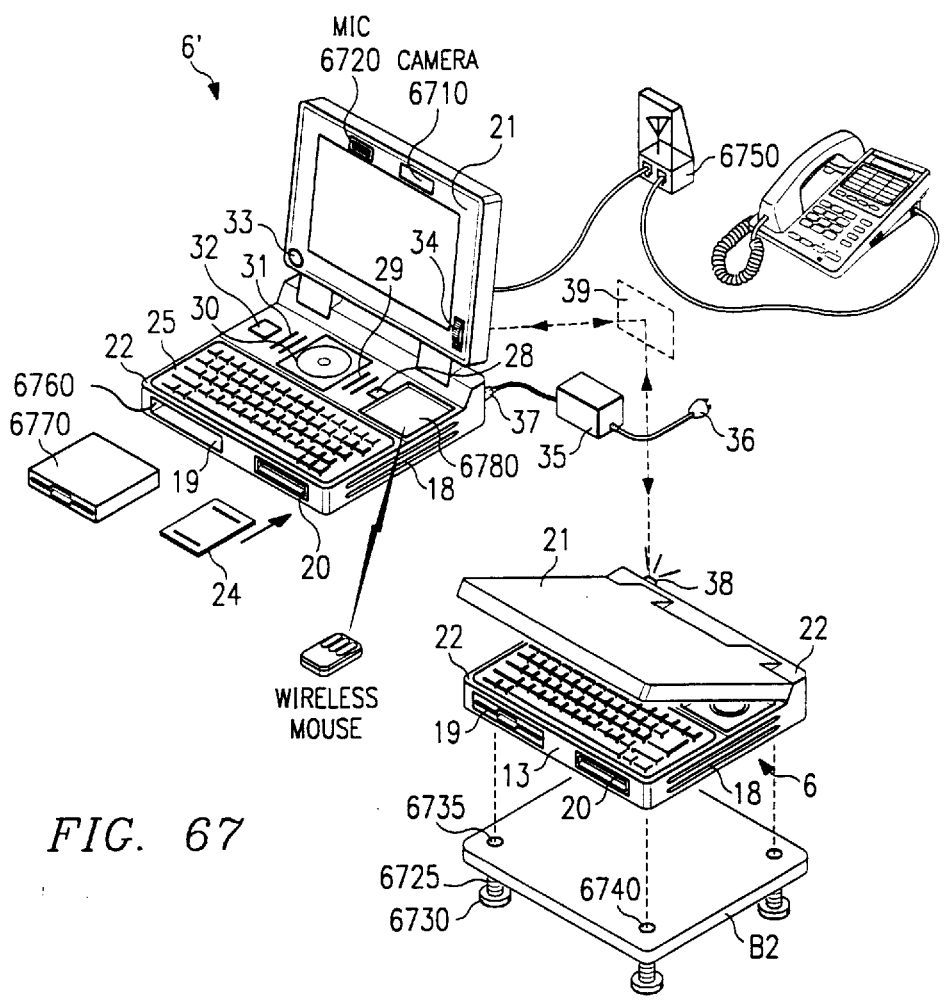
FIG. 67 is a pictorial diagram of two wireless notebook computers with videoteleconferencing capability and battery platforms.
Figure 68:
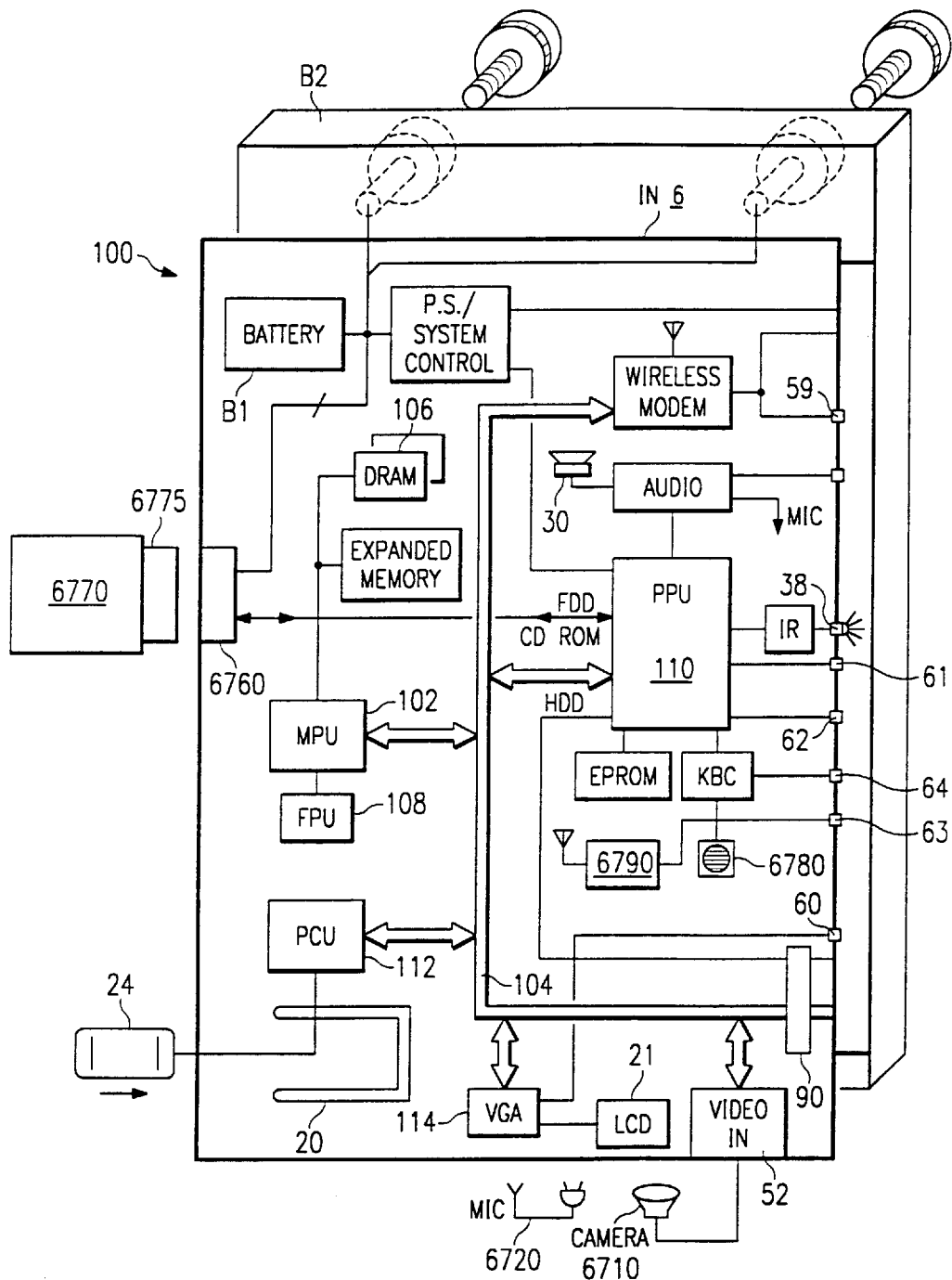
FIG. 68 is a block diagram of each of the notebooks of FIG. 67 with a partially pictorial partially schematic diagram of the connection to a battery platform.

FIG. 67 is a pictorial diagram of two wireless notebook computers with videoteleconferencing capability and battery platforms. Elements corresponding to those in FIG. 1 are left the same. In FIGS. 67 and 68, a miniature video CCD camera 6710 or other suitable camera, is mounted centrally on lid 21 above the LCD display. Camera 6710 is coupled to a Video Interface circuit 52, which in turn advantageously couples to the wide-band PCI bus 104 of notebook 6 in FIG. 68. Also, a microphone 6720 of FIG. 67 mounted on lid 21 above the LCD display is connected to AUDIO circuitry and has its microphone audio digitally processed and coupled for further sound recognition and response by PPU 110 and MPU 102 in FIG. 68.

Battery life for notebook 6 is extended by means of a portable battery B2 having a planar or plate-shaped sealed and durable container which doubles as a platform for the notebook. Rubber feet 6730 have electrically conductive screws or snap-studs such as 6725 which project through passages 6735 and 6740. The left-side front and rear passages are threaded electrically conductive metal collars molded into the body of the insulative container-platform to make internal connection with the electrodes of Battery B2. The right-side front and rear passages may be the same, but here are illustrated as through-holes. In FIG. 68, the electrical connections to battery B2 are coupled or fed to P.S./System Control Block of Notebook 6.

Battery B2 has its chemistry selected from any group of species, such as lithium ion, nickel-cadmium, nickel hydride, alkaline, and lead-acid. Selection of battery chemistry type depends on factors such as energy-density, current and voltage levels, rate of power consumption at peak and average levels, and battery-life. It is believed for platform purposes that lead-acid may be somewhat preferable, although the afore-listed and other battery chemistries are also suitable.

Furthermore, the platform geometry lends itself to radiative and induction modalities of wireless energy reception for notebook 6, as well as to other computer feature enhancement functions, wherein the computer platform element is an important article of manufacture embodiment as well as participating in a combination embodiment of computer combined with electrical platform element.

Cordless operation of notebook 6 is provided by means of internal WIRELESS MODEM which communicates to a wireless wall interface 6750 for connection to a telephone line. Use of a telephone connecting wire remains an option and the wireless wall interface includes telephone jacks for such wire connections.

A connector 6760 is provided in the rear of the left front aperture of notebook 6 so that the floppy disk drive of FIG. 1 can be manually withdrawn and inserted, and so that a CD-ROM drive or battery pack of the same insertable cross-section can be manually substituted in that left front aperture.

The trackball 26 of FIG. 1 is replaced with a finger and/or pen sensitive surface and sensor circuitry 6780 in FIG. 67 for cursor control and data input and recognition. A wireless mouse in FIG. 67 adapted for manual movement across a surface, or shaped for hand manipulation of the wireless mouse trackball in the user's hand, communicates to a wireless mouse interface 6790 of FIG. 68.

FIG. 68 is a block diagram of each of the notebooks of FIG. 67 with a partially pictorial partially schematic diagram of the connection to a battery platform as just described.

Figure 69:
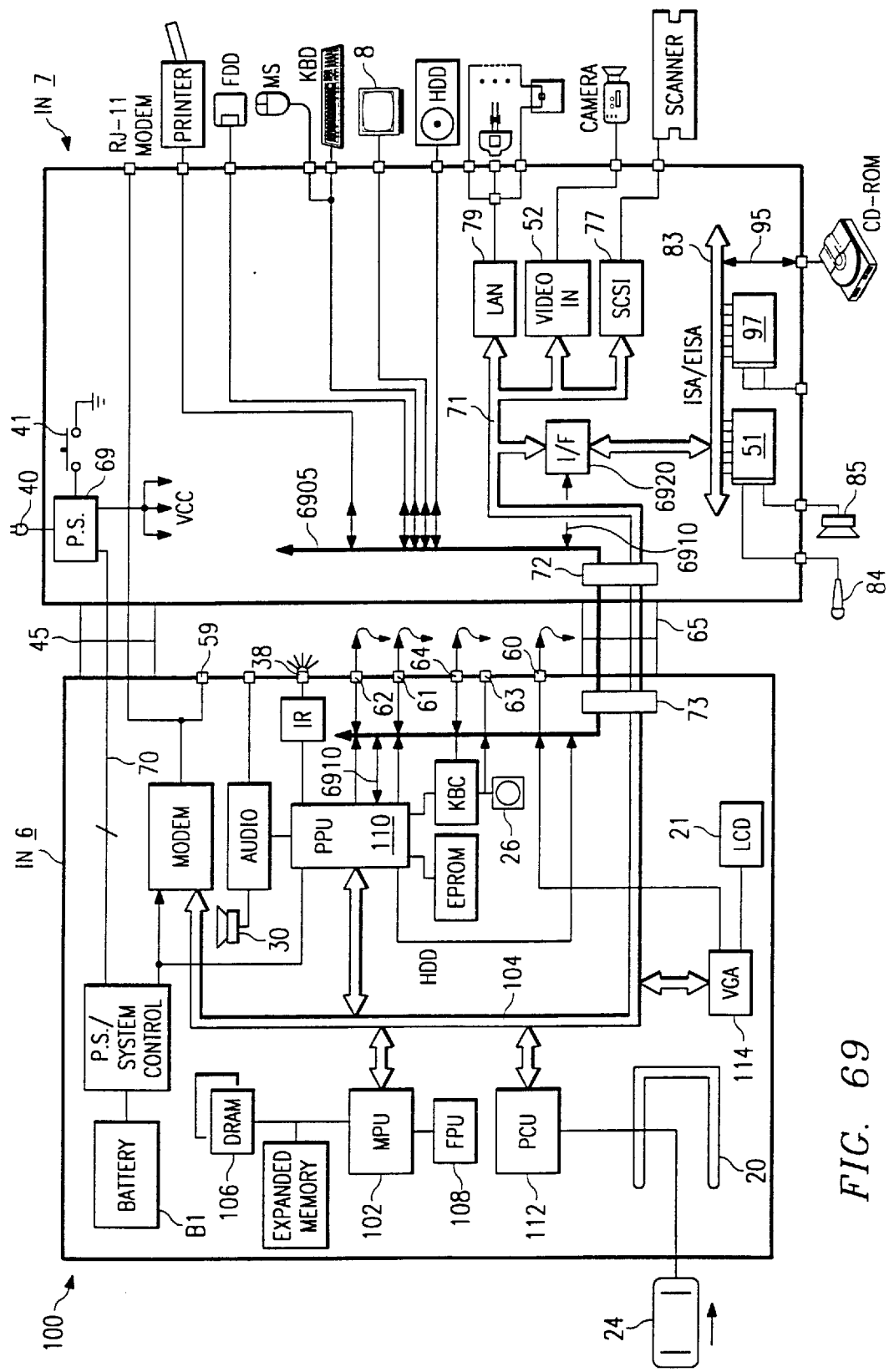
FIG. 69 is a block diagram of alternative circuits and connections for a notebook computer and docking station system.

FIG. 69 is a block diagram of alternative circuits and connections for a notebook computer and docking station system. In FIG. 69, connectors 60–64 are selected for very low-cost and a lifetime requiring a minimum of connections and disconnections. Connectors 45 and 65 are selected for ruggedness and many connections/disconnections. Additional conductors 6905 are routed either through connectors 45 or 65 or both to carry signals in addition to those of wide-band bus 104. These lines 6905 include lines for backing up connectors 60–64 which lines are connected to docking station 7 peripherals such as printer, FDD, MS, KBD, monitor 8, and HDD. In addition, lines 6905 include among their number certain sideband signalling lines 6910 in notebook 6 and docking station 7 to bidirectionally communicate between PPU 110 and a PCI/ISA bus interface circuit or chip 6920. Reliability, economic and performance advantages thus result from the physical and electrical structural improvements in the embodiment of FIG. 69.

Figure 70:
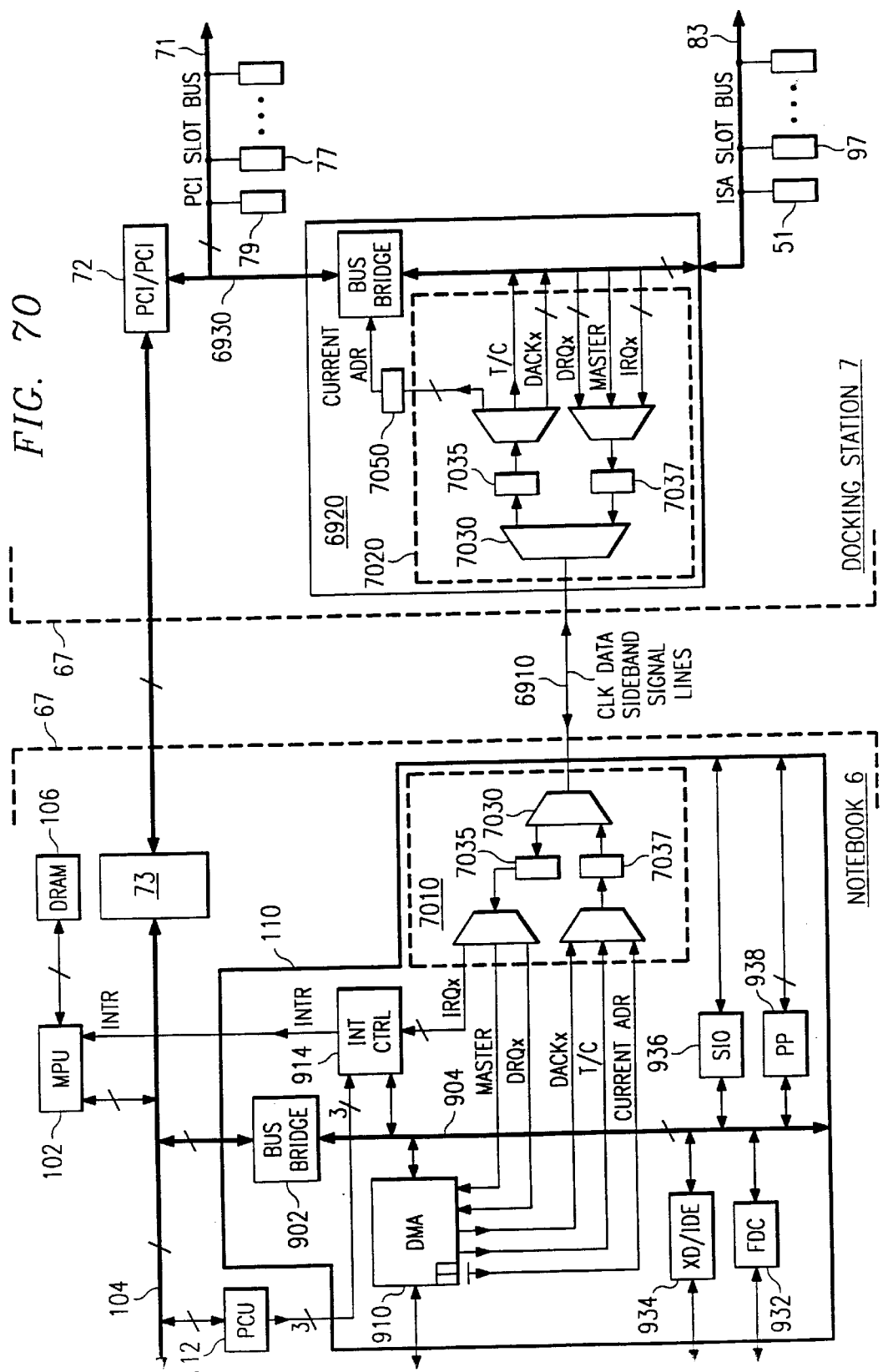
FIG. 70 is a more detailed block diagram of sideband signalling circuits and methods used in the system of FIG. 69.
Figure 71A:
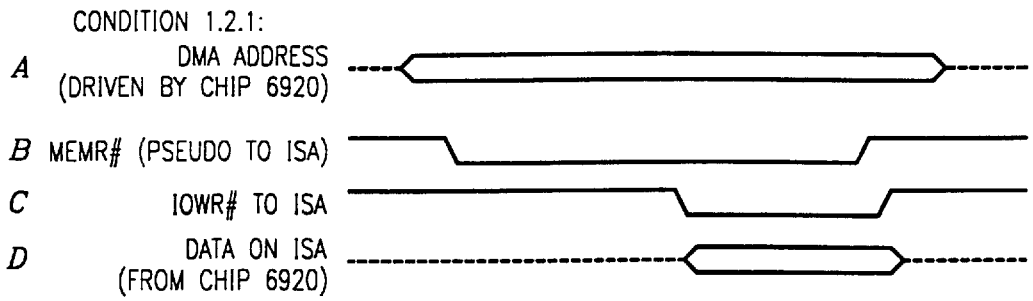
FIGS. 71A–D are a set of waveforms for different operational cases of the sideband signalling circuits and methods of FIG. 70.
Figure 71B:
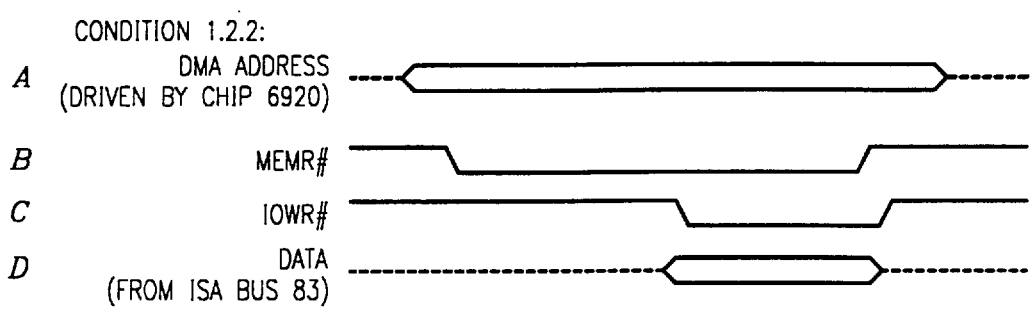
Figure 71C:
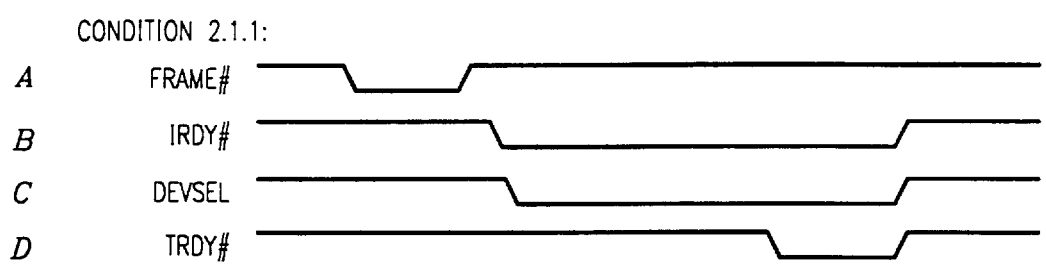
Figure 71D:
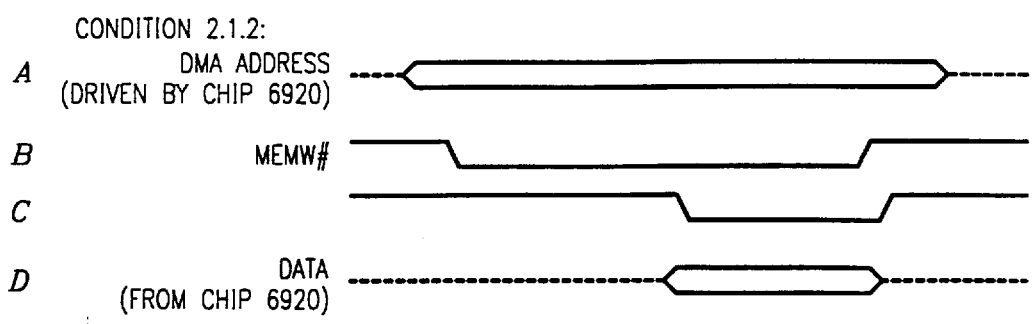

FIG. 70 is a more detailed block diagram of sideband signalling circuits and methods used in the system of FIG. 69. In FIG. 70, a PCI bus 104 is connected to microprocessor MPU 102, card interface chip PCU 112, peripheral unit PPU 110, and buffers 73, Buffers 73 connect notebook 6 bus 104 to docking station 7 PCI/PCI interface 72 which in turn is connected via lines 6930 to PCI/ISA bridge circuit 6920 and thence also to a docking station PCI slot bus 71 to various slots and circuit boards or cards 79, 77, etc. PCI/ISA bridge 6920 connects to a docking station ISA slot bus 83 and to ISA slots and circuit cards 51, 97, etc.

PPU 110 has DMA controller 910 of FIG. 15, Interrupt Controller circuitry 914 of FIGS. 11, 38 and 43, XD/IDE interface 934, Floppy Disk Controller 932, Serial port(s) SIO 936 and parallel port 938 among other circuitry of FIG. 11. In addition, a serial port circuit 7010 (distinct from SIO 936) is coupled and communicates bidirectionally via sideband signal lines 6910 to and with a serial port circuit 7020 in the interface circuit 6920 in the docking station. In the sideband signal lines 6910 a clock signal line CLK provides timing, and one (or more if desired) serial data line(s) SERIAL DATA carry time-multiplexed bits serially representing certain ISA control signals from docking station 7 which are advantageously utilized by DMA controller 910 and Interrupt Controller 914 in PPU 110 in notebook 6.

An ISA bus has a number of lines with names and input or output character as tabulated below. A signal name hyphen prefix "-" means low-active.

| SIGNAL NAME | I/O |
|---|---|
| IRQ15, 14, 12–9, 7–3 | I |
| DRQ7–5, 3–0 | I |
| -DACK7–5, 3–0 | O |
| -MASTER | I |
| OWS | I |
| -SMEMW | O |
| -SMEMR | O |
| -MEMW | I/O |
| -MEMR | I/O |
| -MEM CS16 | I |
| -I/O CS16 | I |
| -IOW | I/O |
| -IOR | I/O |
| -I/O CH CK | I |
| SD15–0 | I/O |
| -I/O CH RDY | I |
| AEN | O |
| SA19–0 | I/O |
| RESET DRV | O |
| CLK | O |
| LA23–17 | I/O |
| -Refresh | I/O |
| T/C | O |
| BALE | O |
| OSC | O |
| SBHE | I/O |

Docking Station 7 ISA slot bus 83 in this example has the above lines. Bridge circuit 6920 controls ISA bus 83. PPU 110 has an improved fast on-chip ISA bus 904 controlled by the bridge circuit 902 of FIGS. 11 and 14. PPU 110 is subtract-decoded on the PCI bus 104 if it is not docked (meaning that it responds to a PCI cycle if no other PCI agent does so) and becomes positive decoded when it is docked to docking station 7. A hardware trap pin or register bit is used to program whether PPU 110 has positive decode. The identity of a docking station 7 chip or card which is subtractively decoded is determined by bridge circuit 6920.

In a now-described docking station-notebook DMA/IRQ control embodiment for improving any of the systems described herein, one DMA controller, or one set of cascaded DMA controllers is established in the system to provide economy of design. In FIG. 69 the DMA controller for the notebook and docking station as a system is DMA controller 910 in PPU 110 in the notebook.

Sideband serial interface signal lines 6910 are provided between notebook PPU 110 and docking station PCI/ISA bridge chip 6910. Lines 6910 are suitably any operative interface such as a two-wire modem-type interface or a 3-wire RS-232 arrangement.

The signals communicated through the high speed serial interface 7010, 6910, 7020 are or include:

| SIGNAL NAME | DIRECTION (NB = NOTEBOOK, DS = DOCKG STN) |
|---|---|
| Interrupt Requests IRQ15, 14, 12–9, 7–3 | DS TO NB |
| DMA Requests DRQ7–5, 3–0 | DS TO NB |
| DMA Acknowledges -DACK7–5, 3–0 | NB TO DS |
| Master request signal -MASTER | DS TO NB |
| Terminal Count (completion signal from DMA 910) T/C | NB TO DS |
| DMA 24 bit Current address (start or end DMA addresses not required) in DMA controller 910 | NB TO DS |

When any of these signals changes value, it is automatically transmitted from the docking station 7 to notebook 6 or vice-versa depending on originating site. Each serial port 7010 and 7020 has a serial transmit/receive circuit 7030 connected to the serial line 6910. A data interface has a serial to parallel interface 7035 for information which is being received by the respective port and a parallel to serial interface 7037 which time multiplexes parallel data to be sent in serial form from the respective port. So, for example, NB TO DS information tabulated above is fed to the parallel to serial interface 7037 in block 7010 but coupled from the serial to parallel interface 7035 in block 7020. Conversely, DS TO NB information tabulated above is fed to the parallel to serial interface 7037 in block 7020 but coupled from the serial to parallel interface 7035 in block 7010.

Further information which can be advantageously communicated is the identification by block 6920 of PPU 110 as a positive decode agent upon notebook insertion into docking station (DS to NB), and a BUSY status signal from NB DMA to DS.

Advantages of using DMA 910 as the one DMA in the NB, DS system are PC/AT IBM compatibility, and reduced gate count in the bridge 6920.

FIG. 71 is a set of waveforms for different operational cases of the sideband signalling circuits and methods of FIG. 70. In FIG. 71.

All DMA/MASTER requests from bridge 6920 in docking station 7 go through serial interface to PPU 110 for DMA arbitration. Once a DMA request from chip 6920 is granted (DACK returned), the DMA current address is then transferred from PPU 110 to chip 6920 via the serial interface sideband lines. After the DMA current address is dloaded to the chip 6920 address latch CURRENT ADR 7050, the DMA cycle is started. Two cases for DMA transfer are tabulated and subdivided below:

CASE 1: MEMORY READ—I/O WRITE CYCLES 1.1: I/O devices in notebook system

If the target DMA I/O device is in the PPU 110, the DMA controller 910 via bus bridge 902 reads the memory (e.g. 106) from PCI bus 104 and provides a memory-read-I/O-write cycle to the target I/O device.

1.2: I/O devices in ISA docking station subsystem

But, if the I/O device is not in the PPU 110, then during memory read, the memory read address is driven by the DMA controller 910 and DMA page register therein. Two conditions are next described:

1.2.1: Condition 1:

If the memory cycle is granted by a PCI device or main memory, the PPU 110 stores the data after the memory read cycle is completed. PPU 110 generates an internal cycle to write the stored data to a write buffer of the chip 6920 via the PCI bus 104 and not the sideband lines 6910. The chip 6920 then initiates a pseudo memory read and an actual I/O write cycle, and provides data to complete the DMA transfer as shown in FIG. 71 Condition 1.2.1 waveform diagram for ISA bus cycle waveform.

1.2.2 Condition 2:

If the memory read cycle is not granted by memory 106 or any PCI devices, then the whole DMA cycle is redirected to the docking ISA bus 83. Chip 6920 generates a memory read and I/O write DMA cycle on the docking ISA bus 83 because it has latched in latch 7050 the DMA Current Address just previously supplied by the sideband lines 6910 thereto. This cycle is shown in FIG. 71 Condition 1.2.2.

CASE 2: I/O READ—MEMORY WRITE CYCLES 2.1: I/O devices in notebook 6 system 2.1.1 Memory device on PCI bus If the requesting DMA I/O device is in the PPU 110, the PPU 110 issues an I/O read from the pertinent I/O device and then initiates a memory write cycle to PCI bus 104, as illustrated in FIG. 71 condition 2.1.1.

2.1.2: Memory device on ISA docking bus 83

If no PCI agent in either the notebook 6 or docking station 7 grants the memory cycle, the chip 6920 aborts current PCI cycle and redirects this memory write cycle to ISA bus 83 in the docking station along with DMA data and memory address, which has been lodged in latch 7050 via sideband lines 6910. The memory write cycle is shown in FIG. 71 condition 2.1.2.

2.2 I/O devices in ISA docking station subsystem

If the requesting device is not in the PPU 110, the chip 6920 responds to the DMA acknowledge to the DMA request that the chip 6920 itself sent to the PPU DMA controller 910 and generates a standard ISA I/O read—memory write DMA cycle on bus 83. During this cycle, the data is also latched in the bridge chip 6920. Since ISA bus 83 is a subtractive decode bus, the memory write cycle also is directed to the PCI bus 71 and 104 to see if any device will grant the cycle. If the memory cycle is granted by a PCI device, the whole DMA cycle is completed. If not, since the ISA cycle was completed first, the bridge chip 6920 just simply performs a target-abort cycle.

In this way advantages of minimum PCI bus interface design overhead and fully compatible ISA DMA cycle compatibility are achieved.

CASE 3: ISA MASTER MODE

Whenever, PPU 110 samples a docking MASTER# signal active during a DMA acknowledge cycle, the PCI bus control is transferred to bridge chip 6920 until MASTER# is deasserted. In other words PPU 110 is not supposed to do any DMA task at all. The MASTER# signal is suitably routed to the DMA controller 910 in one embodiment or to the PCI arbiter 906 wherein mastership is granted to the ISA card in the docking station 7 which is the new master.

Since the ISA spec does not call for memory-to-memory or I/O-to-I/O transfers, no provision for them need be described hereinabove.

A few preferred embodiments are described in detail herein. It is to be understood that the scope of the invention also comprehends embodiments different from those described, yet within the scope of the claims.

For example, color display devices can be raster-scanned cathode ray tubes or other raster-scanned devices; devices that are not raster-scanned and have parallel line or frame drives; color printers, film formatters, or other hard copy displays; liquid crystal, plasma, holographic, deformable micromirror, field-emission or other displays of CRT or non-CRT technology; or three-dimensional or other devices using nonplanar image formation technologies.

"Microcomputer" in some contexts is used to mean that microcomputer requires a memory and "microprocessor" does not. The usage herein is that these terms can also be synonymous and refer to equivalent things. The phrase "processing circuitry" comprehends ASICs (application specific integrated circuits), PAL (programmable array logic), PLAs (programmable logic arrays), decoders, memories, non-software based processors, or other circuitry, or digital computers including microprocessors and microcomputers of any architecture, or combinations thereof. Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Process diagrams are also representative of flow diagrams for microcoded and software based embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

In FIG. 9, MPU 102 includes a microprocessor, memory controller, and PCI Bridge Unit, all on a single integrated circuit chip.

Features of this preferred embodiment include:
Integrated 486 clock-doubled static core
50-MHz and 66-MHz operation at 3.3 V
Direct high speed bus interface into internal 486-CPU bus
Integrated 8K-Byte cache
Supports advanced power management software
System management mode hardware
High-priority system management interrupt (SMI)
Suspend mode (hardware and software initiated)
Integrated 50-MHz and 66-MHz memory controller
Programmable DRAM timing optimized for 60-ns access at 50 and 66 MHz
Supports 3.3-V and 5-V DRAMs
Supports up to 256M-byte DRAM in four 32-bit banks without external buffering
Supports 256K, 512K, 1M, 2M, 4M, 8M, and 16M asymmetric and symmetric DRAMs
Supports shadowed RAM
SMM Memory mapping into main memory (DRAM)
Two-level DRAM write buffers
Integrated 4-level DRAM refresh queue
Programmable write-protection regions
Advanced power management for DRAM
Suspend refresh
Self refresh
Slow refresh
CAS before RAS refresh
Integrated PCI bus interface for master/slave operation The microprocessor, memory control, and PCI bridge unit (MPU) 102 of FIG. 9 integrates a 486 CPU 701, DRAM controller 718, and PCI interface 716 into a single chip contained in a 208-pin PQFP (plastic quad flat pack) package.

The 486 CPU core contains an 8K-byte write-through, 32-bit instruction/data cache 704. The cache 704 is two-way set associative and organized as 1024 sets each containing 2 lines of 4 bytes each. The cache contributes to the overall performance by quickly supplying instructions and data to an internal execution pipeline of CPU core 702.

MPU 102 power-management features allow a dramatic reduction in electrical current consumption when the microprocessor is in a standby mode. Standby mode is entered either by a hardware or software initiated action as described in connection with PPU 110 in FIG. 23. Standby mode allows for CPU clock modulation via a MaskClock MSKCLK input pin of MPU 102 as shown in FIG. 27, thus reducing power consumption. Once in standby mode, the MPU power consumption can be further reduced by generating suspend mode, as discussed in connection with FIG. 33, and stopping the external clock input. Since the MPU 102 is a static device, no internal data is lost when the clock input is stopped.

A system-management mode (SMM) provides an additional interrupt SMI# and an address space that can be used for system power management or software transparent emulation of I/O peripherals or other purposes. SMM is entered using the system-management interrupt (SMI) which has a higher priority than any other interrupt. While running in protected SMM address space, the SMI interrupt routine can execute without interfering with the operating system or application programs. After reception of an SMI, portions of the CPU are automatically saved, SMM is entered and program execution begins at the SMM address space. The location and size of the SMM memory is programmable. Seven SMM instructions in the 486 core instruction set permit saving and restoring the total CPU state when in SMM mode.

In FIG. 9, MPU 102 integrates a high performance DRAM controller 718 that supports up to 256M bytes of DRAM memory 106 with up to four 32-bit banks without external buffering. Additionally, memory interface buffers 720 can be programmed to operate at 3.3-V or 5-V. The DRAM controller 718 is programmable to support 60 ns and 80 ns accesses. Various refresh modes are supported which include: slow, self, suspend, and CAS-before-RAS refresh.

An on-chip PCI interface 716 (bus bridge) is suitably provided compliant with the PCI 2.0 specification. The PCI interface 716 acts as a bus master when there is a CPU initiated transfer between the CPU and the high speed PCI bus 104 and as a target for PCI initiated transfers. An important feature which supports power management is a bus-quiet mode used to inhibit PCI bus cycles when the CPU is accessing the DRAM 106 or internal cache 704.

Functional description for the MPU signal pins is provided in the following table.

| PIN NAME | NO. | I/O TYPE | BUFFER TYPE | FUNCTION |
|---|---|---|---|---|
| | | | | FPU Interface |
| A31 | 139 | O | | Host address bits. A31 and A2 are used to support a |
| A2 | 141 | O | | 387DX/487DLC math coprocessor 108. The A31 output drives the NPS2 input and A2 drives the CMD0 input on the coprocessor. |
| ADS | 152 | O | | Host address status. This output indicates that the host address and bus cycle definition signals are valid. |
| FB2 | 155 | I | | Feedback 2X clock. This input should be connected on the motherboard to the NPUCLK signal. |
| M/IO | 150 | O | | Memory/input-output and write/read. These signals are valid |
| W/R | 148 | O | | when ADS is asserted: |

M/IO  D/C*  W/R  LOCK*  Bus Cycle Type

| M/IO | D/C* | W/R | LOCK* | Bus Cycle Type |
|---|---|---|---|---|
| 0 | 0 | 0 | 0 | Interrupt acknowledge |
| 0 | 0 | 0 | 1 | — |
| 0 | 0 | 1 | X | — |
| 0 | 1 | X | 0 | — |
| 0 | 1 | 0 | 1 | I/O data read |
| 0 | 1 | 1 | 1 | I/O data write |
| 1 | 0 | X | 0 | — |
| 1 | 0 | 0 | 1 | Memory code read |
| 1 | 0 | 1 | 1 | Halt: A31 – A2 = 0h, BE3 – BE0 = 1011 |
| | | | | Shutdown: A31 – A2 = 0h, BE3 – BE0 = 1110 |
| 1 | 1 | 0 | 0 | Locked memory data read |
| 1 | 1 | 0 | 1 | Memory data read |
| 1 | 1 | 1 | 0 | Lock memory data write |
| 1 | 1 | 1 | 1 | Memory data write |

*These signals are internal. X - don't care
— = does not occur

| PIN NAME | NO. | I/O TYPE | BUFFER TYPE | FUNCTION |
|---|---|---|---|---|
| NPUCLK | 154 | O | | Numerical processor unit clock. This output is used to drive the clock input of a 387DX/487DLC math coprocessor. |
| NPRESET | 143 | O | | Numerical processor unit reset. This output is used to reset the 387DX/487DLC math coprocessor. |
| NPBUSY | 146 | I | | Coprocessor busy (active low). This input from the coprocessor indicates to the 486 processor that the coprocessor is currently executing an instruction and is not yet able to accept another opcode. When the 486 processor encounters a WAIT instruction or any coprocessor instruction that operates on the coprocessor stack (i.e., load, pop, arithmetic operation), BUSY is sampled. BUSY is continually sampled and must be recognized as inactive before the CPU will supply the coprocessor with another instruction. However, the following coprocessor instructions are allowed to execute even if BUSY is active since these instructions are used for coprocessor initialization and exception clearing: FNINIT, ENCLEX. |
| NPERROR | 145 | I | | Coprocessor error. This input is used to sense that the coprocessor generated an error during execution of a coprocessor instruction. |
| PEREQ | 144 | I | | Coprocessor request. This input indicates that the coprocessor is ready to transfer data to or from the CPU. The coprocessor may assert PEREQ in the process of executing a coprocessor instruction. The 486 core internally stores the current coprocessor opcode and performs the correct data transfers to support coprocessor operations using PEREQ to synchronize the transfer of required operands. PEREQ is internally connected to a pulldown resistor to prevent this signal from floating active when left unconnected. |
| NPRDY | 153 | I | | Numeric processor ready. This input accepts the READYO signal from the math coprocessor. |
| READY | 142 | O | | Bus ready. This output drives the READY input on the math coprocessor and indicates to the coprocessor when a 486 processor bus cycle is to be terminated. |
| IRQ13 FPUERR# | 167 | O | | Interrupt request 13. This output is asserted when the math coprocessor indicates to the MPU that a numeric processing error has occurred by asserting ERROR. This signal connects to the PPU interrupt request FPUERR. |

| Memory Interface Pins | | | | |
|---|---|---|---|---|
| CAS7 | 61 | O | Column address strobe. CAS3 - 0 drives | |
| CAS6 | 63 | O | banks 0 and 2. CAS7 - 4 drives banks 1 | |
| CAS5 | 64 | O | and 3. | |
| CAS4 | 65 | O | | |
| CAS3 | 66 | O | | |
| CAS2 | 67 | O | | |
| CAS1 | 68 | O | | |
| CAS0 | 70 | O | | |
| RAS3 | 55 | O | Row address strobe. | |
| RAS2 | 56 | O | | |
| RAS1 | 57 | O | | |
| RAS0 | 59 | O | | |
| MA12 | 72 | O | Memory address. Memory address lines | |
| MA11 | 74 | O | that interface directly to system DRAM. | |
| MA10 | 75 | O | | |
| MA9 | 76 | O | | |
| MA8 | 78 | O | | |
| MA7 | 79 | O | | |
| MA6 | 80 | O | | |
| MA5 | 81 | O | | |
| MA4 | 82 | O | | |
| MA3 | 83 | O | | |
| MA2 | 85 | O | | |
| MA1 | 87 | O | | |
| MA0 | 89 | O | | |
| WE | 90 | O | Write enable. | |

| PIN NAME | NO. | TYPE | BUFFER TYPE | FUNCTION |
|---|---|---|---|---|
| MPU Signal Pin Descriptions | | | | |
| MDATA31 | 91 | I/O | | Memory data. Bidirectional data lines |
| MDATA30 | 92 | I/O | | that interface directly to system |
| MDATA29 | 93 | I/O | | DRAM and host data bus. Also |
| MDATA28 | 94 | I/O | | used to transfer data between |
| MDATA27 | 96 | I/O | | PCI devises and host or |
| MDATA26 | 98 | I/O | | memory. |
| MDATA25 | 100 | I/O | | |
| MDATA24 | 101 | I/O | | |
| MDATA23 | 102 | I/O | | |
| MDATA22 | 106 | I/O | | |
| MDATA21 | 107 | I/O | | |
| MDATA20 | 108 | I/O | | |
| MDATA19 | 109 | I/O | | |
| MDATA18 | 111 | I/O | | |
| MDATA17 | 113 | I/O | | |
| MDATA16 | 115 | I/O | | |
| MDATA15 | 116 | I/O | | |
| MDATA14 | 117 | I/O | | |
| MDATA13 | 118 | I/O | | |
| MDATA12 | 119 | I/O | | |
| MDATA11 | 120 | I/O | | |
| MDATA10 | 124 | I/O | | |
| MDATA9 | 126 | I/O | | |
| MDATA8 | 127 | I/O | | |
| MDATA7 | 128 | I/O | | |
| MDATA6 | 129 | I/O | | |
| MDATA5 | 130 | I/O | | |
| MDATA4 | 131 | I/O | | |
| MDATA3 | 133 | I/O | | |
| MDATA2 | 134 | I/O | | |
| MDATA1 | 135 | I/O | | |
| MDATA0 | 137 | I/O | | |
| Miscellaneous/Test | | | | |
| TEST | 179 | I | | Test mode. When asserted this pin causes the MPU to enter test mode. This signal should be tied low for normal operation. |
| TM1 | 181 | I | | Test mode control. These signals |
| TM2 | 186 | I | | should be tied low for normal operation. |
| RSTCPU | 180 | I | | Reset CPU. |
| A20M | 178 | I | | Address bit 20 mask. Forces host to mask physical address bit 20 (HA20) before lookup to the internal cache or driving a memory cycle on the bus. A20M emulates the address wraparound at 1M byte that occurs on the 8086 microprocessor. |
| CPUCLK1 | 184 | I | | 50-MHZ crystal oscillator input. Connects to one side of the crystal that drives MPU internal PLL. Used with CPUCLK2. |
| CPUCLK2 | 185 | O | | 50-MHZ crystal oscillator output. Connects to one side of the crystal that drives MPU internal PLL. Used with CPUCLK1. |
| INTR | 171 | I | | Maskable Interrupt Request. This level-sensitive input causes the processor to suspend execution of the current instruction stream and begin execution of an interrupt service routine. The INTR input can be masked (ignored) through the Flags register IF bit. |
| NMI | 176 | I | | Nonmaskable Interrupt Request. This rising-edge-sensitive input causes the processor to suspend execution of the current instruction stream and begin execution of an NMI interrupt service routine. The NMI interrupt service request cannot be masked by software. Asserting NMI causes an interrupt which internally supplies interrupt vector 2h to the CPU core. External interrupt acknowledge cycles are not necessary since the NMI interrupt vector is supplied internally. The 486 core processor samples NMI at the beginning of each core clock phase 2. To assure recognition, NMI clock is inactive for at least eight CLK2 periods and then active for at least eight CLK2 periods. Additionally, predetermined setup and hold times ensure recognition at a particular clock edge. |
| PCI System Pins | | | | |
| PCLKOUT | 194 | O | | Clock. Provides timing for all transactions on PCI. All other PCI signals are sampled on the rising edge of PCLKOUT, and all other timing parameters are defined with respect to this edge. PCI may operate over a wide range of frequencies. |
| PCLK | 193 | I | | PCI clock feedback. This input should be connected on the motherboard to PCLKOUT. |
| RSTPCI | 191 | I | | PCI Bus Reset. Forces the PCI sequencer of each device to a known state. |
| PCI Address and Data Pins | | | | |
| AD31 | 197 | I/O | | Address and data. These are |
| AD30 | 198 | I/O | | multiplexed on the same PCI |
| AD29 | 200 | I/O | | pins. During the first clock of a |
| AD28 | 202 | I/O | | transaction AD31-AD0 contain a |
| AD27 | 204 | I/O | | physical byte address (32 bits). |
| AD26 | 205 | I/O | | During subsequent clocks, |
| AD25 | 206 | I/O | | AD31-AD0 contain data. |
| AD24 | 207 | I/O | | A bus transaction consists of an |
| AD23 | 3 | I/O | | address phase followed by one |
| AD22 | 4 | I/O | | or more data phases. PCI |

| | | | |
|---|---|---|---|
| AD21 | 5 | I/O | supports both read and write |
| AD20 | 7 | I/O | bursts. Little-endian byte |
| AD19 | 9 | I/O | ordering is used. AD7-AD0 |
| AD18 | 11 | I/O | define the least-significant byte |
| AD17 | 12 | I/O | and AD31-AD24 the |
| AD16 | 13 | I/O | most-significant byte. |
| AD15 | 28 | I/O | |
| AD14 | 29 | I/O | |
| AD13 | 30 | I/O | |
| AD12 | 31 | I/O | |
| AD11 | 33 | I/O | |
| AD10 | 35 | I/O | |
| AD9 | 38 | I/O | |
| AD8 | 40 | I/O | |
| AD7 | 41 | I/O | |
| AD6 | 42 | I/O | |
| AD5 | 44 | I/O | |
| AD4 | 46 | I/O | |
| AD3 | 48 | I/O | |
| AD2 | 49 | I/O | |
| AD1 | 50 | I/O | |
| AD0 | 51 | I/O | |
| C/BE3 | 2 | I/O | Bus commands and byte enables. These are multiplexed on the same pins. During the address phase C/BE3-C/BE0 define the bus command. During the data phase C/BE3-C/BE0 are used as byte enables. The byte enables determine which byte lanes carry meaningful data. C/BE0 applies byte 0, and C/BE3 to byte 3. |
| C/BE2 | 14 | I/O | |
| C/BE1 | 27 | I/O | |
| C/BE0 | 39 | I/O | |
| PAR | 26 | I/O | Parity. Parity is even parity across AD31-AD0 and C/BE3-C/BE0. |

PCI Arbitration

| | | | |
|---|---|---|---|
| HOLD | 195 | I | Hold Request. This input is used to indicate that another bus master requests control of the local bus 714. The bus arbitration (HOLD, HLDA) signals allow the microprocessor to relinquish control of its local bus when requested by another bus master device. Once the processor CPU701 has relinquished its bus (3-stated), the bus master device can then drive the local bus signals. After recognizing the HOLD request and completing the current bus cycle or sequence of locked bus cycles, the microprocessor responds by floating the local bus and asserting the hold acknowledge (HLDA) output. Once HLDA is asserted, the bus remains granted of the requesting bus master until HOLD becomes inactive. When the microprocessor recognizes HOLD is inactive, it simultaneously drives the local bus and drives HLDA inactive. External pullup resistors may be required on some of the microprocessor 3-state outputs to ensure that they remain inactive while in a hold-acknowledge state. The HOLD input is not recognized while RESET is active. If HOLD is asserted while RESET is active, |
| HLDA | 196 | O | RESET has priority and the microprocessor places the bus into an idle state instead of a Hold Acknowledge. This output indicates that the microprocessor is in a hold-acknowledge state and has relinquished control of its local bus. While in the hold-acknowledge state, the microprocessor drives HLDA active and continues to drive SUSPA, if enabled. The other microprocessor outputs are in the high-impedance state allowing the requesting bus master to drive these signals. If the on-chip cache can satisfy bus requests, the microprocessor continues to operate during hold-acknowledge states. A20M is internally recognized during this time. The microprocessor deactivates HLDA when the HOLD request is driven inactive. The microprocessor stores an NMI rising edge during a hold-acknowledge state for processing after HOLD is inactive. The FLUSH input is also recognized during a hold-acknowledge state. If SUSP is asserted during a hold-acknowledge state, the microprocessor may or may not enter suspend mode depending on the state of the internal execution pipeline. The state of the microprocessor signals during hold acknowledge are summarized in the "Signal States" table following this table. |

PCI Error Reporting Pins

| | | | |
|---|---|---|---|
| SERR | 25 | I/O | System error. This pin may be driven by any agent for reporting errors other than parity. |
| PERR | 24 | I/O | Parity error. This pin may be driven by an agent during all PCI transactions, except a special cycle, to report data parity errors. |

PCI Interface Control Pins

| | | | |
|---|---|---|---|
| FRAME | 15 | I/O | Cycle frame. Driven by the current master to indicate the beginning and duration of an access. FRAME is asserted to indicate that a bus transaction is beginning. While FRAME is asserted data transfers continue. When FRAME is deasserted the transaction is in the final data phase. |
| TRDY | 18 | I/O | Target ready. Indicates the target agent's (selected device's) ability to complete the current data phase of the transaction. TRDY is used in conjunction with IRDY. A data phase is completed on any clock where both TRDY and IRDY |

| Signal | Pin | Type | Description |
|---|---|---|---|
| IRDY | 16 | I/O | are sampled asserted. During a read TRDY indicates that valid data is present on AD31-AD0. During a write it indicates that the target is prepared to accept data. Wait cycles are inserted until both IRDY and TRDY are asserted together. Initiator ready. Indicates the initiating agent's (bus master's) ability to complete the current data phase of the transaction. IRDY is used in conjunction with TRDY. A data phase is completed on any clock where both IRDY and TRDY are sampled asserted. During a read IRDY indicates that valid data is present on AD31-AD0. During a write it indicates that the master is prepared to accept data. Wait cycles are inserted until both IRDY and TRDY are asserted together. |
| STOP | 22 | I/O | Stop. Indicates that the current target is requesting the master to stop the current transaction. |
| DEVSEL | 20 | I/O | Device select. When actively driven, DEVSEL indicates the driving device has decoded its address as the target of the current access. As an input, it indicates whether any device on the bus has been selected. |
| LOCK | 23 | O | Lock. An optional signal that indicates an operation that may require multiple transactions to complete. When LOCK is asserted, non-exclusive transactions can proceed. |
| Power Management Signals | | | |
| SMI | 169 | I/O | System Management Interrupt. This bidirectional, level-sensitive signal is an interrupt with higher priority than the NMI interrupt. SMI must be active for at least four CLK2 clock periods to be recognized by the 486 processor. After the SMI interrupt is acknowledged, the SMI pin is driven low by the 486 processor for the duration of the SMI service routine. The SMI input is ignored following reset and can be enabled using the SMI bit in the CCR1 configuration register. SMI is internally connected to a pullup resistor to prevent it from floating active when left unconnected. |
| MASKCLK | 165 | I | Mask clock. Used in conjunction with CKD bit in CCR0 register to stop the CPU core clock or to stop all on-chip clocks (except 32 kHz) and go into suspend. |
| 32KHZ | 182 | I | DRAM refresh. Used for DRAM refresh timing during suspend mode. |
| SUSPEND | 163 | I | Suspend. Requests MPU to enter suspend mode and disable oscillator and clock outputs |
| Power Supply Pins | | | |
| VCC | Note 1 | | Power supply pins. |
| GND | Note 2 | | Device ground pins. |
| VCCP | 37 | | Power pin. |
| VCC1 | Note 3 | | Power supply pins. |
| VCC05 | Note 4 | | Power supply pins. |
| Reserved Pins | | | |
| Reserved | Note 5 | | Reserved pins. |

Notes:
1) Pins 1, 8, 17, 21, 34, 43, 47, 54, 140, 149, 156, 162, 166, 172, 175, 183, 190, 199, 201, and 208 for twenty pins total.
2) Pins 6, 10, 19, 32, 36, 45, 52, 53, 60, 69, 73, 86, 95, 99, 104, 110, 114, 123, 132, 138, 147, 151, 157, 158, 159, 160, 161, 164, 173, 174, 177, 188, 192, and 203 for thirty four pins total.
3) Pins 77, 103, and 122 for three pins total.
4) Pins 58, 62, 71, 84, 88, 97, 105, 112, 121, 125, and 136 for eleven pins total.
5) Pins 168, 170, 187, and 189 for four pins total.

The embedded 486 core processor 702 is initialized when the RESET signal is asserted. The processor 702 is placed in real mode ("8086", mode), signal states shown in the next table are established, and the registers listed in the following table are set to their initialized values. RESET invalidates and disables the cache 704, turns off paging and returns the processor 706 clock circuit to nonclock-doubled mode. When RESET is asserted, the microprocessor 102 terminates all local bus activity and all internal execution. During the time that RESET is asserted, the internal pipeline is flushed and no instruction execution or bus activity occurs.

Approximately 350 to 450 CLK2 clock cycles (hclk2 of FIG. 36) (additional 220+60 cycles if self-test is requested) after deassertion of RESET, the processor 702 begins executing instructions at the top of physical memory (address location FFFF FFF0h). When the first intersegment JUMP or CALL is executed, address lines A31–A20 of local bus 714 in FIG. 9 are driven low for code-segment-relative memory-access cycles. While these address lines are low, the microprocessor 102 executes instructions only in the lowest 1M byte of physical address space until system-specific initialization occurs via program execution.

Signal States During RESET and Hold Acknowledge

| Signal Name | Signal State During RESET | Signal State During Hold Acknowledge |
|---|---|---|
| A20M | Ignored | Input recognized |
| A31–A2 | 1 | Float |
| ADS | 1 | Float |
| C/BE3–C/BE0 | 0 | Float |
| NPBUSY | Initiates self test | Ignored |
| MDATA31–0 | Float | Float |
| NPERROR | Ignored | Ignored |
| HLDA | 0 | 1 |
| HOLD | Ignored | Input recognized |
| INTR | Ignored | Input recognized |
| LOCK | 1 | Float |
| M/IO | 0 | Float |
| NMI | Ignored | Input recognized |
| PEREQ | Ignored | Ignored |
| READY | Ignored | Ignored |
| RSTCPU | Input recognized | Input recognized |
| SMI | Ignored | Input recognized |
| SUSPEND | Ignored | Input recognized |
| W/R | 0 | Float |

| 486 Core Initialized Register Contents | | | |
|---|---|---|---|
| Register | Register Name | Initialized Contents | Comments |
| EAX | Accumulator | xxxx xxxxh | 0000 0000h indicates self-test passed |
| EBX | Base | xxxx xxxxh | |
| ECX | Count | xxxx xxxxh | |
| EDX | Data | xxxx 0400 + Revision ID | Revision ID = 10h |
| EBP | Base Pointer | xxxx xxxxh | |
| ESI | Source Index | xxxx xxxxh | |
| EDI | Destination Index | xxxx xxxxh | |
| ESP | Stack Pointer | xxxx xxxxh | |
| EFLAGS | Flag Word | 0000 0002h | |
| EIP | Instruction Pointer | 0000 FFF0h | |
| ES | Extra Segment | 0000h | Base address set to 0000 0000h Limit set to FFFFh |
| CS | Code Segment | F000h | Base address set to 0000 0000h Limit set to FFFFh |
| SS | Stack Segment | 0000h | |
| DS | Data Segment | 0000h | Base address set to 0000 0000h Limit set to FFFFh |
| FS | Extra Segment | 0000h | |
| GS | Extra Segment | 0000h | |
| IDTR | Interrupt-Descriptor Table | Base = 0, Limit = 3FFh | |
| CR0 | Machine Status Word | 0000 0010h | |
| CCR0 | Configuration Control 0 | 00h | |
| CCR1 | Configuration Control 1 | xxxx xxx0 (binary) | |
| ARR1 | Address Region 1 | 000Fh | 4G-byte noncacheable region |
| ARR2 | Address Region 2 | 0000h | |
| ARR3 | Address Region 3 | 0000h | |
| ARR4 | Address Region 4 | 0000h | |
| DR7 | Debug | 0000 0000h | |

Note:
x = Undefined value

The internal circuitry of 486 CPU core 702 is diagrammed and described in greater detail in TI486 Microprocessor: Reference Guide, 1993, available from Texas Instruments Incorporated and hereby incorporated herein by reference.

The clock circuitry 706 is described in U.S. patent application Ser. No. 08/133,497, filed Oct. 8, 1993, entitled "A Voltage-Controlled Oscillator and System with Reduced Sensitivity to Power Supply variation" and hereby incorporated herein by reference.

In FIG. 9 the PCI bus bridge 716 provides the interface between the rest of MPU 102 and the PCI bus 104. The integrated 486 core processor 701 and memory controller 718, 720 subsystems are connected to the PCI bus 104 through the PCI bridge 716. The PCI bridge 716 maps the address space of local bus 714, of the integrated 486 core processor 701, into the address space of the PCI 104; and provides the mechanism that allows the 486 core processor to access PCI configuration space. The PCI bridge 716 provides a low-latency path through which the 486 core processor directly accesses other PCI agents mapped anywhere in memory and I/O spaces. Additionally, the PCI bridge 716 provides a high-bandwidth path that allows PCI masters outside MPU 102 direct access to main memory. MPU 102 is capable of behaving as a bus master (initiator) or PCI Slave (target) running at 0 MHz up to 25 or 33 MHz and much higher frequencies into hundreds of MegaHertz according to the concepts disclosed herein.

MPU 102 implements a 256-byte configuration space, which is a physical address space for registers 712 to configure PCI agents. The configuration registers 712 are accessed via an Index/Data register pair.

For PCI bus 104 to main memory accesses, the MPU 102 is a target on the PCI bus 104. For host to peripheral component accesses, the MPU is a master on the PCI bus 104. The host can read and write both configuration and non-configuration address spaces. When the host is accessing the MPU configuration registers 712, the MPU 102 is both the master and the target. Configuration cycles initiated by MPPU 102 circuitry in bridge 716 to MPU configuration registers 712 are not forwarded to the PCI bus 104.

The FRAME, IRDY, and TRDY, are some PCI control signals. FRAME is asserted by the initiator (master) to indicate the beginning and end of a PCI transfer. IRDY is asserted by the initiator to indicate that the data is valid (write) or that it is ready to accept data (read). TRDY is asserted by the PCI target to indicate that the data is valid (read) or that it is ready to accept data (write).

All PCI transactions begin with the assertion of FRAME whereupon the master places address and control information on the address/data AD and C/BE command/byte enable lines. If the transaction is a read, the next cycle is used to allow the direction of the bus to turn around and be driven by the target. If the transaction is a write, the next cycle can be a data phase containing the data that is to be transferred to a target.

A data phase completes when both IRDY and TRDY are asserted. If either IRDY or TRDY are negated during the data phase, wait states are inserted by bus bridge 716, for example. FRAME is negated when the initiator has only one data transfer remaining and IRDY is asserted, as in cycles with multiple data phases such as burst cycles. Otherwise, if no burst cycle occurs, FRAME is negated when IRDY is asserted. When FRAME and IRDY are both negated (high), the data transfer is complete and the bus 104 is in an idle cycle.

When MPU 102 asserts FRAME, the other PCI agents in the system decode the address being driven onto the AD lines of bus 104. PCU 112, Display Controller 114 and devices 210 and 220 of FIGS. 5–7 decode the address positively except in system 100, the PPU 110 subtractively decodes addresses not claimed by other devices. When an agent device decodes an address as being its own, it identifies itself as the target by asserting an active signal on select line DEVSEL. If no device responds within five clocks, MPU 102 terminates the cycle with a master abort. When MPU 102 is the target of another PCI master as in the case of a PPU 110 to main memory 106 transfer, MPU 102 asserts DEVSEL to claim the cycle.

Bus commands indicate to the PCI target devices the type of transaction that the master PCI device is requesting, as shown in the next table, for MPU 102. Notice that the entries apply to one embodiment, and that other embodiments provide support as target and initiator selected appropriately to the commands and the architecture of each system embodiment.

| MPU PCI Command Set Support | | | |
|---|---|---|---|
| C/BE3–0 | Command Type | Supported As Target | Supported as Master |
| 0 | Interrupt Acknowledge | No | Yes |
| 1 | Special Cycle | No | Yes |

-continued

MPU PCI Command Set Support

| C/BE3–0 | Command Type | Supported As Target | Supported as Master |
|---|---|---|---|
| 10 | I/O Read | No | Yes |
| 11 | I/O Write | No | Yes |
| 100 | Reserved | N/A | N/A |
| 101 | Reserved | N/A | N/A |
| 110 | Memory Read | Yes | Yes |
| 111 | Memory Write | Yes | Yes |
| 1000 | Reserved | N/A | N/A |
| 1001 | Reserved | N/A | N/A |
| 1010 | Configuration Read | No | Yes |
| 1011 | Configuration Write | No | Yes |
| 1100 | Memory Read Multiple | No* | No |
| 1101 | Reserved | N/A | N/A |
| 1110 | Memory Read Line | No* | No |
| 1111 | Memory Write and Invalidate | No* | No |

*Treated as memory read.
*Treated as memory write

The MPU can, but does not have to, support burst cycles as a master. The burst interface is suitably provided in the memory management unit MMU of CPU core 702. In the case of another PCI master attempting to burst data to memory, the MPU PCI bridge 716 can, in a non-burst mode, also terminate the PCI burst cycle after the first data has transferred. In burst mode, however, the burst cycle executes to completion. A latency timer is suitably used to limit the amount of time that the MPU can use the PCI bus during a burst transfer.

Turning to the subject of status and error reporting, MPU 102 has two signals, PERR and SERR, for handling errors. PERR is used to report data parity errors during all PCI transactions except a special cycle. SERR is used to report address parity errors and special cycle data parity errors. PERR is asserted when a PCI agent receiving data detects a data parity error. SERR is asserted by the PCI agent that detects an address parity error or a special cycle data parity error. In the event of an error, the appropriate status bits are set in the Status and Command register in block 712 as described in register tables later hereinbelow.

Additional MPU errors include 1) access to a non-existent device or 2) accessing a target that cannot handle the request. When MPU 102, as a master, attempts to access a nonexistent device or a device that does not respond, with DEVSEL in a predetermined time, MPU 102 executes a master abort. If the MPU is accessing a target device and the target device cannot handle the request, the target aborts. In both cases, status bits in the Status and Command register are set to indicate that a master abort (MABT bit) or a target abort occurred.

MPU 102 supports both master-initiated termination as well as target-initiated termination. All transactions are concluded when both FRAME and IRDY are negated, indicating that the bus is idle. Master-initiated termination includes 1) Cycle completion or 2) Master abort, as described above, 3) timeout termination. Cycle completion is normal completion of a PCI transaction.

Time-out termination refers to a transaction that is terminated because the latency timer expired before the transaction was able to complete.

The MPU responds to a target-initiated termination in one of the following ways: 1) Retry, 2) Abort or 3) Disconnect.

Retry refers to termination by the target that informs the initiator it currently cannot respond to a transaction and that the transaction should be retried at a later time. No data transfer takes place during this transaction.

Abort refers to termination by the target when the target determines that a fatal error has occurred or that it may never be able to respond to the transaction. The received-target-abort-status bit (TABT) in the PCI Status register is set indicating that the MPU experienced a PCI target-abort condition.

Disconnect refers to termination requested because the target is unable to respond within a latency time interval after the first data phase is transferred. By contrast, no data transfers during a retry. When the MPU 102 only transfers single data, a disconnect resembles a normal cycle completion except that STOP is asserted.

As a target, the MPU completes the transaction. No retry, disconnect, or abort is issued.

The MPU 102 supports HALT and SHUTDOWN. The halt instruction (HLT) stops program execution and prevents the processor 102 from using the local bus 714 until restarted. The CPU 702 in HALT enters a low-power suspend mode. When an external hardware interrupt is detected on the INTR input pin and the interrupts are enabled (IF bit in EFLAGS=1), SMI, NMI, or RESET forces the CPU out of the halt state. The PCI bridge 716 broadcasts the HALT as a special cycle on the PCI bus 104.

Shutdown occurs when a severe error is detected that prevents further processing. The PCI bridge does not broadcast the shutdown cycle as a PCI special cycle. Instead, the PCI bridge logic internally generates a reset to the CPU.

Interrupt acknowledge cycles are generated by the MPU 102 bridge 716 when an INTR output is asserted by PPU 110 to the MPU INTR input. During interrupt acknowledge cycles, the internal bus cycle definition signal (M/IO (pin), D/C (internal), and W/R (pin)) are driven to 000. The interrupt acknowledge cycle has two 8-bit read operations, with the addresses being driven to 4 and 0 for the first and second cycles, respectively. During an interrupt acknowledge cycle, the first byte read is ignored and the second provides the 8-bit interrupt vector. LOCK is also asserted to ensure that the two reads are executed back-to-back.

On the PCI bus, the interrupt acknowledge cycle is a single cycle, in contrast to the two back-to-back read cycles on the CPU bus 714. The cycle is an internal cycle initiated by ADS and terminated by RDY. FRAME is generated on the PCI bus to the PPU to start the Interrupt Acknowledge (INTA) cycle. The CPU bus cycle definition signals are transformed into a PCI interrupt acknowledge (INTA) command. The PPU 110 responds to FRAME and the INTA command by providing a single interrupt vector byte from its internal interrupt controller 914 of FIGS. 11, 38, 43 and 44. A second RDY is generated to the CPU based on the IRDY/TRDY handshake and the cycle completes.

In a PC-compatible address map, the address space 512K-1M (00080000h–000FFFFFh) is reserved for video memory (VRAM or DRAM), ROM, and system-expansion memory. The MPU 102 PCI bridge 716 implements a DRAM Shadow and Timing Control register in block 712 that allows Read Only, Write Only, Read/Write, or Disabled attributes to be programmed for memory blocks within this space except the address range 512k–640k (0008 0000h–0009 FFFFh). This latter address range is not included because most current PC systems are populated with 640 KB of DRAM memory which spans the address space 0000 0000h–0009 FFFFh.

The next table shows the granularity defined by the DRAM Shadow and Timing Control Register for memory in the 640K-1M space (000A 0000–000F FFFFh).

Read only, write only, read/write or disabled attributes are also advantageously assigned to a memory block in the 640K-1M space. The host PCI bridge 716 response to memory access depends on whether the access originates on the CPU primary bus 714 or secondary (PCI) bus 104. As an example, a write access originating on the host bridge primary bus 714 to a memory block for which the attribute bits are set to write only (code 01 in SRRn, SRWn bits of shadow register for that memory space) does not flow through the bridge 716 to the PCI bus 104. Instead, the memory access is directed via bus 714 to the main system memory 106 controlled by the MCU 718. A read access to this same memory block originating on bus 714 does flow through the bridge to PCI bus 104 to BIOS RAM 120 of FIG. 6, for example, and is not responded to by system DRAM 106. This logic in bridge 716 advantageously supports copying of BIOS RAM to DRAM, as described later hereinbelow.

| NPU Granularity in 640K–1M space | |
| --- | --- |
| Address Range | Usage |
| 000A 0000h–000B FFFFh | Video memory (128 Kbyte Block) |
| 000C 0000h–000C 3FFFh | |
| 000C 4000h–000C 7FFFh | |
| 000C 8000h–000C BFFFh | |
| 000C C000h–000C FFFFh | Expansion BIOS ROMs |
| 000D 0000h–000D 3FFFh | (16 Kbyte Blocks) |
| 000D 4000h–000D 7FFFh | |
| 000D 8000h–000D BFFFh | |
| 000D C000h–000D FFFFh | |
| 000E 0000h–000E FFFFh | System BIOS ROMs |
| 000F 0000h–000F FFFFh | (64 Kbyte Blocks) |

Accesses from the host bridge 716 secondary bus (PCI bus 104) are responded to by the bridge 716 in a different way. It is assumed that unless a given address block is disabled, there is a PCI agent on the secondary bus (PCI bus) that will respond to an access within that block. In other words, for addresses, the only accesses originating on the host bridge secondary bus 104 that are passed through to the host bridge primary bus 714 are those to an address block that has a "disabled" attribute. Accesses from the host bridge secondary bus 104 to memory blocks that have been set to read/write, read only, or write only are responded to by the PCI agent on the secondary bus 104 and not passed on to the primary bus 704. The table below describes how the host PCI bridge 716 responds to accesses within the 640K-1M space:

| Origin of Cycle | Access | Block Attribute | Access Cycle Goes to Listed Bus |
| --- | --- | --- | --- |
| CPU Primary Bus | Read | Read Only | CPU (714) |
| | | Write Only | PCI (104) |
| | | Read/Write | CPU |
| | | Disabled | PCI |
| | Write | Read Only | PCI |
| | | Write Only | CPU |
| | | Read/Write | CPU |
| | | Disabled | PCI |
| PCI | Read | Read Only | CPU |

-continued

| Origin of Cycle | Access | Block Attribute | Access Cycle Goes to Listed Bus |
| --- | --- | --- | --- |
| Secondary Bus | | Write Only | PCI |
| | | Read/Write | CPU |
| | | Disabled | PCI |
| | Write | Read Only | PCI |
| | | Write Only | CPU |
| | | Read/Write | CPU |
| | | Disabled | PCI |

The memory controller unit (MCU 718) generates timing control signals for the DRAM array 106. The MCU 718 is integrated on the same single chip as the MPU 102 and supports 1 to 4 DRAM banks and up to 256M bytes or more without external buffers. The MCU 718 supports any combination of DRAM types: 256K, 512K, 1M, 2M, 4M, 8M, or 16M. Three types of refresh modes are supported: normal, suspend refresh, and self refresh. DRAM timing parameters are programmable to allow optimized DRAM accesses for 60 ns and 80 ns DRAMs at system speeds of 50 MHz and 66 MHz. The MCU 718 is designed to coordinate memory accesses originating from the CPU 702 with memory accesses originating from the PCI Interface bridge 716. A PCI master access to main memory 106 has higher priority than a CPU 702 access to main memory 106. The CPU 702 is put on hold until the PCI master is through bursting, unless there are higher priority refresh requests pending.

Each of the 4 DRAM banks in memory 106 supports 1 to 64M bytes in 1M byte increments. The DRAM bank size is individually programmable allowing any mix of banks without restrictions on mixing DRAM size or physical location.

Memory reads or writes to DRAM are double-word aligned 32-bit wide accesses. The MCU 718 has one RAS line per DRAM memory bank where RAS0-3 correspond directly to banks 0–3. Bank 0 contains the lowest addresses and bank 3 contains the highest addresses. The MCU 718 provides eight CAS lines. Each DRAM bank uses four CAS lines; one CAS line per byte. CAS3 and CAS7 control the high-order bytes while CAS0 and CAS4 control the low-order bytes. CAS3-0 drives DRAM banks 0 and 2. CAS7-4 drives DRAM banks 1 and 3.

The MCU 718 provides a common Write Enable (WE) line that is connected to all DRAM memory banks.

DRAM Control Signal Interconnections shows the various DRAM technologies that are supported by the memory controller. The memory array types are selected by programming the Memory Array Type register. Each bank is individually programmable to support any of the DRAM array types.

DRAMs Supported

| Organization (Depth × Width) | Devices per Bank | Bits per Device | Address Widths Rows | Address Widths Columns | Memory Array Type | Size per Bank (Mbits) |
|---|---|---|---|---|---|---|
| 256K × 1 | ×32* | 256K | 9 (MA8–MA0) | 9 (MA8–MA0) | 2 | 1 |
| 256K × 4 | ×8 | 1M | 9 (MA8–MA0) | 9 (MA8–MA0) | 2 | 1 |
| 256K × 16 | ×2 | 4M | 9 (MA8–MA0) | 9 (MA8–MA0) | 2 | 1 |
|  |  |  | 11 (MA10–MA0) | 8 (MA7–MA0) | 3 | 1 |
| 512K × 8 | ×4 | 4M | 10 (MA9–MA0) | 9 (MA8–MA0) | 2 | 2 |
|  |  |  | 12 (MA11–MA0) | 8 (MA7–MA0) | 3 | 4 |
| 1M × 1 | ×32* | 1M | 10 (MA9–MA0) | 10 (MA9–MA0) | 1 | 4 |
| 1M × 4 | ×8 | 4M | 10 (MA9–MA0) | 10 (MA9–MA0) | 1 | 4 |
| 1M × 8 | ×4 | 8M | 10 (MA9–MA0) | 10 (MA9–MA0) | 1 | 4 |
|  |  |  | 12 (MA11–MA0) | 9 (MA8–MA0) | 2 | 4 |
| 1M × 16 | ×2 | 16M | 10 (MA9–MA0) | 10 (MA9–MA0) | 1 | 4 |
|  |  |  | 12 (MA11–MA0) | 9 (MA8–MA0) | 2 | 4 |
| 2M × 8 | ×4 | 16M | 11 (MA10–MA0) | 10 (MA9–MA0) | 1 | 8 |
|  |  |  | 13 (MA12–MA0) | 9 (MA8–MA0) | 2 | 8 |
| 2M × 16 | ×2 | 32M | 11 (MA10–MA0) | 10 (MA9–MA0) | 1 | 8 |
|  |  |  | 13 (MA12–MA0) | 9 (MA8–MA0) | 2 | 8 |
| 4M × 1 | ×32* | 4M | 11 (MA10–MA0) | 11 (MA10–MA0) | 0 | 16 |
| 4M × 4 | ×8 | 16M | 11 (MA10–MA0) | 11 (MA10–MA0) | 0 | 16 |
| 4M × 8 | ×4 | 32M | 11 (MA10–MA0) | 11 (MA10–MA0) | 0 | 16 |
| 4M × 16 | ×2 | 64M | 11 (MA10–MA0) | 11 (MA10–MA0) | 0 | 16 |
|  |  |  | 13 (A12–MA0) | 10 (MA9–MA0) | 1 | 16 |
| 8M × 8 | ×4 | 64M | 13 (MA12–MA0) | 10 (MA9–MA0) | 1 | 32 |
| 16M × 1 | ×32* | 16M | 12 (MA11–MA0) | 12 (MA11–MA0) | 0 | 64 |
| 16M × 4 | ×8 | 64M | 12 (MA11–MA0) | 12 (MA11–MA0) | 0 | 64 |

*Due to the capacitive loading caused by higher fanout on the memory address ines, these implementations are less preferable.

DRAM Timing

The DRAM Interface timing is programmable on a per-bank basis to support several DRAM speeds. The MCU provides two parameters that are used to program DRAM timing. These parameters are programmable by setting the DTMG1-0 bits in the DRAM Shadow and Timing Control register. The first parameter is the RAS activation to DRAM access time (DTMG1). The second parameter is CAS to READY sampling time (DTMG0). The next table shows some example values for programming the DRAM timing types 0, 1, and 2. The timing type is selected for the entire DRAM array. The following table shows the number of access wait states for the different memory cycles and timing types.

DRAM Timing Types

| Timing Type | DTMG 1 | DTMG 0 | RAS Access T Cycles | CAS to READY Sampling T Cycles | System Clock (MHz) | DRAM Speed (ns) |
|---|---|---|---|---|---|---|
| 2 | 1 | 0 | 4 | 2 | 50 | 60 |
| 1 | 0 | 1 | 5 | 3 | 50 | 80 |
|  |  |  |  |  | 66 | 60 |
| 0* | 0 | 0 | 6 | 4 | 50 | 100 |
|  |  |  |  |  | 66 | 80 |

*Default.

Wait States for DRAM Memory Cycles

| DRAM Memory Cycle | Wait States (T Cycles) Type 2 | Type 1 | Type 0 |
|---|---|---|---|
| Normal Read (Single) | 5 | 6 | 8 |
| Normal Write (Single) | 4 | 5 | 6 |
| Normal Read (Back to Back) | 5/6 | 6/8 | 8/10 |
| Normal Write (Back to Back) | 4/6 | 5/8 | 6/10 |
| Normal Read and Write (Back to Back) | 5/5 | 6/7 | 8/8 |
| Normal Write and Read (Back to Back) | 4/7 | 5/9 | 6/12 |
| Page Hit Read | 3 | 4 | 6 |
| Page Hit Write | 2 | 3 | 4 |
| Page Hit Read (Back to Back) | 3/3 | 4/4 | 6/6 |
| Page Hit Write (Back to Back) | 2/2 | 3/3 | 4/4 |
| Page Hit Read and Write (Back to Back) | 3/2 | 4/3 | 6/4 |
| Page Hit Write and Read (Back to Back) | 2/3 | 3/4 | 4/6 |
| Page Miss Read | 8 | 10 | 13 |
| Page Miss Write | 7 | 9 | 11 |
| Page Miss Read (Back to Back) | 8/8 | 10/10 | 13/13 |
| Page Miss Write (Back to Back) | 7/7 | 9/9 | 11/11 |
| Page Miss Read and Write (Back to Back) | 8/7 | 10/9 | 13/11 |
| Page Miss Write and Read (Back to Back) | 7/8 | 9/10 | 11/13 |

System ROM 120 of FIG. 6 suitably resides in the memory space between 640K and 1M. Shadowing allows the contents of the ROM to be copied to DRAM 106 at the same address thereby allowing subsequent accesses to BIOS code to be directed to the DRAM copy. System performance is increased because the BIOS code is then executed from DRAM 106 at memory-controller speeds instead of at slower ROM speeds.

The DRAM Shadow and Timing Control register allows blocks of memory in the address range 768K-1M (000C 0000h–000F FFFFh) to be shadowed. During system initialization, a region of DRAM memory 106 can be set to write only (01 code). Reads to this address are directed to the BIOS ROM 120, while writes are directed to DRAM memory 106. A read and write to the same ROM address reads the data from ROM and writes the data to the shadowed memory location. In this way, the entire ROM 120 contents are copied to DRAM 106. After the ROM contents are copied to DRAM, the shadowed region in DRAM can be set to read only mode (10 in DRAM Shadow and Timing Control Register). This protects the DRAM copy from corruption. Subsequent accesses to ROM 120 are directed to the shadowed DRAM 106.

Video RAM/SMM Memory Support

Video RAM is suitably located in the reserved memory space 640K–768K (000A 0000h–000B FFFFh). Bit 11 (VRAM) in the DRAM Shadow and Timing Control register is used to program whether or not the MCU is to respond to accesses in that address range. When the VRAM bit configuration bit is set to zero (default), the video RAM address space is not accessed by normal ADS or PCI initiated cycles. Cycles initiated to this address space are forwarded to the PCI bridge 716 and thence to bus 104 and are decoded by a display device 114 of FIG. 7. However, cycles initiated by System Management Mode signal strobe (SMADS) can access the video RAM address space (regardless of the VRAM bit value). This allows the portion of DRAM space from A0000h–BFFFFh to be used to store system management mode (SMM ) binary code. In a preferred method of system initialization, the VRAM bit 11 of DRAM Shadow and Timing Control Register is suitably set to one to enable the MCU 718 to respond to accesses in the video RAM space. This allows the SMM code to be shadowed to the DRAM from A0000h–BFFFFh. The VRAM bit 11 can then be set back to zero to disable the MCU from responding in the video RAM space. When a system management interrupt (SMI) is detected, SMADS is generated and SMM code shadowed in the DRAM is executed.

In FIG. 9, memory controller circuitry 718 is associated with two 32 bit wide write buffers in block 720 that temporarily store data before writing to DRAM. The write buffers are enabled by setting Bit 10 (WBE) in the Shadow and Timing Control register. When a write command from the host CPU 702 occurs, the memory controller 718 compares the host address with the address of any buffer in block 720. If the host address matches such write buffer address, the host data is written to that write buffer. The bytes that are written to the write buffer are determined by the host byte-enable BE lines. When all 4-byte locations in the write buffer in block 720 have been filled with host data, the buffers in block 720 are flushed immediately to DRAM 106. If the write buffers in block 720 have not been filled, (i.e., 1 to 3 bytes) the memory controller 718 does not flush the data to DRAM until subsequent write cycles either fill the write buffer, or a mismatch between the host address and the buffered data address occurs. In the case of an address mismatch, the buffer is immediately flushed to DRAM 106 and the current host data is written to the next available buffer. If no write buffer is available, the host 702 is held by the memory controller 718 until a write buffer becomes available and the host 702 can complete the write.

Turning to the subject of DRAM refresh, DRAM refresh requests occur at a programmed interval (typically 15.6 microseconds in a normal refresh mode). For each refresh request, the memory controller performs a CAS before RAS refresh, i.e., CAS is asserted first, followed by RAS. To reduce system noise and current surges, multiple DRAM banks are refreshed in a staggered sequential order starting with bank 0. Also, CAS before RAS refresh uses less power than the RAS only refresh. To support DRAMs with longer refresh times, the memory controller 718 provides programmable refresh rate capability. The DRAM refresh rate is programmable to intervals of 16 $\mu$s, 32 $\mu$s, 64 $\mu$s, or 128 $\mu$s. by setting the appropriate values for Bits 1-0 (REFDIV1-0) in the DRAM Shadow and Timing Control register.

To minimize interference with host cycles, the memory controller 718 supports a 4-level refresh queue. The refresh queue is enabled by setting Bit 2 (QUEEN) of the Shadow and Timing Control register. When the refresh queue is enabled, the memory controller queues up to 4 refresh requests. The memory controller then waits until a host idle cycle occurs to refresh the memory.

In a Self Refresh Mode the memory controller 718 supports DRAMs with self refresh capability. This mode is enabled by setting Bit 3 (SELFREF) to a one in the Shadow and Timing Control register. Self refresh is a special case of CAS-before-RAS refresh in which DRAMs are capable of generating their own refresh request and refresh address. This type of refresh is used in suspend mode wherein MPU 102 pin SUSPEND is activated and the 32 KHz refresh clock is the only clock running. Entering self refresh resembles an extended CAS-before-RAS refresh. WE is high when CAS is first driven low, to prevent the DRAM from entering a test mode. If CAS and RAS are both held low by a predetermined period (typically>16 msec), DRAMs supporting self refresh begin generating their own refresh requests and refresh addresses. When in self-refresh mode, the CAS and RAS signals must remain low, WE and OE are high and the MA memory address lines are disabled to a high impedance (3-state). Self refresh is automatically exited when CAS and RAS go high.

Suspend Refresh

The memory controller supports a low-power suspend mode. In this mode, power to the MPU and DRAM is maintained, but the MPU clocks are stopped placing it in a static state. Suspend refresh is useful for DRAMs that do not support their own self refresh. When entering suspend refresh mode, a CAS-before-RAS refresh is performed. The DRAM continues to be refreshed while the MPU is in suspend mode. When suspend mode is exited, an application program resumes. This mode is enabled by setting Bit 3 (SELFREF) to a one in the Shadow and Timing Control register.

The disclosed chipset of FIGS. 5–7 also supports a lower power suspend mode, called 0-volt suspend, wherein all power is removed to the system 100, including the DRAM 106. In this state only the resume state machine logic called PMU 920B in PPU 110 is powered. All system information is stored to either a hard disk or other non-volatile memory array.

A Page mode is enabled by setting bit 4 (PGMOD) in the Shadow and Timing Control register. Page mode supports faster access and lower power dissipation than normal memory cycles. A page mode cycle begins with a normal cycle. While RAS is kept low to maintain the row address, CAS is cycled to strobe in additional column addresses. This eliminates the time required to set up and strobe sequential row addresses for the same page.

The memory controller unit 718 uses a memory address multiplexing scheme that supports different DRAM sizes. The multiplexing schemes for the various DRAMS are shown in detail in the next table. The memory address (MA) is shown across the top. The numbers located in the MA columns are the host address (HA) lines corresponding to the remapped memory row and column addresses. There are two bits, MATx1 and MATx0 (x is the memory bank number), for each of the four memory banks located in the Memory Array Type register that are used to select the DRAM array type.

Memory Address Mulitplexing Scheme

| | MA12 | MA11 | MA10 | MA9 | MA8 | MA7 | MA6 | MA5 | MA4 | MA3 | MA2 | MA1 | MA0 |
|---|---|---|---|---|---|---|---|---|---|---|---|---|---|
| Memory Array Type 0 - 11/12-Bit Column Address Width | | | | | | | | | | | | | |
| Row | 25 | 24 | 23 | 22 | 21 | 20 | 19 | 18 | 17 | 16 | 15 | 14 | 13 |
| Col | — | 25 | 12 | 11 | 10 | 9 | 8 | 7 | 6 | 5 | 4 | 3 | 2 |
| Memory Array Type 1 - 10-Bit Column Address Width | | | | | | | | | | | | | |
| Row | 24 | 23 | 22 | 21 | 20 | 19 | 18 | 17 | 16 | 15 | 14 | 13 | 12 |
| Col | — | — | — | 11 | 10 | 9 | 8 | 7 | 6 | 5 | 4 | 3 | 2 |
| Memory Array Type 2 - 9-Bit Column Address Width | | | | | | | | | | | | | |
| Row | 23 | 22 | 21 | 20 | 19 | 18 | 17 | 16 | 15 | 14 | 13 | 12 | 11 |
| Col | — | — | — | — | 10 | 9 | 8 | 7 | 6 | 5 | 4 | 3 | 2 |
| Memory Array Type 3 - 8-Bit Column Address Width | | | | | | | | | | | | | |
| Row | 22 | 21 | 20 | 19 | 18 | 17 | 16 | 15 | 14 | 13 | 12 | 11 | 10 |
| Col | — | — | — | — | — | 9 | 8 | 7 | 6 | 5 | 4 | 3 | 2 |

In FIG. 9, the MPU 102 numeric coprocessor interface 710 has pins for connection to a math coprocessor 108 for floating point or other fast calculations in the FPU Interface Table earlier herein-above. Signal pins connect between the MPU 102 numeric coprocessor interface 710, a 387DX or 487DLC numeric coprocessor 108 and the PPU 110 input FPUERR. PPU 110 has an integrated interrupt controller 914 of FIGS. 11 and 43. When an error signal is sent by the numeric coprocessor 108 to MPU pin NPERROR, the MPU 102 responsively asserts the IRQ13 signal at its FPUERR pin. The IRQ13 signal is fed to the PPU 110 FPUERR pin. PPU 110 processes the interrupt request with controller 914 in FIG. 43 and causes a numeric processor error interrupt service routine to be executed.

When numeric coprocessor 108 is performing operations, its BUSY output is asserted low. When the coprocessor 108 needs to transfer data, its PEREQ output is asserted high. The BUSY and PEREQ outputs from the coprocessor 108 are connected to the MPU inputs NPBUSY and PEREQ respectively. The NPBUSY and PEREQ inputs of the MPU 102 are internally connected to the 486 core processor 702 inputs BUSY486 and PEREQ486, respectively.

During a normal cycle, when no error occurs, the internal BUSY486 is asserted when the coprocessor 108 asserts BUSY and deasserted when the coprocessor 108 deasserts BUSY. PEREQ486 is also asserted when the coprocessor asserts PEREQ and deasserted when the coprocessor 108 deasserts PEREQ.

When a numeric coprocessor error occurs, the coprocessor 108 asserts its ERROR output low. The falling edge of this signal causes the internal BUSY486 to be latched in a Busy Latch and IRQ13 to go active, triggering the IRQ13 interrupt request FPUERR to PPU 110. When the coprocessor 108 deasserts BUSY, the internal PEREQ486 signal is asserted. The interrupt service routine then executes on MPU 102, starting at an interrupt vector address supplied by interrupt controller 914, and MPU 102 writes to I/O address 00F0h which deasserts IRQ13, PEREQ486, and BUSY486.

Turning to Power Management Interface 708 of FIGS. 9, 27, 36 and 33, MPU 102 supports two low-power modes: Toff and Suspend. In Toff mode the clock ph1/ph2 of FIG. 36 to the core processor portion 702 of the MPU 102 is stopped by signal (SUSP) of FIG. 33 in response to MASKCLK (hmaskclk). In suspend mode all clocks, except the 32 KHz clock, are stopped and the oscillator OSC and clock multiplying phase lock loop PLL 706 are disabled. The MPU 102 is fully static in suspend mode, except for circuitry in MCU 718 that refreshes the DRAMs 106. In a ready Mode, SUSPEND and MASKCLK signals are inactive and the core processor 702 runs at full speed.

To enter Toff mode, the SUSPEND signal pin (hsuspendx of FIG. 33) is held inactive, and either the MASKCLK (hmaskclk) signal is asserted in hardware of FIG. 27, or bit 6 of a CPU 702 register CCR0 is toggled from 0 to 1 (region 6) by software. The core processor 702 finishes the current instruction and bus cycle and then its clock is stopped by circuit 2840 of FIG. 33. As shown in FIG. 36, the PCI bridge 716 and the memory controller MCU 718 are not affected. Any hardware interrupt to circuit 2840 of FIG. 33, (i.e. INTR (hintr), NMI (hnmi), or SMI smi_in) of FIG. 33, or deassertion of MASKCLK, a PCI master request, or assertion of HOLD restarts the core processor clock ph1/ph2 of FIG. 36. The core processor clock ph1/ph2 advantageously restarts with a maximum latency of one oscillator clock cycle as a result of the location of clock gate 3610 between CPU core 702 and PLL 706. The core processor clock stability and duty cycle requirements are maintained during transitions into and out of the Toff Mode.

In Suspend Mode, assertion of the SUSPEND input (hsuspendx) pin signal to MPU 102 in FIG. 33 not only masks the core processor 702 clock via gate 3610, but also PCI bridge and memory controller MCU 718 have their respective clocks hclk2, hpclk masked as well as all clock outputs (PCLKOUT and NPUCLK) by further advantageous clock gates 3622 and 3624 in pair 3620. Beforehand, internal MPU block 718 of FIG. 33 acknowledges (by signal hstopfmmcu) that it can stop, whereupon signal hstoposc is generated and the clock outputs from gates 3620 are stopped by control signal ENX of FIGS. 34 and 36. When SUSPEND is deasserted, the suspend mode is terminated and the oscillator is enabled by control signal hresume. After a short time, the clock signals to the MPU 102 are restarted and PLL 706 restarts. Stability and duty cycle requirements are maintained for all clocks during transitions into and out of suspend mode.

In the following charts of registers, the default value in every bit is zero (0) unless the notes indicate othewise by an "always" entry.

The PCI Configuration registers 712 are accessed by using Index/Data register pair. The Index register is used to select a particular register in the PCI configuration space. The Data register is used to write/read data to/from the particular register selected by the Index register. The Index register is 32-bits and is located in the I/O map at address 0CF8h–0CFBh and may be accessed only as a full double-word I/O. The Data register is a 32-bit register located in the I/O map at address 0CFCh–0CFFh and may be accessed in bytes, words, or as a double word.

The bits in the Index register are defined as follows: Bit 31 should be a 1 to enable the generation of a PCI configuration cycle.

Bits 30–24 are reserved.

Bits 23–16 define the PCI bus number. This is used only in systems that support hierarchical PCI buses.

Bits 15–11 define the PCI device number. The PCI device number is translated to a unique AD line that is connected to the IDSEL line of a PCI device and is used as a chip select during a PCI configuration cycle.

Bits 10–8 define a functional group within the target PCI device.

Bits 7–0 define the index of a double-word location with PCI configuration space of a target device. Bits 1–0 are hardwired to zero. Internally, BE3-0 are used to determine which bytes to access from the Data register.

The PCI configuration block 712 contains registers that can be used to program the MPU 102 features including the memory control unit and the PCI bridge. Programming these registers is a two-step process: Write the bus number, physical device number, functional number, and Data register index to the Address register (CF8h–CFBh) as a double-word I/O write operation.

Perform an I/O read or write to the Data register (CFCh–CFFh). Bit 31 of the Index register (CF8h–CFBh) should be set to a one to convert the host I/O cycle to the Data register to a PCI configuration cycle on the PCI bus 104. The PCI configuration cycle generated is a Type 0, Mechanism #1 as defined by the PCI Local Bus Specification, revision 2.0.

The table shows how information in the Address register is translated by the host PCI bridge into a PCI configuration cycle.

| | Address Register Device Number Bits | | | | | PCI AD BUS Bits | | | | | |
|---|---|---|---|---|---|---|---|---|---|---|---|
| Device | 15 | 14 | 13 | 12 | 11 | 31 | 30 | 29 | 28 | 27 | 26 |
| Host | 0 | 0 | 0 | 0 | 0 | 0 | 0 | 0 | 0 | 0 | 0 |
| PPU | 0 | 0 | 0 | 0 | 1 | 0 | 0 | 0 | 0 | 0 | 1 |
| PCU | 0 | 0 | 0 | 1 | 0 | 0 | 0 | 0 | 0 | 1 | 0 |
| VGA | 0 | 0 | 0 | 1 | 1 | 0 | 0 | 0 | 1 | 0 | 0 |
| MASTER | 0 | 0 | 1 | 0 | 0 | 0 | 0 | 1 | 0 | 0 | 0 |
| SLAVE1 | 0 | 0 | 1 | 0 | 1 | 0 | 1 | 0 | 0 | 0 | 0 |
| SLAVE2 | 0 | 0 | 1 | 1 | 0 | 1 | 0 | 0 | 0 | 0 | 0 |
| None | 0 | 0 | 1 | 1 | 1 | Not Permitted | | | | | |
| | 0 | 1 | X | X | X | | | | | | |
| | 1 | 0 | X | X | X | | | | | | |
| | 1 | 1 | X | X | X | | | | | | |

The location of the Index/Data register pair can be relocated by writing a value to the upper four bits of a Relocation register (Data register Index 50 in the PCI configuration space). These four bits become the upper four bits of the Index/Data register pair address. For example, the default address for the Index register is 0CF8h–0CFBh followed by the Data register at 0CFCh–0CFFh. If a value of 1 is written to the upper four bits of the Relocation register, then the Index/Data pair would move to I/O location 1CF8h–1CFFh; a value of 2 would move the address to I/O location 2CF8h–2CFFh; etc. The initial write to the Relocation register is done through the Index/Data register at the default address.

An I/O mapping process is an alternative to the Index/Data register pair to access the PCI Configuration registers. The I/O mapping feature allows 256-byte configuration space of each PCI device to be mapped to the I/O address Cx00h–CxFFh, where x represents the PCI device number. Therefore, the PCI configuration space for the host PCI device would be accessed at I/O address C000h–C0FFh; the PCI configuration space for PCI device 1 would be accessed at I/O address C100h–C1FFh; etc. The I/O mapping feature is enabled by writing a 1 to bit 3 of the Relocation register. The initial write to the Relocation register is done through the Index/Data register at the default address.

| MPU Configuration Registers | | | |
|---|---|---|---|
| Default Address (h) | Register | Abbr. | Access |
| 00–01 | Vendor Identification | VID | R |
| 02–03 | Device Identification | DID | R |
| 04–05 | Command | COMM | Mixed |
| 06 | Reserved | — | R/W |
| 07 | Status | STS | Mixed |
| 08 | Revision Code | REVID | R |
| 09–0B | Device Class Code | CLCD | R |
| 0C | Cache Line Size | CLNSZ | R/W |
| 0D | Latency Timer | LTMR | R |
| 0E–0F | Reserved | — | R |
| A0–A3 | Top Memory Address Bank Select | TMA | R/W |
| A4–A7 | DRAM Shadow and Timing Control | STC | R/W |
| A8 | Memory Array Type | MAT | R |
| A9–AB | Reserved | — | R |
| 50 | Relocation | RLC | R/W |
| 51–53 | Reserved | — | R/W |

| Device and Vendor ID Register Data-Register Index (hex): 00 | | | |
|---|---|---|---|
| Bit | Name | Access | Description |
| 31–16 | DID15–0 | R | Device ID. (0A02h) |
| 15–0 | VID15–0 | R | Vendor ID. (104Ch) |

| Status and Command Register Data-Register Index (hex): 04 | | | |
|---|---|---|---|
| Bit | Name | Access | Description |
| 31 | PERR | R/W | Set to 1 when parity error is detected, even if parity error handling is disabled. Cleared by writing a 1. |
| 30 | SYSERR | R/W | Set to 1 when SERR is asserted by MPU. Cleared by writing a 1. |
| 29 | MABT | R/W | Set to 1 when master is aborted (except for special cycle). Cleared by writing a 1. |
| 28 | TABT | R/W | Set to 1 when the bridge is terminated by a target-abort. Cleared by writing a 1. |
| 27 | — | R | Always 0. |
| 26–25 | DEVTMG | R | Always 01. DEVSEL is asserted two clocks after FRAME is asserted. |
| 24 | DPDET | R/W | This bit is used only when MPU is a bus |

Status and Command Register
Data-Register Index (hex): 04

| Bit | Name | Access | Description |
|---|---|---|---|
| | | | master. It is set when three conditions are met: 1) the MPU asserted PERR itself or observed PERR asserted; 2) the MPU acted as the bus master for the operation in which the error occurred; 3) the Parity Error Response bit (bit 6) is set. |
| 23–16 | — | R/W | Reserved. |
| 15–9 | — | R/W | Reserved. |
| 8 | SERR | R/W | Enable bit for the SERR driver. A value of 0 disables the SERR driver. A value of 1 enables the SERR driver. This bit's state after reset is 0. This bit (and bit 6) must be on to report address parity errors. |
| 7 | — | R | Always 0. |
| 6 | PAR | R/W | 1 = Enable parity reporting<br>0 = Disable |
| 5–3 | — | R | Always 0. |
| 2–1 | — | R | Always 1. |
| 0 | — | R | Always 0. |

Revision Code and Device Class Code Registers
Data-Register Index (hex): 08

| Bit | Name | Access | Description |
|---|---|---|---|
| 31–24 | DCC23–16 | R | Device class code. 06h |
| 23–16 | DCC15–8 | R | Device class code. 00h |
| 15–8 | DCC7–0 | R | Device class code. 00h |
| 7–0 | RC7–0 | R | Revision code. 0h |

Cache Line Size and Latency Timer Registers
Data-Register Index (hex): 0C

| Bit | Name | Access | Description |
|---|---|---|---|
| 31–24 | — | R | Always 00h. |
| 23–16 | — | R | Always 00h. |
| 15–8 | LTMR7–0 | R | Latency timer. Always 00h. |
| 7–0 | CLNSZ7–0 | R/W | Cache line size. Default: 00h (KEN high; memory non-cacheable). |

Relocation Register
Data-Register Index (hex): 50

| Bit | Name | Access | Description |
|---|---|---|---|
| 31–8 | — | R/W | Reserved |
| 7–4 | IDRA3–0 | R/W | Upper 4 bits of the index-data register address. |
| 3 | IDEN | R/W | 1 = Enable accessing PCI configuration space via Cx00h–CxFFh.<br>0 = Disable |
| 2–0 | — | R/W | Reserved. |

Top Memory Address Bank Select Registers
Data-Register Index (hex): A0

| Bit | Name | Access | Description |
|---|---|---|---|
| 31–24 | TMA31–24 | R/W | Top memory address for banks 3, 2, 1, and 0: A27–A20.<br>NOTE: Bits 31 – 29 = 110 are used for test purposes; therefore, this combination (110 only) should be avoided in normal operation. |
| 23–16 | TMA23–16 | R/W | Top memory address for banks 2, 1, and 0: A27–A20. |
| 15–8 | TMA15–8 | R/W | Top memory address for banks 1 and 0: A27–A20. |
| 7–0 | TMA7–0 | R/W | Top memory address for bank 0: A27–A20. |

DRAM Shadow and Timing Control Register
Data-Register Index (hex): A4

The DRAM Shadow and Timing Control register defines which 16-Kbyte blocks in the address range 000C 0000h–000D FFFFh are shadowed. The SRRn/SRWn bits, corresponding to each block, define what type of access is allowed to the DRAM in the address range, as shown for bits 31–30, below.

| Bit | Name | Access | Description |
|---|---|---|---|
| 31–30 | SRR9,SRW9 | R/W | Access control for 000C C000–000C FFFFh.<br>SRRn SRWn Access<br>0 0 No access (ROM access) "(disabled)"<br>0 1 Write only (read from ROM)<br>1 0 Read only (write to ROM)<br>1 1 Read/write. |
| 29–28 | SRR8,SRW8 | R/W | Access control for 000C 8000–000C BFFFh. (Same as 31–30) |
| 27–26 | SRR7,SRW7 | R/W | Access control for 000C 4000–000C 7FFFh. (Same as 31–30) |
| 25–24 | SRR6,SRW6 | R/W | Access control for 000C 0000–000C 3FFFh. (Same as 31–30) |
| 23–22 | SRR5,SRW5 | R/W | Access control for 000D C000–000D FFFFh. (Same as 31–30) |
| 21–20 | SRR4,SRW4 | R/W | Access control for 000D 8000–000D BFFFh. (Same as 31–30) |
| 19–18 | SRR3,SRW3 | R/W | Access control for 000D 4000–000D 7FFFh. (Same as 31–30) |
| 17–16 | SRR2,SRW2 | R/W | Access control for 000D 0000–000D 3FFFh. (Same as 31–30) |
| 15–14 | SRR1,SRW1 | R/W | Access control for 000F 0000–000F FFFFh. (Same as 31–30) |
| 13–12 | SRR0,SRW0 | R/W | Access control for 000E 0000–000E FFFFh. (Same as 31–30) |
| 11 | VRAM | R/W | 1 = MCU responds to 000A 0000–000B FFFFh.<br>0 = MCU does not respond. |
| 10 | WBE | R/W | Write buffer enable.<br>1 = Enable.<br>0 = Disable. |
| 9–8 | ENB1–0 | R/W | Bank enable:<br>ENB1 ENB1 Enable<br>0 0 Bank 0<br>0 1 Banks 0 and 1<br>1 0 Banks 0, 1, and 2<br>1 1 All 4 banks |

| Bit | Name | Access | Description | | | |
|---|---|---|---|---|---|---|
| | | | DRAM Shadow and Timing Control Register (Continued) | | | |
| -6 | DTMG1-0 | R/W | Wait states for RAS access timing and CAS to RDY sampling. | | | |
| | | | DTMG1 | DTMG0 | RAS Access Time | CAS to Ready Sampling |
| | | | 0 | 0 | 6 T Cycles | 4 T Cycles |
| | | | 0 | 1 | 5 T Cycles | 3 T Cycles |
| | | | 1 | 0 | 4 T Cycles | 2 T Cycles |
| | | | 1 | 1 | Reserved | Reserved |
| 5 | PGHM | R/W | Page hit/miss sampling point. 1 = at end of T1. 0 = at end of T2. | | | |
| 4 | PGMOD | R/W | Page mode enable. The MCU enables page mode. 1 = On. 0 = Off. | | | |
| 3 | SELFREF | R/W | DRAM self refresh. 1 = On 0 = Off | | | |
| 2 | QUEEN | R/W | Refresh 4-deep queuing enable. 1 = Enable. 0 = Disable. | | | |
| 1-0 | REFDIV | R/W | Refresh period. | | | |
| | | | REFDIV 1 | REFDIV 0 | Period | |
| | | | 0 | 0 | 16 μsec. | |
| | | | 0 | 1 | 32 μsec. | |
| | | | 1 | 0 | 64 μsec. | |
| | | | 1 | 1 | 128 μsec. | |

| Memory Array Type Register Data-Register Index (hex): A8 | | | | | | |
|---|---|---|---|---|---|---|
| Bit | Name | Access | Description | | | |
| 31–24 | Reserved | R | | | | |
| 23–16 | Reserved | R | | | | |
| 15–8 | Reserved | R | | | | |
| 7–6 | MAT3(1-0) | R/W | Memory array type bank 3. DRAM Column | | | |
| | | | MAT3 1 | MAT3 0 | Address Width | |
| | | | 0 | 0 | 11/12 | |
| | | | 0 | 1 | 10 | |
| | | | 1 | 0 | 9 | |
| | | | 1 | 1 | 8 | |
| -4 | MAT2(1-0) | R/W | Memory array type bank 2. DRAM Column | | | |
| | | | MAT2 1 | MAT2 0 | Address Width | |
| | | | 0 | 0 | 11/12 | |
| | | | 0 | 1 | 10 | |
| | | | 1 | 0 | 9 | |
| | | | 1 | 1 | 8 | |
| 3-2 | MAT1(1-0) | R/W | Memory array type bank 1. DRAM Column | | | |
| | | | MAT1 1 | MAT1 0 | Address Width | |
| | | | 0 | 0 | 11/12 | |
| | | | 0 | 1 | 10 | |
| | | | 1 | 0 | 9 | |
| | | | 1 | 1 | 8 | |
| 1-0 | MAT0(1-0) | R/W | Memory array type bank 0. DRAM Column | | | |
| | | | MAT0 1 | MAT0 0 | Address Width | |
| | | | 0 | 0 | 11/12 | |
| | | | 0 | 1 | 10 | |
| | | | 1 | 0 | 9 | |
| | | | 1 | 1 | 8 | |

Features of PPU 110 include:

Bus 104 interface for PCI

Provides a fast internal bus for integration of AT peripherals.

Short PCI bus ownership when mastering to minimize overall system latency.

Fast DMA transfers from internal I/O devices to PCI agents.

Supports disconnection (with retry) for slow internal accesses to improve latency.

PCI clock frequency up to 33 MHz and higher at both 5 V and 3.3 V.

Fast internal AT clock range from PCLK/2 to PCLK/4 (frequency division of bus 104 clock).

PCI bus 104 arbitration for CPU, PPU, and up to two or more external PCI bus masters.

Fully compatible with PC-AT architecture.

Two 8237 compatible DMA controllers.

Two 8259-compatible interrupt controllers. Each channel is individually programmable to level or edge triggered mode.

Interrupt router that routes external PCI and PCMCIA interrupts to a software-selectable interrupt channel.

8254-compatible timer/counter.

MC146818-compatible RTC with integrated low-power 32-kHz oscillator and 128-byte CMOS SRAM.

Power Management
CPU clock control without SMI intervention
Mixed 3.3 V/5 V support
System activity timers (STANDBY timer and SUSPEND timer) monitoring of:
  PCI bus activity (DEVSEL)
  VGA frame buffer activity
  Direct memory access (DMA) requests
  Serial port interrupts and chip selects (COM1)
  Parallel-port interrupts and chip select (LPT1)
  Hard-disk-controller interrupts and chip select
  Floppy-disk-controller interrupts and chip select
  Programmable chip select (PCS0 and PCS1)
    Other interrupts (IRQ9, IRQ10, IRQ11, and IRQ15)
Short term CPU clock speedup timer monitoring of:
  Keyboard IRQ or mouse IRQ
  PCI bus master cycle requests
  Masked system activity timer output
  Peripheral activity timers
  IDE
  FDD
  COM1
  Programmable CS0, CS1
  VGA frame buffer
  CPU clock masking by hardware with programmable register for adjusting gate-on/gate-off ratio bidirectional SMI handshaking protocol support:
  Six I/O trap SMI support:
    IDE, FDC, COM1, LPT1, programmable chip-select 0 and 1
    Four-bit backlight intensity adjustment pulse-width modulation (PWM)
    Fully static solution (100-$\mu$A/chip maximum drain at 3.3 V) Resume can be caused by RTC alarm, modem ring, suspend/resume button, keyboard IRQ, mouse IRQ, ON/OFF button, PCU's CRDSMI, or a low-to-high transition on the BATLOW input.
    Shadow registers for saving full system state to disk
    Bus quieting and I/O leakage current control Full hardware for Microsoft advanced power management software
    FDC (Floppy Disk Controller)
      Functionally compatible with Intel 82077SL
      Supports 3.5-inch drives (720 kB, 1.44 MB and 2.88 MB)
      Supports 5.25-inch drives (360 kB and 1.2 MB)
      All buffers integrated
      Supported track formats:
      IBM System 34 format (MFM)
      Perpendicular 500 kb/s format (MFM)
      Perpendicular 1-Mb/s format (MFM)
      Data FIFO during execution phase of read/write command
      255-step recalibrate command
      Software reset
      Integrated floppy data separator with no external components
      Supports at least one Floppy Drive
      Drive Interface signals can be multiplexed to parallel port pins for use with external drive
        Serial interface
        16c550-compatible serial port
        16-byte FIFO
        Selectable timing reference clock: 1.8461 MHz or 8 MHz
      Parallel port
        Compatible with standard Centronics parallel interface
        Support for fast parallel protocols: ECP and EPP
        16-byte data path FIFO buffer
        Direct memory access (DMA) transfer
        Decompression of run length encoded data in ECP reverse mode
      IDE Interface (hard disk)
        Complete IDE interface logic. IDE hard disk is isolated and can be powered off independently.
        Supports high-speed IDE access
      XD-bus interface
        Support for BIOS ROM (can be flash EEPROM)
        Provides keyboard controller connections
        Two user-programmable chip selects
        Audio CODEC support The PCI bus interface 902 provides both a master and a slave interface to the PCI bus 104. As a PCI master, the PPU runs cycles on behalf of the DMA master and manages internal data routing.

When reading data or writing data from/to the PCI bus, the PPU transfers a double word. The PPU does not have to generate PCI I/O cycles as a master. As a PCI slave, the PPU accepts cycles initiated by PCI masters targeted for the PPU's internal register set or internal fast-AT bus.

As a resource, the PPU can be locked by any PCI master. In the context of locked cycles, the entire PPU subsystem (including the internal fast-AT bus) is considered a single resource.

PCI arbiter 906 provides support for four PCI masters; the MPU (host), PPU, and two other PCI masters. The arbiter 906 controls host access to the PCI bridge by using HOLD/HLDA handshake protocol. This implies that the host is always parked on the PCI bus. PPU accesses to the PCI bus are controlled by internal request/grant signals, while accesses by external PCI masters are controlled by external request/grant signals. Arbitration is based on a fair rotation scheme and allows for one master agent to be assigned as a super agent. The arbiter supports locked cycles by implementing a PCI bus lock.

The PPU contains an internal wholly on-chip fast-AT bus 904 that is similar to the ISA bus. However, the on-chip fast-AT bus is dynamically programmable and runs at higher than typical ISA bus speeds. Fast-AT bus speeds, for IDE accesses and non-IDE accesses, can be independently programmed to run at ½, ⅓, or ¼ the PCI clock speed of bus 104.

The PPU has a section 912 that incorporates the functionality of an 82206 peripheral controller chip. Included are two 82C37-compatible DMA controllers 910, two 82C59-compatible interrupt controllers 914, one 82C54 compatible timer/counter 916, and an MC146818-compatible real-time clock 918 with 114 bytes of CMOS RAM memory. A high-page register is included in the DMA subsystem to support DMA to a 32-bit memory address. The PPU provides an XD bus and control signals that are used to support BIOS ROM (including flash EEPROM) and keyboard controller. Additionally, two programmable chip selects are provided that can be used to support additional peripheral devices such an audio CODEC chip. The XD bus is shared with the IDE hard disk interface and is used as the lower byte of the IDE data bus.

Serial/Parallel Ports

The PPU provides one 16C550 compatible serial interface port and one parallel port. The parallel port is capable of supporting protocols for extended capabilities port (ECP), enhanced parallel port (EPP), and the standard Centronics bidirectional port. DMA accesses are supported under the ECP and EPP protocols.

Power Management Unit

The power management unit (PMU) 920 subsystem provides distributed power management of system peripherals through the use of activity timers and I/O trapping system-management interrupts.

Centralized power-management logic, primarily used for controlling the CPU clock, is provided through system standby 2420 and suspend SUSP timers. Additionally, a temporary-on timer TEMP can be enabled to slow down the CPU clock between key-strokes without software intervention. These timers, along with a short latency (approximately 100 ns) in restoring the CPU clock to full speed, can be used to dynamically save power with minimal affect on system performance.

Terminal Assignments/PPU Signal Pin Descriptions

| PIN NAME | NO. | I/O TYPE | BUFFER TYPE* mA | FUNCTION |
|---|---|---|---|---|
| Extended Capabilities Parallel Port (ECP)* | | | | |
| STB (HostClk) | 195 | O | +12 mA, FS | Std Mode: Strobe. Latches data into the printer. ECP Mode: Host clock. Registers data or address into the slave. |
| PDATA7 | 205 | I/O | TTL, hys/ TTL +12 mA | Address/Data. Contains address or data |
| PDATA6 | 204 | I/O | | |
| PDATA5 | 203 | I/O | | |
| PDATA4 | 202 | I/O | | |
| PDATA3 | 200 | I/O | | |
| PDATA2 | 199 | I/O | | |
| PDATA1 | 198 | I/O | | |
| PDATA0 | 197 | I/O | | |
| ACK PeriphClk | 2 | I/O | TTL, hys, FS/TTL, FS, +12 mA | Std Mode: Acknowledge. Indicates successful data transfer. ECP Mode: Peripheral clock. Indicates valid data is being driven by the peripheral when asserted. Handshakes with HostAck in reverse. |
| BUSY PeriphAck | 3 | I/O | TTL, hys, FS/TTL, FS, +12 mA | Std Mode: Busy. Goes high when printer is not ready to accept data. ECP Mode: Peripheral acknowledge. This signal deasserts to indicate that the peripheral can accept data. In the reverse direction this signal, when high, indicates the data is a command (normally RLE). |
| PE AckReverse | 4 | I/O | TTL, hys, FS/TTL, FS, +12 mA | Std Mode: Paper empty. Indicates printer has run out of paper. ECP Mode: Acknowledge reverse. Used to acknowledge a change in the transfer direction. Asserted indicates forward, deasserted indicates reverse. |
| SLCT xflag | 5 | I/O | TTL, hys, FS/TTL, FS, +12 mA | Std Mode: Select. Goes high when printer has been selected. ECP Mode: External flag. Indicates printer on line. |
| AFD HostAck | 196 | O | TTL, +12 mA | Std Mode: Autofeed. Indicates paper is to be autofed to the printer. ECP Mode: Host acknowledge. Requests byte of data from the peripheral when asserted, handshaking with PeriphClk in the reverse direction. In the forward direction, this signal indicates whether the data lines contain ECP address or data. |
| FAULT PeriphReq | 207 | I/O | TTL, hys, FS/TTL, FS, +12 mA | Std Mode: Fault. Indicates printer error condition. ECP Mode: Peripheral interrupt request. Generates an error interrupt when asserted. |
| INIT ReverseReq | 208 | O | TTL, +12 mA | Std Mode: Initialize. Printer initialize. ECP Mode: Reverse request. Sets the transfer direction to reverse when asserted, and forward when deasserted. |
| SLIN | 1 | O | TTL, | Std Mode: Select line printer. Selects |

-continued

Terminal Assignments/PPU Signal Pin Descriptions

| PIN NAME | NO. | I/O TYPE | BUFFER TYPE* mA | FUNCTION |
|---|---|---|---|---|
| ECPMode | | | +12 mA | the printer when active. ECP Mode: Extended capabilities mode. Always asserted in ECP mode. |
| Floppy Disk Controller (FDC) | | | | |
| HD | 167 | O | TTL, OD, 24 mA | High density select. |
| ED | 180 | O | TTL, OD, 24 mA | Extra high density select. |
| FDDIR | 170 | O | TTL, OD, 24 mA | Direction. This output determines the direction of the head movement (active = step in, inactive = step out) during a seek operation. During read or write, FDDIR is inactive. |
| DSKCHG | 182 | I | TTL, hys | Disk change. This input indicates if the drive door has been opened. The state of the pin is available from the digital input register (DIR). |
| HDSEL | 179 | O | TTL, OD, 24 mA | Head select. This output determines which side of the disk drive is accessed. Active selects side 1, inactive selects side 0. |
| MEN | 169 | O | TTL, OD, 24 mA | Motor enable. Decoded motor enable for the drive. This output is directly controlled by the digital output register (DOR). It is also acts as drive select. |
| INDEX | 168 | I | TTL, hys | Index. Indicates the beginning of the track. |
| RDATA | 178 | I | TTL, hys | Read data. Serial data from the disk. |
| STEP | 172 | O | TTL, OD, 24 mA | Step. Supplies step pulses to the drive. |
| TRACK0 | 175 | I | TTL, hys | Track 0. Indicates that the head is on track 0. |
| WDATA | 173 | O | TTL, OD, 24 mA | Write data. FM or MFM data to the disk. |
| FDWE | 174 | O | TTL, OD, 24 mA | Write enable. Drive control that enables the head to write. |
| WRP | 177 | I | TTL, hys | Write protect. Indicates whether the drive is write protected. |
| Integrated drive electronics (IDE) | | | | |
| CS1FX | 165 | O | TTL, +12 mA | Drive chip select 0. This chip-select signal is decoded from the address bus and used to select the command block registers. |
| CS3FX | 166 | O | TTL, +12 mA | Drive chip select 1. This chip-select signal is decoded from the address bus and used to select the command block registers. |
| DA2 | 164 | O | TTL, +12 mA | Drive address bus. This is a 3-bit binary-coded address used to access a register or data port in the drive. DA1 and DA0 are also used for byte addressing from a 32-bit access between the host and the SD bus. |
| DA1 | 162 | O | | |
| DA0 | 163 | O | | |
| DD15 | 154 | I/O | TTL, hys/ TTL +12 mA | Drive data bus. upper byte of IDE data bus. |
| DD14 | 153 | I/O | | |
| DD13 | 151 | I/O | | |
| DD12 | 150 | I/O | | |
| DD11 | 149 | I/O | | |
| DD10 | 148 | I/O | | |
| DD9 | 146 | I/O | | |
| DD8 | 145 | I/O | | |
| IDEIOR | 158 | O | TTL, +12 mA | Drive I/O read. |
| IDEIOW | 156 | O | TTL, +12 mA | Drive I/O write. |

-continued

Terminal Assignments/PPU Signal Pin Descriptions

| PIN NAME | NO. | I/O TYPE | BUFFER TYPE* mA | FUNCTION |
|---|---|---|---|---|
| IDEIRQ | 160 | I | TTL, hys | Drive interrupt request. Used to inform the system that the drive has an interrupt pending. |
| IDERST | 155 | O | TTL, +12 mA | Drive reset. Used to reset the IDE drive. |
| IOCS16 | 161 | I | TTL, hys | I/O chip select 16. This input indicates to the host system that the 16-bit data port has been addressed and that the hard drive is prepared to send or receive a 16-bit data word. |
| IOCHRDY | 159 | I | TTL, hys | I/O channel ready. This input is deasserted by a target to extend the current I/O cycle. |
| Interrupt Controller Interface | | | | |
| INTR | 82 | O | TTL, +2 mA | Interrupt. Used to indicate to the CPU that an interrupt has been generated. |
| KBDIRQ | 113 | I | TTL, hys | Keyboard controller interrupt request. |
| MSIRQ | 114 | I | TTL, hys | Mouse interrupt request. |
| CRDAIORQ | 90 | I | TTL, hys | PCMCIA card A I/O interrupt request. |
| CRDBIORQ | 91 | I | TTL, hys | PCMCIA card B I/O interrupt request. |
| CRDSRVRQ | 92 | I | TTL, hys | PCMCIA card and socket services interrupt request. This signal is shared by card slots A and B. |
| FPUERR | 99 | I | TTL, hys | FPU error input. Used to trigger INT13. |
| Miscellaneous/Test/FPU/Timers | | | | |
| FDC_D7 | 97 | O | TTL, +2 mA | Floppy disk controller bit 7. This output contains information about bit 7 of the digital input register of the floppy disk controller. |
| A20M | 72 | O | TTL, +2 mA | A20 mask output. |
| RSTCPU | 73 | O | TTL, +2 mA | Reset CPU signal. |
| OSCOUT | 77 | O | TTL, +2 mA | 14.31818-MHz crystal oscillator output to VGA device. |
| 14MHZXIN | 75 | I | Osc. | 14.31818-MHz crystal oscillator input. |
| 14MHZXO | 76 | O | Osc. | 14.31818-MHz crystal oscillator output. |
| 48MHZXIN | 95 | I | Osc. | 48-MHz-crystal oscillator input. |
| 48MHZXO | 93 | O | Osc. | 48-MHz-crystal oscillator output. |
| AUDDRQ1 | 133 | I | TTL, hys | Audio DMA request. These inputs are used by audio chip to request a DMA cycle. |
| AUDDRQ0 | 131 | I | TTL, hys | |
| AUDDACK1 | 134 | O | TTL, +2 mA | Audio DMA acknowledge. These outputs are used to indicate to an audio chip that a DMA request has been acknowledged. |
| AUDDACK0 | 132 | O | | |
| TEST | 98 | I | | Test mode. When asserted, this causes the PPU to enter the test mode. |
| KBDCLK | 130 | O | TTL, +2 mA | Keyboard clock. Clock output signal to drive the keyboard controller. Programmable to operate at 16, 12, 8, or 4 MHz. |
| SPKROUT | 129 | O | TTL, +2 mA | Speaker output. Connects to external speaker drive circuitry. |
| 32KHZOUT | 87 | O | TTL, +2 mA | Refresh output. 32-kHz output of the timer/counter circuitry used to refresh DRAM memory attached to the MPU. |
| PCI Arbitration Signals | | | | |
| LOCK | 46 | I | TTL, FS | PCI transaction lock. Indicates to the PPU PCI arbiter that an initiatro requires exclusive access to a PCI resource. |
| REQ1 | 14 | I | TTL, | PCI master agent bus request. Indicates to the arbiter that this agent desires |
| REQ0 | 16 | I | FS | |

-continued

Terminal Assignments/PPU Signal Pin Descriptions

| PIN NAME | NO. | I/O TYPE | BUFFER TYPE* mA | FUNCTION |
|---|---|---|---|---|
| | | | TTL, FS | use of the bus. This is a point-to-point signal. |
| HOLD/ MPUGNT | 9 | O | +XX mA | CPU hold request or MPU grant. Request to the CPU to relinquish control of the PCI bus, or grant PCI bus to MPU. |
| GNT1 | 13 | O | +XX mA | PCI arbiter bus grants. Indicates to |
| GNT0 | 15 | O | +XX mA | the agent that access to the bus has been granted. This is a point-to-point signal. |
| HLDA/ MPUREQ | 8 | I | TTL, FS | CPU hold acknowledge or MPU request. Acknowledgement from CPU that CPU no longer controls the PCI bus or MPU requests the PCI bus. |

PCI System Pins

| PCLK | 11 | I | TTL, FS | PCI bus clock. |
|---|---|---|---|---|

PCI Address and Data Pins

| AD31-0 (pins 18-21, 23-26, 30-33, 35-38, 52-55, 57-60, 63-66, 68-71. AD31 is pin 18. AD0 is pin 71. | | | TTL, FS/ +XX mA | PCI bus multiplexed address and data. |
|---|---|---|---|---|
| C/BE3 | 27 | I/O | TTL, | PCI bus multiplexed command and byte |
| C/BE2 | 39 | I/O | FS/ | enables. |
| C/BE1 | 51 | I/O | +XX mA | |
| C/BE0 | 62 | I/O | | |
| PAR | 49 | I/O | TTL, FS/ +XX mA | PCI bus parity. PAR reflects the even parity computed across the AD31-AD0 an C/BE3-C/BE0 buses on the previous cycle. |

PCI Error Reporting Signal

| PERR | 47 | I/O | TTL, FS | Data parity error indication. Driven by the PPU when it identifies a data parity error when acting as the target of a PCI operation or when acting as the initiator of a PCI operation. |
|---|---|---|---|---|
| SERR | 48 | I | TTL, FS | System error indication. Monitored by the PPU when it acts as the initiator of a PCI bus operation. |

PCI Interface Control Pins

| FRAME | 41 | I/O | TTL, FS/ +XX mA | PCI bus cycle frame. Driven by the current master to indicate the beginning and duration of an access. FRAME is asserted to indicate that a bus transaction is beginning. While FRAME is asserted data transfers continue. When FRAME is deasserted the transaction is in the final data phase. |
|---|---|---|---|---|
| TRDY | 43 | I/O | TTL, FS/ +XX mA | PCI bus target ready. Indicates the target agent's (selected device) ability to complete the current data phase of the transaction. TRDY is used in conjunction with IRDY. A data phase is completed on any clock where both TRDY and IRDY are sampled asserted. During a read, TRDY indicates that valid data is present on AD31-AD0. During a write, it indicates that the target is prepared to accept data. Wait cycles are inserted until both IRDY and TRDY are asserted together. |

-continued

Terminal Assignments/PPU Signal Pin Descriptions

| PIN NAME | NO. | I/O TYPE | BUFFER TYPE* mA | FUNCTION |
|---|---|---|---|---|
| IRDY | 42 | I/O | TTL, FS/ +XX mA | PCI bus initiator ready. Indicates the initiating agent's (bus master) ability to complete the current data phase of the transaction. IRDY is used in conjunction with TRDY. A data phase is completed on any clock where both IRDY and TRDY are sampled asserted. During a write, IRDY indicates that valid data is present on AD31-AD0, During read, it indicates that the master is prepared to accept data. Wait cycles are inserted until both IRDY and TRDY are asserted together. |
| STOP | 45 | I/O | TTL, FS/ +XX mA | PCI bus transaction terminator from target agent. Indicates that the current target is requesting the master to stop the current transaction. |
| DEVSEL | 44 | I/O | TTL, FS/ +XX mA | PCI bus device selected acknowledge. When actively driven, DEVSEL indicates the driving device has decoded its address as the target of the current access. As an input, it indicates whether any device on the bus has been selected. |
| IDSEL | 28 | I | TTL, FS | PCI bus device configuration space selector. Each device selects its own address for normal accesses. However, accesses in the configuration address space require device selection decoding to be done externally and signalled to the PCI device via the IDSEL pin that functions as a chip select. This signal should be connected to one of the upper 6 address lines (AD31- 26) of the MPU. |
| RSTPCI | 10 | O | +XX mA | PCI bus reset. |
| INTA | 6 | I | TTL, FS | PCI bus device interrupt A. Level sensitive interrupt input |
| INTB | 7 | I | TTL, FS | PCI bus device interrupt B. Level sensitive interrupt input. |
| Power Management Unit | | | | |
| BATLOW | 104 | I | TTL, hys, FS | Battery low. |
| SRBTN | 105 | I | TTL, hys | Suspend/resume button. Input used to monitor the status of a switch that can indicate to the system whether the notebook PC's cover is closed or open. This pin is falling edge sensitive. SRBTN is internally connected to a pullup resistor to prevent it from floating active when left unconnected. |
| SMI | 83 | I/O | TTL, hys, FS/TTL, +2 mA | SMI. This is a point-to-point signal between CPU and PPU used to request system management interrupt. |
| FDDPWR | 183 | O | TTL, +2 mA | Floppy drive power enable. When active, this output can be used to enable the floppy disk drive power. |
| HDDPWR | 184 | O | TTL, +2 mA | IDE drive power enable. When active, this output can be used to enable the hard disk drive power. |
| Reserved | 96 | | | |
| PWRGOOD5 | 102 | I | TTL, hys | Power good. Master system reset for 5-V logic. |
| ONBTN | 101 | I | TTL, hys | On button. This pin is falling edge sensitive. ONBTN is internally connected to a pullup resistor to prevent it from floating active when left unconnected. |
| MASCLK | 84 | O | TTL, +2 mA | CPU clock control gate. This output is used to stop the core CPU clock |

-continued

Terminal Assignments/PPU Signal Pin Descriptions

| PIN NAME | NO. | I/O TYPE | BUFFER TYPE* mA | FUNCTION |
|---|---|---|---|---|
| SUSPEND | 85 | O | TTL, +2 mA | input when it is active. Suspend status. This output indicates that the chipset is in suspend mode. |
| GPSMI | 115 | I | TTL, hys | Subsystem power management interrupt request. This is a general purpose SMI input. |
| CRDSMI | 86 | I | TTL, hys | PCMCIA system power management interrupt request. |
| PCSPWR | 127 | O | TTL, +2 mA | Programmable device power enable. |
| SIUPWR | 185 | O | TTL, +2 mA | Serial port power enable. Turn off RS232 driver when it is inactive. |
| BLADJ | 88 | O | TTL, +2 mA | LCD backlight intensity adjustment PWM output. |
| VCCON | 103 | O | TTL, +2 mA | Turn on main power. |
| Real-time Clock interface | | | | |
| RTCPWR | 106 | I | | RTC power. This input is the battery power source for the internal RTC. |
| RTCXIN | 107 | I | Osc. | RTC 32.768-kHz crystal oscillator input. This input connects to one side of the RTC crystal when the internal RTC is enabled. |
| RTCXO | 108 | O | Osc. | RTC 32.768-kHz crystal oscillator output. This input connects to one side of the RTC crystal when the internal RTC is enabled. |
| RTCRCLR | 110 | I | TTL, hys | RTC CMOS SRAM clear. This signal is used to reset the RTC when battery is removed. |
| RTCGND | 109 | I | | 32.768-kHz crystal oscillator ground return. Internal ground used to connect one side of shunt filter capacitor. |
| Serial Interface 1(SIF) | | | | |
| CTS | 191 | I | TTL, hys | Clear to send. The logical state of the CTS pin is reflected in the CTS bit of the mode status register (MSR) of the ACE. A change of state in either CTS pin since the previous reading of the associated MSR causes the setting of DCTS MSR0 of each modem status register. |
| DCD | 186 | I | TTL, hys | Data carrier detect. DCD is a modem input whose condition can be tested by the CPU by reading MSR7 (DCD) of the modem status registers. MSR3 (DDCD) of the modem status registers indicates whether the DCD input has changed since the previous reading of the MSR. DCD has no effect on the receiver. |
| DSR | 187 | I | TTL, hys | Data set ready inputs. The logical state of the DSR pin is reflected in MSR5 of its associated modem status register. DDSR MSR1 indicates whether the associated DSR pin has changed state since the previous reading of the MSR. |
| DTR | 192 | O | TTL, +2 mA | Data terminal ready. The DTR pin can be set (low) by writing a logical 1 to MCR0, modem control register bit 0 of its associated ACE. This signal is cleared (high) by writing a logical 0 to the DTR bit MCR0 or whenever a reset occurs. When active (low), the DTR pin indicates that its ACE is ready to receive data. |
| RI | 193 | I | TTL, hys | Ring indicator. The RI signal is a modem control input whose condition is tested by reading MSR6 (RI) of each SIF. The modem status register output TERI MSR2 indicates whether the RI |

-continued

Terminal Assignments/PPU Signal Pin Descriptions

| PIN NAME | NO. | I/O TYPE | BUFFER TYPE* mA | FUNCTION |
|---|---|---|---|---|
| RTS | 189 | O | TTL, +2 mA | input has changed from high to low since the previous reading of the MSR. Request to send. An RTS pin is set low by writing a logical 1 to MCR1. Both RTS pins are reset high by PWRGOOD. A low on the RTS pin indicates that its ACE has data ready to transmit. In half-duplex operations, RTS is used to control the direction of the line. |
| SIN | 188 | I | TTL, hys | Serial data input. The serial data input moves information from the communication line or modem to the SIF receiver circuits. A mark (1) is high, and a space (0) is low. Data on serial data inputs is disabled when operating in the loop mode. |
| SOUT | 190 | O | TTL, +2 mA | Serial data output. This line is a serial data output from the SIF transmit circuit. A mark is a logical 1 (high) and a space is a 0 (low). Each SOUT is held in the mark condition when the transmitter is disabled, PWRGOOD is true (high), the transmitter register is empty, or when in the loop mode. |
| Power Supply Pins | | | | |
| VCC3 | Note 1 | | | 3.3-V power supply pins. |
| GND | Note 2 | | | Device ground pins. |
| RTCPWR | 106 | | | RTC power pin. This input is the battery power source for the internal RTC. |
| VCCXD | 135 | | | XD bus power supply pin. This pin can be tied to 3.3 V or 5 V. |
| VCCDK | Note 3 | | | Disk power supply pins. These pins can be tied to 3.3 V or 5 V. |
| VCC5 | Note 4 | | | 5-V power supply pins. |
| XD Bus Control Interface Signals | | | | |
| XD7 | 136 | I/O | TTL, hys/TTL, +4 mA | I/O X-bus data. |
| XD6 | 137 | I/O | | |
| XD5 | 138 | I/O | | |
| XD4 | 139 | I/O | | |
| XD3 | 141 | I/O | | |
| XD2 | 142 | I/O | | |
| XD1 | 143 | I/O | | |
| XD0 | 144 | I/O | | |
| XA1 | 117 | O | TTL, +4 mA | X-bus address bits 1 and 0. Two least-significant bits of the X bus. For keyboard controller accesses, XA2 is internally multiplexed into XA1. |
| XA0 | 116 | O | | |
| EEACLK | 118 | O | TTL, +2 mA | Flash memory address clock. This signal is used to clock in XA(17:2) for ROM address. |
| ROMCS | 119 | O | TTL, +2 mA | ROM chip select. Chip select for BIOS ROM. |
| XDWR | 120 | O | TTL, +2 mA | XD write. This signal is used to write to the XD bus. Equivalent to SMEMW for ROM addresses and MEMW or IOW for I/O addresses. |
| XDRD | 121 | O | TTL, +2 mA | XD read. This signal is used to read from the XD bus. Equivalent to SMEMR for ROM addresses and MEMR or IOR for I/O addresses. |
| VPPEN | 122 | O | TTL, +2 mA | Programming voltage. 12-V erase and programming voltage for flash-memory chips. |
| KBDCS | 124 | O | TTL, +2 mA | Keyboard controller chip select. This output goes low for accesses to the I/O addresses 60, 62, 64, and 66h. |

-continued

Terminal Assignments/PPU Signal Pin Descriptions

| PIN NAME | NO. | I/O TYPE | BUFFER TYPE* mA | FUNCTION |
|---|---|---|---|---|
| PCS0 | 125 | O | TTL, +2 mA | Programmable chip select 0. This output provides a chip-select signal that can be programmed to go active for different I/O address ranges. |
| PCS1 | 126 | O | TTL, +2 mA | Programmable chip select 1. This output provides a chip-select signal that can be programmed to go active for different I/O address ranges. |
| RSTXD | 128 | O | TTL, +2 mA | Reset I/O devices. Used to reset I/O devices on XD bus to a known state. |
| Reserved Pins | | | | |
| NC | 78 | | | No connect. |
| NC | 79 | | | No connect. |
| NC | 80 | | | No connect. |
| NC | 81 | | | No connect. |
| NC | 111 | | | No connect. |
| NC | 112 | | | No connect. |
| NC | 89 | | | No connect. |

\*Names in parenthesis indicate signal names when used as an industry standard parallel port.
\*TTL = TTL thresholds, hys = hysteresis, and FS = fail-safe for input buffers. TTL = TTL thresholds, FS = fail-safe, and drive current is shown in for output buffers.
Notes:
1) Pins 17, 29, 40, 56, 67, 95, 123, 157, and 176 for nine pins total.
2) Pins 12, 22, 34, 50, 61, 74, 100, 140, 152, 181, and 201 for eleven pins total.
3) Pins 147 and 171 for two pins total.
4) Pins 194 and 206 for two pins total.

The PCI bus interface 912 provides the interface between the PPU and the PCI bus. The integrated PPU subsystems are connected to the PCI bus through a PCI bridge. The basic function of the PCI bridge is the translation of address and protocol between the PCI bus 104 and the internal fast-AT bus 904.

FIG. 14 shows major functional blocks of the the PCI Interface 902. PCI master and slave accesses are handled by separate logic blocks 1202 and 1204 respectively. The PCI slave block 1204 translates PCI cycles initiated by a PCI master targeted to the PPU subsystems or internal registers. The PCI master block 1202 implements state machine logic that is capable of executing PCI master cycles on the PCI bus 104 after it has been granted ownership of the PCI bus by the PCI arbiter 906. In the context of the PPU, it requests the PCI bus as a master when a DMA cycle is requested by the DMA controller.

The fast-AT control block generates the necessary signals used to communicate on the internal fast-AT bus 904. Data transferred between the PCI bus 104 and the fast-AT bus 904 is latched by the data router/buffer logic 1210. The fast-AT controller 1206, in conjunction with the Data Router/Buffer 1210, assembles or disassembles data transferred between the PCI and fast-AT bus when required. For example, a double-word access originating on the PCI bus to a fast-AT subsystem may be translated to four byte-wide accesses on the fast-AT bus.

The PPU implements a set of Configuration registers 1222 that are used to configure the PPU. These registers can be accessed from the PCI bus by a PCI master capable of generating PCI configuration cycles, such as the MPU. Descriptions of the PCI Configuration registers and their default bit values are provided later hereinbelow. Defualt values of zero for all bits are assumed unless tabulated otherwise.

The PPU decodes PCI-bus accesses using subtractive decoding. This means that the PPU will respond to PCI transactions if no other agent in the system responds within a specified period of time. When a write transaction occurs on the PCI bus, the PPU responds in one of four ways:

Write data from the PCI bus into an internal Configuration register—(configuration cycle )

Forward the cycle to the internal fast-AT bus

Retry the transaction if the PPU is currently unable to respond

Ignore the cycle.

When a read transaction occurs on the PCI bus, the PPU responds in one of three ways:

Place the data from an internal Configuration register onto the PCI Bus.—(configuration cycle)

Forward the cycle to the internal fast-AT bus

Ignore the cycle.

The PPU implements a 256-byte configuration register 1222 space.

For PCI to main memory accesses, the PPU is a master on the PCI bus. For host to PCI accesses, the PPU is a target on the PCI bus. Configuration cycles initiated by the host to the PPU configuration address space are forwarded to the PCI bus and responded to by the PPU.

PCI Command Set

Bus commands indicate to the slave the type of transaction the master is requesting. Bus commands are encoded on the C/BE3-0 lines during the address phase of a PCI cycle.

PCI Command Set Support

| C/BE3–0 | Command Type | Supported As Target | Supported As Master |
|---|---|---|---|
| 0000 | Interrupt Acknowledge | Yes | No |
| 0001 | Special Cycle | Yes | No |
| 0010 | I/O Read | Yes | No |
| 0011 | I/O Write | Yes | No |
| 0100 | Reserved | N/A | N/A |
| 0101 | Reserved | N/A | N/A |
| 0110 | Memory Read | Yes | Yes |
| 0111 | Memory Write | Yes | Yes |
| 1000 | Reserved | N/A | N/A |
| 1001 | Reserved | N/A | N/A |
| 1010 | Configuration Read | Yes | No |
| 1011 | Configuration Write | Yes | No |
| 1100 | Memory Read Multiple | No* | No |
| 1101 | Reserved | N/A | N/A |
| 1110 | Memory Read Line | No* | No |
| 1111 | Memory Write and Invalidate | No* | No |

*Treated as memory read.
*Treated as memory write

DEVSEL Generation

As a PCI slave, the PPU asserts the DEVSEL signal to indicate it is the target of a PCI transaction. DEVSEL is asserted by the PPU when it subtractively decodes a PCI transaction.

The PPU samples DEVSEL as an input to determine if another PCI target has claimed the current PCT transaction. If another PCI target has not asserted DEVSEL before the PPU reaches the subtractive decode point, the PPU may claim the cycle by asserting DEVSEL and forward the PCd transaction to the internal fast-AT bus.

In a system as here in which all other PCI target devices in the system can complete a decode and assert DEVSEL within 1 or 2 clocks after FRAME is asserted, a configuration option is provided to move the DEVSEL sample point forward. This allows fast access to slaves on the fast-AT bus.

The DEVSEL sampling point is changed by setting the SDSP bit (Bit 24) in a PCI Bus Control register (PCICTRL) located in the PCI Configuration Registers 1222 of the PPU. When the SDSP bit is set to zero (default), the PPU samples DEVSEL on the three consecutive PCI clocks following the address phase. If no PCI target device has asserted DEVSEL, the PPU asserts DEVSEL which can be sampled by the PCI master device on the fourth PCI clock. If the SDSP bit is set to one, the PPU samples DEVSEL during the two consecutive PCI clocks following the address phase. If no other PCI target device has asserted DEVSEL, the PPU asserts DEVSEL which is sampled by the PCI master during the third PCI clock.

In addition to sampling DEVSEL inactive at the subtractive decode sampling point, the PPU responds by asserting DEVSEL when the PCI transaction is any of the following:

An I/O read or write to the 64K-byte address space 0000h–FFFFh. The IOSE bit (Bit XX) in the PCI Command register is set to one to enable the PPU to respond to PCI originated I/O cycles.

A memory read or write to an address in the lower 16M bytes of memory, 000000h–FFFFFFh (memory-mapped device). The MSE bit (Bit XX) in the PCI Command register, if set to a one, enables the PPU to respond to PCI originated memory cycles.

A memory read or write to address FFFC0000h–FFFFFFFFh or 000C0000h–000FFFFFh. The 4 G byte bit (Bit XX) and the 1M byte bit (Bit XX), if set to a one (default) in the ROM Chip Select register, enables the PPU to respond to these address ranges.

An interrupt acknowledge cycle. The INTACKEN bit (Bit 0) in the PCI Bus Control register, if set to one, enables the PPU to respond to interrupt acknowledge cycles.

A configuration read or write to the PPU Configuration registers.

Once the PPU has asserted DEVSEL in response to a PCI transaction, it either completes or retries the cycle. The PPU retries the cycle if it is unable to perform the current PCI transaction. The PCI master attempts the PCI transaction at some later time. This may occur if the PPU is in the middle of a DMA cycle and cannot service a current request.

As a Master, the PPU waits for 5 PCI clocks after the assertion of FRAME for a slave to assert DEVSEL. If the PPU does not receive DEVSEL in this period of time, it will master-abort the cycle.

A third type of master-initiated termination exists, but is not supported by the PPU. This type is known as time-out termination. Time-out termination refers to a transaction that is terminated because the latency timer expired before the transaction was able to complete. The PPU can implement a latency timer, but this embodiment does not require it.

PPU as Master—Target-Initiated Terminations
Retry
Abort
Disconnect
PPU as Target—Target Initiated Terminations
As a target, the PPU supports the following forms of target-initiated termination:
Retry
Disconnect Retry refers to termination by the PPU which informs the initiator that it currently cannot respond to a transaction and that it should be retried at a later time. No data transfer takes place during this transaction. If the PPU is currently servicing a DMA transfer, it may be unable to respond to another PCI transaction until the DMA is complete. In this case, the PPU will retry the PCI transaction.

Disconnect refers to termination requested because the target is unable to respond within a predetermined latency period. This type of termination will occur after the first data phase is transferred. The difference between Retry and Disconnect is that no data transfers during a Retry. Since the PPU will only transfer single data, a Disconnect results in the same as a normal cycle completion except that STOP is asserted.

As a target, the PPU does not target-abort in this embodiment.

The PPU contains a PCI arbiter 906 that supports four PCI masters: the host bridge (MPU) PPU, and two other PCI masters. The PPU's REQ/GNT lines are internal. The arbiter interfaces with the MPU via the HOLD and HLDA signals. The arbiter provides two additional pairs of REQ/GNT signals which can be used to accept two external PCI masters. Upon reset, the PCI arbiter 906 is disabled and the MPU has default access to the PCI bus because the HOLD signal is deasserted. This assures that the MPU can access the BIOS ROM which is under control of the PPU. The PCI arbiter is enabled by setting the ARBEN bit (BIT XX) in the PCI Arbiter Control register.

Arbitration Priority is described next. MPU access to the PCI bus is controlled by HOLD/HLDA signal protocol. HOLD is asserted to the MPU when another PCI master requests the PCI bus. Basically, this puts the MPU in a parked mode on the PCI bus. The term parked means that the MPU has default access to the PCI bus when no other master is using or requesting the bus. This reduces PCI latency of the MPU as it does not have to request the PCI bus.

Abitration between the other three PCI masters (the PPU, and two external devices) is based on a fair rotation scheme shown in FIG. 40. The arbiter treats all requests with equal priority and rotates through active PCI requests until they are all serviced. The table below shows events or conditions that can alter the fair rotation sequence. When there are no more PCI requests pending, the arbiter deasserts HOLD and the MPU regains access to the PCI bus.

| Priority | Condition/Event | Next Bus Master |
|---|---|---|
| Highest | PPU is current master and maintains request | PPU |
|  | LOCK is active | Current bus master |
|  | System management interrupt | MPU |
|  | Super agent request | Super agent |
|  | Multiple requests | Fair rotation |
| Lowest | No request | MPU |

A PCI master may be designated as a super agent, for example, a PCI device that requires extremely low latency. One device in the system is assigned super agent status. Bits 7–5 of the PCI Arbiter Control register are used to select which if any device is a super agent. When the arbiter detects a PCI bus request from a super agent, that device will be granted the PCI bus when the current master completes its access and the bus becomes available. A super agent's request is serviced with higher priority over other devices in the fair rotation scheme. FIG. 41 shows an example of a super agent device assigned to REQ1/GNT1.

PCI Master Time-Out is now described. An external PCI master will be considered inoperable if the following conditions occur:

A PCI master has issued a request (REQx).

The PCI arbiter has issued a grant (GNTX) to the master.

The PCT bus remains idle (FRAME and IRDY deasserted) for 16 PCI clocks.

Once a PCI master is determined to be inoperable, its grant is removed and its request will be permanently masked by the arbiter. This mechanism insures that the MPU is able to regain access to the PCI bus. PCI master time-out does not apply to the PPU as a master or the MPU.

The PPU's PCI/fast-AT block 902 generates the fast-AT bus clock, SYSCLK, using a dynamic SYSCLK mechanism which, among other things, advantageously provides better throughput for IDE drives. Accesses to the IDE drive may operate at either a "fast" or a "slow" SYSCLK rate. Similarly, non-IDE accesses may be either fast or slow.

The PCI/fast-AT block 902 of FIGS. 11 and 14 generates SYSCLK as a divide of PCLK by a clock divider 1201. Depending on three register bits in PPU PCI Configuration register 1222 space and the type of transaction on the fast-AT bus, SYSCLK is generated by frequency division as PCLK/2, PCLK/3 or PCLK/4. The fast-AT bus SYSCLK is considered to be either fast or slow. When SYSCLK is running fast, it is generated as PCLK/2. When SYSCLK is running slow, it is either PCLK/3 or PCLK/4, depending on the PCI bus PCLK speed.

The PPU's PCI Configuration Register Space register (PCICTRL) provides three bits to control dynamic SYSCLK generation. These bits, described below, are functionally related as shown in the next table.

Bit PCLK33MHZ: Indicates whether or not PCLK is at 33 MHz. If this bit is active (a one), PCLK is considered 33 MHz. If this bit is inactive (a zero), PCLK is considered 25 MHz. Note that this bit affects only how SYSCLK is generated from PCLK; it has no effect on PCLK itself.

Bit IDEfast: Indicates whether or not fast-AT bus accesses to the IDE drive should operate at a fast SYSCLK rate. When set to one, SYSCLK runs at a fast rate for IDE accesses. When set to zero, SYSCLK runs at a slow SYSCLK rate for IDE accesses. IDE accesses are defined as accesses to I/o space address 1F0h to 1F7h and 3F6h to 3F7h.

Bit XDfast: Indicates whether or not fast-AT bus accesses, which are not to the IDE drive, should operate at a fast SYSCLK rate. When set to one, SYSCLK runs at a fast rate for non-IDE accesses. When set to zero, SYSCLK runs at a slow SYSCLK rate for non-IDE accesses.

Dynamic SYSCLK Truth Table

|  |  |  | Divider | |
|---|---|---|---|---|
| PCLK33MHZ | IDEFAST | XDFAST | For IDE Accesses | for Non-IDE Accesses |
| 1 | 1 | 1 | 2 | 2 |
| 1 | 1 | 0 | 2 | 4 |
| 1 | 0 | 1 | 4 | 2 |
| 1 | 0 | 0 | 4 | 4 |
| 0 | 1 | 1 | 2 | 2 |
| 0 | 1 | 0 | 2 | 3 |
| 0 | 0 | 1 | 3 | 2 |
| 0 | 0 | 0 | 3 | 3 |

The Peripheral Controller module 912 is an implementation of some peripherals which would otherwise require implementation on a system board. A peripheral layer therein consists of peripheral blocks that provide PC-AT-compatible functions. A control layer therein consists of two subsystems, a decode subsystem and a clock and wait state control subsystem. The decode subsystem enables the peripheral subsystems and controls the data bus buffers. The clock and wait state control subsystem handles DMA wait state generation and the I/O channel ready (IOCHRDY) line.

The peripheral layer consists of the DMA function, memory mapper, interrupt controller, counter/timer, and RTC. The two 8237-compatible DMA controllers 910 have four channels each, allowing a total of seven DMA channels: four 8-bit channels and three 16-bit channels. An eighth channel, which is the first 16-bit channel, is used for cascading as shown in FIG. 15. The controllers 1310 and 1312 are named DMA1 and DMA2, respectively. A '74LS612 page register (DMA-PAGE) is part of the DMA subsystem which supplements the DMA and, when required, drives the upper address lines.

The 8259A-compatible interrupt controllers 914 provide 16 channels of interrupts, which are divided into two cascaded controllers, INTC1 and INTC2 of FIG. 43, each with eight inputs. See FIGS. 11, 38, 43 and 44. Of these channels, 13 can be defined by the user for specific system functions while the other three are internally connected to other devices.

The 8254-compatible counter/timer (CTC) block 916 has three independent counters. An independent clock drives these counters. Counter 0 may be used as a system multi-level interrupt for timekeeping and task switching. Its output is connected to interrupt 0 of INTC1. Square wave or pulse generation can be programmed at counter 1. Counter 2 has a gate input for controlling thereof, and can function as an internal counter, a timer, or a gated rate/pulse generator.

The MC146818-compatible RTC block 918 maintains the time and date and has 114 bytes of user-accessible RAM.

When the system power is off, an external battery may be used to keep the clock/calendar information and RAM active.

Turning to the control layer, the decode, the clock, and wait state control blocks are described next.

The decode subsystem deals with all the registers on board the 82206 compatible portion, and the maintenance of I/O decode compatibility with the PC-AT. This task is advantageously performed by multiple levels of decoding. The decode truth table is shown below.

All clock and wait state control is accomplished through the configuration register. Writing to the configuration register, at location 023h, allows the user to control the following functions: DMA command width, CPU read and write cycle lengths, and the DMA clock rate. To write to or read from the configuration register, the user writes a 01h to location 022h and then writes to or reads location 023h.

Decode Truth Table

| Address Range (hex) | Device Selected |
|---|---|
| 000–00F | DMA1 |
| 020–021 | INTC1 |
| 022–023 | CONFIG |
| 040–043 | CTC |
| 070–071 | RTC |
| 080–08F | DMA PAGE |
| 0A0–0A1 | INTC2 |
| 0C0–0DF | DMA2 |
| 480–48F | DMA HIGH PAGE |
| 4D0–4D1 | IRQ Edge/Level Control Register |

In FIG. 15, the DMA subsystem consists of two 8237-compatible controllers, DMA1 1310 and DMA2 1312, cascaded together via channel 0 on DMA2. DMA1 channels 0 and 1 are dedicated to external 8-bit audio devices via request pins AUDDRQ0 and AUDDRQ1, and acknowledge pins AUDDACK0 and AUDDACK1. DMA1 channel 2 and channel 3 are dedicated to the PPU floppy disk controller and the PPU ECP parallel port, respectively. DMA2 channels 1, 2, and 3 are available for other peripherals. The DMA channel allocation is shown in the following table:

| Controller | Data Width | Channel | PC-AT Channel | Peripheral |
|---|---|---|---|---|
| DMA1 | 8 Bit | 0 | 0 | Audio 0 |
| DMA1 | 8 Bit | 1 | 1 | Audio 1 |
| DMA1 | 8 Bit | 2 | 2 | Floppy |
| DMA1 | 8 Bit | 3 | 3 | ECP |
| DMA2 | 16 Bit | 1 | 4 | Unused |
| DMA2 | 16 Bit | 2 | 5 | Unused |
| DMA2 | 16 Bit | 3 | 6 | Unused |

During a DMA cycle, the PPU becomes the PCI bus master and transfers data to and from system memory by performing PCI memory read and write cycles. The PPU does not perform DMA data transfers between other PCI-connected I/O devices and system memory in this system embodiment.

Initially, DMA operations and control begins with the basic architecture. Unless otherwise noted, the functionality described here applies to both DMA1 and DMA2. The following paragraphs list several operating conditions and transfer modes to address areas:

Three operating Conditions:
  Idle
  Program
  Active

Three Transfer Modes
  Single transfer mode
  Block transfer mode
  Demand transfer mode Three Transfer Types
  Read transfer (memory to I/O)
  Write transfer (I/C to memory)
  Verify transfer The following features are important to DMA operating conditions:

Autoinitialization eliminates the need for reprogramming the operating parameters.

Priority determines the servicing of DMA requests.

Address generation determines how DMA addresses are generated.

Compressed timing provides a way to operate with the fewest number of DMA clock cycles.

These conditions (transfer modes, transfer types, and features) are managed under the control and use of ten register types and five special device commands. Some of the registers are available for each channel, while others are more global to the whole DMA subsystem. These registers are described in tables later hereinbelow, and they are:

Current address register

Current word count register

Base address register

Base word count register

Command register

Mode register

Request register

Request mask register

Status register

Temporary register

The special device commands generally affect the contents of one or more of these registers or the subsystem status. These five commands are:

Clear byte pointer flip-flop

Set byte pointer flip-flop

Master clear

Clear request mask register

Clear mode register counter

These commands appear in the discussions on the various operating modes and conditions. Their specific bit assignments, where applicable, are discussed later herein. Any special commands are described as part of the program condition.

Under normal operation, the DMA controller 910 operates in one of three conditions: idle, program, or active. During idle, the DMA controller executes a single, one-state cycle. The controller remains idle by default until the device is initialized, and either the CPU (e.g. MPU 102) attempts access to one of the ten internal registers or a DMA request is active.

When the DMA subsystem receives a DMA request, it becomes active and issues a bus request to the arbiter 906 block. The arbiter then asserts HOLD to the CPU, which responds by completing the current cycle and asserting HLDA. This allows the arbiter 906 to return bus grant to the DMA subsystem and the PPU becomes the new bus master. The DMA controller generates memory addresses and control signals that are converted by the PCI to Fast-AT bridge

902 into PCI memory accesses. The controller can perform DMA to the FDC, the ECP parallel port, or to audio devices 1 or 2. Transfers involving these I/O devices are completed in a single PCI cycle.

During Idle, an on-chip state machine in DMA control 910 samples DMA DREQ Request 1 and 2 inputs every clock cycle. The DMA subsystem also monitors HLDA and PCI cycle addresses to determine if the CPU is trying to access an internal register, which would cause entry into the program condition.

As to the Program Condition, when the CPU is attempting to access the on-chip registers, the program condition is entered and lasts until the CPU has completed any programming changes. The device operating parameters may be altered during the program condition.

The CPU can access the internal registers of DMA1 and DMA2 by reading and writing I/O addresses 000h to 00Fh and 0C0h to 0DEh. The address assignments are tabulated next.

DMA Controller Address Assignments

| Address (hex) | | | | Byte Pointer | Register Function | | | |
|---|---|---|---|---|---|---|---|---|
| DMA1 | DMA2 | Read | Write | Flip-Flop | Operation | Channel | Object | Byte |
| 000 | 0C0 | 0 | 1 | 0 | Read | 0 | Current address | Low |
|  |  | 0 | 1 | 1 | Read | 0 | Current address | High |
|  |  | 1 | 0 | 0 | Write | 0 | Base and current address | Low |
|  |  | 1 | 0 | 1 | Write | 0 | Base and current address | High |
| 001 | 0C2 | 0 | 1 | 0 | Read | 0 | Current word count | Low |
|  |  | 0 | 1 | 1 | Read | 0 | Current word count | High |
|  |  | 1 | 0 | 0 | Write | 0 | Base and current word count | Low |
|  |  | 1 | 0 | 1 | Write | 0 | Base and current word count | High |
| 002 | 0C4 | 0 | 1 | 0 | Read | 1 | Current address | Low |
|  |  | 0 | 1 | 1 | Read | 1 | Current address | High |
|  |  | 1 | 0 | 0 | Write | 1 | Base and current address | Low |
|  |  | 1 | 0 | 1 | Write | 1 | Base and current address | High |
| 003 | 0C6 | 0 | 1 | 0 | Read | 1 | Current word count | Low |
|  |  | 0 | 1 | 1 | Read | 1 | Current word count | High |
|  |  | 1 | 0 | 0 | Write | 1 | Base and current word count | Low |
|  |  | 1 | 0 | 1 | Write | 1 | Base and current word count | High |
| 004 | 0C8 | 0 | 1 | 0 | Read | 2 | Current address | Low |
|  |  | 0 | 1 | 1 | Read | 2 | Current address | High |
|  |  | 1 | 0 | 0 | Write | 2 | Base and current address | Low |
|  |  | 1 | 0 | 1 | Write | 2 | Base and current address | High |
| 005 | 0CA | 0 | 1 | 0 | Read | 2 | Current word count | Low |
|  |  | 0 | 1 | 1 | Read | 2 | Current word count | High |
|  |  | 1 | 0 | 0 | Write | 2 | Base and current word count | Low |
|  |  | 1 | 0 | 1 | Write | 2 | Base and current word count | High |
| 006 | 0CC | 0 | 1 | 0 | Read | 3 | Current address | Low |
|  |  | 0 | 1 | 1 | Read | 3 | Current address | High |
|  |  | 1 | 0 | 0 | Write | 3 | Base and current address | Low |
|  |  | 1 | 0 | 1 | Write | 3 | Base and current address | High |
| 007 | 0CE | 0 | 1 | 0 | Read | 3 | Current word count | Low |
|  |  | 0 | 1 | 1 | Read | 3 | Current word count | High |
|  |  | 1 | 0 | 0 | Write | 3 | Base and current word count | Low |
|  |  | 1 | 0 | 1 | Write | 3 | Base and current word count | High |
| 008 | 0D0 | 0 | 1 | X | Read | — | Status register | — |
|  |  | 1 | 0 | X | Write | — | Command register | — |
| 009 | 0D2 | 0 | 1 | X | Read | — | DMA request register | — |
|  |  | 1 | 0 | X | Write | — | DMA request register | — |
| 00A | 0D4 | 0 | 1 | X | Read | — | Command register | — |
|  |  | 1 | 0 | X | Write | — | Single DMA request mask register bit | — |
| 00B | 0D6 | 0 | 1 | X | Read | — | Mode register | — |
|  |  | 1 | 0 | X | Write | — | Mode register | — |
| 00C | 0D8 | 0 | 1 | X | Set | — | Byte pointer flip-flop | — |
|  |  | 1 | 0 | X | Clear | — | Byte pointer flip-flop | — |
| 00D | 0DA | 0 | 1 | X | Read | — | Temporary register | — |
|  |  | 1 | 0 | X | Master clear |  |  |  |
| 00E | 0DC | 0 | 1 | X | Clear | — | Mode register counter | — |
|  |  | 1 | 0 | X | Clear | — | All DMA request mask register bits | — |

-continued

DMA Controller Address Assignments

| Address (hex) | | Byte Pointer | | Register Function | | | |
|---|---|---|---|---|---|---|---|
| DMA1 | DMA2 | Read | Write | Flip-Flop | Operation | Channel Object | Byte |
| 00F | 0DE | 0 | 1 | X | Read | — All DMA request mask register bits | — |
|  |  | 1 | 0 | X | Write | — All DMA request mask register bits | — |

Addressing the count or address registers is augmented by the byte pointer flip-flop, due to the large number of internal registers in the DMA subsystem. This bit toggles each time a read or write is made to one of those registers, thereby selecting between the high or low byte. The flip-flop is cleared by a hardware RESET or the master clear command and may be cleared or set by the CPU issuing the proper command.

The following chart describes the special device commands supported by logic circuitry responsive thereto in DMA control 910 of FIG. 15.

| Command | Description |
|---|---|
| Clear byte pointer flip-flop | Normally used prior to a read or write. Sets the byte pointer flip-flop to point to the low byte of the address or word count register and ensures that the bytes will be read in the proper sequence. |
| Set byte pointer flip-flop | Adjusts the byte pointer flip-flop to point at the high byte of an address or word count register. |
| Master clear | Has the same effect as a hardware RESET. The DMA controller is put the idle condition by this command. The command register, mode register counter, request register, status register, temporary register, and the byte pointer flip-flop are all cleared, while the request mask register is set. |
| Clear request mask register | Clears the mask bits in the register, enabling the four DMA channels on a controller to accept requests. |
| Clear mode register counter | Clears an additional counter that is used to allow access to the four mode registers while using only one address. After clearing the counter, all four mode registers can be read with successive reads to the read mode register address. Channel 0 is read prior to proceeding to channel 3. |

These five commands simplify the programming task on the device. The commands are executed as a result of asserting the specified address and either IORD or IOWR. The data lines are advantageously ignored by block 912 whenever an IOWR-activated command is issued: therefore, any data returned on an IORD-activated command will be invalid. The next section details address and signal conditions to which the DMA circuitry is responsive to perform an internal register function or issue a special command. Registers that are available for each channel and those that are controller-specific are also indicated.

Turning to the Active Condition, the DMA subsystem enters active condition and begins a DMA transfer cycle when either: a DMA request occurs on an unmasked channel when the device is not in program condition, or a software request occurs.

An example of a preferred process or method of operation during the active condition for a read transfer cycle is shown below:

1) DMA control block 910 receives DMA request DREQ1 or 2 from a peripheral 1310 or 1312.
2) DMA control block 910 issues a bus request HREQ, REQ2# to arbiter 906.
3) PCI arbiter 906 asserts hold request, HOLD, to the CPU>
4) CPU responds with hold acknowledge, HLDA.
5) Arbiter 906 returns bus grant GNT2# to the DMA control 910.
6) DMA subsystem returns DMA acknowledge DACK1 or 2 to the peripheral 1310 or 1312.
7) DMA subsystem executes single or multiple DMA transfers to or from memory 106 via PCI bus 104.
8) DMA subsystem completes transfer and deasserts hold request HREQ.
9) Arbiter 906 releases hold request HOLD to CPU.
10) CPU deasserts hold acknowledge, HLDA.
11) DMA subsystem deasserts DMA acknowledge DACK1 or 2 to the peripheral 1310 or 1312.

In the DMA Transfer Modes, each DMA channel can be configured to operate in single, block, or demand transfer mode.

In the Single-transfer mode, the DMA controller 910 performs only a single transfer before deactivating its bus request to the PPU Arbiter 906. Some time later, the arbiter responds by deactivating bus grant GNT2 to the DMA controller. At this point, if the peripheral is still asserting DMA request, the DMA controller 910 will once again request control of the PCI bus from the arbiter 906.

In block-transfer mode, the DMA controller 910 performs a sequence of DMA cycles until the word count reaches FFFFh. When this occurs, the DMA controller 910 provides terminal count indication to the DMA peripheral. The DMA request can be deasserted as soon as the first cycle has been completed. In this mode, the arbiter grants control of the PCI bus to the DMA subsystem at the start of the transfer and only hands control back to the host when the sequence is completed.

In demand-transfer mode, the DMA controller 910 performs a sequence of DMA cycles until either the word count reaches FFFFh or DMA request is deasserted. If the word count expires first, the controller provides terminal count indication to the DMA peripheral. In this mode, the arbiter grants control of the PCI bus to the DMA subsystem at the start of the transfer and only hands control back to the host when the sequence is completed.

Turning to DMA transfer types, the three types of transfer provided by the DMA subsystem are read, write, and verify. Read transfer reads data from system memory and writes it to an I/O device either inside the PPU or connected to it. Write transfer performs the reverse operation, reading from the I/O device and writing to system memory. Verify transfers supply DMA acknowledge to the requesting I/O device, but no data transfers occur. The PPU takes control of the PCI bus by asserting HOLD, but does not generate any PCI memory cycles.

During autoinitialization, each of the four DMA channels reinitializes when the terminal count on a given channel has been reached. Autoinitialization is enabled by a bit in the Mode Register. Originally written by the CPU, the base address and word count registers are reloaded into the current address and word count registers. The base registers can only be changed by the CPU and remain unchanged during DMA active cycles. When the request mask bit reaches terminal count, it will not be set if the channel has been programmed for autoinitialization. DMA can operate without CPU intervention.

DMA Request DREQ Priority is determined in one of two ways. The first method is fixed priority, where channel 0 is the highest priority, and the remaining channels decrease in order down to channel 3, the lowest priority. The second method is rotating priority, where the channels maintain the 0 through 3 order used in fixed priority, but the actual assignment of priority changes. On the next arbitration, the lowest priority goes to the most recently serviced channel. An example of this method is shown below.

| Priority | First Arbitration | Second Arbitration | Third Arbitration |
|---|---|---|---|
| Highest | Channel 0 | Channel 3 | Channel 1* grant |
|  | Channel 1 | Channel 0* grant* | Channel 2 |
|  | Channel 2* grant* | Channel 1 | Channel 3 |
| Lowest | Channel 3 | Channel 2 | Channel 0 |

*Indicates requested channels

The DMA subsystem issues a bus request to the arbiter in cases where multiple requests occur simultaneously although priority arbitration remains unresolved until hold acknowledge, HOLDA, is received from the CPU.

In Address Generation, The DMA subsystem generates 32-bit memory addresses for the PCI memory cycle generated by the PPU during DMA. For 8-bit DMA cycles, DMA1 generates A15-0 directly; for 16-bit DMA cycles, DMA2 generates A16-1 with A0 equal to zero (aligned addressing). The higher order address bits come from the low page and high page registers that are associated with each DMA channel: For 8-bit DMA cycles, A23-16 come from the low page register and A31-24 come from the high page register. For 16-bit DMA cycles, A23-17 come from the low page register and A31-24 come from the high page register. The low and high page registers for each channel are accessed by the host at the I/O locations shown as DMA Page Register Locations:

| DMA Channel | Low Page Register | High Page Register |
|---|---|---|
| 0 DMA1 channel 0 | 0087 | 0487 |
| 1 DMA1 channel 1 | 0083 | 0483 |
| 2 DMA1 channel 2 | 0081 | 0481 |
| 3 DMA1 channel 3 | 0082 | 0482 |
| 5 DMA2 channel 1 | 008B | 048B |
| 6 DMA2 channel 2 | 0089 | 0489 |
| 7 DMA2 channel 3 | 008A | 048A |

All page registers can be written to and read by the CPU and are cleared by device reset.

This Register Descriptions section details the register types used by the DMA subsystem:

Current Address Register (CAR)

The address used by each channel during transfer is stored in this 16-bit current address register. The channels can be programmed so that this register automatically increments or decrements after each transfer. Also, channel 0 may be set up so that the CAR register contents are fixed with the address hold bit in the command register. Read or write access of this register is available to the CPU and is accomplished through consecutive byte accesses. If autoinitialization is enabled, the register is reloaded when the current word count register reaches terminal count.

Current Word Count Register

This register contains the word count to be transferred, that is, the number of transfers to perform. One additional transfer is performed, which decrements this register from 0 to the terminal count of FFFFh. When this occurs, a transfer count will be generated, and the DMA operation on that channel is suspended and further requests are masked unless autoinitialization is enabled.

Base Address and Base Word Count Registers

These two write-only registers preserve initial values of the current address and current word count registers, respectively. They provide reload data when autoinitialization is enabled on a channel.

Command Register

The overall operation of the DMA subsystem is controlled by this register pair for units DMA1 and 2. It is cleared by a RESET or master clear command, and may be read or written by the CPU. Base Address (hex): DMA1=008, DMA2=0D0

| Bit | Name | Access | Description |
|---|---|---|---|
| 7 | DAK | R/W | Sets the active level of the DACK signal. When this bit is a 1, DACK is active high. |
| 6 | DREQ | R/W | Sets the active level of the DREQ signal. When this bit is a 1, DREQ is active low. |
| 5 | EW | R/W | Controls exterior write. When this bit is a 1, write commands are asserted one DMA cycle earlier. When EW is enabled, read and write start in state S2. |
| 4 | RP | R/W | Rotating priority is enabled when this bit is 1. Fixed priority is the default. |
| 3 | CT | R/W | Compressed timing is enabled when this bit is 1. Normal timing is the default. |
| 2 | CD | R/W | Controller disable. When set, this bit prevents DMA cycles from occurring when the CPU needs to reprogram. |
| 1 | AH | R/W | When this bit is a 1, address hold on channel 0 is enabled when performing |

| Bit | Name | Access | Description |
|---|---|---|---|
| 0 | M—M | R/W | memory-to-memory transfers. When this bit is a 1, memory-to-memory transfers are enabled on channel 0 and 1. |

Channel Select Bits

In several of the remaining registers, bits 1 and 0 determine channel select. The conventions shown next are used in naming those bits and their values to choose a specific channel.

| CS1 (Bit 1) | CS2 (Bit 0) | Channel Select Bits for A Given Register |
|---|---|---|
| 0 | 0 | Channel 0 |
| 0 | 1 | Channel 1 |
| 1 | 0 | Channel 2 |
| 1 | 1 | Channel 3 |

Mode Register

Each channel has its own mode register to select the operator modes, transfer types, etc., as described below. All four mode registers reside at the same I/O address, and bits 0 and 1 determine which channel's register is to be written. Consecutive reads to the I/O location will read each of the registers. Since bits 0 and 1 will be 1 during these reads, the clear mode register counter command allows the CPU to restart the reads at the first channel's register.

| Base Address (hex): DMA1 = 00B, DMA2 = 0D6 | | | |
|---|---|---|---|
| Bit | Name | Access | Description |
| 7:6 | M1–0 | R/W | Set the Transfer mode for each channel as shown:<br>M1 M0 Mode<br>0  0  Demand transfer<br>0  1  Single cycle transfer<br>1  0  Block transfer<br>1  1  Cascade |
| 5 | DEC | R/W | A 1 here decrements the address after each transfer. Determines the direction of the address counter. |
| 4 | A1 | R/W | A 1 here enables autoinitialization |
| 3–2 | TT1–0 | R/W | Control transfer type as shown:<br>TT1 TT0 Type<br>0  0  Verify transfer<br>0  1  Write transfer<br>1  0  Read transfer<br>1  1  Reserved |
| 1–0 | CS1–0 | R/W | Channel select bits |

Request Register

The request register is a 4-bit register that generates software requests and can be independently set or reset by the CPU. DMA service may be requested externally or under software control. All four bits are read in one operation, appear in the lower four bits of the byte, and are cleared by RESET. Bits 4–7 are read as 1s. The request mask does not affect software-generated requests.

| Base Address (hex): DMA1 = 009, DMA2 = 0D2 | | | |
|---|---|---|---|
| Bit | Name | Access | Description |
| 7–3 | — | R | Bits 7–4 read as 1. |
| 2 | RB | R/W | Request bit. Writing a 1 to this bit indicates a request is required. |
| 1–0 | CS1–0 | R/W | Channel select bits. |
| Base Address (hex): DMA1 = 009, DMA2 = 0D2 | | | |
| 7–4 | — | R | These bits read as 1. |
| 3–0 | RC3–0 | R/W | Each bit corresponds to the channel number, and the state of the request bit for a channel is returned in the appropriate bit of the request register during a read. |

Request Mask Register

The request mask register is a four-bit register that inhibits external DMA requests from generating transfer cycles, and may be programmed in two different ways. Each channel can be independently masked by writing to the write-single-mask bit address. The data format for this operation is shown below. Base Address (hex): DMA1=00A. DMA2=0D4

| Bit | Name | Access | Description |
|---|---|---|---|
| 7–3 | — | R/W | Reserved |
| 2 | MB | R/W | A 1 in this bit sets or resets the request mask bit for the channel specified in CS1–0 inhibiting external requests. |
| 1–0 | CS1–0 | R/W | Channel select bits. |

Using the other programming method, the four mask bits can be written in one operation by writing to the write-all-mask-bits address. The format for write all/read all is: Base Address (hex): DMA1=00E/00F, DMA2=0DC/0DE

| Bit | Name | Access | Description |
|---|---|---|---|
| 7–4 | — | R/W | Reserved |
| 3–0 | MB3–0 | R/W | Mask bits for channel 3–0. |

RESET or master clear command will set all four mask bits. When terminal count has been reached, if autoinitialization is disabled, individual channel mask bits will be set. If a clear mask register operation is performed, the register is cleared and all four channels are enabled.

Status Register

The status register is read-only determining the status of all four channels including terminal count, and whether or not an external service request is pending. RESET, master clear, or a status read will clear bits 0–3 of this register. RESET, Master Clear, or the pending request being deasserted will clear bits 4–7, which are not affected by the state of the mask register bits. The status register format is shown below. The channel number corresponds to the numbers in the bit name. Base Address (hex): DMA1=008, DMA2=0D0

|   | Bit |   |   |   |   |   |   |   |
|---|---|---|---|---|---|---|---|---|
|   | 7 | 6 | 5 | 4 | 3 | 2 | 1 | 0 |
| Name | DREQ3 | DREQ2 | DREQ1 | DREQ0 | TC3 | TC2 | TC1 | TC0 |

The programmable interrupt controller 914 operates as an interrupt manager for the entire system 100. The controller 914 accepts requests from peripherals, issues interrupt requests to the CPU, resolves interrupt priorities, and provides vectors for the CPU to determine which interrupt routines to execute. In addition, to restructure the interrupt subsystem, priority assignment modes are available that can be reconfigured at any time during system operations. As FIG. 43 shows, the interrupt controller has two blocks, INTC1 and INTC2, interconnected and programmed to run in cascade mode for 16 channels. INTC1 is configured for master operation in cascade mode and is located at I/O addresses 020h–021h. INTC2 is a slave located at I/O addresses 0A0h–0A1h. The INTC2 interrupt request output signal is internally connected to the INTC1 interrupt request input channel 2.

The interrupt controller supports 16 interrupt inputs, IRQ0 to IRQ15. Organization of the 16 interrupt channels are illustrated in FIG. 43. of the 16 interrupts, the following channels are preassigned:

IRQ0 is dedicated to the timer/counter.
IRQ1 is dedicated to the external keyboard controller.
IRQ2 is used to cascade INTC2 into INTC1.
IRQ6 is dedicated to the floppy disk controller.
IRQ8 is dedicated to the real time clock.
IRQ13 is used for FPU error on input FPUERR.

The remaining 10 channels can be program controlled to serve any of several different interrupt sources:
Parallel port
Serial port
Mouse
Hard disk
PCMCIA controller 112

Three registers control interrupt routing:
PCI Interrupt Mapping Register
Interrupt Enable Register
PCU Interrupt Shadow Register These registers are located in PCI configuration register 1222 space and can be programmed to connect particular interrupt sources to specific interrupt controller channels.

The PCI Interrupt Mapping Register controls how PCI interrupts from bus 104 on PPU 110 pins INTA and INTB are routed to the internal interrupt request lines (IRQs) of PPU 110.

| Bit | Name | Access | Description |
|---|---|---|---|
| 7–4 | PINT 7–4 | R/W | Map INTB:<br>Connect |

| | | | | |
|---|---|---|---|---|
| PINT7 | PINT6 | PINT5 | PINT4 | INTB To: |
| 0 | 0 | 0 | 0 | IRQ9 |
| 0 | 0 | 0 | 1 | IRQ10 |
| 0 | 0 | 1 | 0 | IRQ11 |
| 0 | 0 | 1 | 1 | IRQ15 |
| All other states: disconnect | | | | |

| Bit | Name | Access | Description |
|---|---|---|---|
| 3–0 | PINT 3–0 | R/W | Map INTA: |

| | | | | Connect |
|---|---|---|---|---|
| PINT3 | PINT2 | PINT1 | PINT0 | INTA To: |
| 0 | 0 | 0 | 0 | IRQ9 |
| 0 | 0 | 0 | 1 | IRQ10 |
| 0 | 0 | 1 | 0 | IRQ11 |
| 0 | 0 | 1 | 1 | IRQ15 |
| All other states: disconnect | | | | |

The Interrupt Enable Register controls how the internal lines for serial port interrupt SINT and, parallel port interrupt PINT and PPU pins for mouse interrupt (MSIRQ or MSINT), and IDE interrupt (IDEIRQ or HDCINT) are routed to the internal IRQs of PPU 110.

Base Address (hex): 52

|   | Bit |   |   |   |   |   |   |   |
|---|---|---|---|---|---|---|---|---|
|   | 7 | 6 | 5 | 4 | 3 | 2 | 1 | 0 |
| Name | — | SINT04 | SINT03 | PINT07 | PINT05 | MSINT12 | MSINT13 | HDCINT14 |
| Default | 0 | 1 | 0 | 1 | 0 | 1 | 0 | 1 |

| Bit | Name | Access | Description |
|---|---|---|---|
| 7 | — | R/W | Reserved |
| 6 | SINT04 | R/W | SINT0 connect to IRQ4<br>0 = Disable<br>1 = Enable |
| 5 | SINT03 | R/W | SINT0 connect to IRQ3<br>0 = Disable<br>1 = Enable |
| 4 | PINT07 | R/W | PINT0 connect to IRQ7<br>0 = Disable<br>1 = Enable |
| 3 | PINT05 | R/W | PINT0 connect to IRQ5<br>0 = Disable<br>1 = Enable |
| 2 | MSINT12 | R/W | MSINT connect to IRQ12<br>0 = Disable<br>1 = Enable |
| 1 | MSINT13 | R/W | MSINT connect to IRQ13<br>0 = Disable<br>1 = Enable |
| 0 | HDCINT14 | R/W | HDCINT connect to IRQ14<br>0 = Disable<br>1 = Enable |

Note: The following assignments are not programmable INT0: Timer, INT1: KBD, INT2: Cascade, INT6: Floppy, INT8: RTC, INT13: FPU.

The PCU Interrupt Shadow Register controls how the PCMCIA interrupts CRDAIORQ, CRDBIORQ, and CRD- SRVRQ are routed to the internal PC-AT IRQs. The register shadows other registers in the PCU PCMCIA controller. When the CPU writes to those locations, the PPU interface 902 updates the contents of this register.

Base Address (hex): 50–51

| Bit | Name | Access | Description |
|---|---|---|---|
| 15–12 | CSINT3–0 | R/W | Bit 7–4 of PCU register 45h or 05h (ExCA offset) |
| 11–8 | — | R | Reserved |
| 7–4 | CBINT3–0 | R/W | Bit 3–0 of PCU register 43h (ExCA offset) |
| 3–0 | CAINT3–0 | R/W | Bit 3–0 of PCU register 03h (ExCa offset) |

Edge/Level Interrupt Channel

The PPU implements EISA-compatible edge/level interrupt channel control registers at I/O addresses 4D0h and 4D1h. The registers provide one bit for each IRQ to determine if the interrupt is edge sensitive or level sensitive. Both registers are cleared by reset for default edge-sensitive operation. Setting any bit configures the associated interrupt as level sensitive. These controllers recognize active-low levels on these lines as interrupt requests. The low level must be maintained until the PCI interrupt acknowledge cycle and must be negated before the interrupt service routine issues the EOI command. IRQ0, IRQ1, IRQ2, IRQ8, and IRQ13 can be hardwired for edge-sensitive mode as in the preferred embodiment and be unchangeable, or left reprogrammable.

The register bit for IRQ6 is not set by software because this channel is dedicated to the floppy disk controller, which outputs positive edge interrupts.

Edge/Level Register 1
Base Address (hex): 4D0

| Bit | Name | Access | Description |
|---|---|---|---|
| 7 | EL7 | R/W | IRQ7 type:<br>0 = Edge<br>1 = Level |
| 6 | — | R | Reserved |
| 5 | EL5 | R/W | IRQ5 type:<br>0 = Edge<br>1 = Level |
| 4 | EL4 | R/W | IRQ4 type:<br>0 = Edge<br>1 = Level |
| 3 | EL3 | R/W | IRQ3 type:<br>0 = Edge<br>1 = Level |
| 2–0 | — | R | Reserved |

Edge Level Register 1
Base Address (hex): 4D1

| | Bit | | | | | | | |
|---|---|---|---|---|---|---|---|---|
| | 7 | 6 | 5 | 4 | 3 | 2 | 1 | 0 |
| Name | EL15 | EL14 | — | EL12 | EL11 | EL10 | EL9 | — |
| Default | 1 | 1 | 1 | 1 | 1 | 1 | 1 | 1 |

| Bit | Name | Access | Description |
|---|---|---|---|
| 7 | EL15 | R/W | IRQ15 type:<br>0 = Edge<br>1 = Level |
| 6 | EL14 | R/W | IRQ14 type:<br>0 = Edge<br>1 = Level |
| 5 | — | R | Reserved |
| 4 | EL12 | R/W | IRQ12 type. This bit is dedicated to the FDC.<br>0 = Edge<br>1 = Reserved |
| 3 | EL11 | R/W | IRQ11 type:<br>0 = Edge<br>1 = Level |
| 2 | EL10 | R/W | IRQ10 type:<br>0 = Edge<br>1 = Level |
| 1 | EL9 | R/W | IRQ9 type:<br>0 = Edge<br>1 = Level |
| 0 | — | R | Reserved |

In FIG. 44, the Interrupt Request register stores requests from all channels requesting service. Its bits are labeled using channel names IR7-0. Corresponding to the channel names, the in-service register bits are named IS7-0. These bits indicate which channels are currently being serviced. The Interrupt Mask register permits the CPU to disable any or all interrupt channels. The priority resolver evaluates inputs from the above three registers, issues interrupts, and latches the corresponding bits into the in-service G54 register. A master controller of FIG. 43 outputs a code to the slave device during interrupt acknowledge cycles. This output is compared in the cascade buffer/comparator with a 3-bit identification code (previously written). If the codes match, the slave controller generates an interrupt vector. The contents of the Vector register provide the CPU with the appropriate interrupt vector.

Interrupt Sequence

A complete system interrupt request and service consists of a sequence of four method steps:
1) A peripheral asserts its interrupt line, which is routed to one of the PPU IRQs. If the interrupt channel is not masked in the Interrupt Mask register (IMR), the interrupt controller sets the corresponding bit in the Interrupt Request register (IRR).
2) The Priority Resolver in the interrupt controller controller evaluates the requests and asserts CPU interrupt output INTR, if appropriate.
3) The CPU corresponds to the interrupt request by performing a PCI interrupt acknowledge cycle. The PPU PCI interface decodes the bus command and sends two interrupt acknowledge pulses to the interrupt controller.
4) The interrupt controller sets the relevant bit in the Interrupt Service register In-Service (ISR) and clears the IRR bit. The controller outputs an 8-bit vector, which is returned to the CPU on AD7-0 during the data phase of the PCI interrupt acknowledge cycle. If the automatic end-of-interrupt (EOI) mode is selected, the ISR bit is cleared. Otherwise, the interrupt service routine must issue an EOI command before terminating.

End-of-Interrupt (EOI) Operation

End of interrupt (EOI) causes an ISR bit to be reset. A specific CPU EOI command, or the priority resolver clearing the highest-priority ISR bit (nonspecific EOI), can determine which ISR bit should be reset. If the interrupt controller is operating in a mode that does not alter the fully nested structure, it can determine the correct ISR bit to reset. A specific EOI must be generated at the end of the interrupt service routine in cases where the fully nested structure is not maintained. A nonspecific EOI command will not clear an ISR bit that is masked in special mask mode by an IMR bit. At the end of the PCI interrupt acknowledge cycle, the interrupt controller can optionally generate an automatic end of interrupt (AEOI).

The interrupt controller accepts two types of commands:

initialization command words (ICWs)

operational command words (OCWs)

In the following discussion of these commands, the address for the INTC1 register will be listed first, followed by the address for the INTC2 register in parentheses.

Four Initialization Command Words (ICWs) (ICW1–4) are used in writing the initialization process.

ICW1 begins the process by writing the address 020h (0A0h) with a 1 on bit 4 of the data byte. The interrupt controller then performs the following method steps:

Resets the initialization command word counter to 0

Latches ICW1 into the device

Enables fixed priority mode

Assigns IR7 the highest priority

Clears the Interrupt Mask register

Sets the slave mode address to 7

Disables special mask mode

Selects IRR for status read operations

The remaining three I/O writes to address 021h (0A1h) load ICW2–ICW4.

The ICWs and OCWs are as described in TACT83000 AT Chip Set: User's Guide, Texas Instruments Inc. 1991 at pp. 2–31 through 2–37, and the entire said User's Guide is hereby incorporated herein by reference.

PPU Counter/Timer Subsystem

The PPU contains a programmable counter/timer (CTC) that is compatible with the Intel 8254. The subsystem contains three separate counters and a Control register that can be accessed at I/O addresses 040h to 043h. Counter 0 is connected to IRQ0 and generates a system timer interrupt. Counter 1 generates a refresh timing bit in the Port B register; and counter 2 generates the speaker output signal SPKROUT of FIG. 60.

Counter Description

Each CTC counter includes the following:

A control register

A status register 16-bit counting element (CE)

Two 8-bit counter input latches (CIL and CIH)

Two 8-bit counter output latches (COL and COH)

The Control register determines the counter mode, and can be programmed by writing a control word to address 043h. The Status register contains counter mode and output information, and it is read using the readback command. The input latches, CIL and CIH, hold the initial count value and are loaded using the write command. The 16-bit counting element CE is the actual synchronous down counter, and it is loaded with the value held in the counter input latches following a mode-specific event. The counter contents can read using the read command. The output latches, COL and COH, allow software to read the counter contents without disturbing counter operation by using the counter latch command.

Because the condition of the CTC control registers, counter registers, and counter outputs is undefined at powerup, each counter is suitably programmed before it is used. All CTC commands are written to I/O address 043h, and all count and status information is written to and read from separate I/O addresses for counters 0, 1, and 2. The counter 0 read/write register is at I/O address 040h, while those for counters 1 and 2 are located at 041h and 042h, respectively. A control word (a write-only location) is written to the Control register prior to writing an initial count.

Read/Write Counter Commands

The write command initializes the counter and must be followed by counter data writes to the appropriate counter read/write register. The F3 through F0 bits in the write command word specify whether the subsequent counter data byte or bytes will go to either counter MSB, LSB, or both. The read command reads the counter and must be followed by counter data reads from the appropriate counter read/write register. The read command reads the counting element directly. The read may be undefined, if the count is in the process of changing. To disable counter 2, clear Port B register bit 0 (TM2GATE) before the software issues the read command to ensure that the read data is valid. Counter 0 and counter 1 are permanently enabled, and the read command does not return valid data. During read/write counter commands, M2-0 are defined as shown in the Control register definition for bits 3–1.

Latch Counter Command

COL and COH latch the current state in the CE after the software issues a latch counter command. They remain latched until the CPU reads them, or until software reprograms the counter. Then the latches return to a transparent condition where software enables them, and can directly read their contents. Software issues latch counter commands to more than one counter before it reads the first command. However, software reads only the first command, if the commands are issued to the same counter. A readback command register returns the count value, mode, counter output state, and the counter null flag. A status byte register contains the state of OUT, the condition of the null-count flag, the initialization-command bits, the counter mode, and the counting-element format.

Counter Operation

Counters 0, 1, and 2 are all clocked at 1.193 MHz (14.31818 Mhz divided by 12). Counters 0, 1, and 2 are intended to be used according to the following guidelines:

Counter 0 generates IRQ0 and should be programmed in mode 3 to generate a square wave. Following initialization, counter 0 drives IRQ0 high and starts decrementing the count by two each during clock period. When the counter reaches zero, software reloads the initial count and drives IRQ0 low. This process repeats continuously with IRQ0 flipping each time the counter decrements to zero. This gives a square wave on IRQ0 with a period equal to the initial count value multiplied by the clock period (838 ns).

Counter 1 is used to toggle Port B register bit 4 refresh detect (REFDET) and should be programmed in mode 2. Following initialization, counter 1 drives REFDET high and starts decrementing the count by one during each clock period. When the counter reaches one, software drives REFDET low for one clock period and then reloads the initial count. This process repeats continuously with REFDET pulsed low at a period equal to the initial count value multiplied by the clock period (838 ns).

Counter 2 generates the speaker output, SPKROUT, as illustrated in FIG. 60, and is usually programmed in mode 3. SPKROUT is pulsed low with period equal to the initial count value multiplied by the clock period (838 ns). Software enables counter 2 by setting Port B register bit 0 (TM2GATE). The counter 2 output is read from Port B register bit 5 (OUT2). Software enables SPKROUT output by setting Port B register bit 1 (SPKDATA).

Real Time Clock Subsystem

The counter/timers are as described in TACT83000 AT Chip Set: User's Guide, Texas Instruments Inc. 1991 at pp. 2–42 through 2–47, except for improvements as described herein, and the entire said User's Guide is hereby incorporated herein by reference.

The real time clock (RTC) 918 of FIG. 11 has a time-of-day clock with alarm, programmable periodic interrupt, hundred-year calendar, and 114 bytes of user-accessible low-power static RAM 919. Enhancements to the RTC allow it to operate in a low power consumption (battery-powered) mode (see layout of FIG. 12) and to secure the contents of both the RAM and clock during system powerup and powerdown. The RTC registers and RAM are accessed using an index/data register pair at I/O addresses 70h and 71h. Before reading or writing a value to the data register, software must first write an 8-bit offset to the index register. The 128 addressable locations in the RTC are divided into 10 bytes. These locations contain the time, calendar and alarm data, four control and four status bytes, and 114 RAM bytes. The CPU can read all 128 bytes, write to all locations except registers C and D, bit 7 of register A, and bit 7 of the seconds byte (always 0). Programming an interrupt occurrence time into the three alarm bytes generates an interrupt at a specific time. Software can generate periodic interrupts by setting a 1 (don't care) in the high order two bits in an alarm register. For example, to generate an interrupt every hour, program a C0h into register 5. To generate an interrupt once a second, program the same value into all three alarm registers.

The 144 bytes of RAM from index register 0Eh to 7Fh can be accessed during update cycles and are general purpose. They are not affected by the RTC, and when the system is off, the device is normally battery powered. These bytes are suitably used as calibration parameters and nonvolatile storage for configuration.

Four status registers in the RTC subsystem are accessible by the CPU at all times. They are located at index addresses 0Ah-0Dh and control the operation and monitor the status of the RTC.

RTC Status Registers A–D:

Register A provides an update-in-progress flag, divider/prescaler control, and periodic interrupt control.

Register B enables the update cycle, controls the generation of interrupts, enables alarm interrupts, formats the hour and hour alarm, and provides a toggle between daylight and standard time.

Register C provides additional interrupt, alarm and updated end interrupt flag information.

Register D provides a means to check the validity of the RTC data.

During normal operation, the RTC performs an update cycle once per second. An update cycle depends on software clearing the divider bits DV2-0, and clearing the SET bit in register B. An update cycle increments the clock/calendar registers and compares them to the alarm registers. While the cycle is comparing the register, it looks for matches. If a match occurs, an alarm is sent and an interrupt is issued, if both the alarm and interrupt control bits are enabled. During an update, the lower 10 registers are unavailable to the CPU to prevent possible data corruption in the registers, or reading of incorrect data. To avoid contention problems between the CPU and the RTC, a flag in register A signals an impending update cycle. The update in progress (UIP) bit is asserted 244 ms prior to the start of the cycle and remains until the cycle has been completed. Upon completion, software clears the UIP bit and sets the update flag bit in register C. During an update cycle, CPU access is always allowed to registers A through D.

There are two methods for reading and writing time and date information to the RTC, each allowing the user to avoid contention between the CPU and RTC:

1) Read register A, determine that the state of the UIP bit is 0, and perform the read or write operation. To operate successfully, the entire read or write operation preferably takes no longer than 244 ms to complete.

2) Read register C once and continue to read this register until the update flag bit is a 1. Read or write operations can be Gcompleted until the beginning of the next cycle.

Referring to FIG. 17, IDE/XD Interface signals are a subset of the internal fast-AT bus signals which are used to connect the PPU internal peripherals of FIG. 11 to bus bridge 902. Bus 904 normally runs with either a PCLK/2, PCLK/3 of PCLK/4 bus clock. Accesses to external devices connected to the XD and IDE interfaces can be configured to run at different speeds by adjusting the speed of the internal bus clock SYSCLK. In FIG. 17, the XD-bus and IDE interface signals are split into two sections, supplied by separate Voltage rails: VCC_XD and VOC_DK. Flexibility is a resulting advantage in choosing system components, allowing the use, for example, of 3.3-V keyboard Controller and BIOS ROM (for low power), together with a 5-V IDE drive (for low cost).

An XD interface 1501 supports the following external peripherals: BIOS ROM 120 (which may be a flash EEPROM), Keyboard Controller 118, and two additional devices. Two DMA channels and a programmable chip-select, PCS0, are available to support a business audio chip such as the Analog Devices AD1848. A second programmable chip-select PCS1 is also available.

The BIOS ROM 120 is supplied with address bits 1-0, a chip-select CS# and read/write strobes. The upper 15 address lines are driven onto the PCI address/data bus 104 by the PPU 110 while it is waiting for data to be returned from the BIOS ROM. The PPU provides addresses to non-writable BIOS 120 via the PCI AD bus. When the PPU responds to a PCI I/O or memory-mapped read, it drives the address from the PCI bus back onto the PCI AD bus after it asserts DEVSEL. The address from AD31-2 during the address cycle is driven onto AD31-2 during the data phase. The system implementation may connect the address lines of an EPROM BIOS to selected AD bus lines.

In FIG. 17, the XRD and XWR signals serve as read and write strobes for both memory or I/O cycles depending on whether ROMCS# is active or not respectively.

In FIG. 11, the PPU FDC subsystem 930 integrates all logic necessary for floppy disk control. It is fully software compatible with the Intel 82077SL including programmable power management functions. All signals and buffers are provided to support either a 5.25 in (360 kB and 1.2 MB) or a 3.5 in (720 kB, 1.44 MB and 2.88 MB) floppy drive. An integrated high performance digital data separator (no external components) supports data rates up to 1 Mbit/s. A 16-byte FIFO is included in the FDC bus interface to reduce bus latency.

Status, Data, and Control Registers

The table below summarizes the FDC registers accessible by the host. FDC Register Accessibility

| | | | Bit Names | | | | | | | |
|---|---|---|---|---|---|---|---|---|---|---|
| Address | Access | Register Name | D7 | D6 | D5 | D4 | D3 | D2 | D1 | D0 |
| 3F2 | R/W | Digital Output DOR | ME3 | ME2 | ME1 | ME0 | DMAEN | NRSET | DSEL1 | DSEL0 |
| 3F3 | R/W | Tape Drive | — | — | — | — | — | — | TSEL1 | TSEL0 |
| 3F4 | R | Main Status | RQM | DIO | NDM | CB | D3B | D2B | D1B | D0B |
| 3F4 | W | Data Rate Select | SRST | POWD | DOSC | PRE2 | PRE1 | PRE0 | DRS1 | DRS0 |
| 3F5 | R/W | FIFO Data | | | | Command/Data transfer | | | | |
| 3F7 | R | Digital Input DIR | DSK CHG | — | — | — | — | — | — | — |
| 3F7 | W | Configuration Control | — | — | — | — | — | DRS2 | DRS1 | DRS0 |

The FDC supports the following 24 Intel 82077SL-compatible commands:

1. Read Data
2. Read Deleted Data
3. Write Data
4. Write Deleted Data
5. Read ID
6. Write ID
7. Read Diagnostics
8. Scan Equal
9. Scan Low or Equal
10. Scan High or Equal
11. Seek
12. Recalibrate
13. Sense Interrupts
14. Sense Device Status
15. Specify
16. Configure
17. Dump Registers
18. Perpendicular Mode
19. Relative Seek
20. Verify
21. Version
22. Verset
23. Lock
24. Powerdown Mode The FDC supports the following track formats:
IBM System 3740 FM
IBM System 34 MFM
Perpendicular MFM 500 kbit/s
Perpendicular MFM 1 Mbit/s Formats 1 and 2 are the default formats; other formats are selected by issuing Perpendicular Mode command.

The FDC includes a phase-shifter to pre-compensate disk-write data for the effects of data spreading. Either early, late or no precompensation is dynamically selected depending on the bit pattern. The magnitude of the phase shift is determined by the precompensation select bits in the Data Rate Select Register, as shown next.

| FDC Write Precompensation | | | | |
|---|---|---|---|---|
| PRE2 | PRE1 | PRE0 | EARLY | LATE |
| 0 | 0 | 0 | | Default |
| 0 | 0 | 1 | −41.7 | +41.7 |
| 0 | 1 | 0 | −83.3 | +83.3 |
| 0 | 1 | 1 | −125.0 | +125.0 |
| 1 | 0 | 0 | −166.7 | +166.7 |
| 1 | 0 | 1 | −208.3 | +208.3 |
| 1 | 1 | 0 | −250.0 | +250.0 |
| 1 | 1 | 1 | 0.0 | 0.0 |

The DRS1 and DRS0 bits in the Data Rate Select Register select the required data rate, and default precompensation as shown here:

| FDC Default Precompensation | | | | |
|---|---|---|---|---|
| DRS1 | DRS0 | Data Rate MFM (bit/s) | Data Rate FM (bit/s) | Default Precompensation (ns) |
| 0 | 0 | 500K | 250K | 125.0 |
| 0 | 1 | 300K | 150K | 125.0 |
| 1 | 0 | 250K | 125K | 125.0 |
| 1 | 1 | 1M | — | 41.7 |

The FDC Subsystem 930 includes a digital data separator which provides a clock synchronized to the frequency and phase of the raw data stream from the disk. This data separator locks to the data within 8 bytes and provides greater than 40% jitter tolerance over plus or minus 12.5% of the nominal frequency. Both FM and MFM data encoding is supported at data rates from 125 kbit/s to 1 Mbit/s.

The powerdown behavior of the FDC, is compatible with that of the 82077SL, with some improvements, detailed below.

Direct Powerdown Mode is entered by setting the POWD bit in the Data Rate Select (DRS) register. This causes an immediate termination of activity, so should be avoided during commands which write to the disk. In Direct Powerdown Mode, the FDC clock is disabled and the FDC held in a software reset state. This mode can be exited by a software or hardware reset.

Auto Powerdown Mode is selected using a Powerdown Mode command. Once this mode is selected, the auto-powerdown state will be entered when the following idle conditions are met: MSR register has a value of 80h, (Main Status Register, RQM=1, all else=0).

The head unload time has expired,
No interrupts are pending.

Since the FDC can enter or exit the auto-powerdown state instantly, no latency timer is required.

During auto-powerdown, the FDC clock is stopped but no reset occurs. Auto-powerdown is exited by either writing to the data FIFO register or setting any motor enable bit ME0, 1, 2 or 3 in the DOR register.

FDC signals are mapped to the parallel port terminals in FDC parallel port (FPP) mode as tabulated below:

| PPU Terminal Number | Parallel Port Mode Signal Name | I or O | FPP Mode Signal Name | I or O |
|---|---|---|---|---|
| 1 | SLIN | O | STEP | O |
| 2 | ACK | I | DR1 | O |
| 3 | BUSY | I | MEN1 | O |
| 4 | PE | I | WDATA | O |
| 5 | SLCT | I | FDWE | O |
| 195 | STB | O | DR0 | O |
| 196 | AFD | I/O | DENSEL | O |
| 197 | PDATA0 | I/O | INDEX | I |
| 198 | PDATA1 | I/O | TRACK0 | I |
| 199 | PDATA2 | I/O | WRP | I |
| 200 | PDATA3 | I/O | RDATA | I |
| 202 | PDATA4 | I/O | DSKCHG | I |
| 203 | PDATA5 | I/O | — | I |
| 204 | PDATA6 | I/O | MEN0 | O |
| 205 | PDATA7 | I/O | — | I |
| 207 | FAULT | I | HDSEL | O |
| 208 | INIT | O | DIR | O |

This table should be compared by the reader with the PPU Signal Pin Descriptions Table herein.

As shown in FIG. 11, FPP mode is selected by setting bit 6, PIFFDC, of the Parallel Interface Configuration register to 1. This register is located at base address 78h in PCI configuration space and described in its table later below. When PIFFDC=1, the parallel port 938 is disabled (clock stopped, internal chip-select inactivated, and I/O's isolated) and the terminal pins otherwise used for parallel port 938 are connected instead via a multiplexer 939 to the FDC 932 in the manner shown above.

In FPP mode, two floppy drives 126.0 and 126.1 are supported with no increase in the number of PPU 110 terminal pins, therefore two motor-enable signals (MEN1, MEN0) and two drive-select signals (DR1, DR0) are provided.

For compatibility reasons, a single density select signal (DENSEL) is provided in FPP mode in place of HD and ED in standard mode. DENSEL is true (1) for high data rates (1M bytes/sec or 500K Bytes/Sec) and false (0) for low data rates (300K Bytes/Sec or 250K Bytes/Sec. In this way, the PPU110 pins already tabulated in the PPU Signal Pin Descriptions Table for Floppy Disk Controller are augmented by this further set of parallel port pins used for additional floppy access by an alternative or additional floppy disk drive. In such advantageous arrangement, a floppy drive can be plugged into the parallel port connector and utilized in the FPP mode, further increasing the variety of system embodiments.

Serial Port 936 of FIG. 11 serves two serial input/output channels that simultaneously perform serial-to-parallel conversion on data characters received from peripheral devices or modems and parallel-to-serial conversion on data characters transmitted by the MPU 102. The information obtained includes the type and condition of the transfer operations being performed and the error conditions. A programmable baud rate generator is included that can divide the timing reference clock input by a divisor between 1 and $2^{16}-1$. The circuitry is suitably made compatible with an M16C550 serial port or enhanced TL16C450 serial port.

In the following summary of the serial port internal registers, I/O addresses should be added to a base address of 3F8h for serial port 0 and 2F8h for serial port 1. Access to some registers is controlled by the state of the divisor latch access bit (DLAB).

| Serial Interface Internal Registers | | | | |
|---|---|---|---|---|
| I/O Address | DLAB | Access | Acronym | Register Function |
| Base + 0h | 0 | R | RBR | Receiver Buffer Register |
| Base + 0h | 0 | W | THR | Transmitter Holding Register |
| Base + 1h | 0 | R/W | IER | Interrupt Enable Register |
| Base + 2h | X | R | IIR | Interrupt Identification Register |
| Base + 2h | X | W | FCR | FIFO Control Register |
| Base + 3h | X | R/W | LCR | Line Control Register |
| Base + 4h | X | R/W | MCR | Modem Control Register |
| Base + 5h | X | R/W | LSR | Line Status Register |
| Base + 6h | X | R/W | MSR | Modem Status Register |
| Base + 7h | X | R/W | SCR | Scratch Register |
| Base + 0h | 1 | R/W | DLL | Divisor Latch (LS Byte) |
| Base + 1h | 1 | R/W | DLM | Divisor Latch (MS Byte) |

Receiver Buffer Register (RBR) and Transmitter Holding Register (THR) are data registers that hold from five to eight bits of data. If fewer than eight data bits are transmitted, data is right justified to the LSB. The data registers are double-buffered so that read and write operations are performed while the serial port is performing the parallel-to-serial or serial-to-parallel conversion.

Receiver Buffer Register (RBR 8 bits)
I/O Address (hex): base+0h

| Bit | Name | Access | Description |
|---|---|---|---|
| 7–0 | DATA7–0 | R | Data bits 7–0 |

Transmitter Holding Register (THR)
I/O Address (hex): base+0h

| Bit | Name | Access | Description |
|---|---|---|---|
| 7–0 | DATA7–0 | R | Data bits 7–0 |

Interrupt Enable Register (IER 8 bits)
I/O Address (hex): base+1h

| Bit | Name | Access | Description |
|---|---|---|---|
| 7–4 | — | R/W | Reserved |
| 3 | MODS | R/W | Modem status interrupt enable |
| 2 | RCVLS | R/W | Receiver line status interrupt enable |
| 1 | TMXHRE | R/W | Transmitter Holding register empty interrupt enable |
| 0 | RCVDA | R/W | Received data available interrupt enable |

Interrupt Identification Register (IIR 8 Bits)
I/O Address (hex):base+2h

| Bit | Name | Access | Description |
|---|---|---|---|
| 7–6 | FIFOE1–0 | R | FIFO enabled FIFOE1 FIFOE0 Function 0 0 |

-continued

| Bit | Name | Access | Description |
|---|---|---|---|
| | | | 0  1 |
| | | | 1  0 |
| | | | 1  1 |
| 5–4 | — | R | Reserved |
| 3 | TCINT | R | Trigger change interrupt pending (active only in FIFO mode) |
| 2–1 | HPIP1–0 | R | Highest priority pending code bit<br>HPIP1  HPIP0  Function<br>0  0<br>0  1<br>1  0<br>1  1 |
| 0 | PENINT | R | Pending interrupt |

FIFO Control Register (FCR 8 bits)
I/O Address (hex): base+2h

| Bit | Name | Access | Description |
|---|---|---|---|
| 7–6 | RCVTL1–0 | W | Receiver FIFO trigger level<br>                      Func-<br>RCVTL1  RCVTL0  tion<br>0  0<br>0  1<br>1  0<br>1  1 |
| 5–4 | — | W | Reserved |
| 3 | MODE1 | W | RXRDY and TXRDY mode 1 |
| 2 | XMTCLR | W | Transmitter FIFO clear |
| 1 | RCVCLR | W | Receiver FIFO clear |
| 0 | FIFOEN | W | FIFO enable |

Line Control Register (LCR 8 bits)
I/O Address (hex): base+3h

| Bit | Name | Access | Description |
|---|---|---|---|
| 7 | DLAB | R/W | Divisor latch access bit |
| 6 | BC | R/W | Break control |
| 5 | SP | R/W | Stick parity enable |
| 4 | EPS | R/W | Even parity select |
| 3 | PEN | R/W | Parity enable |
| 2 | STB | R/W | Stop bit select |
| 0–1 | WLSB1–0 | R/W | Word length select<br>WLSB1  WLSB0  Function<br>0  0<br>0  1<br>1  0<br>1  1 |

Modem Control Register (MCR)
I/O Address (hex): base+4h

| Bit | 7 | 6 | 5 | 4 | 3 | 2 | 1 | 0 |
|---|---|---|---|---|---|---|---|---|
| Name | — | — | — | LOOP | INTEN | OUT | RTS | DTR |
| Default | 0 | 0 | 0 | 0 | 1 | 0 | 0 | 0 |

| Bit | Name | Access | Description |
|---|---|---|---|
| 7–5 | — | R/W | Reserved |
| 4 | LOOP | R/W | Provides a local loopback feature for diagnostic channel testing |
| 3 | INTEN | R/W | Interrupt enable |
| 2 | OUT | R/W | Output 1 (unused internal signal) |
| 1 | RTS | R/W | Controls request-to-send signal (RTS) |
| 0 | DTR | R/W | Controls data-terminal-ready signal (DTR) |

Line Status Register (LSR)
I/O Address (hex): base+5h

| Bit | 7 | 6 | 5 | 4 | 3 | 2 | 1 | 0 |
|---|---|---|---|---|---|---|---|---|
| Name | RCVR | TEMT | THRE | BI | FE | PE | OE | DR |
| Default | 0 | 0 | 0 | 0 | 1 | 0 | 0 | 0 |

| Bit | Name | Access | Description |
|---|---|---|---|
| 7 | RCVR | R/W | Receiver FIFO error |
| 6 | TEMT | R/W | Transmitter empty |
| 5 | THRE | R/W | Transmitter holding register empty |
| 4 | BI | R/W | Break interrupt |
| 3 | FE | R/W | Framing error |
| 2 | PE | R/W | Parity error |
| 1 | OE | R/W | Overrun error |
| 0 | DR | R/W | Data ready |

Modem Status Register (MSR)
I/O Address (hex): base+7h

| Bit | 7 | 6 | 5 | 4 | 3 | 2 | 1 | 0 |
|---|---|---|---|---|---|---|---|---|
| Name | DCD | RI | DSR | CTS | DDCD | TERI | DDSR | DCTS |
| Default | 0 | 0 | 0 | 0 | 1 | 0 | 0 | 0 |

| Bit | Name | Access | Description |
|---|---|---|---|
| 7 | DCD | R/W | Indicates the status of the data-carrier-detect (DCD) input |
| 6 | RI | R/W | Indicates the status of the ring-indicator (RI) input |
| 5 | DSR | R/W | Indicates the status of the data-set-ready (DSR) input |
| 4 | CTS | R/W | Indicates the status of the clear-to-send (CTS) input |
| 3 | DDCD | R/W | Delta data carrier detect |
| 2 | TERI | R/W | Trailing edge of ring indicator |
| 1 | DDSR | R/W | Delta data set ready |
| 0 | DCTS | R/W | Delta clear to send |

Scratch Register (SCR 8 bits)
I/O Address (hex):base+7h

| Bit | Name | Access | Description |
|---|---|---|---|
| 7–0 | DATA7–0 | R/W | Data bits 7–0 |

Divisor Latch Registers (DLL and DLM)
I/O Address (hex): base +0h and base+1h

The Divisor Latch registers hold a 16-bit number that is used to obtain a sampling clock from the timing reference clock input. The sampling clock is 16 times the desired baud rate.

Parallel Port Interface

The PPU parallel port 938 is an extended capabilities parallel (ECP) port with additional enhanced parallel port (EPP) protocol support. ECP modes 000 and 001 are compatible with Centronics and bidirectional Centronics ports, and ECP mode 100 (normally unused) is defined to be EPP mode. Thus, together with the ECP protocol modes, the PPU parallel port supports three distinct transfer protocols. Advantageously, pin count is minimized by using the same pins in the PPU Signal Pin Description Table (earlier hereinabove) for any of the modes. See pins 1–5 and 195–208. In FIG. 42, the parallel port 938 has an 8-bit host interface 4210 (including DMA support) that is connected to the Fast-AT bus 904, a sequencer 4220 containing state machines for the three different protocols, a 16-byte FIFO data path 4230, and a parallel interface 4245.

In the "Centronics" modes, the parallel port is compatible with a Centronics uni- or bidirectional parallel port. It consists of a single byte data port that is used to write and read data to/from the port data lines, and registers to control and reflect the status of the parallel port signals. Signalling protocol is handled by software which must assert control strobes and poll for acknowledgement itself. Maximum bandwidth is about 150K bytes/s.

In enhanced parallel port (EPP) mode, SLIN and AFD are automatically generated and are redefined to be address strobe and data strobe respectively, while STB indicates a write or a read cycle. Additional I/O addresses are defined for data and address accesses and when these locations are used, handshaking is performed automatically by hardware. Together with faster interface timing, this allows data throughput up to 2M bytes/s.

Extended Capabilities Port (ECP) Protocol is an enhancement to the IEEEP 1284 standard; it defines transfer protocols and timing that offer a reverse channel as fast as the forward channel and places no limits on the data transfer speeds in either direction. Software overhead is reduced by direct memory access (DMA) support, data buffering, and automatic strobe generation. ECP defines separate I/O locations for address and data accesses, specifies standard configuration registers to aid plug-and-play, allow for future expansion, and specifies FIFO operation.

The parallel port operating modes are selected by bits 7–5 of the Extended Control register in block 4240 of FIG. 42 and tabulated later hereinbelow in the chart for that register with descriptions below next.

Standard Parallel Port Mode (000) is the default mode in which parallel port behavior is compatible with the standard Centronics port. The FIFO is reset and the direction bit in the Device Control register has no effect.

Bidirectional Parallel Port Mode (001) is the same as mode 000 except that setting the direction bit floats (three-states) the data lines and reading the data register returns the value on the data lines.

In Parallel Port FIFO Mode (010) data written or DMAed to the FIFO is transmitted automatically using the "Centronics" protocol. Only the forward direction is useful.

ECP Parallel Port Mode (011) has forward direction (direction=0) data written to the ECP data FIFO. Addresses written to the ECP address FIFO are placed in a single FIFO and transmitted automatically using ECP protocol. In the reverse direction (direction=1) data bytes are transferred from the ECP parallel port and placed in the FIFO.

In enhanced Parallel Port Mode (100), EPP read, write, or address cycles can be executed or, if no EPP cycle is pending, compatible "Centronics" accesses can be made (is in mode 001). A software process should set direction=0 before attempting to perform an EPP write cycle.

Mode 101 is available for any additional mode desired by the skilled worker.

In FIFO Test Mode (110) the FIFO can be written and read but no data is transmitted on the parallel port. The FIFO will not stop accepting or sending data if full or empty conditions occur, and the FIFO read and write address counters simply wrap around.

In Configuration Mode (111), the ECP Configuration registers A and B are accessible.

Mode-switching is allowed only into and out of modes 000 and 001. All P1284 negotiation takes place in these two modes. Setting the mode to 011 (ECP) causes the hardware to initiate data transfer. Switching out of modes 011 or 010 in the middle of a transfer or when data remains in the FIFO causes the transfer to be aborted and the data to be lost.

The PPU parallel port supports decompression of run length encoded (RLE) data in ECP mode (011) referse direction. During reverse direction transfers, the peripheral indicates a command byte is to be transferred by setting PeriphAck (BUSY) low. Bits 6–0 of the command byte indicate the number of times the next data byte should be replicated; bit 7 is zero.

Parallel Port Internal Registers of Port 938 are given by this table:

| I/O Address | Mode | Access | Acronym | Register Function |
| --- | --- | --- | --- | --- |
| 378h | Std/Bidi and EPP | R/W | PADATA | Data Port Register |
| 378h | ECP | W | EAFIFO | ECP Address FIFO Register |
| 379h | All | R | DSR | Device Status Register |
| 37Ah | All | R/W | DCR | Device Control Register |
| 37Bh | EPP | R/W | EPPA | EPP Address Port Register |
| 37Ch–37Fh | EPP | R/W | EPPD | EPP Data Port Register |
| 778h | ECP | R/W | ECPFIFO | ECP Data FIFO Register |
| 778h | Config | R | ECPCA | ECP Configuration Register A |
| 779h | Config | R | ECPCB | ECP Configuration Register B |
| 77Ah | All | R/W | ECR | Extended Control Register |

Data Port Register (in block 4240)
I/O Address (hex): 378

This is the standard parallel data port register. In standard mode, writing to this register drives data onto the parallel port data lines. In all other modes, the drivers can be three-stated by setting the direction bit (5) in the Device Control register. Reads to this register return the value on the data lines.

| Bit | Name | Access | Description |
| --- | --- | --- | --- |
| 7–0 | PD7–0 | R/W | Parallel data port |

ECP Address FIFO Register (EAFIFO in block 4250)
I/O Address (hex): 378

| Bit | Name | Access | Description |
| --- | --- | --- | --- |
| 7–0 | EAFIFO7–0 | W | ECP address |

Device Status Register (DSR) (in block 4240)

I/O Address (hex): 379

| Bit | Name | Access | Description |
|---|---|---|---|
| 7 | BUSY | R | Corresponds to the BUSY input |
| 6 | ACK | R | Corresponds to the ACK input |
| 5 | PE | R | Corresponds to the PE input |
| 4 | SLCT | R | Corresponds to the SLCT input |
| 3 | ERR | R | Corresponds to the ERR input |
| 2 | PRINT | R | Printer interrupt. Set to 0 by rising transition of ACK Set to 1 by read of this register |
| 1–0 | — | R | Reserved |

Device Control Register (DCR 8 bits) (in block 4240)

I/O Address (hex): 37A

| Bit | Name | Access | Description |
|---|---|---|---|
| 7–6 | — | R/W | Reserved |
| 5 | DIR | R/W | In standard (000) and FIFO (010) modes this bit has no effect. In all other modes: 1 = three-state the parallel port data lines. |
| 4 | INT2EN | R/W | 1 = enable interrupts on the rising edge of ACK |
| 3 | SLIN | R/W | Select line printer: 1 = SLIN output active 0 = SLIN output inactive |
| 2 | INIT | R/W | Initialize: 1 = INIT output active 0 = INIT output inactive |
| 1 | AFD | R/W | Autofeed: 1 = AFD output active 0 = AFD output inactive |
| 0 | STB | R/W | Strobe; 1 = STB output active 0 = STB output inactive |

EPP Address Port Register (EPPA) (in block 4250)

I/O Address (hex): 37B

| Bit | Name | Access | Description |
|---|---|---|---|
| 7–0 | EPPA7–0 | R/W | EPP address strobe |

EPP Data Register (PADATA) (in block 4250)

I/O Address (hex): 37C–37F

In EPP mode (100), when data is read from or written to the EPP Address Port register, an address strobe is automatically generated.

In EPP mode (100), when data is read from or written to the EPP Data register, an address strobe is automatically generated.

| Bit | Name | Access | Description |
|---|---|---|---|
| 31–0 | PADATA31–0 | R/W | Parallel port for EPP data |

ECP Data FIFO Register (ECPFIFO) (in block 4250)

I/O Address (hex): 778

A data byte written to the ECP Data FIFO register is placed in the FIFO and tagged as ECP data.

| Bit | Name | Access | Description |
|---|---|---|---|
| 7–0 | ECPFIFO7–0 | R/W | Parallel data port for ECP data |

ECP Configuration Register A (ECPCA) (in block 4240)

I/O Address (hex): 778

| | Bit | | | | | | | |
|---|---|---|---|---|---|---|---|---|
| | 7 | 6 | 5 | 4 | 3 | 2 | 1 | 0 |
| Name | IMPID3 | IMPID2 | IMPID1 | IMPID0 | — | — | — | — |
| Default | 0 | 0 | 0 | 1 | 1 | 1 | 1 | 1 |

| Bit | Name | Access | Description |
|---|---|---|---|
| 7–4 | IMPID3–0 | R | Implementation ID number. Always reads 0001b to indicate an 8-bit implementation. (PWORD = 1 Byte) |
| 3–0 | — | R | Reserved. Always reads 1111b |

ECP Configuration Register B (ECPCB) (in block 4240)

I/O Address (hex): 779

| | Bit | | | | | | | |
|---|---|---|---|---|---|---|---|---|
| | 7 | 6 | 5 | 4 | 3 | 2 | 1 | 0 |
| Name | COMPRESS | INTR VALUE | INTR LINE2 | INTR LINE1 | INTR LINE0 | DMA CHNL2 | DMA CHNL1 | DMA CHNL0 |
| Default | 0 | 0 | 0 | 0 | 1 | 0 | 1 | 1 |

| Bit | Name | Access | Description |
|---|---|---|---|
| 7 | COMPRESS | R | Compression: off = 0; on = 1 |
| 6 | INTRVALUE | R | Returns value on interrupt line to determine possible conflicts. |
| 5–3 | INTRLINE2–0 | R | Always reads 001. IRQ7 selected |
| 2–0 | DMACHNL2–0 | R | Always reads 011. DMA channel 3 selected |

ECP Extended Control Register (ECR) (in block 4240)

I/O Address (hex): 77A

|  | Bit | | | | | | | |
| --- | --- | --- | --- | --- | --- | --- | --- | --- |
|  | 7 | 6 | 5 | 4 | 3 | 2 | 1 | 0 |
| Name | MODE2 | MODE1 | MODE0 | FLTINTREN | DMAEN | SVCINTR | FULL | EMPTY |
| Default | 0 | 0 | 0 | 1 | 1 | 1 | 1 | 1 |

| Bit | Name | Access | Description |
| --- | --- | --- | --- |
| 7–5 | MODE3–0 | R/W | Select mode of operation<br>MODE2 MODE1 MODE0 Mode<br>0　　　0　　　0　Standard parallel port (forward)<br>0　　　0　　　1　Bidirectional parallel port<br>0　　　1　　　0　Parallel Port FIFO<br>0　　　1　　　1　ECP parallel port<br>1　　　0　　　0　EPP parallel port<br>1　　　0　　　1　Reserved<br>1　　　1　　　0　FIFO test<br>1　　　1　　　1　Configuration |
| 4 | FLTINTREN | R/W | In ECP mode, when set to 0, enables an interrupt on the falling edge of FAULT. |
| 3 | DMAEN | R/W | 0 = disable DMA |
| 2 | SVCINTR | R/W | 0 = disable DMA and all service interrupts |
| 1 | FULL | R/W | 1 = FIFO is full |
| 0 | EMPTY | R/W | 1 = FIFO is empty |

IDE Interface

The X-bus data bits <7:0> are shared with the IDE interface, but an external '245 buffer used to isolate the IDE data from the XD data, so that the IDE drive can be powered down to save energy while the XD interface is still functioning. The rest of the normal IDE interface signals, including IDE data bits <15:8> are included in the IDE interface.

CS1FX decodes I/O addresses 1F0–1F7h and CS3FX decodes addresses 3F6–3F7h.

An IOCHRDY input is supported for use by drives which insert wait-states in order to lengthen the IDE access cycle.

Power Management Unit (PMU)

In FIG. 23; PMU State Definitions are as follows:

In the READY state, the system is fully powered up and runs at full speed. Individual devices may be powered down.

The STANDBY state conserves power by adjusting CPU turn-on time by a Mask Clock circuit of FIG. 27.

The TEMPORARY state is similar to the READY state, and is entered through the STANDBY state (by a system event, a KBC or mouse interrupt). After a short-duration timer times out, the system will return to the STANDBY state.

The 3-V SUSPEND state differs from the T(off) duration of the STANDBY state in the following respects:
All the clocks, not just the CPU clock, are stopped.
The MPU crystal oscillating circuitry is disabled.
All the peripheral devices can be powered down, without regard to status of the peripheral timers.

A resume from 3-V SUSPEND can be caused by either RTC alarm, modem ring, keyboard or mouse interrupts, suspend/resume button, on/off button, CRDSMI from PCU112, or a low-to-high transition on the BATLOW signal.

The 0-V SUSPEND state has the lowest level of power consumption available. System state is stored to disk by software. All components, except the RTC 918 and the resume logic of the PMU, are powered down. The system can resume by FIG. 21 SRBTN input, ONBTN input, or RTC alarm.

The OFF state is the same as 0-V SUSPEND except the system state is not stored to disk and the SRBTN input will not turn the system on.

The state transitions A,B, , , , Q,R for FIG. 23 are explained in the next table. The FIG. 23 state machine control logic 2035 is defined by the logic in this table which is straightforwardly implemented as electronic logic from the logic information in the table. Conjunctions "and" and "or" refer to Boolean AND and OR. Parentheses (), brackets [] and braces {} group Boolen expressions.

| State Transition Table for FIG. 23 | | |
| --- | --- | --- |
| Path | Transition | Software/Hardware State |
| A | READY --> STANDBY | [Software writes the STATE bits of the PMU_CNTRL register (base address: 0A0h–0A2h) with 01] |
| B | READY --> 3-V SUSPEND | [Software writes the STATE bits of the PMU_CNTRL register (base address: 0A0h–0A2h) with 10] and (SUSPSEL bit is 1) |
| C | READY --> 0-V SUSPEND | [Software writes the STATE bits of the PMU_CNTRL register (base address: 0A0h–0A2h) with 10] and (SUSPSEL bit is 0) |
| D | READY --> OFF | [Software writes the STATE bits of the PMU_CNTRL register (base address: 0A0h–0A2h) with 11] or [(PWRGD3 input transits from high to low) and (BATLOW input is active)] |
| E | STANDBY --> READY | [Software writes the STATE |

State Transition Table for FIG. 23

| Path | Transition | Software/Hardware State |
|------|------------|-------------------------|
| F | STANDBY --> TEMPORARY | bits of the PMU_CNTRL register (base address: 0A0h–0A2h) with 00] or (STANDBY timer doesn't time out) (STANDBY timer times out but TEMPORARY timer doesn't time out) |
| G | STANDBY --> 3-V SUSPEND | [Software writes the STATE bits of the PMU_CNTRL register (base address: 0A0h–0A2h) with 10] and (SUSPSEL bit is 1) |
| H | STANDBY --> 0-V SUSPEND | [Software writes the STATE bits of the PMU_CNTRL register (base address: 0A0h–0A2h) with 10] and (SUSPSEL bit is 0) |
| I | STANDBY --> OFF | [Software writes the STATE bits of the PMU_CNTRL register (base address: 0A0h–0A2h) with 11] or [(PWRGD3 input transits from high to low) and (BATLOW input is active)] |
| J | TEMPORARY --> READY | [Software writes the STATE bits of the PMU_CNTRL register (base address: 0A0h–0A2h) with 00] or (STANDBY timer doesn't time out) |
| K | TEMPORARY --> STANDBY | (Both STANDBY and TEMPORARY timers time out) |
| L | TEMPORARY --> 3-V SUSPEND | [Software writes the STATE bits of the PMU_CNTRL register (base address: 0A0h–0A2h) with 10] and (SUSPSEL bit is 1) |
| M | TEMPORARY --> 0-V SUSPEND | [Software writes the STATE bits of the PMU_CNTRL register (base address: 0A0h–0A2h) with 10] and (SUSPSEL bit is 0) |
| N | TEMPORARY --> OFF | [Software writes the STATE bits of the PMU_CNTRL register (base address: 0A0h–0A2h) with 11] or [(PWRGD3 input transits from high to low) and (BATLOW input is active)] |
| O | 3-V SUSPEND --> READY | [(INBLRES bit is 0) or (BATLOW input is inactive)] and {(S/R Button is pushed) or [(On/Off Button is pushed) and (RMSKOBTN bit is 0)] or [(Alarm input is high) and (RMSKALARM bit is 0)] or [(Ring input is high) and (RMSKRING bit is 0)] or [(PCMCIA generates an CRDSMI) and (RMSKCRDSMI bit is 0)] or [(Keyboard or mouse interrupts) and (RMSKKBMS bit is 0)] or [(BATLOW input transits from low to high) and (BLRES bit is 1)]} |
| P | 3-V SUSPEND --> OFF | (PWRGD3 input transits from high to low) and (BATLOW input is active) |
| Q | 0-V SUSPEND --> READY | [(INBLRES bit is 0) or (BATLOW input is inactive)] and (S/R Button is pushed) or [(On/Off Button is pushed) and (RMSKOBTN bit is 0)] |
| R | OFF --> READY | [(On/Off Button is pushed) and (BATLOW input is inactive)] |

Power State Information for each PMU state of FIG. 23

| Power-Up Status | Ready | Standby | Temporary | 3-V Suspend | 0-V Suspend | Off |
|-----------------|-------|---------|-----------|-------------|-------------|-----|
| VCC to MPU | On | On | On | On | Off | Off |
| VCC to PCU | On | On | On | On | Off | Off |
| VCC to PPU | On | On | On | On | Off | Off |

Power State Information for each PMU state of FIG. 23

| Power-Up Status | Ready | Standby | Temporary | 3-V Suspend | 0-V Suspend | Off |
|---|---|---|---|---|---|---|
| (less PMU) | | | | | | |
| VCC to KBC | On | On | On | On | Off | Off |
| VCC to DRAM | On | On | On | On | Off | Off |
| VCC to PMU Other Logic (Note 1) | On | On | On | On | Off | Off |
| VCC to PMU Resume Logic (Note 2) | On | On | On | On | On | On |
| VCC to RTC | On | On | On | On | On | On |
| VCC to Peripherals | Dynamic | Dynamic | Dynamic | (Note 3) | Off | Off |
| System Data and Status | Active | Active | Active | Stored in DRAM | Stored on disk | Not saved |
| Peripheral Timers | Active | Active | Active | Active | Stopped Cleared | Stopped Cleared |
| CPU Clock | On | T(on)/T(off) | On | Off | Off | Off |
| Other Clocks | Active | Active | Active | Off | Off | Off |
| Exit From This State (Note 4) | A to D | E to I | J to N | O,P | Q | R |

Notes:
1) PMU "other logic" consists of all the logic in the PMU subsystem except the resume logic.
2) PMU resume logic consists of the logic for resume from the 0-V SUSPEND states (ONBTN, RTC alarm, and suspend/resume button monitoring circuits) and for wake up from the OFF state (ONBTN and RTC alarm monitoring circuits).
3) Peripheral power is enabled/disabled by software before entering 3-V suspend.
4) See previous table, "A to D" means items A to D inclusive, etc. in State Transition Table.

When the system is in the READY or TEMPORARY states, the HISPD input of FIG. 27 is high and MASKCLK is always inactive (high).

When the system is in the 3.3-V SUSPEND, 0-V SUSPEND or OFF states MASKCLK is always active (low).

When the system is in the STANDBY state MASKCLK is modulated as in FIG. 27 between two adjacent system timer interrupts (IRQ0's) or two adjacent periodic SMI's. This signal is inactive for a fraction of time then becomes active for the rest of the period. The inactive/active (Ton/Toff) ratio is determined by the TONTOFF register 2510. In addition, if a keyboard interrupt, a mouse interrupt, a PCT bus master request, or (optionally) a system event occurs, the MASKCLK becomes inactive for a period of time, which is determined by the Temporary Timer TEMP programming bits 20-23 of the PMU_TIMER register.

Turning now to the subject of clocks, and referring to FIG. 37, all PPU clock signals are derived from four primary clock signals. These primary clocks are:

PCLK. This is the PCI clock signal as specified in the PCI Revision 2.0 Specification.

14MHZ_CLK. 14.31818-MHz clock signal is generated by PPU on-chip oscillator and external crystal.

32KHZ_CLK. 32.768-kHz clock signal is generated by PPU on-chip RTC oscillator and external crystal.

48MHZ_CLK. 48-MHz clock signal is generated by PPU on-chip oscillator and external crystal.

The 32kHz_CLK is powered by RTCPWR and is always active. The other primary clocks are active during Power-On-Reset, but stopped during SUSPEND. When a resume event occurs, clock stable indications from the PMU are used to produce stabilized versions of the primary clocks.

All secondary clocks are derived from the three stabilized versions of the primary clocks, that is they are active during reset and inactive during suspend and for a predetermined time after a resume event. The next table shows the various internal PPU clocks and their derivation.

| Clock Signal | Nominal Value(s) | Used by | Derivation |
|---|---|---|---|
| SYSCLK | 16, 12, or 8 MHz | Fast-AT Bus and DMA controller | PCLK/2, /3, or /4 |
| FDCCLK | 24 MHz | FDC | 48 MHZ_CLK/2 |
| KBCCLK | 16, 12, 8 or 4 MHz | KBC (external) | 48 MHZ_CLK/3, /4, /6, /12 |
| SIFCLK0 | 1.8461 or 8 MHz | Serial Port 0 | 48 MHZ_CLK/26 or /6 |
| PARCLK | 8 MHz | Parallel Port | 48 MHZ_CLK/6 |
| TMRCLK | 1.193 MHz | Timers | 14 MHZ_CLK/12 |

Secondary clocks are disabled when the corresponding Block Enable signal (from PCI-space configuration registers) is inactive. Secondary clock frequency switching and enabling/disabling is performed with circuits that prevent glitches. Each clock divider is provided with a short reset by the PMU after power up and 0-V resume.

Referring to Port B and FIG. 60, The PPU provides an I/O port (port B) and logic to control the speaker output. Since the PPU does not generate an NMI (nonmaskable interrupt), signals ENIOCK and ENPRCK are redundant but provided for compatibility.

Port B Register
I/O Address (hex): 061

| Bit | Name | Access | Description |
|---|---|---|---|
| 7 | PRCK | R | Indicates parity error has occurred |
| 6 | IOCHCK | R | I/O channel check signal |
| 5 | OUT2 | R | Timer 2 output |
| 4 | REFDET | R | Refresh detected indicator |
| 3 | ENIOCK | R/W | Not used in PPU |
| 2 | ENPRCK | R/W | Not used in PPU |

-continued

| Bit | Name | Access | Description |
|-----|------|--------|-------------|
| 1 | SPKDATA | R/W | Used to gate Timer 2 output to speaker |
| 0 | TM2GATE | R/W | Enables Timer 2 gate |

The SPKDATA and TM2GATE signals are connected as shown in FIG. 60.

PPU Registers Summary

The configuration registers 1222 of PPU110 are listed in the next lengthy table. Registers 1222 define how the PPU functions interact with the rest of the system (enabling, interrupt configuration, I/O map, etc.). All the undefined registers should be considered as reseerved space. The design of the address decoding circuitry in PPU is patterned on the designation of register addresses in the table.

PPU Configuration Registers 1222 (access via PCI space)

| Base Address (h) | Acronym | Register Function |
|---|---|---|
| 00 | VID | Vendor Identification Number |
| 02 | DID | Device Identification Number |
| 04 | COMM | Command Decode and Generation Control |
| 06 | STS | Device Status |
| 08 | REVID | Revision Identification Number |
| 09–0B | CLCD | Class Code |
| 0E | HT | Header Type |
| 4B–48 | | Reserved |
| 40 | PCICRTL | PCI Bus Control |
| 51–50 | CPUINT | PCU Interrupt Shadow |
| 52 | INTEN | PPU Internal Interrupt Enable |
| 53 | PCIINT | PCI Interrupt Mapping |
| 58–59 | PCS0 | Programmable Chip Select 0 |
| 5A–5B | PCS1 | Programmable Chip Select 1 |
| 60 | PAC | PCI Arbiter Control |
| 70 | MISC | Miscellaneous |
| 71 | FDR | Floppy Disk |
| 72 | IDE | IDE Interface Configuration |
| 74 | SIF | Serial Interface Configuration |
| 75 | | Reserved |
| 78 | PIF | Parallel Interface Configuration |
| 80 | RCS | ROM Chip Select Configuration |
| 90 | SHDNDX | Shadow Index Register |
| 91 | SHDDATA | Shadow Data Register |
| 0A0–0A2 | PMU_CONTROL | PMU status and control (on V_bat) |
| 0A4 | MASK_RESUME | Suspend/resume status and control (on V_bat) |
| 0A8–0AA | SOURCE_SMI | SMI source-event indicators |
| 0AC–0AE | MASK_SMI | SMI source-event masking control |
| 0B0–0B3 | MASK_SYSTEM | Standby and suspend activity monitor masks |
| 0BC–0BF | PMU_TIMERS | PMU activities monitor timers time out values |
| 0C0 | TONTOFF_ADJ | CPU clock on/off percentage adjustment |
| 0C4 | PWM_INTNSTY | LCD Backlight pulse-width-modulation adjustment |
| 0C8–0CB | VGA_DECODE | VGA standard and linear frame buffer address decode |
| 0CC | MASK_CPUCLK | Mask off the CPU clock |
| 0D0–0D3 | | Reserved |

PPU Control Registers for PC Functions (Access via I/O Space on bus 904)

PPU Control Registers for PC Functions (Access via I/O Space on bus 904)

| Default Address (h) | Function | Register | | Access |
|---|---|---|---|---|
| 1F0 | IDE | Data Register | | R/W |
| 1F1 | IDE | Error Register | | R |
| 1F1 | IDE | Features Register | | W |
| 1F2 | IDE | Sector Count Register | | R/W |
| 1F3 | IDE | Sector Number Register | | R/W |
| 1F4 | IDE | Starting Cylinder Address LSB Register | | R/W |
| 1F5 | IDE | Starting Cylinder Address MSB Register | | R/W |
| 1F6 | IDE | Drive and Head Select Register | | R/W |
| 1F7* | IDE | Sector Count Register | — | R |
| 1F7* | IDE | Command Register | — | W |
| 278 | PIF | Data Register | PDR | R/W |
| 279 | PIF | Status Register | PSR | R |
| 27A | PIF | Control Register | PCR | R/W |
| ** | SIF | Receiver Buffer Register | RBR | R |
| ** | SIF | Transmitter Holding Register | THR | W |
| ** | SIF | Divisor Latch (LSB) Register | DLL | R/W |
| | SIF | Divisor Latch (MSB) Register | DLM | R/W |
| | SIF | Interrupt Enable Register | IER | R/W |
| | SIF | Interrupt Identification Register | IIR | R |
| | SIF | FIFO Control Register | FCR | W |
| | SIF | Line Control Register | LCR | R/W |
| | SIF | Modem Control Register | MCR | R/W |
| | SIF | Line Status Register | LSR | R/W |
| | SIF | Modem Status Register | MSR | R/W |
| | SIF | Scratch Pad Register | SCR | R/W |
| 378 | STD/EPP | Data Port | PADATA | R/W |
| 378 | ECP | ECP Address FIFO | EAFIFO | W |
| 379 | P/U | Status | DSR | R |
| 37A | P/U | Control Register | DCR | R/W |
| 37B | EPP | EPP Address | EPPA | R/W |
| 37C–37F | EPP | EPP Data | EPPD | R/W |
| 3F0 | FDC | Status Register A | SRA | R |
| 3F1 | FDC | Status Register B | SRB | R |
| 3F2 | FDC | Digital Output Register | DOR | R/W |
| 3F3 | FDC | Tape Drive Register | TDR | R/W |
| 3F4 | FDC | Main Status Register | MSR | R |
| 3F4 | FDC | Data Rate Select Register | DRS | W |
| 3F5 | FDC | Data Register | FIFO | R/W |
| 3F6 | IDE | Alternate Status Register | — | R |
| 3F6 | IDE | Device Control Register | — | W |
| 3F7§ | IDE | Drive Address Register | — | R |
| 3F7§ | FDC | Digital Input Register | DIR | R |
| 3F7 | FDC | Configuration Control Register | CCR | W |
| 778 | ECP | ECP Data FIFO Register | ECPFIFO | W |
| 778 | ECP | ECP Configuration Register A | ECPCA | R |
| 779 | ECP | ECP Configuration Register B | ECPCB | R |
| 77A | P/U | Extended Control Register | ECR | R/W |

*These registers reside in the IDE drive, and are not internal to the PPU.
**If DLAB (LCR Bit 7) = 0; then RBR and THR are being accessed. If DLAB = 1; then DLL is accessed.
§Shared between IDE and FDC functions.

I/O Address Ranges for PPU

| Address Range (h) | Device Selected |
|---|---|
| 000–00F | DMA1 |
| 020–021 | INTC1 |
| 022–023 | CONFIG |
| 040–043 | CTC |

| I/O Address Ranges for PPU | |
|---|---|
| Address Range (h) | Device Selected |
| 070–071 | RTC |
| 080–08F | DMA PAGE |
| 0A0–0A1 | INTC2 |
| 0D0–0DF | DMA2 |
| 480–48F | DMA HIGH PAGE |
| 4D0–4D1 | IRQ Edge/Level Control Register |

PCI Bus Control (PCICTRL) Register
Base Address (hex): 43–40

| Bit | Name | Access | Description |
|---|---|---|---|
| 31–25 | — | R/W | Reserved |
| 24 | SDSP | R/W | Subtractive Decode Sample Point. Controls how the PPU monitors and drives DEVSEL when acting as a PCI slave. When set to 1, the PPU samples DEVSEL on the two PCLK rising edges following the address cycle; If no other PCI device has asserted DEVSEL and the transaction is one the PPU can accept, it will then assert DEVSEL after the second PCLK rising edge so that the PCI master samples it asserted on the third PCLK rising edge. When set to 0, the PPU samples DEVSEL on the three PCLK rising edges following the address cycle; If no other PCI device has asserted DEVSEL and the transaction is one the PPU can accept, it will then asert DEVSEL after the third PCLK rising edge so that the PCI master samples it asserted on the fourth PCLK rising edge. |
| 23–19 | — | | Reserved |
| 18 | RTRYEXP | R/W | Retry counter expired. Indicates that PPU was unable to complete a data transfer while mastering before the within the number of retries programmed in the max retry count register. Write a 1 to clear. Write of 0 has no effect. |
| 17 | DPERRM | R/W | Data Parity Error while Mastering. The PPU sets this bit when a data parity error occurs when the PPU is mastering the PCI bus. This bit is different from the MDPARERR(STS) bit in that DPERRM may be set regardless of the state of the PRSPEN(COMM) bit. Write a 1 to clear. Write of 0 has no effect. |

Programmable Chip Select Register 0 (PCS0)
Base Address (hex): 59–58

| Bit | Name | Access | Description |
|---|---|---|---|
| 15–2 | GA15–2g | R/W | Base I/O address for PCS0 (selects a 4-byte region). |
| 1 | — | | Reserved |
| 0 | SELEN0 | R/W | Select enable 0. 1 = Enable PCS0 for 4-byte I/O decoding. 0 = disable |

Programmable Chip Select Register 1 (PCS1)
Base Address (hex): 5B–5A

| Bit | Name | Access | Description |
|---|---|---|---|
| 15–2 | GA15–2 | R/W | Base I/O address for PCS1 |
| 1 | — | R/W | Reserved |
| 0 | SELEN1 | R/W | Select enable 1 1 = Enable PCS1 for 4 byte I/O decoding 0 = disable |

PCI Arbiter Control (PAC)
Base Address (hex): 60

| Bit | Name | Access | Description |
|---|---|---|---|
| 7–5 | SM7–5 | R/W | Super agent selector:<br>SM7 SM6 SM5 Super Agent<br>0 0 0 None<br>0 1 0 Master 1<br>0 1 1 Master 2<br>1 0 0 Master 3<br>All other states are Reserved. |
| 4 | HOLDSEL | R/W | Defines pin 8 and 9. 1 = Pin 8 is MPUREQ, and pin 9 is MPUGNT 0 = Pin 8 is HLDA, and pin 9 is HOLD |
| 3–1 | | | Reserved |
| 0 | ARBEN | R/W | Arbiter enable: 1 = Enable arbiter 0 = disable (CPU is always master) |

Miscellaneous Register (MISC)
Base Address (hex): A8

| Bit | Name | Access | Description |
|---|---|---|---|
| 7 | KBCSNPEN | R/W | 1 = enable port 92 functions 0 = disable port 92 functions |
| 6 | ELINDEX | R/W | PCU index data: 1 = PCU index data at 3E2h, 3E3h 0 = 3E0h, 3E1h for shadowing purpose |
| 5–4 | KBCLK1–0 | R/W | Select keyboard clock frequency:<br>KBCLK1 KBCLK0 Frequency<br>0 0 4 MHz<br>0 1 8 MHz<br>1 0 12 MHz<br>1 1 16 MHz |
| 3 | XQUIET | R/W | X-bus and IDE interface quiet: 1 = Quiet when no access 0 = Reflects internal write bus |
| 2 | VPPEN | R/W | Enable VPP output: 1 = VPP output is active 0 = VPP output is inactive |
| 1–0 | — | R | Reserved |

Floppy Configuration Register (FCR)
Base Address (hex): 71

| Bit | Name | Access | Description |
|---|---|---|---|
| 7 | FDSEN | R/W | FDS Function Enable. Enables and disables the FDS function within the IPU. When disabled, the clock going to the FDS is stopped and the inputs are isolated. 0 = Disable. 1 = Enable. |
| 6 | FDCEN | R/W | FDC function enable. Enables and disables the FDC function within the PPU. When disabled, the clock going to the FDC is stopped, the inputs are isolated, the outputs are in a |

-continued

| Bit | Name | Access | Description |
|---|---|---|---|
| | | | low-power default state, and control registers within the FDC are not accessible.<br>0 = Disable<br>1 = Enable |
| 5 | FDCRST | R/W | FDC hard reset. This bit places the FDC function in a reset mode. While in reset mode, all FDC outputs from the PPU are three-stated while FDC outputs within the PPU go to a quiet bus state, and the FDC control registers are reset to their default values. When the RESET state is exited, the outputs will go to the inactive default state. The FDC configuration register bits are not reset by this bit.<br>0 = Not in software-controlled reset.<br>1 = In software-controller reset. |
| 4–0 | — | R | Reserved (Read as 0). |

Integrated Drive Electronics (IDE) Configuration Register

Base Address (hex): 72

| Bit | Name | Access | Description |
|---|---|---|---|
| 7 | IDEEN | R/W | IDE interface enable. This bit enables and disables the IDE interface function within the PPU. When disabled, the inputs are isolated and the outputs are in a low-power default state.<br>0 = Disable.<br>1 = Enable. |
| 6 | IDERST | R/W | IDE hard reset. This bit controls the RST line going to the IDE drive.<br>0 = RST not in software-controlled reset.<br>1 = RST signalling software-controlled reset. |
| 5–0 | — | R | Reserved (Read as 0). |

Serial Interface Configuration Register (SIF)

Base Address (hex): 74

| Bit | Name | Access | Description |
|---|---|---|---|
| 7 | SIFEN | R/W | Serial interface enable. This bit enables and disables the serial port function within the PPU. When disabled, the clock going to the serial port is stopped, the inputs are isolated and the outputs are in a low-power default state. Control registers within the serial port are not accessible when it is disabled.<br>0 = Disable.<br>1 = Enable. |
| 6 | SRST | R/W | Serial interface hard reset. This bit places the serial port function in hard reset mode. Write a 0 to SRST will leave the reset mode.<br>0 = Not in reset mode.<br>1 = In reset mode. |
| 5 | SCLK | R/W | Serial interface clock frequency select. this bit selects the serial interface clock frequency.<br>0 = 1.8461 MHz.<br>1 = 8 MHz. |
| 4–0 | — | R | Reserved (Read as 0). |

Parallel Interface Configuration Register (PIF)
Base Address (hex): 78

| Bit | Name | Access | Description |
|---|---|---|---|
| 7 | PIFEN | R/W | Parallel interface enable. This bit enables and disables the parallel port function within the PPU. When disabled, the clock going to the parallel port is stopped, the inputs are isolated, and the out-puts are in a low-power default state.<br>0 = Disable.<br>1 = Enable. |
| 6 | PIFRST | R/W | Parallel interface hard reset. This bit places the parallel port in hard reset mode.<br>0 = Not in reset mode.<br>1 = In reset mode. |
| 5 | PIFFDC | R/W | Parallel interface FDC select bit. This bit multiplexes the FDC drive interface signals to the parallel port pins so that a floppy drive can be plugged into the parallel port.<br>0 = Select normal parallel port pins<br>1 = Multiplex FDC signals to parallel port pins. |
| 4 | — | R | Reserved (Read as 0). |
| 3–0 | FIFOTRLD3–0 | R/W | ECP 16-byte data FIFO threshold definition. |

ROM Chip Select Configuration Register (RCS)
Base Address (hex): 81

| Bit | Name | Access | Description |
|---|---|---|---|
| 15 | — | R | Reserved (Read as 0). |
| 14 | 4GB | R/W | RCS below 4 GB Enable. This bit enables ROMCS accesses to the addresses just below the 4 GB address (FFFC 0000–FFFF FFFFh).<br>0 = ROM not at FFFC 0000–FFFF FFFFh.<br>1 = ROM at FFFC 0000–FFFF FFFFh. |
| 13 | 1MB | R/W | RCS below 1 MB Enable. This bit enables ROMCS accesses to the addresses just below the 1 MB address (000C 0000–000F FFFFh.<br>0 = ROM not at 000C 0000–000F FFFFh.<br>1 = ROM at 000C 0000–000F FFFFh. |
| 12 | RCSF8 | R/W | RCS for xxxF 8000–xxxF FFFFh. This bit enables ROMCS accesses to xxxF 8000–xxxF FFFFh.<br>0 = Accesses disabled.<br>1 = Accesses enabled. |
| 11 | RCSF0 | R/W | RCS for xxxF 0000–xxxF 7FFFh Enable. This bit enables ROMCS accesses to xxxF 0000–xxxF 7FFFh.<br>0 = Accesses disabled.<br>1 = Accesses enabled. |
| 10 | RCSE8 | R/W | RCS for xxxE 8000–xxxE FFFFh Enable. This bit enables ROMCS accesses to xxxE 8000–xxxE FFFFh.<br>0 = Accesses disabled.<br>1 = Accesses enabled. |
| 9 | RCSE0 | R/W | RCS for xxxE 0000–xxxE 7FFFh Enable. This bit enables ROMCS accesses to xxxE 0000–xxxE 7FFFh.<br>0 = Accesses disabled.<br>1 = Accesses enabled. |
| 8 | RCSDC | R/W | RCS for xxxD C000–xxxD FFFFh Enable. This bit enables ROMCS accesses to xxxD C000–xxxD FFFh.<br>0 = Accesses disabled.<br>1 = Accesses enabled. |
| 7 | RCSD8 | R/W | RCS for xxxD 8000–xxxD BFFFh Enable. This bit enables ROMCS accesses to xxxD 8000–xxxD BFFFh.<br>0 = Accesses disabled. |

| Bit | Name | Access | Description |
|---|---|---|---|
| 6 | RCSD4 | R/W | 1 = Accesses enabled. RCS for xxxD 4000–xxxD 7FFFh Enable. This bit enables ROMCS accesses to xxxD 4000–xxxD 7FFFh. 0 = Accesses disabled. 1 = Accesses enabled. |
| 5 | RCSD0 | R/W | RCS for xxxD 0000–xxxD 3FFFh Enable. This bit enables ROMCS accesses to xxxD 0000–xxxD 3FFFh. 0 = Accesses disabled. 1 = Accesses enabled. |
| 4 | RCSCC | R/W | RCS for xxxC C000–xxxC FFFFh Enable. This bit enables ROMCS accesses to xxxC C000–xxxC FFFFh. 0 = Accesses disabled. 1 = Accesses enabled. |
| 3 | RCSC8 | R/W | RCS for xxxC 8000–xxxC BFFF(h) Enable. This bit enables ROMCS accesses to xxxC 8000–xxxC BFFFh. 0 = Accesses disabled. 1 = Accesses enabled. |
| 2 | RCSC6 | R/W | RCS for xxxC 6000–xxxC 67FFh VROM hole En. This bit enables ROMCS accesses to xxxC 6000–xxxC 67FFh. 0 = Accesses disabled. 1 = Accesses enabled. |
| 1 | RCSC4 | R/W | RCS for xxxC 4000–xxxC 7FFFh not VROM En. This bit enables ROMCS accesses to xxxC 4000–xxxC 7FFFh excluding the Video ROM hole at xxxC 6000–xxxC 67FFh. 0 = Accesses disabled. 1 = Accesses enabled. |
| 0 | RCSC0 | R/W | RCS for xxxC 0000–xxxC 3FFFh Enable. This bit enables ROMCS accesses to xxxC 0000–xxxc 3FFFh. 0 = Accesses disabled. 1 = Accesses enabled. |

Shadow Index Register (SHDNDX)
Base Address (hex): 90

| Bit | Name | Access | Description |
|---|---|---|---|
| 7–0 | SHDNDX7–0 | R/W | Index that selects which shadowed data is accessed via a read to SHDDATA register. |

Shadow Data Register (SHDDATA)
Base Address (hex): 91

| Bit | Name | Access | Description |
|---|---|---|---|
| 7–0 | SHDDATA7–0 | R | Data port for reading shadowed register information. SHDNDX must be written before reading SHDDATA to select the required data. |

PMU_CNTRL Register

The read-only bits in this register (bits 23–16) can be cleared by a write to this register.
Base Address=0A0h–0A2h

| Bit | Name | Access | Description |
|---|---|---|---|
| 23 | SUSPOK | R | High level on this bit indicates a successful suspend. (Used to distinguish between resume and power up.) |
| 22 | SRBTNRSM | R | Resumed by the suspend/resume button. |
| 21 | OBTNRSM | R | Resumed or powered up by the on/off button. |
| 20 | ALARMRSM | R | Resumed or powered up by RTC alarm. |
| 19 | RINGRSM | R | Resumed by modem ring. |
| 18 | KBMSRSM | R | Resumed by keystroke or mouse interrupts. |
| 17 | CRDSMIRSM | R | Resumed by the CRDSMI input from PCU. |
| 16 | BATLOWRSM | R | Resumed by a low-to-high transition on the BATLOW input. |
| 15 | — | | |
| 14 | VCCDRV5V | R/W | If VCCDK (VCC for disk) is powered by 5-V VCC, this bit should be set to 1 in order to make IDE and FDC resets a function of PWRGOOD5. |
| 13 | VCCXD5V | R/W | If VCCXD (VCC for XD bus) is powered by 5 V VCC, this bit should be set to 1 in order to make RSTXD a function of PWRGOOD5. |
| 12 | PCION5V | R/W | If any PCI device is powered by 5 V, this bit should be set to 1 in order to make PCI reset a function of PWRGOOD5. |
| 11–9 | — | | |
| 8 | ENPMU | R/W | Enable all power management features. |
| 7–5 | | | |
| 4 | TEMPRDY | R/W | This bit is used to control the state flow when a system event (as defined in MASK_SYSTEM register) occurs in the STANDBY state. 1 = Go to TEMPORARY state 0 = Go to READY state |
| 3 | — | | |
| 2–1 | STATE1–0 | R/W | When read, these bits indicate the current power state:<br>State1 State0 State<br>X 0 READY<br>X 1 STANDBY<br>The system software or user can change the current power state by writing to these bits:<br>State1 State0 State<br>0 0 READY<br>0 1 STANDBY<br>1 0 SUSPEND<br>1 1 OFF |
| 0 | SUSPSEL | R/W | Select 0-V or 5-V SUSPEND state, to be used in conjunction with the above STATE bits. 0 = Select 0-V SUSPEND state 1 = Select 5-V SUSPEND state |

MASK_RESUME Register
Base Address=0A4h

| Bit | Name | Access | Description |
|---|---|---|---|
| 7 | INBLRES | R/W | If this bit is set while the system is in SUSPEND state and the BATLOW input is active the system cannot be resumed. When cleared, forces ONBTN and SRBTN input pullups to be enabled. |
| 6 | RMSKOBTN | R/W | When set, mask the On/Off button input from resuming the system from 0-V suspend or 5-V suspend. |
| 5 | — | R/W | Reserved |
| 4 | RMSKALARM | R/W | Mask the RTC alarm input from resuming the system from 0-V suspend, 5-V suspend, or power up. |
| 3 | RMSKRING | R/W | Mask the modem ring input from resuming the system from 5-V suspend. |

| Bit | Name | Access | Description |
| --- | --- | --- | --- |
| 2 | RMSKKBMS | R/W | Mask the keystroke or the mouse interrupts from resuming the system from 5-V suspend. |
| 1 | RMSKCRDSMI | R/W | Mask the SMI of PCMCIA (CRDSMI) from resuming the system from 5-V suspend. |
| 0 | BLRES | R/W | If this bit is set to 1, a low-to-high transition on BATLOW will resume the system from 5-V suspend. (INBLRES bit must be reset to0.) |

SOURCE_SMI Register
Base Address=0A8h–0AAh

Bits in this register indicate which event triggered the SMI. These bits can be cleared by a write to this register, or set by power management software of FIG. 46.

| Bit | Name | Access | Description |
| --- | --- | --- | --- |
| 23 | SWSMIR | R | This bit indicates that an SMI is generated by software. |
| 22 | — | | |
| 21 | TRPIDE | R | An IDE I/O is trapped. |
| 20 | TRPFDD | R | A FDD I/O is trapped. |
| 19 | TRPCOM1 | R | A serial port (COM1) I/O is trapped. |
| 18 | TRPLPT1 | R | A parallel port (LPT1) I/O is trapped. |
| 17 | TRPPCS0 | R | A programmable chip select (PCS0) is trapped. |
| 16 | TRPPCS1 | R | A programmable chip select (PCS1) is trapped. |
| 15 | BATLOW | R | An SMI is generated by a high-to-low transition on the BATLOW input which will set this bit. |
| 14 | ONOFFBTN | R | This bit indicates that an SMI is generated by the ONBTN input. |
| 13 | SUSPBTN | R | This bit indicates that an SMI is generated by the SRBTN input. |
| 12 | GPSMI | R | This bit indicates that an SMI is generated on the GPSMI pin. |
| 11 | CRDSMI | R | This bit indicates that an SMI is generated on the PCMCIASMI CRDSMI. |
| 10 | PERIODICSMI | R | This bit indicates that a periodic SMI is generated in the STANDBY state. |
| 9–7 | — | | |
| 6 | STDBYTO | R | An SMI is generated by the STANDBY timer timed out. |
| 5 | SUSPTO | R | An SMI is generated by the SUSPEND timer timed out. |
| 4 | VGATO | R | An SMI is generated by the VGA timer timed out. |
| 3 | IDETO | R | An SMI is generated by the IDE timer timed out. |
| 2 | FDDTO | R | An SMI is generated by the FDD timer timed out. |
| 1 | SIUTO | R | An SMI is generated by the Serial/Parallel timer timed out. |
| 0 | PCSTO | R | An SMI is generated by the programmable chip select (s) timer timed out. |

MASK_SMI Register
Base Address=0ACh–0AEh

| Bit | Name | Access | Description |
| --- | --- | --- | --- |
| 23 | SWSMIW | W | A write to this bit will generate an SMI. |
| 22 | — | | |
| 21 | MSKTRPIDE | R/W | Mask the SMI generated by the IDE I/O trap. |
| 20 | MSKTRPFDD | R/W | Mask the SMI generated by the FDD I/O trap. |
| 19 | MSKTRPCOM1 | R/W | Mask the SMI generated by the COM1 I/O trap. |
| 18 | MSKTRPLPT1 | R/W | Mask the SMI generated by the LPT1 I/O trap. |
| 17 | MSKTRPPCS0 | R/W | Mask the SMI generated by the PCS0 trap. |
| 16 | MSKTRPPCS1 | R/W | Mask the SMI generated by the PCS1 trap. |
| 15 | MSKBATLOW | R/W | Mask the SMI generated by the BATLOW input. |
| 14 | MSKONBTN | R/W | Mask the SMI generated by toggling the On/Off button. |
| 13 | MSKSUSPBTN | R/W | Mask the SMI generated by toggling the Suspend/Resume button. |
| 12 | MSKGPSMI | R/W | Mask the SMI generated by the GPSMI input pin. |
| 11 | MSKCRDSMI | R/W | Mask the SMI generated by the PCMCIASMI CRDSMI. |
| 10 | MSKPRDSMI | R/W | Mask the periodic SMI in the STANDBY state. When this bit is not set, a periodic SMI is generated and wakes up the system by enabling the MSKCLK output to CPU; if it is set to 1, the task is performed by System Timer 0, which generates an IRQ0 every 55 ms. |
| 9–8 | SMIPRD1–0 | R/W | Set the time period between two successive periodic SMI's.<br><br>SMIPRD1  SMIPRD0  Time Period<br>0  0  125 ms<br>0  1  250 ms<br>1  0  500 ms<br>1  1  1 second |
| 7 | — | | |
| 6 | MSKSTDBYTO | R/W | Mask the SMI generated by the STANDBY timer timed out. |
| 5 | MSKSUSPTO | R/W | Mask the SMI generated by the SUSPEND timer timed out. |
| 4 | MSKVGATO | R/W | Mask the SMI generated by the VGA timer timed out. |
| 3 | MSKIDETO | R/W | Mask the SMI generated by the IDE timer timed out. |
| 2 | MSKFDDTO | R/W | Mask the SMI generated by the FDD timer timed out. |
| 1 | MSKSIUTO | R/W | Mask the SMI generated by the SIU timer timed out. |
| 0 | MSKPCSTO | R/W | Mask the SMI generated by the programmable chip-select timer timed out. |

MASK_SYSTEM Register
Base Address=0B0h–0B3h

Bits in this register are used to mask system events which are not intended to be monitored by the STANDBY and the SUSPEND timers. When a bit is set to 1 that particular event will be masked.

| Bit | Name | Access | Description |
| --- | --- | --- | --- |
| 31–30 | — | | |
| 29 | STDBYPCI | R/W | Mask PCI events (form the DEVSEL input) off the STANDBY timer event monitoring. |
| 28 | STDBYCSI | R/W | Mask PCMCIA card service interrupts off the STANDBY timer event monitoring. |
| 27 | STDBYVGA | R/W | Mask VGA events (from VGA chip select) off the STANDBY timer event monitoring. |
| 26 | STDBYDMA | R/W | Mask DMA requests off the |

| Bit | Name | Access | Description |
|---|---|---|---|
| 25 | STDBYIDE | R/W | STANDBY timer event monitoring Mask IDE events off the STANDBY timer event monitoring. |
| 24 | STDBYFDD | R/W | Mask FDD events off the STANDBY timer event monitoring. |
| 23 | STDBYPCS0 | R/W | Mask the first programmable chip select (PCS0) events off the STANDBY timer event monitoring. |
| 22 | STDBYPCS1 | R/W | Mask the second programmable chip select (PCS1) events off the STANDBY timer event monitoring. |
| 21 | STDBYCOM1 | R/W | Mask COM1 events (COM1CS + IRQ for COM1) off the STANDBY timer event monitoring. |
| 20 | STDBYLPT1 | R/W | Mask LPT1 events (LPT1CS + IRQ7) off the STANDBY timer event monitoring. |
| 19 | STDBYIRQ9 | R/W | Mask IRQ9 off the STANDBY timer event monitoring. |
| 18 | STDBYIRQ10 | R/W | Mask IRQ10 off the STANDBY timer event monitoring. |
| 17 | STDBYIRQ11 | R/W | Mask IRQ11 off the STANDBY timer event monitoring. |
| 16 | STDBYIRQ15 | R/W | Mask IRQ15 off the STANDBY timer event monitoring. |
| 15 | — | | |
| 14 | SUSPKBMS | R/W | Mask keyboard and mouse interrupts off the STANDBY timer event monitoring. |
| 13 | SUSPPCI | R/W | Mask PCI events off the STANDBY timer event monitoring. |
| 12 | SUSPCSI | R/W | Mask PCMCIA card service interrupts off the STANDBY timer event monitoring. |
| 11 | SUSPVGA | R/W | Mask VGA events off the STANDBY timer event monitoring. |
| 10 | SUSPDMA | R/W | Mask DMA requests off the STANDBY timer event monitoring. |
| 9 | SUSPIDE | R/W | Mask IDE events off the STANDBY timer event monitoring. |
| 8 | SUSPFDD | R/W | Mask FDD events off the STANDBY timer event monitoring. |
| 7 | SUSPPCS0 | R/W | Mask the first programmable chip selece (PCS0) events off the STANDBY timer event monitoring. |
| 6 | SUSPPCS1 | R/W | Mask the second programmable chip select (PCS1) events off the STANDBY timer event monitoring. |
| 5 | SUSPCOM1 | R/W | Mask the serial port (COM1) events off the STANDBY timer event monitoring. |
| 4 | SUSPLPT1 | R/W | Mask the parallel port (LPT1) events off the STANDBY timer event monitoring. |
| 3 | SUSPIRQ9 | R/W | Mask IRQ9 off the STANDBY timer event monitoring. |
| 2 | SUSPIRQ10 | R/W | Mask IRQ10 off the STANDBY timer event monitoring. |
| 1 | SUSPIRQ11 | R/W | Mask IRQ11 off the STANDBY timer event monitoring. |
| 0 | SUSPIRQ15 | R/W | Mask IRQ15 off the STANDBY timer event monitoring. |

MASK_SIU_VGA Register
Base Address=0B4h

| Bit | Name | Access | Description |
|---|---|---|---|
| 7–6 | — | | |
| 5 | MASKPCOM1 | R/W | When the bit is set, COM1 chip select and interrupt events will not affect the SIU power control output. |
| 4 | MASKPLPT1 | R/W | When the bit is set, LPT1 chip select and interrupt events will not affect the SIU power control output. |
| 3–2 | — | | |
| 1 | MASKPKBMS | R/W | When the bit is set, keyboard and mouse interrupt events will not affect the graphics (VGA frame buffer) idle timer. |
| 0 | MASKPVGA | R/W | When the bit is set, VGA frame buffer access events will not affect the graphics idle timer. |

SW_PWR_CNTL Register
Base Address=0B8h

Bits in the register will let the software, instead of the hardware, control the power to peripheral devices. When the odd-number bits in this register are reset to 0 (return control to hardware), the corresponding hardware timer will also be reset.

| Bit | Name | Access | Description |
|---|---|---|---|
| 7 | SWCNTLIDE | R/W | Software control the IDE power output. |
| 6 | SWIDEPWR | R/W | 1 = Turn on the IDE power output. 0 = Turn off the IDE power output. |
| 5 | SWCNTLFDD | R/W | Software control the FDD power output. |
| 4 | SWFDDPWR | R/W | 1 = Turn on the FDD power output. 0 = Turn off the FDD power output. |
| 3 | SWCNTLSIU | R/W | Software control the SIU power output. |
| 2 | SWSIUPWR | R/W | 1 = Turn on the SIU power output. 0 = Turn off the SIU power output. |
| 1 | SWCNTLPCS | R/W | Software control the programmable chip-select power output. |
| 0 | SWPCSPWR | R/W | 1 = Turn on the programmable chip-select power output. 0 = Turn off the programmable chip-select power output. |

PMU_TIMERS Register
Base Address=0BC–0BFh

| Bit | Name | Access | Description |
|---|---|---|---|
| | | PMU_TIMERS Register (continued) | |
| 31–28 | STDBYTMR3–0 | R/W | Set the time-out value of the STANDBY timer. |

| STDBY TMR3 | STDBY TMR2 | STDBY TMR1 | STDBY TMR0 | Time Out |
|---|---|---|---|---|
| 0 | 0 | 0 | 0 | Disable |
| 0 | 0 | 0 | 1 | 2 Seconds |
| 0 | 0 | 1 | 0 | 6 Seconds |
| 0 | 0 | 1 | 1 | 10 Seconds |

-continued

| Bit | Name | Access | Description | | | | |
|---|---|---|---|---|---|---|---|
| | | | 0 | 1 | 0 | 0 | 14 Seconds |
| | | | 0 | 1 | 0 | 1 | 18 Seconds |
| | | | 0 | 1 | 1 | 0 | 22 Seconds |
| | | | 0 | 1 | 1 | 1 | 26 Seconds |
| | | | 1 | 0 | 0 | 0 | 30 Seconds |
| | | | 1 | 0 | 0 | 1 | 1 Minute |
| | | | 1 | 0 | 1 | 0 | 2 Minutes |
| | | | 1 | 0 | 1 | 1 | 3 Minutes |
| | | | 1 | 1 | 0 | 0 | 4 Minutes |
| | | | 1 | 1 | 0 | 1 | 5 Minutes |
| | | | 1 | 1 | 1 | 0 | 10 Minutes |
| | | | 1 | 1 | 1 | 1 | 15 Minutes |
| 27–24 | SUSPTMR3–0 | R/W | Set the time-out value of the SUSPEND timer. | | | | |
| | | | SUSP TMR3 | SUSP TMR2 | SUSP TMR1 | SUSP TMR0 | Time Out |
| | | | 0 | 0 | 0 | 0 | Disable |
| | | | 0 | 0 | 0 | 1 | 1 Minute |
| | | | 0 | 0 | 1 | 0 | 2 Minutes |
| | | | 0 | 0 | 1 | 1 | 3 Minutes |
| | | | 0 | 1 | 0 | 0 | 4 Minutes |
| | | | 0 | 1 | 0 | 1 | 5 Minutes |
| | | | 0 | 1 | 1 | 0 | 6 Minutes |
| | | | 0 | 1 | 1 | 1 | 7 Minutes |
| | | | 1 | 0 | 0 | 0 | 8 Minutes |
| | | | 1 | 0 | 0 | 1 | 9 Minutes |
| | | | 1 | 0 | 1 | 0 | 10 Minutes |
| | | | 1 | 0 | 1 | 1 | 11 Minutes |
| | | | 1 | 1 | 0 | 0 | 12 Minutes |
| | | | 1 | 1 | 0 | 1 | 13 Minutes |
| | | | 1 | 1 | 1 | 0 | 14 Minutes |
| | | | 1 | 1 | 1 | 1 | 15 Minutes |
| 23–20 | TEMPTMR3–0 | R/W | Set the time-out value of the TEMPORARY timer. | | | | |
| | | | TEMP TMR3 | TEMP TMR2 | TEMP TMR1 | TEMP TMR0 | Time Out |
| | | | 0 | 0 | 0 | 0 | Disable |
| | | | 0 | 0 | 0 | 1 | 30 ms |
| | | | 0 | 0 | 1 | 0 | 60 ms |
| | | | 0 | 0 | 1 | 1 | 90 ms |
| | | | 0 | 1 | 0 | 0 | 120 ms |
| | | | 0 | 1 | 0 | 1 | 150 ms |
| | | | 0 | 1 | 1 | 0 | 180 ms |
| | | | 0 | 1 | 1 | 1 | 240 ms |
| | | | 1 | 0 | 0 | 0 | 360 ms |
| | | | 1 | 0 | 0 | 1 | 480 ms |
| | | | 1 | 0 | 1 | 0 | 720 ms |
| | | | 1 | 0 | 1 | 1 | 960 ms |
| | | | 1 | 1 | 0 | 0 | 1.92 ms |
| | | | 1 | 1 | 0 | 1 | 3.84 ms |
| | | | 1 | 1 | 1 | 0 | 7.68 ms |
| | | | 1 | 1 | 1 | 1 | 15.36 ms |
| 19–16 | IDETMR3–0 | R/W | Set the time-out value of the IDE timer. | | | | |
| | | | IDE TMR3 | IDE TMR2 | IDE TMR1 | IDE TMR0 | Time Out |
| | | | 0 | 0 | 0 | 0 | Disable |
| | | | 0 | 0 | 0 | 1 | 1 Minute |
| | | | 0 | 0 | 1 | 0 | 2 Minutes |
| | | | 0 | 0 | 1 | 1 | 3 Minutes |
| | | | 0 | 1 | 0 | 0 | 4 Minutes |
| | | | 0 | 1 | 0 | 1 | 5 Minutes |
| | | | 0 | 1 | 1 | 0 | 6 Minutes |
| | | | 0 | 1 | 1 | 1 | 7 Minutes |
| | | | 1 | 0 | 0 | 0 | 8 Minutes |
| | | | 1 | 0 | 0 | 1 | 9 Minutes |
| | | | 1 | 0 | 1 | 0 | 10 Minutes |
| | | | 1 | 0 | 1 | 1 | 11 Minutes |
| | | | 1 | 1 | 0 | 0 | 12 Minutes |
| | | | 1 | 1 | 0 | 1 | 13 Minutes |
| | | | 1 | 1 | 1 | 0 | 14 Minutes |
| | | | 1 | 1 | 1 | 1 | 15 Minutes |
| 15–12 | FDDTMR3–0 | R/W | Set the time-out value of the FDD timer. | | | | |
| | | | FDD TMR3 | FDD TMR2 | FDD TMR1 | FDD TMR0 | Time Out |
| | | | 0 | 0 | 0 | 0 | Disable |
| | | | 0 | 0 | 0 | 1 | 1 Minute |

-continued

| Bit | Name | Access | Description | | | | |
|---|---|---|---|---|---|---|---|
| | | | 0 | 0 | 1 | 0 | 2 Minutes |
| | | | 0 | 0 | 1 | 1 | 3 Minutes |
| | | | 0 | 1 | 0 | 0 | 4 Minutes |
| | | | 0 | 1 | 0 | 1 | 5 Minutes |
| | | | 0 | 1 | 1 | 0 | 6 Minutes |
| | | | 0 | 1 | 1 | 1 | 7 Minutes |
| | | | 1 | 0 | 0 | 0 | 8 Minutes |
| | | | 1 | 0 | 0 | 1 | 9 Minutes |
| | | | 1 | 0 | 1 | 0 | 10 Minutes |
| | | | 1 | 0 | 1 | 1 | 11 Minutes |
| | | | 1 | 1 | 0 | 0 | 12 Minutes |
| | | | 1 | 1 | 0 | 1 | 13 Minutes |
| | | | 1 | 1 | 1 | 0 | 14 Minutes |
| | | | 1 | 1 | 1 | 1 | 15 Minutes |
| 11–8 | SIUTMR3–0 | R/W | Set the time-out value of the SIUTMR timer. | | | | |
| | | | SIU TMR3 | SIU TMR2 | SIU TMR1 | SIU TMR0 | Time Out |
| | | | 0 | 0 | 0 | 0 | Disable |
| | | | 0 | 0 | 0 | 1 | 1 Minute |
| | | | 0 | 0 | 1 | 0 | 2 Minutes |
| | | | 0 | 0 | 1 | 1 | 3 Minutes |
| | | | 0 | 1 | 0 | 0 | 4 Minutes |
| | | | 0 | 1 | 0 | 1 | 5 Minutes |
| | | | 0 | 1 | 1 | 0 | 6 Minutes |
| | | | 0 | 1 | 1 | 1 | 7 Minutes |
| | | | 1 | 0 | 0 | 0 | 8 Minutes |
| | | | 1 | 0 | 0 | 1 | 9 Minutes |
| | | | 1 | 0 | 1 | 0 | 10 Minutes |
| | | | 1 | 0 | 1 | 1 | 11 Minutes |
| | | | 1 | 1 | 0 | 0 | 12 Minutes |
| | | | 1 | 1 | 0 | 1 | 13 Minutes |
| | | | 1 | 1 | 1 | 0 | 14 Minutes |
| | | | 1 | 1 | 1 | 1 | 15 Minutes |
| 7–4 | PCSTMR3–0 | R/W | Set the time-out value of the PIO timer. | | | | |
| | | | PCS TMR3 | PCS TMR2 | PCS TMR1 | PCS TMR0 | Time Out |
| | | | 0 | 0 | 0 | 0 | Disable |
| | | | 0 | 0 | 0 | 1 | 1 Minute |
| | | | 0 | 0 | 1 | 0 | 2 Minutes |
| | | | 0 | 0 | 1 | 1 | 3 Minutes |
| | | | 0 | 1 | 0 | 0 | 4 Minutes |
| | | | 0 | 1 | 0 | 1 | 5 Minutes |
| | | | 0 | 1 | 1 | 0 | 6 Minutes |
| | | | 0 | 1 | 1 | 1 | 7 Minutes |
| | | | 1 | 0 | 0 | 0 | 8 Minutes |
| | | | 1 | 0 | 0 | 1 | 9 Minutes |
| | | | 1 | 0 | 1 | 0 | 10 Minutes |
| | | | 1 | 0 | 1 | 1 | 11 Minutes |
| | | | 1 | 1 | 0 | 0 | 12 Minutes |
| | | | 1 | 1 | 0 | 1 | 13 Minutes |
| | | | 1 | 1 | 1 | 0 | 14 Minutes |
| | | | 1 | 1 | 1 | 1 | 15 Minutes |
| 3–0 | VGATMR3–0 | R/W | Set the time-out value of the VGA timer. | | | | |
| | | | VGA TMR3 | VGA TMR2 | VGA TMR1 | VGA TMR0 | Time Out |
| | | | 0 | 0 | 0 | 0 | Disable |
| | | | 0 | 0 | 0 | 1 | 1 Minute |
| | | | 0 | 0 | 1 | 0 | 2 Minutes |
| | | | 0 | 0 | 1 | 1 | 3 Minutes |
| | | | 0 | 1 | 0 | 0 | 4 Minutes |
| | | | 0 | 1 | 0 | 1 | 5 Minutes |
| | | | 0 | 1 | 1 | 0 | 6 Minutes |
| | | | 0 | 1 | 1 | 1 | 7 Minutes |
| | | | 1 | 0 | 0 | 0 | 8 Minutes |
| | | | 1 | 0 | 0 | 1 | 9 Minutes |
| | | | 1 | 0 | 1 | 0 | 10 Minutes |
| | | | 1 | 0 | 1 | 1 | 11 Minutes |
| | | | 1 | 1 | 0 | 0 | 12 Minutes |
| | | | 1 | 1 | 0 | 1 | 13 Minutes |
| | | | 1 | 1 | 1 | 0 | 14 Minutes |
| | | | 1 | 1 | 1 | 1 | 15 Minutes |

TONTOFF_ADJ Register
Base Address=0C0h

| Bit | 7 | 6 | 5 | 4 | 3 | 2 | 1 | 0 |
|---|---|---|---|---|---|---|---|---|
| Name | — | TONTOF F6 | TONTOF F5 | TONTOF F4 | TONTOF F3 | TONTOF F2 | TONTOF F1 | TONTOF F0 |
| Default | 0 | 0 | 1 | 1 | 1 | 1 | 1 | 1 |

| Bit | Name | Access | Description |
|---|---|---|---|
| 7 | — | | |
| 6–0 | TONTOFF6–0 | R/W | Set the CPU tun-on and turn-off percentage in the STANDBY state. The MASKCLK signal is always active when all the bits in this register are set to 1, and always inactive if all the bits are reset to 0. |

PWM_INTINSTY Register
Base Address=0C4h

| Bit | Name | Access | Description |
|---|---|---|---|
| 7–4 | — | | |
| 3–0 | PWM3–0 | R/W | Set the 4-bit pulse-width-modulation value for the LCD intensity adjustment. (0h: Off; 0Fh: Full on) |

VGA_DECODE Register
Base Address=0C8h–0CBh

This register defines the VGA standard frame buffer area (located from 0A0000h to 0BFFFFh) and linear frame buffer area (any where in memory space aligned on a 1/2/4-Mbyte boundary).

| Bit | Name | Access | Description |
|---|---|---|---|
| 31–20 | VGAA31–20 | R/W | VGA linear frame buffer base addresses A31–A20. |
| 19–4 | — | | |
| 3–2 | VGALFB1–0 | R/W | Set VGA linear frame buffer block size. <br> VGALFB1 VGAFLB0 Block Size <br> 0 0 Disabled <br> 0 1 1M bytes <br> 1 0 2M bytes <br> 1 1 4M bytes |
| 1–0 | VGASFB1–0 | R/W | Set VGA standard frame buffer area. <br> VGASFB1 VGASFB0 Frame Buffer Area <br> 0 0 Disabled <br> 0 1 0A0000h–0AFFFFh <br> 1 0 0B0000h–0BFFFFh <br> 1 1 0A0000h–0BFFFFh |

MASK_CPUCLK Register

Base Address=0CCh

A write to this register with any value in the STANDBY state will inactivate MASKCLK output and stop the clock to CPU core.

Shadow Registers

The shadow registers maintain the logic states when the system is resumed from suspend states.

| Shadow Registers | Width | Comments |
|---|---|---|
| NMI Mask and RTC Address Register | 8 | |
| DMA Channel 0 Base Register | 16 | |
| DMA Channel 1 Base Register | 16 | |
| DMA Channel 2 Base Register | 16 | |
| DMA Channel 3 Base Register | 16 | |
| DMA Channel 4 Base Register | 16 | |
| DMA Channel 5 Base Register | 16 | |
| DMA Channel 6 Base Register | 16 | |
| DMA Channel 7 Base Register | 16 | |
| DMA Channel 0 Word Count Register | 16 | |
| DMA Channel 1 Word Count Register | 16 | |
| DMA Channel 2 Word Count Register | 16 | |
| DMA Channel 3 Word Count Register | 16 | |

-continued

| Shadow Registers | Width | Comments |
|---|---|---|
| DMA Channel 4 Word Count Register | 16 | |
| DMA Channel 5 Word Count Register | 16 | |
| DMA Channel 6 Word Count Register | 16 | |
| DMA Channel 7 Word Count Register | 16 | |

Shadow Registers

| Shadow Registers | Width | Comments |
| --- | --- | --- |
| DMA Controllers Mask Register | 8 | A bit for each channel indicates if this channel is masked. |
| DMA Channel 0 Mode Register | 6 | |
| DMA Channel 1 Mode Register | 6 | |
| DMA Channel 2 Mode Register | 6 | |
| DMA Channel 3 Mode Register | 6 | |
| DMA Channel 4 Mode Register | 6 | |
| DMA Channel 5 Mode Register | 6 | |
| DMA Channel 6 Mode Register | 6 | |
| DMA Channel 7 Mode Register | 6 | |
| Timer 1 Counter 0 Count Register | 16 | |
| Timer 1 Counter 1 Count Register | 16 | |
| Timer 1 Counter 2 Count Register | 16 | |
| Interrupt Controller 1 ICW2 | 5 | The 3 least significant bits are ignored. |
| Interrupt Controller 1 ICW4 | 7 | The least significant bit (uPM) is always set to 1. |
| Interrupt Controller 1 OCW1 | 8 | |
| Interrupt Controller 1 OCW2 | 8 | |
| Interrupt Controller 1 OCW3 | 8 | |
| Interrupt Controller 2 ICW2 | 5 | The 3 least significant bits are ignored. |
| Interrupt Controller 2 ICW3 | 3 | Only the 3 least significant bits are used. |
| Interrupt Controller 2 ICW4 | 7 | The least significant bit (uPM) is always set to 1. |
| Interrupt Controller 2 OCW1 | 8 | |
| Interrupt Controller 2 OCW2 | 8 | |
| Interrupt Controller 2 OCW3 | 8 | |

A write to a shadowed standard ISA register automatically updates the associated shadow register listed. For the interrupt controller in PPU, each channel has its own LTIM (Level Triggered Interrupt Mode) bit, which should be readable and writable, thus, there is no need for shadowing. For the master interrupt controller in PPU, ICW3 is always programmed as 04h (cascade only one slave interrupt controller, which connects to the IR2 input of the master interrupt controller). Hence, there is no need for shadowing.

The PCU 112 is a PCMCIA Card Controller with PCI Interface as shown in FIG. 18 with the following exemplary features:

Two PCMCIA (Personal Computer Memory Card International Association -compatible) slots with hot insertion/removal Supports ATA interface PCMCIA 2.1/JEIDA (Japan Electronics Industry Development Association) 4.1 exchangeable card architecture compatible Supports both 3.3-V and 5-V cards Programmable interrupt routing Programmable control of supply voltage Vcc and non-volatile memory programming voltage VPP for each card slot Four-deep, 32-bit write buffer Device selection (for cascading) done through PCI configuration registers Interrupt output can be configured to be edge triggered (ISA type) or level triggered Exchangeable card architecture registers are mapped in both the PCI configuration space and I/O space Extension registers mapped in the PCI interface 3.3-V PCI interface and core logic The PCU 112 interfaces two PC cards to the PCI bus 104. The PCU 112 core logic and PCI interface are powered at 3.3 V. The card interfaces are selectively powered at the card VCC to support any combination of 3.3-V and 5-V cards.

All card signals are individually buffered to allow hot insertion and removal without external buffering. The PCU 112 is register compatible with the Intel E 82365SL-DF exchangeable card architecture ExCA (TM) controller and can be cascaded to support up to eight PC card slots. The PCU internal datapath logic allows the host to access 8- and 16-bit cards using full 32-bit PCI cycles for maximum performance. Independent 4-deep by 32-bit write buffers allow fast posted writes to improve system bus utilization.

A low-voltage, submicron CMOS process is utilized to achieve low system power consumption while operating at PCI clock rates up to 33 MHz and higher. A power-down mode allows host software to reduce power consumption further while preserving internal register contents and allowing PC cards to interrupt the host.

PCU 112 has a pin-out as shown in FIG. 57. PCU Signal Terminal Descriptions are tabulated next. Note that dual-function or multiple function pins use a slash "/" or parentheses () to indicate the various signals and features. Since the PCU can be used with remarkably different kinds of cards, such as flash EEPROM memory cards and modem cards, the multiple functionality confers flexibility and economy advantages.

| PIN | | I/O | BUFFER | |
| --- | --- | --- | --- | --- |
| NAME | NO. | TYPE | TYPE | FUNCTION |
| | | | PCI System Terminals | |
| PCLK | 163 | I | CMOS | Bus Clock. Provides timing for all transactions on the PCI bus. |
| RSTIN | 164 | I | CMOS | Reset. Forces the PCU to a known state. |
| | | | PCI Address and Data Terminals | |
| AD31 | 166 | I/O | CMOS | Address/data bus. During the address |
| AD30 | 167 | I/O | 12 mA | phase of a PCI cycle, AD31–AD0 contain a |

-continued

| | | | | |
|---|---|---|---|---|
| AD29 | 168 | I/O | | 32-bit address. During the data phase, |
| AD28 | 169 | I/O | | AD31–AD0 contain data. |
| AD27 | 171 | I/O | | |
| AD26 | 172 | I/O | | |
| AD25 | 173 | I/O | | |
| AD24 | 174 | I/O | | |
| AD23 | 178 | I/O | | |
| AD22 | 179 | I/O | | |
| AD21 | 180 | I/O | | |
| AD20 | 181 | I/O | | |
| AD19 | 183 | I/O | | |
| AD18 | 184 | I/O | | |
| AD17 | 185 | I/O | | |
| AD16 | 186 | I/O | | |
| AD15 | 197 | I/O | | |
| AD14 | 198 | I/O | | |
| AD13 | 199 | I/O | | |
| AD12 | 200 | I/O | | |
| AD11 | 202 | I/O | | |
| AD10 | 203 | I/O | | |
| AD9 | 204 | I/O | | |
| AD8 | 205 | I/O | | |
| AD7 | 208 | I/O | | |
| AD6 | 1 | I/O | | |
| AD5 | 2 | I/O | | |
| AD4 | 3 | I/O | | |
| AD3 | 5 | I/O | | |
| AD2 | 6 | I/O | | |
| AD1 | 7 | I/O | | |
| AD0 | 8 | I/O | | |
| C/BE3 | 175 | I | CMOS | Bus commands C and byte enables BE are |
| C/BE2 | 187 | I | | multiplexed on these PCI pins. During |
| C/BE1 | 196 | I | | the address phase, C/BE3–C/BE0 define |
| C/BE0 | 207 | I | | the bus command. During the data phase, |
| | | | | C/BE3–C/BE0 are used as byte enables. |
| | | | | The byte enables determine which byte |
| | | | | lanes carry meaningful data. C/BE0 |
| | | | | applies to byte 0, and C/BE3 to byte 3. |
| PAR | 194 | O | 12 mA | Parity. During the data phase of PCI |
| | | | | reads, the chip calculates even parity |
| | | | | across AD31–0 and C/BE3–0 and |
| | | | | outputs the result on PAR. |
| FRAME | 188 | I | CMOS | Cycle frame. Driven by the current mas- |
| | | | | ter to indicate the beginning and dura- |
| | | | | tion of an access. FRAME is asserted to |
| | | | | indicate that a bus transaction is be- |
| | | | | ginning. While FRAME is asserted data |
| | | | | transfers continue. When FRAME is |
| | | | | deasserted the transaction is in the |
| | | | | final data phase. |
| TRDY | 191 | O | 12 mA | Target ready. Indicates the PCUs ability |
| | | | | to complete the current data phase of |
| | | | | the transaction. TRDY is used in con- |
| | | | | junction with IRDY. A data phase is com- |
| | | | | pleted on any clock where both TRDY and |
| | | | | IRDY are sampled asserted. During a |
| | | | | read, TRDY indicates that valid data is |
| | | | | present on AD31–AD0. During a write, it |
| | | | | indicates that the PCU is prepared to |
| | | | | accept data. Wait cycles are inserted |
| | | | | until both IRDY and TRDY are asserted |
| | | | | together. |
| IRDY | 189 | I | CMOS | Initiator ready. Indicates the bus |
| | | | | master's ability to complete the current |
| | | | | data phase of the transaction. IRDY is |
| | | | | used in conjunction with TRDY. A data |
| | | | | phase is completed on any clock where |
| | | | | both IRDY and TRDY are sampled asserted. |
| | | | | During a write, IRDY indicates that val- |
| | | | | id data is present on AD31–AD0. During a |
| | | | | read, it indicates that the master is |
| | | | | prepared to accept data. Wait cycles are |
| | | | | inserted until both IRDY and TRDY are |
| | | | | asserted together. |
| STOP | 193 | O | 12 mA | Stop. Indicates that the PCU is request- |
| | | | | ing the PCI bus master to stop the |
| | | | | current transaction. |
| DEVSEL | 192 | O | 12 mA | Device select. When asserted, DEVSEL |
| | | | | indicates that the PCU has decoded its |
| | | | | address as the target of the current |

|  |  |  |  |  | access. |
|---|---|---|---|---|---|
| IDSEL | 176 | I |  | CMOS | Initialization device select. Selects the PCU during configuration accesses. This signal can be connected to one of the upper 24 PCI bus 104 address lines. |

PCMCIA PC Card Interface Controller (Slots A and B)

| NAME | PIN NO. SLOT A* | SLOT B* | I/O TYPE | BUFFER TYPE | FUNCTION |
|---|---|---|---|---|---|
| BVD1 (STSCHG) (RI) | 126 | 63 | I | CMOS | Battery voltage detect 1. Generated by memory PC cards that include batteries. This signal is used with BVD2 as an indication of the condition of the batteries on a memory PC card. Both BVD1 and BVD2 are kept high when the battery is good. When BVD2 is low and BVD1 is high, the battery is weak and needs to be replaced. When BVD1 is low, the battery is no longer servicable and the data in the memory PC card is lost. (Status change). This signal is used to alert the system to changes in the RDY/BSY, WP, or BVD conditions of the I/O PC card. (Ring indicate). This signal is used by modem cards to indicate ring detection. |
| BVD2 (SPKR) | 125 | 62 | I | CMOS | Battery voltage detect 2. Generated by memory PC cards that include batteries. This signal is used with BVD1 as an indication of the condition of the batteries on a memory PC card. Both BVD1 and BVD2 are kept high when the battery is good. When BVD2 is low and BVD1 is high, the battery is weak and needs to be replaced. When BVD1 is low, the battery is no longer serviceable and the data in the memory PC card is lost. (Speaker). This binary audio signal is an optional signal available only when the card and socket have been configured for the I/O interface. The audio signals from card A and B can be combined by the PCU and output on terminal SPKROUT. |
| CA25 | 110 | 48 | O | 2 MA | Card address. Drives PC card address lines. CA25 is the most-significant bit. |
| CA24 | 108 | 46 | O |  |  |
| CA23 | 106 | 44 | O |  |  |
| CA22 | 104 | 42 | O |  |  |
| CA21 | 102 | 40 | O |  |  |
| CA20 | 100 | 38 | O |  |  |
| CA19 | 98 | 36 | O |  |  |
| CA18 | 95 | 33 | O |  |  |
| CA17 | 93 | 31 | O |  |  |
| CA16 | 103 | 41 | O |  |  |
| CA15 | 105 | 43 | O |  |  |
| CA14 | 99 | 37 | O |  |  |
| CA13 | 96 | 34 | O |  |  |
| CA12 | 107 | 45 | O |  |  |
| CA11 | 90 | 28 | O |  |  |
| CA10 | 86 | 23 | O |  |  |
| CA9 | 92 | 30 | O |  |  |
| CA8 | 94 | 32 | O |  |  |
| CA7 | 109 | 47 | O |  |  |
| CA6 | 111 | 49 | O |  |  |
| CA5 | 113 | 51 | O |  |  |
| CA4 | 114 | 52 | O |  |  |
| CA3 | 115 | 53 | O |  |  |

| | | | | |
|---|---|---|---|---|
| CA2 | 118 | 56 | O | |
| CA1 | 119 | 57 | O | |
| CA0 | 120 | 58 | 0 | |

*Terminal name is preceded with A__. As an example, the full name for terminal 126 is A__BVD1.
Terminal name is preceded with B__. As an example, the full name for terminal 63 is B__BVD1.

PCU Signal Terminal Descriptions (Continued)

| NAME | PIN NO. SLOT A* | PIN NO. SLOT B* | I/O TYPE | BUFFER TYPE | FUNCTION |
|---|---|---|---|---|---|
| PCMCIA PC Card Interface Controller (Slots A and B) continued | | | | | |
| IORD | 89 | 27 | O | 2 mA | I/O read. This signal is driven low by the PCU to enable I/O PC card data output during host I/O read cycles. |
| IOWR | 91 | 29 | O | 2 mA | I/O write. This signal is driven low by the PCU to strobe write data into I/O PC cards during host I/O write cycles. |
| OE | 88 | 25 | O | 2 mA | Output enable. This output is driven low by the the PCU to enable memory PC card data output during host memory read cycles. |
| REG | 117 | 55 | O | 2 mA | Attribute memory select. The REG signal remains high for all common memory accesses. When this signal is asserted, access is limited to attribute memory (OE or WE active) and to the I/O space (IORD or IOWR active). Attribute memory is a separately accessed section of card memory and is generally used to record card capacity and other configuration and attribute information. |
| WE/PRGM | 101 | 39 | O | 2 mA | Write enable/program. This output signal is used for strobing memory write data into memory PC cards. This signal is also used for memory PC cards that employ programmable memory technologies. |
| RDY/BSY (IREQ) | 122 | 60 | I | CMOS | Ready/busy. The ready/busy function is provided by the RDY/BSY signal when the PC card and the host socket are configured for the memory-only interface. This input is driven low by the memory PC cards to indicate that the memory card circuits are busy processing a previous write command. This signal is set high when memory PC cards are ready to accept a new data transfer command. (Interrupt request). This signal is asserted by an I/O PC card to indicate to the host that a device on the I/O PC card requires service by the host software. The signal is held at the inactive level when no interrupt is requested. |
| RESET | 112 | 50 | O | 2 mA | PC card reset. Forces a hard reset to a PC card. |
| WAIT | 123 | 61 | I | CMOS | Bus cycle wait. Driven by a PC card to delay completion of the memory or I/O cycle that is in progress. |
| CIS3V | 121 | 59 | I | CMOS | Card is 3.3 volt. This signal indicates if the PC card can be powered at 3.3 volts. Cards that can operate at 3.3 volts should assert CIS3V. Cards that require 5 volts |

PCU Signal Terminal Descriptions (Continued)

| NAME | PIN NO. SLOT A* | SLOT B* | I/O TYPE | BUFFER TYPE | FUNCTION |
|---|---|---|---|---|---|
| | | | | | do not supply an output signal to drive the CIS3V input; therefore an external pullup resistor is connected to CIS3V to prevent this output from floating. |

Terminal name is preceded with A__. As an example, the full name for terminal 91 is A_IOWR. Terminal name is preceded with B__. As an example, the full name for terminal 29 is B_IOWR.

| NAME | PIN NO. SLOT A<sup>⊖</sup> | SLOT B<sup>⊖</sup> | I/O TYPE | BUFFER TYPE | FUNCTION |
|---|---|---|---|---|---|
| | | | | | PCMCIA PC Card Interface Controller (Slots A and B) continued |
| WP IOIS16 | 127 | 64 | I | CMOS | Write protect/Card is 16-bit port. Reflects the status of the write-protect switch on memory PC cards. For I/O cards, WP is used for the 16-bit port (IOIS16) function. The status of the signal can be read in the interface status register. (I/O is 16 bits) This signal is sserted by the PC card when the address on the bus corresponds to an address to which the PC card responds, and the I/O port which is addressed is capable of 16-bit accesses. |
| CD1 | 73 | 10 | I | CMOS | Card detect 1, Card Detect 2. These |
| CD2 | 128 | 65 | I | CMOS | terminals (CD1 and CD2) are connected to ground internally on the PC card. When a PC card is inserted into a socket, these signals are driven low. The signal status is available by reading the Interface Status Register. |
| CE1 | 85 | 22 | O | 2 mA | Card enable 1. CE1 enables even numbered address bytes. |
| CE2 | 87 | 24 | O | | Card enable 2. CE2 enables odd numbered address bytes. |
| CDATA15 | 84 | 21 | I/O | CMOS/ | Card data. CDATA15 is the most |
| CDATA14 | 82 | 19 | I/O | 2 mA | significant bit. |
| CDATA13 | 79 | 16 | I/O | | |
| CDATA12 | 77 | 14 | I/O | | |
| CDATA11 | 75 | 12 | I/O | | |
| CDATA10 | 135 | 72 | I/O | | |
| CDATA9 | 133 | 69 | I/O | | |
| CDATA8 | 130 | 67 | I/O | | |
| CDATA7 | 83 | 20 | I/O | | |
| CDATA6 | 80 | 17 | I/O | | |
| CDATA5 | 78 | 15 | I/O | | |
| CDATA4 | 76 | 13 | I/O | | |
| CDATA3 | 74 | 11 | I/O | | |
| CDATA2 | 134 | 71 | I/O | | |
| CDATA1 | 132 | 68 | I/O | | |
| CDATA0 | 129 | 66 | I/O | | |
| GPI | 136 | 148 | I | CMOS | General purpose input. This input may be used for several purposes: an active-low input indicating that the card VPP line has reached the user specified range, an input indicating a pending card eject or insertion, or as an input source for generating |

-continued

| NAME | PIN NO. SLOT A | PIN NO. SLOT B | I/O TYPE | BUFFER TYPE | FUNCTION |
|---|---|---|---|---|---|
| | | | | | card status-change interrupts. |
| VPP_PGM | 142 | 146 | O | 2 mA | VPP program. Enables the programming voltage onto the card VPP terminal. This terminal is mutually exclusive with VPP_VCC. |
| VPP_VCC | 141 | 145 | O | 2 mA | VPP is VCC. Enables the socket VCC supply onto the card VPP terminal. This terminal is mutually exclusive with VPP_PGM. |
| VCC_3 | 140 | 144 | O | 2 mA | VCC is 3.3 volt. Enables a 3.3-volt supply onto the card VCC terminal. This terminal is mutually exclusive with VCC_5. |
| VCC_5 | 139 | 143 | O | 2 mA | VCC is 5 volt. Enables a 5-volt supply onto the card VCC terminal. This terminal is mutually exclusive with VCC_3. |

Terminal name is preceded with A__. As an example, the full name for terminal 84 is A_CDATA15. Terminal name is preceded with B__. As an example, the full name for terminal 21 is B_CDATA15.

| NAME | PIN NO. | I/O TYPE | BUFFER TYPE | FUNCTION |
|---|---|---|---|---|
| | | Miscellaneous Signals | | |
| TEST | 150 | I | CMOS 100 μA pull down | Test. When asserted, the PCU enters test mode. |
| SPKROUT | 138 | O | 2 mA | Speaker. This output carries the digital audio signal from the PC card. |
| FDC_D7 | 149 | I | CMOS | Floppy disk d7. This signal inputs data bit 7 of the Digital Input Register of the floppy-disk controller. This information is latched only when the location 3F7 (or 377) is read in the I/O space. |
| SMI | 151 | O | 2 mA | PCU SMI request. System management interrupt is asserted. |
| IRQ3 | 152 | O | 4 mA | Interrupt request 3,4,5,7,9, 10,11,12,14,15 signals indicate an interrupt request from one of the cards, routed by request type. |
| IRQ4 | 153 | O | | |
| IRQ5 | 154 | O | | |
| IRQ7 | 155 | O | | |
| IRQ9 | 156 | O | | |
| IRQ10 | 157 | O | | |
| IRQ11 | 158 | O | | |
| IRQ12 | 159 | O | | |
| IRQ14 | 160 | O | | |
| IRQ15 | 161 | O | | |
| | | Power Supply Terminals | | |
| GND | Note (1) | I | — | Device ground terminals. |
| $V_{CCE}$ | 137 | I | — | Power supply terminal for control interface |
| $V_{CCP}$ | Note (2) | I | — | Power supply terminals for PCI interface and core logic. |
| $V_{CCA}$ | Note (3) | I | — | Power supply terminals for card A. |
| $V_{CCB}$ | Note (4) | I | — | Power supply terminals for card B. |

Notes:
(1) Terminals 4, 18, 54, 81, 116, 147, 165, 177, 190, and 201 for ten terminals total.
(2) Terminals 9, 26, 124, 162, 170, 182, 195, and 206 for eight terminals total.
(3) Terminals 97 and 131 for two terminals total. Terminals 35 and 70 for two terminals total.
(4) Terminals 35 and 70 for two terminals total.

PCMCIA 2.1 provides a hardware and software interface standard for connecting credit-card sized memory and I/O cards to personal computers. By implementing compliant card slots, PC makers allow customers to use industry standard PCMCIA memory and I/O cards from many different vendors. The PCMCIA 2.1 standard is an extension of the previous PCMCIA 1.01 and JEIDA 4.1 standards.

PCMCIA cards can have two types of memory: 1) attribute memory containing card configuration registers and data, and 2) common memory that is used by the application. Attribute memory contains the card information structure (CIS) defined by PCMCIA 2.1 that is read by PC system software to determine the capabilities of the card. To allow applications to access card memory, the PC card adapter supports a window-mapping architecture wherein MPU 102 maps areas of card memory into unused areas of the PC memory space. At least five memory windows are implemented for each card slot.

By reading the CIS the PC can determine if a card is memory only or is I/O capable. I/O cards interrupt the host. In FIG. 18, PCU card slot hardware includes logic 1630 to route the single card interrupt output to one of ten PC IRQn interrupt lines. I/O cards generally have a small number of I/O ports which need to be mapped into the PC I/O space for access by device drivers and applications.

The PCU 112 is suitably designed to operate at 3.3 V with card interfaces powered at 3.3 V or 5 V. The card A and B interfaces have separate $V_{cc}$ terminals that are connected to the card $V_{cc}$. This means that both 3.3-V and 5-V cards can be connected directly to the PCU (no external level shifting buffers are needed). Because the card $V_{cc}$ terminals are completely independent, one card can be powered at 5V while the other card is powered at 3.3V.

The PCU outputs two $V_{cc}$ control signals VCC-3 and VCC-5 for each of cards A and B that can be used to control external card power supplies. This allows software to dynamically change card and PCU card interface $V_{cc}$ during device operation. The PCU control interface can also be powered at 3.3V or 5V; however, this is normally hardwired in the system and need not change dynamically although it can be programmed to do so.

In FIG. 18, the PCU interfaces directly to the PCI bus via block 1602 with no external buffering. From a software standpoint the PCU occupies 1) PCI configuration space, 2) I/O space, and 3) 3) memory space. The PCU implements a single PCI configuration space using configuration registers 1616 with a standard 64-byte header region. As to 2), the PCU maps index and data ports at I/O addresses 3E0, 3E1 (or 3E2, 3E3). Host software can program PC card I/O windows at any byte boundary in the first 64 Kbytes of host I/O space. As to 3), host software can program PC card windows at any 4K-byte boundary in a 16M-byte page of PCI memory space. The 16M-byte page is selected using the Memory Window Page register in PCI configuration space.

The PCU has all outputs valid within a predetermined maximum interval, (e.g. 11 nanoseconds) after PCI clock rising-edges. The PCU uses positive address decode to determine if the PCI address falls within any enabled card memory or I/O window or matches the I/O data/index port used to access the compatibility registers 1616. If a match is detected the PCU asserts DEVSEL at the start of a fourth clock cycle as a medium-speed peripheral.

The PCU forces a disconnect by asserting STOP and TRDY together during a first data phase. PCU 112 signals a target abort for I/O cycles where the byte enables output by the bus master correspond to addresses outside the decode hit range. In this case the PCU deasserts DEVSEL and asserts STOP together without asserting TRDY.

All valid PCI cycles that represent a hit to one of the card interfaces are translated to appropriate PCMCIA cycle(s). This includes 8-, 16-, and 32-bit read/write cycles, contiguous or split. Translation depends on the type of card and the card size. The next table shows the number of PCMCIA cycles that will be generated for a given PCI cycle. Once the translation has been selected, the cycle is serialized to the PCMCIA card.

| PCMCIA Cycle Count for Given PCI Cycle | | | | | |
|---|---|---|---|---|---|
| PCI Byte Enables | | | | No. of PCMCIA Cycles | |
| BE3 | BE2 | BE1 | BE0 | 8-Bit Card | 16-Bit Card |
| 1 | 1 | 1 | 1 | 0 | 0 |
| 1 | 1 | 1 | 0 | 1 | 1 |
| 1 | 1 | 0 | 1 | 1 | 1 |
| 1 | 1 | 0 | 0 | 2 | 1 |
| 1 | 0 | 1 | 1 | 1 | 1 |
| 1 | 0 | 1 | 0 | 2 | 2 |
| 1 | 0 | 0 | 1 | 2 | 2 |
| 1 | 0 | 0 | 0 | 3 | 2 |
| 0 | 1 | 1 | 1 | 1 | 1 |
| 0 | 1 | 1 | 0 | 2 | 2 |
| 0 | 1 | 0 | 1 | 2 | 2 |
| 0 | 1 | 0 | 0 | 3 | 2 |
| 0 | 0 | 1 | 1 | 2 | 1 |
| 0 | 0 | 1 | 0 | 3 | 2 |
| 0 | 0 | 0 | 1 | 3 | 2 |
| 0 | 0 | 0 | 0 | 4 | 2 |

PCI cycles are aborted under two I/O cycle conditions, based on the address phase of the cycle. First, the BE3-0 bits can cause a cycle to become invalid. Since an I/O-window setup for each card has byte granularity it is possible for an I/O cycle to stretch across window boundaries once byte lanes have been enabled. For example, the first word of a 32-bit PCI I/O cycle might be within an I/O-window boundary, but the second word could cross the boundary and not be mapped by the card. In this case the cycle will be aborted by the device using PCI bus cycle abort protocol. This scenario is absent in memory cycles which have a 4K-byte window granularity.

Second, the internal state machine performs a check that compares BE3-0 to AD1-0, and confirms the validity of the cycle (ie. the byte enables agree with the lower two bits of the address). If inconsistency is detected, the I/O cycle is invalid and is aborted.

In FIG. 18, PCU 112 block 1602 performs bus cycle conversion between the PCI bus 104 and the PCMCIA bus 1604 and generates all the card address and control signals. When the MPU 102 reads or writes to an enabled memory or I/O window, PCU block 1602 enables the appropriate card interface controller 1610 or 1612 and executes a PCMCIA read or write cycle.

PCMCIA 2.0 specifies that all cards, whether memory or I/O, when first inserted behave as memory cards. This means that I/O cards do not initially respond to I/O cycles and that they drive the dual-function PCMCIA signal pins as memory card signals. After MPU 102 has read the card information structure (CIS) from the card attribute memory it enables I/O capable cards by writing to an on-card Configuration Option Register, whereupon an I/O card drives the dual-function signal pins in the I/O mode. PCU block 1602 interprets these card signals as either memory or I/O mode depending on the value of bit CTYPE in the Interrupt and General Control register in block 1616.

PCU 112 supports an ATA interface defined by PCMCIA release 2.0 and contains special logic for ATA Drive Address register b7. The standard PC/AT I/O address for the ATA hard disk Drive Address register is the same as the address for the floppy disk Drive Status register if both drives are at the primary (3F7) or secondary (377) locations. During reads from this address the ATA drive supplies bits 6–0 and the floppy drive supplies bit 7, the disk change bit. In PC/AT computer architecture, the floppy and hard disks are connected to the same physical data bus. The floppy disk acts to drive bit d7 and three-states (electrically floats) its outputs d6 through d0. The hard disk three-states the d7 output but drives outputs d6 through d0. In a system with an ATA drive connected via PCMCIA and the floppy drive connected to a separate system peripheral bus, PCU 112 inputs d7 from the system floppy-disk controller and outputs d7 on the PCI bus during reads from the ATA Drive Address register. I/O addresses 3F7 and 377 are configured as read only so that PCU 112 does not respond during writes to the floppy disk. Both features are enabled by setting bit ATAEN in the special Miscellaneous Register in block 1616.

Turning to Power Down Mode, software sets b0 PWRDN in the Global Control register. In power-down mode all PCMCIA outputs and bidirectionals are three-stated. These terminals are: A_CA[25:0], A_CDATA[15:0], A_IORD, A_IOWR, A_REG, A_OE, A_WE/PRGM, A_RESET, A_CE1, A_CE2 B_CA[25:0], B_CDATA[15:0], B_IORD, B_IOWR, B_REG, A_OE, B_WE/PRGM, B_RESET, B_CE1, B_CE2

All other terminals function as in normal operation. All internal registers retain their contents and are fully accessible via PCI bus 104. All card and status-change interrupts remain enabled. PCU 112 responds to PCI card accesses but does not execute the cycles on the PCMCIA interface.

PCU 112 maps areas of card memory into the host memory space. Ten independent memory windows with five dedicated to each of cards A and B start and stop on any 4K-byte address boundary above the first 64K bytes in host memory and can access 16-bit or 8 bit card memory. These five windows are defined by five (5) sets of six (6) registers per card in block 1616 tabulated later hereinbelow as Memory-Window (0,1,2,3, or 4) Start/End/Offset Address Low/High Byte Registers. Programmable address offsets allow each window to be located anywhere in the 64M-byte card memory space whatever its position in host memory space.

Memory windows are mapped to either the card attribute or common memory spaces. For cards A and B, MPU 102 suitably sets up one window to access the card information structure (CIS) located in attribute memory and another window to access data stored in common memory.

Each memory window has the above-mentioned set of six internal registers associated with it that define its size, location, offset, data width, and cycle attributes. Most of the register bits are used to program the host memory-window start and end addresses and the card memory offset. The window start and end addresses are 14 bits long and correspond to host address bits AD23-12 to give a minimum window resolution of 4K bytes. The offset address is 2 bits longer and corresponds to card address bits CA25-12.

The PCU also contains 2 page registers, 1 for each of card A and card B. that allow the memory windows to be located above the first 16M bytes of system address space. The system address bits AD31-24 are compared with the page register values, and if they match, PCU 112 memory-window decode logic is enabled. This allows the PCMCIA memory windows to be located in any of the 256 separate 16M-byte pages that make up the 4 G (giga) byte PCI address space.

The start and end addresses for the window in card memory are calculated by adding the offset to the host memory start and end addresses. For each host memory-window access the PCU adds the offset to the incoming host address to generate the correct 26-bit card address. A PCU adder in block 1602 wraps around to zero at the top of the 64M-byte card address space to allow both positive and negative address offsets using 2s complement arithmetic.

Also, PCU 112 maps areas of card I/O space into the host I/O space. Four independent I/O windows with two dedicated to each of cards A and B start and stop on any byte address boundary inside the first 64K bytes in host memory and can access 16-bit or 8-bit card ports.

To allow I/O remapping, cards should decode only the minimum number of card address lines required to address the number of I/O locations they have. This means that an I/O card with six I/O locations should decode CA0, CA1, and CA2 and ignore all higher address bits. The PCMCIA INPACK signal need not be supported by PCU 112 and I/O cards are accessed when the MPU 102 host I/O address falls inside the I/O start and end address range.

Each I/O window has a set of four internal registers (respectively, for each card A and B in block 1616 tabulated later herein as I/O window (0,1) Start/End Low/High Byte Register. The registers define I/O window size, location, data width, and cycle attributes. Most of the register bits are used to program the host I/O-window start and end addresses. The window start and end addresses are 16 bits long and correspond to host address bits AD15-0 to give a minimum window resolution of 1 byte.

Turning to the subject of interrupts, as shown in FIG. 38, PCU 112 generates three types of interrupts:

1) I/O card interrupts. PC cards, configured in I/O mode, output level mode interrupts or pulse (edge) mode interrupts on PCMCIA terminal RDY/BSY (IREQ).
2) Status-change interrupts. These occur when card signals RDY/BSY(IREQ), BVD1(STSCHG), BVD2 (SPKR) or card detect lines CD1,CD2 change state.
3) Ring Indicate. The ring indicate from PC modem cards can be used to generate a System Management Interrupt SMI to wake up the host.

In I/O Card Interrupts, the PCU independently routes card A and B I/O interrupts to any of terminals IRQ3, 4, 5, 7, 9,10,11,12,14, or 15. The card interrupts on RDY/BSY (IREQ) can be level or pulse (edge) mode, depending on the type of card used. In both cases the card asserts RDY/BSY (IREQ) active low. In the case of level-mode interrupts the card drives RDY/BSY(IREQ) low until the interrupt has been serviced by the host. In the case of pulse-mode interrupts the card deasserts RDY/BSY(IREQ) after a fixed delay.

After device reset the PCU 112 is set up by default to invert the incoming card interrupt before outputting it on the selected IRQ terminal. The IRQ terminal is active high and outputs a positive edge interrupt for PC-AT compatible hosts from active low card A or B pulse-mode and level-mode interrupts on RDY/BSY(IREQ).

For host systems that support level-mode interrupts, the PCU card slot is programmed for level mode by setting AIREQLM or BIREQLM in the Global Control register to disable the default interrupt inversion. The MPU 102 is also programmed for level mode by setting bit LevIREQ in the card Configuration Option register. In this configuration IRQ is driven low until the card A or B deasserts RDY/BSY (IREQ) following interrupt service.

The PCU 112 IRQ outputs are push-pull meaning that the interrupt lines are actively driven during both high-level and low-level output states. In systems that support shared level-mode interrupts, external three-state buffers are connected between the PCU and the shared interrupt line. The buffer data input and active-low enable are both driven by the selected IRQ to give an open-drain output for interrupt sharing.

In Status Change Interrupts, the PCU independently and programmably routes card A and B status-change interrupts to any of terminals IRQ3, 4, 5, 7, 9, 10, 11, 12, 14, 15 or to SMI. All interrupts can be output as level or pulse mode. The events that can cause status-change interrupts depend on whether the card is configured as an I/O or memory card. For I/O-configured cards the events that can be programmed to be recognized as a card status change (CSC) are: battery voltage detect input, BVD1(STSCHG), low indicatin a change in battery voltage, write protect, or ready/busy status.

For memory-configured cards the CSC events can be programmed for: one or both of battery voltage detect inputs, BVD1(STSCHG) and/or BVD2(SPKR), low indicating battery deterioration, or ready/busy input, RDY/BSY (IREQ), transition indicating ready/busy status change.

For either I/O or memory cards: one or both card-detect inputs, CD1 and/or CD2, transition indicating card insertion or removal In the default pulse (edge) mode the IRQ outputs are driven active high as soon as a status change is detected. This provides MPU 112 with a positive edge to trigger an interrupt. For host system embodiments that support level-sensitive interrupts, the PCU 112 is programmed for level mode by setting CSCLM in the Global Control register. In this mode the selected IRQ is driven active low when a status change occurs.

To determine the source of any card status-change interrupt, MPU 102 reads the flag bits in the Card Status Change register in PCU 112 (see next table). The flags can either be cleared automatically by the read operation itself, or explicitly by writing a 1 to the flag. This option is controlled by bit XWBCSC in the Global Control register. When all flags have been cleared, the selected IRQ is returned to the inactive state.

In FIG. 31, The system management interrupt (SMI) output is an open-drain interrupt that is programmably used to signal card-status changes (CSC) or modem-ring detection to the host. Card status-change interrupts can be routed to SMI by setting bit SMIEN in the Interrupt and General Control register. SMI is asserted active low when any card-status change occurs and remains low until all status-change-interrupt flags have been cleared.

Modem-ring indicate is input on BVD1 (STSCHG) (RI) and used to generate SMI interrupts. The mechanism is enabled by setting bit CRIEN in the Interrupt and General Control register and setting bit RISMI in the TI Miscellaneous register. When BVE1 (STSCHG) (RI) goes from high to low, the ring indicate interrupt flag, RISTAT bit in the TI Miscellaneous register, is set and SMI is asserted active low.

In FIG. 31, CSC flags are stored in CSC registers for cards A and B. These CSC flags are fed to the inputs of NAND gates 2672 or 2674 for the respective card A or B. If any of the CSC flags goes low, the corresponding NAND gate 2672 or 2674 produces a high active output A_CSC or B_CSC which are respectively fed to inputs of corresponding NAND gates 2676 and 2678. The SMIEN bits in the Interrupt and General Control Registers for cards A and B are respectively fed to corresponding second inputs of NAND gates 2676 and 2678. The output of each of the NAND gates 2676, 2678, and of two more NAND gates 2680 and 2682 are all fed to four inputs of a NAND gate 2684 which supplies an inverter 2686 to produce the low-active SMI# output. A NAND gate 2688 has one input connected to the output of NAND gate 2684 and a second input enabled by a test signal TESTZ, to produce an output SMIENZ#.

Two registers called TI Miscellaneous Registers for cards A and B have RISTAT (Ring Indicator Status) and RISMI (Ring Indicator SMI) bits which are fed to inputs of NAND gates 2680 and 2682 for cards A and B. CRIEN enable bits in the A and B Interrupt and General control Registers respectively enable the NAND gates 2680 and 2682.

Modem-ring indicate is input on BVD1(STSCHG)(RI) and used to generate SMI interrupts. The mechanism is enabled by setting bit CRIEN in the Interrupt and General Control register and setting bit RISMI in the TI Miscellaneous register. When BVD1(STSCHG)(RI) goes from high to low, the ring indicate interrupt flag, RISTAT bit in the TI Miscellaneous register, is set and SMI is asserted active low.

In FIG. 31, the described circuitry establishes advantageous system flexibility by allowing system software to set the various flags and enables as may be desired by the system designer. The system management interrupt SMI circuitry on the PCU 112, PPU 110 and MPU 102, as well as the display controller 114, recognizes that the different system power management signals in particular areas of the system lend themselves to special groupings in which the logic circuitry can be concentrated or partitioned onto the particular integrated circuit chips, with the result of flexible and effective system management power control with remarkably few interconnections between chips. Put another way, the partitioning of the SMI system among the chips of system 100 recognizes that a multitude of power-management relevant signal sources can have their information condensed down to just one or a few pin-out signals for communication between the chips. In this way, the embodiment realizes distributed power management functions in a flexible and inexpensive power management system.

In FIGS. 38 and 18, the PCU 112.1 allows I/O card interrupts and card status-change (CSC) interrupts for card A and card B to be routed by selector logic 3810 in block 1630 to any of terminals IRQ3, 4, 5, 7, 9, 10, 11, 12, 14, or 15. The routing is selected by programming the SINT3-0 and CINT3-0 fields in the Interrupt and General Control register IGC and the Card Status Change Interrupt Configuration (ICR) register in block 1616. These registers are duplicated for cards A and B. If more than one interrupt is to be routed to the same IRQ terminal, the PCU 112.1 logically combines them to produce a shared interrupt. To do this the PCU 112.1 determines whether the combined interrupt should be pulse mode (active high) or level mode (active low). The rule implemented in a preferred embodiment is that if any of the interrupts routed to an IRQ are programmed to be level mode (active low) then all the interrupts routed to this terminal will be level mode. In this case the interrupts are logically ANDed in logic 3810 of block 1630 to generate the IRQ.

In a typical PC system all I/O card and Card Status Change interrupts will probably be programmed as pulse (edge) mode (active high). In this case the interrupts are logically NORed to generate the IRQ, interrupts may mask each other if the host is edge sensitive rather than level sensitive. In an advantageous method the interrupt service routine for the system polls all cards and PCU card status-change flags before terminating to check for new interrupts.

For systems that support level-mode interrupts, all I/O card and card status-change interrupts routed to a common IRQ are suitably programmed as level mode. The I/O card interrupts from the card A or B are also programmed as level mode by setting bit LevIREQ in the card Configuration Option register. In this case the interrupts are logically ANDed together to generate the composite level mode IRQ.

For systems requiring more than two PC card slots, multiple PCUs 112.0, 112.1, 112.2 . . . 112.n of FIG. 38 are advantageously connected in parallel. To avoid I/O access conflicts the PCUs are assigned different addresses and index ranges. This is done by programming the IOSEL and DEVID bits in the special Initialization register in the Extension Register group during system configuration as tabulated next. (The Initialization Register bits are described later hereinbelow).

| PCU Device Number | IOSEL Bit | DEVID Bit | Index/Data | Index Range |
| --- | --- | --- | --- | --- |
| 112.0 | 0 | 0 | 3E0h/3E1h | 00h–3Fh |
| 112.1 | 0 | 1 | 3E0h/3E1h | 40h–7Fh |
| 112.2 | 1 | 0 | 3E2h/3E3h | 00h–3Fh |
| 112.3 | 1 | 1 | 3E2h/3E3h | 40h–7Fh |

To avoid index register bus conflicts between devices 112.0, 112.1, 112.2 and 112.3, each PCU implements a special register shadowing scheme. Depending on how the IOSEL and DEVID bits are programed, the PCU will either respond directly to index register accesses (devices 0 and 2), or will passively shadow index writes without driving any PCI signals (devices 1 and 3). When PCUs are added to a system the device numbers (encoded in IOSEL and DEVID) should be used in the sequence 0, 1, 2, 3 or 2, 3, 0, 1 to ensure that one device always responds to index register accesses.

With several PCUs working in parallel, the device interrupt outputs are suitably combined in FIG. 38 for connection to the interrupt controller of FIG. 43. The SMI outputs are open drain and are connected directly in a wired OR arrangement with an external pullup. The device IRQ outputs are push-pull and when configured in pulse mode (active high) are ORed together in an external PAL or logic chip. For host systems that support shared level-mode interrupts, the multiple PCU IRQ outputs are paralleled using external three-state buffers to implement common system interrupt lines. The buffer data input and active-low enable are both driven by the selected IRQ to give an open-drain output for interrupt sharing.

In FIG. 18, block 1602 of PCU 112, implements a single 256 byte PCI configuration space with a header region occupying the bottom 64 bytes. The PCU maps all registers in the next table into the top 128 bytes of configuration space. Some of the remaining 64 bytes are used for the special Extension registers.

The MPU 102 accesses the PCU 112 configuration register space using PCI configuration read and write cycles. During the address phase of a configuration cycle, the host PCI bridge 716 asserts an address on lines AD31-11 of bus 104 depending on which device the MPU 102 wants to access. PCU input pin IDSEL is connected to the AD bus line corresponding to the physical PCI device number assigned to the PCU. Address bits AD10-8 carry the functional PCI device number and are ignored by the PCU which is a single-function device. Address bits AD7-2 carry the doubleword address of any configuration register and are decoded internally by the PCU 112.

In block 1602 of FIG. 18, a read/write 8-bit index register receives the bus 104 AD address for one of 256 locations in block 1616. Data goes from bus 104 to an 8-bit read/write data register. To access any register MPU 102 writes an index value to the index register and then either reads or writes the data register.

The following table shows the index offset for each register in configuration block 1616 together with the corresponding address in PCI configuration space, followed by charts for the Extension Registers.

| Name | Socket A PCI Address | Socket B PCI Address | Socket A Index Offset | Socket B Index Offset |
|---|---|---|---|---|
| Identification and Revision register | 80 | C0 | 00 | 40 |
| Interface Status register | 81 | C1 | 01 | 41 |
| Power and RESETDRV Control register | 82 | C2 | 02 | 42 |
| Interrupt and General Control register | 83 | C3 | 03 | 43 |
| Card Status Change register | 84 | C4 | 04 | 44 |
| Card Status Change Interrupt Configuration register | 85 | C5 | 05 | 45 |
| Address Window Enable register | 86 | C6 | 06 | 46 |
| I/O-window Control register | 87 | C7 | 07 | 47 |
| I/O-Window 0 Start-Address Low-Byte register | 88 | C8 | 08 | 48 |
| I/O-Window 0 Start-Address High-Byte register | 89 | C9 | 09 | 49 |
| I/O-Window 0 End-Address Low-Byte register | 8A | CA | 0A | 4A |
| I/O-Window 0 End-Address High-Byte register | 8B | CB | 0B | 4B |
| I/O-Window 1 Start-Address Low-Byte register | 8C | CC | 0C | 4C |
| I/O-Window 1 Start-Address High-Byte register | 8D | CD | 0D | 4D |
| I/O-Window 1 End-Address Low-Byte register | 8E | CE | 0E | 4E |
| I/O-Window 1 End-Address High-Byte register | 8F | CF | 0F | 4F |
| Memory-Window 0 Start-Address Low-Byte register | 90 | D0 | 10 | 50 |
| Memory-Window 0 Start-Address High-Byte register | 91 | D1 | 11 | 51 |
| Memory-Window 0 End-Address Low-Byte register | 92 | D2 | 12 | 52 |
| Memory-Window 0 End-Address High-Byte register | 93 | D3 | 13 | 53 |
| Memory-Window 0 Offset-Address Low-Byte register | 94 | D4 | 14 | 54 |
| Memory-Window 0 Offset-Address High-Byte register | 95 | D5 | 15 | 55 |
| Card Detect and General Control Register register | 96 | D6 | 16 | 56 |
| Reserved | 97 | D7 | 17 | 57 |
| Memory-Window 1 Start-Address Low-Byte register | 98 | D8 | 18 | 58 |
| Memory-Window 1 Start-Address High-Byte register | 99 | D9 | 19 | 59 |
| Memory-Window 1 End-Address Low-Byte register | 9A | DA | 1A | 5A |
| Memory-Window 1 End-Address High-Byte register | 9B | DB | 1B | 5B |
| Memory-Window 1 Offset-Address Low-Byte register | 9C | DC | 1C | 5C |
| Memory-Window 1 Offset-Address High-Byte register | 9D | DD | 1D | 5D |
| Global Control register | 9E | DE | 1E | 5E |
| Reserved | 9F | DF | 1F | 5F |
| Memory-Window 2 Start-Address Low-Byte register | A0 | E0 | 20 | 60 |
| Memory-Window 2 Start-Address High-Byte register | A1 | E1 | 21 | 61 |
| Memory-Window 2 End-Address Low-Byte register | A2 | E2 | 22 | 62 |
| Memory-Window 2 End-Address High-Byte register | A3 | E3 | 23 | 63 |
| Memory-Window 2 Offset-Address Low-Byte register | A4 | E4 | 24 | 64 |
| Memory-Window 2 Offset-Address High-Byte register | A5 | E5 | 25 | 65 |
| Reserved | A6 | E6 | 26 | 66 |

-continued

| Name | Socket A PCI Address | Socket B PCI Address | Socket A Index Offset | Socket B Index Offset |
|---|---|---|---|---|
| Reserved | A7 | E7 | 27 | 67 |
| Memory-Window 3 Start-Address Low-Byte register | A8 | E8 | 28 | 68 |
| Memory-Window 3 Start-Address High-Byte register | A9 | E9 | 29 | 69 |
| Memory-Window 3 End-Address Low-Byte register | AA | EA | 2A | 6A |
| Memory-Window 3 End-Address High-Byte register | AB | EB | 2B | 6B |
| Memory-Window 3 Offset-Address Low-Byte register | AC | EC | 2C | 6C |
| Memory-Window 3 Offset-Address High-Byte register | AD | ED | 2D | 6D |
| Reserved | AE | EE | 2E | 6E |
| Reserved | AF | EF | 2F | 6F |
| Memory-Window 4 Start-Address Low-Byte register | B0 | F0 | 30 | 70 |
| Memory-Window 4 Start-Address High-Byte register | B1 | F1 | 31 | 71 |
| Memory-Window 4 End-Address Low-Byte register | B2 | F2 | 32 | 72 |
| Memory-Window 4 End-Address High-Byte register | B3 | F3 | 33 | 73 |
| Memory-Window 4 Offset-Address Low-Byte register | B4 | F4 | 34 | 74 |
| Memory-Window 4 Offset-Address High-Byte register | B5 | F5 | 35 | 75 |
| Reserved | B6 | F6 | 36 | 76 |
| Reserved | B7 | F7 | 37 | 77 |
| Reserved | B8 | F8 | 38 | 78 |
| Reserved | B9 | F9 | 39 | 79 |
| Reserved | BA | FA | 3A | 7A |
| Reserved | BB | FB | 3B | 7B |
| Reserved | BC | FC | 3C | 7C |
| Reserved | BD | FD | 3D | 7D |
| Reserved | BE | FE | 3E | 7E |
| Reserved | BF | FF | 3F | 7F |

General Setup Registers

Identification and Revision Register

| PCI Addresses (hex): | Socket A: 80 Socket B: C0 | Offset (hex): | Socket A: 00 Socket B: 40 |
|---|---|---|---|

System software tests this register to enable interface processes.

| Bit | Name | Access | Description |
|---|---|---|---|
| 7–6 | IFTYPE1–0 | R | Hardwired to 10. |
| 5–4 | — | R | Reserved. |
| 3–0 | COMP3–0 | R | Hardwired to 0100. |

Interface Status Register

| PCI Addresses (hex): | Socket A: 81 Socket B: C1 | Offset (hex): | Socket A: 01 Socket B: 41 |
|---|---|---|---|

The read-only interface status register provides the current status of the card A or B socket interface signals.

| Bit | Name | Access | Description |
|---|---|---|---|
| 7 | GPI | R | VPP valid. Indicates the state of the GPI pin.<br>0 = GPI pin is 1.<br>1 = GPI pin is 0. |
| 6 | CPOWER | R | PC card power active. Indicates the current power status of the socket.<br>0 = Power to the socket is turned off.<br>1 = Power is provided to the socket. Outputs VCC_5, VCC_3, VPP_PGM, VPP_VCC are set according the Power Control Register bits tabulated in the next chart. |
| 5 | RDYBSY | R | Ready/Busy. Indicates the ready/busy condition of the PC card.<br>0 = PC card is busy.<br>1 = PC card is ready. |
| 4 | CWP | R | Memory write protect. Bit value is the logic level of the WP signal on the memory PC card interface.<br>0 = WP input is 0. Card is read and write.<br>1 = WP input is 1. Card is read only. However, memory write access to the slot will not be blocked unless the write protect bit in the associated Card Memory Offset Address high-byte register is also set to one. |
| 3 | CD2 | R | Card detect 2. With card detect 1 indicates that a card is present in the socket and fully seated.<br>0 = CD2 input is 1.<br>1 = CD2 input is 0 (card inserted). |
| 2 | CD1 | R | Card detect 1. With card detect 2 indicates that a card is present in the socket and fully seated.<br>0 = CD1 input is 1.<br>1 = CD1 input is 0 (card inserted). |
| 1–0 | BVD2–1 | R | Battery voltage detect 2 and 1. These bits reflect the vaue of input pins BVD1(STSCHG) and BVD2(SPKR).<br>BVD2 BVD1 Battery Voltage<br>0 0 Battery dead.<br>1 0 Battery dead.<br>0 1 Battery replacement warning<br>1 1 Battery good. |
| 0 | STS | R | For I/O PC cards, this bit indicates the status of the STSCHG/RI signal from the PC card when the ring indicate enable bit in the interrupt and general control register is set to 0. |

Power and RESETDRV Control Register

| PCI Addresses (hex): | Socket A: 82 Socket B: C2 | Offset (hex): | Socket A: 02 Socket B: 42 |
|---|---|---|---|

This read/write register controls the PC card power.

| Bit | Name | Access | Description |
|---|---|---|---|
| 7 | COE | R/W | Output enable.<br>0 = PC card outputs CADR25–0, CE1, CE2, IORD, OE, REG, RESET, WE, DATA15–0 to 3-state (floating)<br>1 = PC card outputs (as above) enabled |
| 6 | — | R/W | Reserved. |
| 5 | AUTOPWR | R/W | Auto power switch enable.<br>0 = Automatic socket power switching disabled.<br>1 = Automatic socket power switching enabled. |
| 4–3 | VCC1–0 | R/W | VCC control bits. These bits control card VCC using outputs VCC_5 and VCC_3.<br><br>VPP1 VPP0　　VPP_PGM VPP Voltage<br>　0　　0　0　　0　No connect.<br>　0　　1　0　　0　Reserved<br>　1　　0　1　　0　5 V<br>　1　　1　0　　1　3.3 V |
| 2 | — | R/W | Reserved. |
| 1–0 | VPP1–0 | R/W | VPP control bits. These bits control card VPP using outputs VPP_PGM and VPP_VCC.<br><br>VPP1 VPP0　VPP_PGM　VPP_VCC VPP Voltage<br>　0　　0　　0　　　0　No connect<br>　0　　1　　0　　　1　5 V<br>　1　　0　　1　　　0　12 V<br>　1　　1　　0　　　0　Reserved |

Card Status Change Register

| PCI Addresses (hex): | Socket A: 84<br>Socket B: C4 | Offset (hex): | Socket A: 04<br>Socket B: 44 |
|---|---|---|---|

The Status Card Change Register contains flag bits for each type of the card status change. Each Flag can be enabled as an interrupt source by writing to the Card Status Change Interrupt Configuration register. The status flags can be cleared automatically by a register read or explicitly by writing a zero (0) to each set flag. The method used depends on whether bit XWBCSC in the Global Control register is set clear. If the card status change interrupt is enabled to one of the system bus interrupt request lines, the corresponding IRQ signal remains active high until the register is read.

| Bit | Name | Access | Description |
|---|---|---|---|
| 7–5 | — | R/W | Reserved |
| 4 | GPICHG | R | GPI change.<br>0 = No change detected on GPI signal.<br>1 = A change has been detected on GPI signal. |
| 3 | CDCHG | R | Card detect change.<br>0 = No change detected on either CD1 or CD2 signals.<br>1 = A change has been detected on either CD1 or CD2 signals. |
| 2 | RDYCHG | R | Ready change.<br>0 = No low-to-high change detected on RDY/BSY.<br>1 = Detected low-to-high change of the RDY/BSY signal indicating that the memory PC card is ready to accept new data transfer. |
| 1 | BWARN | R | Battery warning.<br>0 = Battery-warning condition not detected<br>1 = Battery-warning condition detected |

-continued

| Bit | Name | Access | Description |
|---|---|---|---|
| 0 | BDEAD | R | Battery dead.<br>0 = Battery-dead condition not detected<br>1 = Battery-dead condition detected |

Address Window Enable Register

| PCI Addresses (hex): | Socket A: 82<br>Socket B: C6 | Offset (hex): | Socket A: 06<br>Socket B: 46 |
|---|---|---|---|

The address window enable register controls the enabling of the memory and I/O-mapping windows to the PC card memory or I/O space.

I/O window enables control I/O accesses within the I/O address for the window specified. When PC card enables are generated, I/O accesses pass addresses from the system bus directly through to the PC Card

| Bit | Name | Access | Description |
|---|---|---|---|
| 7 | IW1EN | R/W | I/O-window 1 enable.<br>0 = Disable.<br>1 = Enable |
| 6 | IW0EN | R/W | I/O-window 0 enable.<br>0 = Disable<br>1 = Enable. |
| 5 | — | R/W | Reserved |
| 4 | MW4EN | R/W | Memory-window 4 enable.<br>0 = Disable.<br>1 = Enable. |
| 3 | MW3EN | R/W | Memory-window 3 enable.<br>0 = Disable.<br>1 = Enable. |
| 2 | MW2EN | R/W | Memory-window 2 enable.<br>0 = Disable.<br>1 = Enable. |
| 1 | MW1EN | R/W | Memory-window 1 enable.<br>0 = Disable.<br>1 = Enable. |
| 0 | MW0EN | R/W | Memory-window 0 enable. |

-continued

| Bit | Name | Access | Description |
|---|---|---|---|
| | | | 0 = Disable.<br>1 = Enable. |

Global Control Register

| PCI Addresses (hex): | Socket A: 9E<br>Socket B: DE | Offset (hex): | Socket A: 1E<br>Socket B: 5E |
|---|---|---|---|

| Bit | Name | Access | Description |
|---|---|---|---|
| 7-5 | — | R/W | Reserved |
| 4 | BIREQLM | R/W | Card B IREQ level mode interrupt enable.<br>0 = B_IREQ is pulse mode.<br>1 = B_IREQ is level mode |
| 3 | AIREQLM | R/W | Card A IREQ level mode interrupt enable.<br>0 = A_IREQ is pulse mode.<br>1 = A_IREQ is level mode |
| 2 | XWBCSC | R/W | Explicit write back of card status change interrupt acknowledge.<br>0 = CSC interrupts cleared by read of Card Status Change Register.<br>1 = SCS interrupts cleared by explicit write back of 1 to status flags in Card Status Change Register. |
| 1 | CSCLM | R/W | CSC level mode interrupt enable.<br>0 = CSC interrupts are pulse mode.<br>1 = CSC interrupts are level mode. |
| 0 | PWRDN | R/W | Chip power down.<br>0 = Normal operation.<br>1 = Power down enabled. |

Card Detect and General Control Register

| CI Addresses (hex): | Socket A: 96<br>Socket B: D6 | Offset (hex): | Socket A: 16<br>Socket B: 56 |
|---|---|---|---|

| Bit | Name | Access | Description |
|---|---|---|---|
| 7-4 | — | R/W | Reserved |
| 3 | GPITRAN | R/W | GPI transition control.<br>0 = GPI high to low transition causes CSC interrupt.<br>1 = GPI low to high transition causes CSC interrupt. |
| 2 | GPIEN | R/W | GPI enable.<br>0 = CSC interrupts from GPI disabled.<br>1 = CSC interrupts from GPI enabled. |
| 1 | CONFRES | R/W | Configuration reset enable.<br>0 = Normal operation.<br>1 = Reset configuration registers for slot when CD1 and CD2 go high. |
| 0 | — | R/W | Reserved. |

Interrupt Register

Interrupt and General Control Register

| PCI Addresses (hex): | Socket A: 83<br>Socket B: C3 | Offset (hex): | Socket A: 03<br>Socket B: 43 |
|---|---|---|---|

This read/write Interrupt and General Control register controls the interrupt steering for the PC card I/O interrupt as well as general control of the PCU.

| Bit | Name | Access | Description |
|---|---|---|---|
| 7 | CRIEN | R/W | Ring indicate enable. The ring indicate enable bit has no function when the PC card type bit is set to 0 (memory PC card). For I/O PC cards:<br>0 = The STSCHG/RI signal from the I/O PC card is used as the STSCHG signal. The current status of the signal is then available to be read from the interface status register and this signal can be configured as a source for the card status change interrupt.<br>1 = The STSCHG/RI signal from the I/O PC card is used as a ring indicator signal and is passed through to the SMI output. |
| 6 | CRESET | R/W | PC card RESET. This is a software reset to the PC card.<br>0 = Drive card RESET active high.<br>1 = Drive card RESET active low. |
| 5 | CTYPE | R/W | PC card type (memory card or I/O card).<br>0 = Selects a memory PC card.<br>1 = Selects an I/O PC card and enables the PC card interface multiplexer for routing of PC card I/O signals. |
| 4 | SMIEN | R/W | SMI enable.<br>0 = CSC interrupts routed to one or more of the IRQ lines according to bits 7-4 in the Card Status Change Configuration register.<br>1 = CSC interrupts output on the SMI. |
| 3-0 | CINT3-0 | R/W | This field selects the routing for PC card I/O interrupts. |

-continued

| Bit | Name | Access | Description | | | | |
|---|---|---|---|---|---|---|---|
| | | | CINT3 | CINT2 | CINT1 | CINT0 | Level |
| | | | 0 | 0 | 0 | 0 | IRQ not selected |
| | | | 0 | 0 | 0 | 1 | Reserved. |
| | | | 0 | 0 | 1 | 0 | Reserved. |
| | | | 0 | 0 | 1 | 1 | IRQ3 enabled |
| | | | 0 | 1 | 0 | 0 | IRQ4 enabled |
| | | | 0 | 1 | 0 | 1 | IRQ5 enabled |
| | | | 0 | 1 | 1 | 0 | Reserved |
| | | | 0 | 1 | 1 | 1 | IRQ7 enabled |
| | | | 1 | 0 | 0 | 0 | Reserved |
| | | | 1 | 0 | 0 | 1 | IRQ9 enabled |
| | | | 1 | 0 | 1 | 0 | IRQ10 enabled |
| | | | 1 | 0 | 1 | 1 | IRQ11 enabled |
| | | | 1 | 1 | 0 | 0 | IRQ12 enabled |
| | | | 1 | 1 | 0 | 1 | Reserved |
| | | | 1 | 1 | 1 | 0 | IRQ14 enabled |
| | | | 1 | 1 | 1 | 1 | IRQ15 enabled |

Card Status Change Interrupt Configuration Register

| PCI Addresses (hex): | Socket A: 85 | Offset (hex): | Socket A: 05 |
|---|---|---|---|
| | Socket B: C5 | | Socket B: 45 |

This register controls interrupt steering of the card status change interrupt and the card status change interrupt enables.

| Bit | Name | Access | Description |
|---|---|---|---|
| 7-4 | SINT3-0 | R/W | This field selects the routing for CSC interrupts. This field is ignored if bit SMIEN in the Interrupt and General Control register is set to 1. |
| | | | SINT3 SINT2 SINT1 SINT0 Interrupt Request Level |
| | | | 0 0 0 0 IRQ not selected. |
| | | | 0 0 0 1 Reserved. |
| | | | 0 0 1 0 Reserved. |
| | | | 0 0 1 1 IRQ3 enabled. |
| | | | 0 1 0 0 IRQ4 enabled. |
| | | | 0 1 0 1 IRQ5 enabled. |
| | | | 0 1 1 0 Reserved. |
| | | | 0 1 1 1 IRQ7 enabled. |
| | | | 1 0 0 0 Reserved. |
| | | | 1 0 0 1 IRQ9 enabled. |
| | | | 1 0 1 0 IRQ10 enabled. |
| | | | 1 0 1 1 IRQ11 enabled. |
| | | | 1 1 0 0 IRQ12 enabled. |
| | | | 1 1 0 1 Reserved. |
| | | | 1 1 1 0 IRQ14 enabled. |
| | | | 1 1 1 1 IRQ15 enabled. |
| 3 | CDEN | R/W | Card detect enable. 0 = Disables the generation of a card status change interrupt when the card detect signals change state. 1 = Enables a card status change interrupt when a change has been detected on the CD1 or CD2 signals. |
| 2 | RDYEN | R/W | Ready enable for memory PC cards. This bit is ignored when the interface is configured for I/O PC cards. 0 = Disables the generation of a card status change interrupt when a low-to-high transition has been detected on the RDY/BSY signal. 1 = Enables a card status change interrupt when a low-to-high transition has been detected on the RDY/BSY signal. |
| 1 | BWRNEN | R/W | Battery warning enable for memory PC cards. This bit is ignored when the interface is configured for I/O PC cards. 0 = Disables the generation of a card status change interrupt when a battery warning condition has been detected. 1 = Enables a card status change interrupt when a battery warning condition has been detected. |
| 0 | BDEADEN | R/W | Battery dead enable (STSCHG). 0 = Disables the generation of a card status change interrupt. This bit is ignored when the interface is configured for I/O PC cards and the CRIEN bit in the Interrupt and General Control register is set to 1. 1 = (For memory PC cards) Enables a card status change interrupt when a battery dead condition has been detected. (For I/O PC cards) Enables the PCU to generate a card status interrupt if the STSCHG/RI signal has been pulled low by I/O PC card, assuming that the ring indicate enable bit in the interrupt and general control register is set to 0. |

I/O-window Registers

I/O-window Control Register

| PCI Addresses (hex): Socket A: | Offset (hex): Socket A: 07 |
|---|---|
| Socket B: C7 | Socket B: 47 |

This register configures I/O-window 0 and I/O-window 1

| Bit | Name | Access | Description |
|---|---|---|---|
| 7 | IW1WS | R/W | Window 1 wait state. 0 = 16-bit and 8-bit cycles have standard length. 1 = 16-bit cycles extended by equivalent of one ISA wait state, 8-bit cycles are unchanged. |
| 6 | IW1ZWS | R/W | Window 1 zero wait state. 0 = 16-bit and 8-bit cycles have standard length. 1 = 8-bit cycles are reduced to equivalent of three ISA clock cycles, 16-bit cycles are unchanged. |
| 5 | IW1ADS | R/W | I/O-window 1 auto data size. |

-continued

| Bit | Name | Access | Description |
|---|---|---|---|
| 4 | IW1DS | R/W | 0 = Window data width determined by bit IW1DS.<br>1 = Window data width determined by input IOIS16 from PC card.<br>I/O-window 1 data size. This bit is ignored if IW1ADS is set.<br>0 = Window data width is 8 bits.<br>1 = Window data width is 16 bits. |
| 3 | IW0WS | R/W | Window 0 wait state.<br>0 = 16-bit and 8-bit cycles have standard length.<br>1 = 16-bit cycles extended by equivalent of one ISA wait state, 8-bit cycles are unchanged. |
| 3 | IW0ZWS | R/W | Window 0 zero wait state.<br>0 = 16-bit and 8-bit I/O cycles have standard length.<br>1 = 8-bit I/O cycles are reduced to equivalent of three ISA clock cycles, 16-bit I/O cycles are unchanged. |
| 1 | IW0ADS | R/W | I/O-window 0 auto data size.<br>0 = Window data width determined by bit IW0DS.<br>1 = Window data width determined by input IOIS16 from PC card. |
| 0 | IW0DS | R/W | I/O-window 0 data size. This bit is ignored if IW0ADS is set.<br>0 = Window data width is 8 bits.<br>1 = Window data width is 16 bits. |

I/O-Window 0 Start-Address Low-Byte Register

PCI Addresses (hex): Socket A: 88 Offset (hex):Socket A: 08 Socket B: C9 Socket B:49

This register contains the low-order address bits used to determine the start address of I/O address window 0. This provides a minimum 1 byte window for I/O address window 0.

| Bit | Name | Access | Description |
|---|---|---|---|
| 7-0 | SA7-0 | R/W | I/O-window 0 start address A7-0. |

I/O-Window 0 Start-Address High-Byte Register

PCI Addresses (hex):Socket A: 89 Offset (hex): Socket A: 09
Socket B: C9    Socket B: 49

This register contains the high-order address bits used to determine the start address of I/O address window 0.

| Bit | Name | Access | Description |
|---|---|---|---|
| 7-0 | SA15-8 | R/W | I/O-window 0 start address A15-8. |

I/O-Window 0 End-Address Low-Byte Register

PCI Addresses (hex):Socket A: 8A Offset (hex):Socket A: 0A
Socket B: CA    Socket B: 4A This register contains the low-order address bits used to determine the end address of I/O address window 0. This provides a minimum 1 byte window for I/O address window 0.

| Bit | Name | Access | Description |
|---|---|---|---|
| 7-0 | EA7-0 | R/W | I/O-window 0 end address A7-0. |

I/O Window 0 End-Address High-Byte Register

PCI Addresses (hex): Socket A: 8B Offset (hex): Socket A: 0B
Socket B: CB    Socket B:4B This register contains the high-order address bits used to determine the end address of I/O address window 0.

| Bit | Name | Access | Description |
|---|---|---|---|
| 7-0 | EA15-8 | R/W | I/O-window 0 end address A15-8. |

Memory Window Registers

Memory-Window 0 Start-Address Low Byte Register

PCI Addresses (hex):    Socket A:90    Offset (hex):    Socket A:10
                        Socket B: D0                    Socket B:50

This register contains the low-order address bits used to determine the start address of the corresponding system memory address mapping window. This provides a minimum memory mapping window of 4K bytes.

A Memory PC card is selected when the following conditions are satisfied.

The memory window is enabled.

The PCI address bits A23-12 are greater than or equal to the memory window start address.

The PCI address bits are A23-12 are less than or equal to the memory window end address.

The PCI address bits AD31-24 are equal to the Memory Window Page register value (default is zero).

The system memory address mapping windows can all be configured by software to be used independently, or used in concert to perform mapping for special memory mapping requirements, like LIM/EMS (Lotus-Intel-Microsoft/ Extended Memory Specification) or XIP (Execute in Place).

| Bit | Name | Access | Description |
|---|---|---|---|
| 7-0 | SA19-12 | R/W | System memory-window start address A19-12 |

Memory-Window 0 Start-Address High-Byte Register

PCI Addresses (hex):    Socket A: 91 Offset (hex):    Socket A: 11
                        Socket B: D1                    Socket B: 51

This register contains the high-order address bits used to determine the start address of the corresponding system memory address mapping window. Each system memory window has a data path size associated with it that is controlled by a bit in this register.

| Bit | Name | Access | Description |
|---|---|---|---|
| 7 | DSIZE | R/W | Memory-window data size.<br>0 = window data width is 8 bits.<br>1 = window data width is 16 bits. |
| 6 | ZWS | R/W | Window 0 zero wait state.<br>0 = 16-bit and 8-bit memory cycles have standard length.<br>1 = 8-bit memory cycles are reduced to equivalent of three ISA clock cycles, 16-bit memory cycles are reduced to equivalent of two ISA clock cycles. |
| 5-4 | SCRATCH | R/W | Scratch bits. General purpose storage and retrieval. |
| 3-0 | SA23-20 | R/W | System memory-window start-address A23-20. |

Memory-Window 0 End-Address Low-Byte Register

| PCI Addresses (hex): | Socket A: 92<br>Socket B: D2 | Offset (hex): | Socket A: 12<br>Socket B: 52 |
|---|---|---|---|

This register contains the low-order address bits used to determine the end address of the corresponding system memory address mapping window. This provides a minimum memory mapping window of 4 Kbytes.

| Bit | Name | Access | Description |
|---|---|---|---|
| 7-0 | EA19-12 | R/W | System memory-window end address A19-12. |

Memory-Window 0 End-Address High-Byte Register

| PCI Addresses (hex): | Socket A: 93<br>Socket B: D3 | Offset | Socket A:13<br>Socket B: 53 |
|---|---|---|---|

This register contains the high-order address bits used to determine the end address of the corresponding system memory address mapping window.

| Bit | Name | Access | Description |
|---|---|---|---|
| 7-6 | WS1-0 | R/W | Window wait state. WS1 and WS0 determine the number of equivalent ISA wait states added to 16-bit memory cycles (8-bit memory cycles are unchanged). |
| 5-4 | — | R/W | Reserved. |
| 3-0 | EA23-20 | R/W | System memory-window end address A23-20. |

Memory-Window 0 Ofset Address Low-Byte Register

| PCI Addresses (hex): | Socket A: 94<br>Socket B: D4 | Offset (hex): | Socket A: 14<br>Socket B: 54 |
|---|---|---|---|

This register contains the low-order address bits that are added to the system address bits A19-12 to generate the memory address for the PC card.

| Bit | Name | Access | Description |
|---|---|---|---|
| 7-0 | OF19-12 | R/W | Card memory offset-address A19-12. |

Memory-Window 0 Offset Address High-Byte Register

| PCI Addresses (hex): | Socket A: 95<br>Socket B: D5 | Offset (hex): | Socket A: 15<br>Socket B: 55 |
|---|---|---|---|

This register contains the high-order address bits that are added to the system address bits A23-20 to generate the memory address for the PC card. The software write protect of the PC card memory for the corresponding system memory window is controlled by this register. This register also controls whether the corresponding system memory window is mapped to attribute or common memory in the PC card.

| Bit | Name | Access | Description |
|---|---|---|---|
| 7 | WP | R/W | Write protect. Write operations to the PC card through the corresponding sytem memory window are controlled by this bit.<br>0 = Write operations allowed.<br>1 = Write operations are inhibited. |
| 6 | REG | R/W | Reg active. Accesses to the system memory are controlled by this bit.<br>0 = Accesses common memory on the PC card.<br>1 = Accesses attribute memory on the PC card. |
| 5-0 | OF25-20 | R/W | Card memory offset-address A25-20. |

Configuration Header

The PCU supports the PCI defined 64-Kbyte header. Reads from registers that are reserved or that are not implemented will return zero.

Device identification lRegister

PCI Addresses (hex): 00

This 32-bit register contains the device and vendor ID.

| Bit | Name | Access | Description |
|---|---|---|---|
| 31–16 | DEVICE ID | R | Identifier allocated by vendor. PCU device ID is 0900h. |
| 15–0 | VENDOR ID | R | Identifies manufacturer. TI vendor ID is 104Ch. |

Command Register

PCI Addresses (hex): 04

This 32-bit register contains the status and command fields.

| Bit | Name | Access | Description |
|---|---|---|---|
| 31–16 | STATUS | R | Reserved. |
| 1 | COMMAND | R | Reserved. |
|  |  | R/W | 0 = Memory access disabled.<br>1 = Memory access enabled. |
| 0 |  | R/W | 0 = I/O access disabled.<br>1 = I/O access enabled. |

Device Identification 2 Register

PCI Addresses (hex): PCI Addresses (hex): 08

This 32-bit register contains the class code and revision fields.

| Bit | Name | Access | Description |
|---|---|---|---|
| 31–8 | CLASS CODE | R | Class code is <Base class> and <Sub-class> and <Prog if>. PCMCIA bridge class code is: 060500. |
| 7–0 | REVISION ID | R | First silicon revision ID is 00. |

Miscellaneous Function 1 Register
PCI Addresses (hex): 0C
This 32-bit register contains the BIST, Header type, latency type, and cache line fields.

| Bit | Name | Access | Description |
|---|---|---|---|
| 31–24 | BIST | R | 0 = No built in self test. |
| 23–16 | HEADER TYPE | R | 0 = Single function. |
| 15–8 | LATENCY TYPE | R | 0 = Target only. |
| 7–0 | CACHE LINE | R | 0 = Target only. |

Base Address Registers 0 to 5
PCI Addresses (hex): 10, 14, 18, 1C, 20, 24.
These 32-bit registers are provided by PCI to allow software remapping of devices in I/O and memory space. The PCU does not implement this feature.

| Bit | Name | Access | Description |
|---|---|---|---|
| 31–0 | BASE ADDRESS | R | Not implemented. |

Expansion ROM Base Address Registers
PCI Addresses (hex): 30.
This 32-bit register Is provided by PCI to allow software remapping of device expansion ROM. The PCU does not implement this feature.

| Bit | Name | Access | Description |
|---|---|---|---|
| 31–0 | ROM ADDRESS | R | Not implemented |

Miscellaneous Function 2 Register
PCI Addresses (hex): 3C
This 32-bit register contains the MAX_LAT, MAX_GNT, interrupt pin, and interrupt line fields.

| Bit | Name | Access | Description |
|---|---|---|---|
| 31–24 | MAX_LAT | R | 0 = target only. |
| 23–16 | MAX_GNT | R | 0 = target only |
| 15–8 | INT PIN | R | 1 = single function: PCU uses INTA only. Used to communicate interrupt line routing but does not affect device function. Field is written by POST software after resource allocation and is read by device drivers and operating systems. |
| 7–0 | INT LINE | R/W | |

PCI Header Reserved Registers
PCI Addresses (hex): 28, 2C, 34, 38
These 32-bit registers are read only with hard wired value 0.
Extension Registers
The extension registers are accessible only in PCI configuration space and are used to control special features.
Initialization Register
PCI Addresses (hex): Socket A: 40
Socket B: 44

This register controls device I/O addressing and software reset.

| Bit | Name | Access | Description |
|---|---|---|---|
| 7–6 | — | R/W | Reserved. |
| 5–4 | TS2–1 | R/W | PCLK clock frequency bits programmed at power up. The PCMCIA cycle generator uses PCI clock for waveform timing. TS1 TS0 Clock Frequency<br>0   0   25 MHz<br>0   1   33 MHz<br>1   0   50 MHz<br>1   1   66 MHz |
| 3 | IOSEL | R/W | IO address select.<br>0 = Index/Data registers at 3E0/3E1.<br>1 = Index/Data registers at 3E2/3E3. |
| 2 | DEVID | R/W | Device number.<br>0 = Valid Index range is 00 to 3F for socket A, 40 to 7F for socket B.<br>1 = Valid Index range is 80 to BF for socket A, C0 to FF for socket B. |
| 1 | SRES | R/W | Soft reset.<br>0 = Normal operation.<br>1 = Reset PCU. |
| 0 | CSET | R/W | Chipset type.<br>0 = Chipset name 0<br>1 = Chipset name 1 |

Write Buffer Control Register
PCI Addresses (hex): Socket A: 41
Socket B: 45
This register controls the internal write buffer.

| Bit | Name | Access | Description |
|---|---|---|---|
| 7–5 | — | R/W | Reserved. |
| 4 | IOBUF | R/W | Write buffer cycle select.<br>0 = Memory writes only to write buffer.<br>1 = Memory and IO writes to write buffer. |
| 3 | FDEP | R/W | Write buffer depth.<br>0 = 4 deep.<br>1 = deep. |
| 2 | FEN | R/W | Write buffer enable/disable.<br>0 = Write buffer off .<br>1 = Write buffer on. |
| 1 | FULL | R | Write buffer full.<br>0 = Write buffer not full.<br>1 = Write buffer full. |
| 0 | EMPTY | R/W | When read, this bit indicates write buffer status.<br>Read 0 = Write buffer not empty.<br>Read 1 = Write buffer empty.<br>When written to, this bit allows software to flush the write buffer.<br>Write 0 = No change.<br>Write 1 = Flush write buffer. |

Miscellaneous Register
PCI Addresses (hex): Socket A: 42
Socket B: 46
This register controls socket PC card ring indicate, speaker, and card voltage detection.

| Bit | Name | Access | Description |
|---|---|---|---|
| 7–5 | — | R/W | Reserved. |
| 4 | ATAEN | R/W | ATA special feature enable.<br>0 = Normal operation.<br>1 = I/O-window addresses 3F7 and 377 will be read only. Input FDC_D7 is routed to AD31 during reads from I/O 3F7 and 377. |
| 3 | RISMI | R/W | Ring Indicate RI change to SMI interrupt |

-continued

| Bit | Name | Access | Description |
|---|---|---|---|
| | | | enable. |
| | | | 0 = Normal operation. |
| | | | 1 = RI change generates level mode interrupt on SMI. |
| 2 | RISTAT | R/W | RI Ring Indicate change. |
| | | | 0 = No change detected on RI signal. |
| | | | 1 = A change has been detected on RI signal. |
| 1 | SPKEN | R/W | Speaker to speaker out enable. |
| | | | 0 = SPKR routing to SPKROUT disabled. |
| | | | 1 = SPKR routing to SPKROUT enabled |
| 0 | DET5V | R | This bit is connected to PC card pin CIS3V. |
| | | | 0 = Card is 3 V. |
| | | | 1 = Card is 5 V. |

Memory-Window Page Register

PCI Addresses (hex): Socket A: 43

Socket B: 47

This register contains an 8 bit page number which is compared with PCI address signals AD31-24 during memory cycles. If the page bits P7-0 match AD31-24 then the PCU memory-window decode logic is enabled. This allows the memory windows to be located above the first 16 Mbytes of system address space, thereby overcoming a limitation of the ISA bus. By using the page register, the programmer can locate the PCMCIA memory windows in any of the 256 separate 16 Mbyte pages which make up the 4 Gbytes PCI address space.

| Bit | Name | Access | Description |
|---|---|---|---|
| 7-0 | P7-0 | R/W | Memory-window page number. |

PCMCIA cycle timing is controlled by the wait-state bits in the compatible Memory Window and I/O-Window registers. The PCMCIA cycle generator uses the PCI clock to generate the correct card address setup and hold, and the PCMCIA command active (low) interval. As the PCU may be used in systems with different PCI clock frequencies, the PCMCIA cycle generator needs to know the maximum PCI clock frequency in order to optimize the cycle timing. To communicate this information to the cycle generator, there are two additional register bits implemented in the TI Initialization register. These bits TS1 and TS0 should be programmed by software according to maximum PCI clock frequency.

The PCMCIA address setup and hold times are a function of the wait state bits and the PCI clock frequency bits TS1,TS0. The next tables show address setup time in PCLK cycles and nanoseconds (ns) for I/O and memory cycles, command active time in PCLK cycles and nanoseconds for I/O and memory cycles, and address hold time in PCLK cycles and nanoseconds for I/O and memory cycles.

PCMCIA Address Setup, 8- and 16-bit PCI Cycles

| Wait State Bits | TS1:0 = 00 PCLK/ns | TS1:0 = 01 PCLK/ns | TS1:0 = 10 PCLK/ns |
|---|---|---|---|
| I/O | 2/80 | 3/90 | 4/80 |
| Mem WS1 0 | 1/40 | 2/60 | 4/80 |
| Mem WS1 1 | 3/120 | 4/120 | 5/100 |

PCMCIA command Active, 8-Bit PCI Cycles

| Wait State Bits | | | TS1:0 = 00 PCLK/ns | TS1:0 = 01 PCLK/ns | TS1:0 = 10 PCLK/ns |
|---|---|---|---|---|---|
| I/O WW, ZWS | 0 | 0 | 15/600 | 19/570 | 29/580 |
| | 1 | x | 18/720 | 23/690 | 35/700 |
| | 0 | 1 | 5/200 | 7/210 | 10/200 |
| Memory WS1, WS0, ZWS 00 | | 0 | 15/600 | 19/570 | 29/580 |
| 01 | x | | 18/720 | 23/690 | 35/700 |
| 10 | x | | 18/720 | 23/690 | 35/700 |
| 10 | x | | 18/720 | 23/690 | 35/700 |
| 00 | 1 | | 5/200 | 7/210 | 10/250 |

PCMCIA Command Active, 16-Bit PCI Cycles

| Wait State Bits | | | TS1:0 = 00 PCLK/ns | TS1:0 = 01 PCLK/ns | TS1:0 = 10 PCLK/ns |
|---|---|---|---|---|---|
| I/O WS, ZWS | 0 | 0 | 5/200 | 7/210 | 10/200 |
| | 1 | x | 8/320 | 11/330 | 16/320 |
| | 0 | 1 | N/A | N/A | N/A |
| Memory WS1, WS0, ZWS 00 | | 0 | 7/280 | 9/270 | 13/260 |
| 01 | x | | 10/400 | 13/390 | 10/380 |
| 10 | x | | 13/520 | 17/510 | 25/500 |
| 11 | x | | 16/640 | 21/630 | 32/640 |
| 00 | 1 | | 4/160 | 5/150 | 7/140 |

PCMCIA Address Hold, 8- and 16-bit PCI Cycles

| Wait State Bits | TS1:0 = 00 PCLK/ns | TS1:0 = 01 PCLK/ns | TS1:0 = 10 PCLK/ns |
|---|---|---|---|
| I/O | 1/40 | 2/60 | 2/50 |
| Mem WS1 0 | 1/40 | 2/60 | 2/50 |
| Mem WS1 1 | 2/80 | 3/90 | 4/80 |

What is claimed is:

1. An integrated circuit comprising on a single chip:

distinct supply voltage terminals and internal on-chip supply conductors connected respectively thereto, including a ground terminal and terminals for first and second supply voltages;

a first inverter connected between said first supply voltage and ground and having a first inverter input and a first inverter output;

a second inverter connected between said second supply voltage and ground and having a second inverter input and a second inverter output;

a first feedback transistor having connections to said second supply voltage, and to said second inverter input and said second inverter output;

a second feedback transistor having connections to ground, and to said second inverter input and said second inverter output;

first and second open-type inverters connected to ground and each said open-type inverter having an input and output;

the input of said first open-type inverter connected to said first inverter input, the output of said first open-type inverter connected to said second inverter input;

the input of said second open-type inverter connected to said first inverter output, the output of said second open-type inverter connected to said second inverter output.

2. The integrated circuit of claim 1 further comprising a first logic circuit connected to said first supply voltage terminal and having an output connected to the first inverter input.

3. The integrated circuit of claim 1 further comprising a second logic circuit connected to said second supply voltage terminal and having an input connected to the second inverter output.

4. The integrated circuit of claim 1 wherein said first feedback transistor comprises a p-channel transistor having a gate connected to said second inverter output and a source and drain connected between said second voltage and said second inverter input.

5. The integrated circuit of claim 1 wherein said second feedback transistor comprises an n-channel transistor having a gate connected to said second inverter output and a source and drain connected between ground and said second inverter input.

6. An electronic circuit comprising:
an input circuit connected to a first supply voltage and having an input and an output;
an output circuit connected to a second supply voltage and having an input and an output;
a first feedback circuit connected to said second supply voltage and said output circuit;
a second feedback circuit connected to ground and said output circuit; and
a first transition acceleration circuit, having an input and an output, said input of said first transition acceleration circuit connected to said input of said input circuit and said output of said first transition acceleration circuit connected to said input of said output circuit.

7. The circuit of claim 6 further comprising a second transition acceleration circuit, having an input and an output, said input of said second transition circuit connected to said output of said input circuit and said output of said second transition circuit connected to said first feedback circuit, said second feedback circuit and said output of said output circuit.

8. The circuit of claim 6 further comprising a first voltage circuit connected to said first supply voltage and having an output connected to said input of said input circuit.

9. The circuit of claim 6 further comprising a second voltage circuit connected to said second supply voltage and having an input connected to said output of said output circuit.

10. The circuit of claim 6 wherein said input circuit comprises an inverter.

11. The circuit of claim 6 wherein said output circuit comprises an inverter.

12. The circuit of claim 6 wherein said first transition acceleration circuit comprises an open-type inverter.

13. The circuit of claim 7 wherein said second transition acceleration circuit comprises an open-type inverter.

14. The circuit of claim 6 wherein said first feedback circuit comprises a p-channel transistor having a gate connected to said output of said output circuit and a source and drain connected between said second voltage and said input of said output circuit.

15. The circuit of claim 6 wherein said second feedback circuit comprises an n-channel transistor having a gate connected to said output of said output circuit and a source and drain connected between ground and said input of said output circuit.

16. The circuit of claim 6 wherein said first feedback circuit assists low to high transitions at said input of said output circuit.

17. The circuit of claim 6 wherein said second feedback circuit assists high to low transitions at said input of said output circuit.

18. A personal computer comprising:
provision for user input;
a memory;
provision for output;
a microprocessor coupled to said provision for user input, to said memory and to said provision for output; and
an electronic circuit coupled to said microprocessor comprising:
an input circuit connected to a first supply voltage and having an input and an output;
an output circuit connected to a second supply voltage and having an input and an output;
a first feedback circuit connected to said second supply voltage and said output circuit;
a second feedback circuit connected to ground and said output circuit; and
a first transition acceleration circuit, having an input and an output, said input of said first transition acceleration circuit connected to said input of said input circuit and said output of said first transition acceleration circuit connected to said input of said output circuit.

19. The personal computer of claim 18 further comprising a second transition acceleration circuit, having an input and an output, said input of said second transition circuit connected to said output of said input circuit and said output of said second transition circuit connected to said first feedback circuit, said second feedback circuit and said output of said output circuit.

20. The personal computer of claim 18 further comprising a first voltage circuit connected to said first supply voltage and having an output connected to said input of said input circuit.

21. The personal computer of claim 18 further comprising a second voltage circuit connected to said second supply voltage and having an input connected to said output of said output circuit.

22. The personal computer of claim 18 wherein said input circuit comprises an inverter.

23. The personal computer of claim 18 wherein said output circuit comprises an inverter.

24. The personal computer of claim 18 wherein said first transition acceleration circuit comprises an open-type inverter.

25. The personal computer of claim 20 wherein said second transition acceleration circuit comprises an open-type inverter.

26. The personal computer of claim 18 wherein said first feedback circuit comprises a p-channel transistor having a gate connected to said output of said output circuit and a source and drain connected between said second voltage and said input of said output circuit.

27. The personal computer of claim 18 wherein said second feedback circuit comprises an n-channel transistor having a gate connected to said output of said output circuit and a source and drain connected between ground and said input of said output circuit.

28. The personal computer of claim 18 wherein said first feedback circuit assists low to high transitions at said input of said output circuit.

29. The personal computer of claim 18 wherein said second feedback circuit assists high to low transitions at said input of said output circuit.

30. The personal computer of claim 18 wherein said provision for user input comprises an input connector.

31. The personal computer of claim 30 further comprising an input device connected to said input connector.

32. The personal computer of claim 18 wherein said provision for output comprises an output connector.

33. The personal computer of claim 32 further comprising a display connected to said output connector.

34. The personal computer of claim 18 wherein said microprocessor is a portion of a first integrated circuit and said electronic circuit is a portion of a second integrated circuit.

35. A personal computer comprising:

an input device;

a memory;

a display;

a microprocessor coupled to said input device, said memory, and said display; and a circuit coupled to said microprocessor comprising:

distinct supply voltage terminals and internal on-chip supply conductors connected respectively thereto, including a ground terminal and terminals for first and second supply voltages;

a first inverter connected between said first supply voltage and ground and having a first inverter input and a first inverter output;

a second inverter connected between said second supply voltage and ground and having a second inverter input and a second inverter output;

a first feedback transistor having connections to said second supply voltage, and to said second inverter input and said second inverter output;

a second feedback transistor having connections to ground, and to said second inverter input and said second inverter output;

first and second open-type inverters connected to ground and each said open-type inverter having an input and output;

the input of said first open-type inverter connected to said first inverter input, the output of said first open-type inverter connected to said second inverter input; and the input of said second open-type inverter connected to said first inverter output, the output of said second open-type inverter connected to said second inverter output.

36. The personal computer of claim 35 wherein said microprocessor is a portion of a first integrated circuit and said circuit is a portion of a second integrated circuit.

37. The personal computer of claim 35 further comprising a first logic circuit connected to said first supply voltage terminal and having an output connected to the first inverter input.

38. The personal computer of claim 35 further comprising a second logic circuit connected to said second supply voltage terminal and having an input connected to the second inverter output.

39. The personal computer of claim 35 wherein said first feedback transistor comprises a p-channel transistor having a gate connected to said second inverter output and a source and drain connected between said second voltage and said second inverter input.

40. The personal computer of claim 35 wherein said second feedback transistor comprises an n-channel transistor having a gate connected to said second inverter output and a source and drain connected between ground and said second inverter input.

41. The personal computer of claim 35 wherein said input device includes a keyboard.

42. The personal computer of claim 35 wherein said display includes a CRT.

43. The personal computer of claim 35 wherein said personal computer has the form of a notebook computer.

44. An electronic wiring board article of manufacture comprising:

a printed wiring board having a substantially insulative planar board element, conductors in or on said board element;

a first integrated circuit comprising a microprocessor mounted on said printed wiring board; and a second integrated circuit mounted on said printed wiring board and coupled to said microprocessor comprising:

an input circuit connected to a first supply voltage and having an input and an output;

an output circuit connected to a second supply voltage and having an input and an output;

a first feedback circuit connected to said second supply voltage and said output circuit;

a second feedback circuit connected to ground and said output circuit; and a first transition acceleration circuit, having an input and an output, said input of said first transition acceleration circuit connected to said input of said input circuit and said output of said first transition acceleration circuit connected to said input of said output circuit;

said conductors of said printed wiring board providing connection between said first integrated circuit and said second integrated circuit.

* * * * *